(12) United States Patent
Mann et al.

(10) Patent No.: US 9,465,300 B2
(45) Date of Patent: Oct. 11, 2016

(54) CATOPTRIC OBJECTIVES AND SYSTEMS USING CATOPTRIC OBJECTIVES

(75) Inventors: Hans-Juergen Mann, Oberkochen (DE); Wilhelm Ulrich, Aalen (DE); Marco Pretorius, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/438,428

(22) Filed: Apr. 3, 2012

(65) Prior Publication Data

US 2012/0188525 A1 Jul. 26, 2012

Related U.S. Application Data

(63) Continuation of application No. 12/474,247, filed on May 28, 2009, now Pat. No. 8,169,694, which is a continuation of application No. 12/166,406, filed on Jul. 2, 2008, now Pat. No. 7,719,772, which is a (Continued)

(51) Int. Cl.
*G02B 21/00* (2006.01)
*G02B 3/00* (2006.01)
(Continued)

(52) U.S. Cl.
CPC ....... *G03F 7/70233* (2013.01); *G02B 17/0663* (2013.01); *G03F 7/70308* (2013.01); *G02B 13/0065* (2013.01); *G02B 13/16* (2013.01); *G02B 17/0621* (2013.01);
(Continued)

(58) Field of Classification Search
CPC .. G02B 13/16; G02B 17/08; G02B 17/0804; G02B 13/0065; G02B 21/04; G02B 17/0621; G02B 17/0663

USPC ........ 359/365, 366, 649–651, 726, 731, 733
See application file for complete search history.

(56) References Cited

U.S. PATENT DOCUMENTS

| 4,650,292 A | 3/1987 | Baker et al. |
| 4,655,555 A | 4/1987 | Maechler et al. |

(Continued)

FOREIGN PATENT DOCUMENTS

| CN | 1 506 766 A | 6/2004 |
| DE | 33 43 868 | 6/1985 |

(Continued)

OTHER PUBLICATIONS

Bal, Matthieu Frédéric, dissertation "Next-Generation Extreme Ultraviolet Lithographic Projection Systems", pp. 1-139, (Feb. 10, 2003).

(Continued)

*Primary Examiner* — Evelyn A Lester
(74) *Attorney, Agent, or Firm* — Fish & Richardson P.C.

(57) ABSTRACT

In general, in a first aspect, the invention features a system that includes a microlithography projection optical system. The microlithography projection optical system includes a plurality of elements arranged so that during operation the plurality of elements image radiation at a wavelength λ from an object plane to an image plane. At least one of the elements is a reflective element that has a rotationally-asymmetric surface positioned in a path of the radiation. The rotationally-asymmetric surface deviates from a rotationally-symmetric reference surface by a distance of about λ or more at one or more locations of the rotationally-asymmetric surface.

34 Claims, 54 Drawing Sheets

Related U.S. Application Data continuation of application No. 11/520,558, filed on Sep. 13, 2006, now Pat. No. 7,414,781.

(60) Provisional application No. 60/793,387, filed on Apr. 7, 2006, provisional application No. 60/716,437, filed on Sep. 13, 2005.

(51) Int. Cl.
  *G02B 9/00*     (2006.01)
  *G02B 17/00*    (2006.01)
  *G03F 7/20*     (2006.01)
  *G02B 21/04*    (2006.01)
  *G02B 17/08*    (2006.01)
  *G02B 13/16*    (2006.01)
  *G02B 13/00*    (2006.01)
  *G02B 17/06*    (2006.01)

(52) U.S. Cl.
  CPC .......... *G02B 17/08* (2013.01); *G02B 17/0804* (2013.01); *G02B 21/04* (2013.01)

(56) References Cited

U.S. PATENT DOCUMENTS

| | | | |
|---|---|---|---|
| 5,003,567 A | 3/1991 | Hawryluk et al. | |
| 5,063,586 A * | 11/1991 | Jewell | B82Y 10/00 359/859 |
| 5,071,240 A | 12/1991 | Ichihara et al. | |
| 5,142,417 A * | 8/1992 | Brunn | G02B 17/0642 359/859 |
| 5,212,588 A | 5/1993 | Viswanathan et al. | |
| 5,309,276 A | 5/1994 | Rodgers | |
| 5,686,728 A | 11/1997 | Shafer | |
| 5,812,309 A | 9/1998 | Thoma et al. | |
| 5,815,310 A | 9/1998 | Williamson | |
| 6,033,079 A | 3/2000 | Hudyma | |
| 6,072,852 A | 6/2000 | Hudyma | |
| 6,172,825 B1 | 1/2001 | Takahashi | |
| 6,195,201 B1 | 2/2001 | Koch et al. | |
| 6,198,793 B1 | 3/2001 | Schultz et al. | |
| 6,226,346 B1 | 5/2001 | Hudyma | |
| 6,229,595 B1 | 5/2001 | McKinley et al. | |
| 6,240,158 B1 | 5/2001 | Oshino | |
| 6,244,717 B1 | 6/2001 | Dinger | |
| 6,249,391 B1 * | 6/2001 | Hayakawa et al. | 359/720 |
| 6,266,389 B1 | 7/2001 | Murayama et al. | |
| 6,302,548 B2 | 10/2001 | Takahashi et al. | |
| 6,318,869 B1 | 11/2001 | Hudyma | |
| 6,353,470 B1 | 3/2002 | Dinger | |
| 6,359,678 B1 | 3/2002 | Ota | |
| 6,426,506 B1 | 7/2002 | Hudyma | |
| 6,452,661 B1 | 9/2002 | Komatsuda | |
| 6,512,641 B2 | 1/2003 | Omura | |
| 6,549,270 B1 | 4/2003 | Ota | |
| 6,557,443 B1 | 5/2003 | Larue | |
| 6,577,443 B2 * | 6/2003 | Dinger et al. | 359/366 |
| 6,600,552 B2 | 7/2003 | Dinger | |
| 6,660,552 B2 | 12/2003 | Payne et al. | |
| 6,666,560 B2 | 12/2003 | Suzuki | |
| 6,710,917 B2 * | 3/2004 | Mann et al. | 359/365 |
| 6,750,948 B2 | 6/2004 | Omura | |
| 6,850,361 B1 * | 2/2005 | Nakano | G02B 17/0642 359/365 |
| 6,867,913 B2 | 3/2005 | Mann et al. | |
| 6,894,834 B2 | 5/2005 | Mann et al. | |
| 6,902,283 B2 | 6/2005 | Dinger | |
| 6,922,291 B2 | 7/2005 | Sunaga et al. | |
| 6,929,373 B2 | 8/2005 | Yoshikawa et al. | |
| 6,947,210 B2 | 9/2005 | Terasawa | |
| 7,114,818 B2 | 10/2006 | Minakata | |
| 7,224,441 B2 | 5/2007 | Sasaki | |
| 7,414,781 B2 | 8/2008 | Mann et al. | |
| 7,682,031 B2 | 3/2010 | Mann et al. | |
| 7,719,772 B2 * | 5/2010 | Mann et al. | 359/649 |
| 7,869,138 B2 | 1/2011 | Mann et al. | |
| 8,169,694 B2 | 5/2012 | Mann et al. | |
| 2001/0002155 A1 | 5/2001 | Takahashi et al. | |
| 2001/0038446 A1 | 11/2001 | Takahashi | |
| 2001/0043391 A1 | 11/2001 | Shafer et al. | |
| 2002/0012100 A1 | 1/2002 | Shafer | |
| 2002/0114089 A1 | 8/2002 | Dinger et al. | |
| 2002/0171047 A1 | 11/2002 | Chan et al. | |
| 2002/0171048 A1 | 11/2002 | Braat | |
| 2003/0076483 A1 | 4/2003 | Komatsuda | |
| 2003/0147131 A1 | 8/2003 | Terasawa | |
| 2004/0070743 A1 | 4/2004 | Hudyma et al. | |
| 2004/0114217 A1 | 6/2004 | Mann et al. | |
| 2004/0165160 A1 | 8/2004 | Van Beek et al. | |
| 2004/0165255 A1 | 8/2004 | Sasaki et al. | |
| 2004/0165282 A1 | 8/2004 | Sunaga et al. | |
| 2004/0189968 A1 | 9/2004 | Terasawa | |
| 2004/0252358 A1 | 12/2004 | Kawahara et al. | |
| 2005/0036213 A1 | 2/2005 | Mann et al. | |
| 2005/0088760 A1 | 4/2005 | Mann et al. | |
| 2005/0093041 A1 | 5/2005 | Singer et al. | |
| 2005/0134980 A1 | 6/2005 | Mann et al. | |
| 2006/0209302 A1 | 9/2006 | Sasaki | |
| 2006/0232867 A1 | 10/2006 | Mann et al. | |
| 2006/0284113 A1 | 12/2006 | Chang et al. | |
| 2007/0058269 A1 | 3/2007 | Mann et al. | |
| 2007/0195317 A1 | 8/2007 | Schotter et al. | |
| 2009/0046357 A1 | 2/2009 | Mann et al. | |
| 2009/0262443 A1 | 10/2009 | Mann et al. | |
| 2011/0063596 A1 | 3/2011 | Mann et al. | |

FOREIGN PATENT DOCUMENTS

| | | |
|---|---|---|
| DE | 102 12 405 | 10/2002 |
| DE | 103 59 576 | 7/2005 |
| DE | 10 2005 042 005 | 7/2006 |
| EP | 0 730 169 | 9/1996 |
| EP | 0 730 179 | 9/1996 |
| EP | 0 730 180 | 9/1996 |
| EP | 0 744 665 | 11/1996 |
| EP | 0 779 528 | 6/1997 |
| EP | 0 730 513 | 8/1997 |
| EP | 1 069 448 | 1/2001 |
| EP | 1 093 021 | 4/2001 |
| EP | 1 199 590 | 4/2002 |
| EP | 1 225 481 | 7/2002 |
| EP | 1 333 260 A2 | 8/2003 |
| EP | 1 335 228 | 8/2003 |
| EP | 1 335 229 | 8/2003 |
| EP | 1 434 093 | 6/2004 |
| EP | 1 450 196 | 8/2004 |
| EP | 1 450 209 | 8/2004 |
| EP | 1 465 003 A1 | 10/2004 |
| EP | 1 494 056 | 1/2005 |
| EP | 1 376 191 | 1/2007 |
| JP | 3-041328 | 2/1991 |
| JP | 07-036959 | 2/1995 |
| JP | 07 283116 | 10/1995 |
| JP | 11-110791 | 4/1999 |
| JP | 2001-185480 | 7/2001 |
| JP | 2002-015979 | 1/2002 |
| JP | 2002-139672 | 5/2002 |
| JP | 2003-114387 | 4/2003 |
| JP | 1 335 229 | 8/2003 |
| JP | 2003-222572 | 8/2003 |
| JP | 2003-233002 | 8/2003 |
| JP | 2004-029625 | 1/2004 |
| JP | 2004-512552 | 4/2004 |
| JP | 2004-516500 | 6/2004 |
| JP | 2004-214242 | 7/2004 |
| JP | 2004-525398 | 8/2004 |
| JP | 2004-258541 | 9/2004 |
| JP | 2005-055553 | 3/2005 |
| JP | 2005-166778 | 6/2005 |
| JP | 2005-172988 | 6/2005 |
| TW | 476943 | 2/2002 |
| TW | 594043 | 6/2004 |
| TW | 2004 23228 A | 11/2004 |
| TW | 226938 | 1/2005 |

(56) References Cited

FOREIGN PATENT DOCUMENTS

| TW | 2004 03228 A | 9/2005 |
|---|---|---|
| TW | 200632372 A | 9/2006 |
| WO | WO 02/48796 | 6/2002 |
| WO | WO 02/056114 | 7/2002 |
| WO | WO 2004/010224 | 1/2004 |
| WO | WO 2006/069725 | 7/2006 |

OTHER PUBLICATIONS

English translation of Office Action for corresponding Application No. JP 2008-529565, dated Feb. 21, 2011.
Russell Hudyma, "An Overview of Optical Systems for 30nm Resolution Lithography at EUV Wavelengths," Proceedings of SPIE, vol. 4832, Dec. 2002, pp. 137-148.
T. Jewell "Optical system design issues in development of projection camera for EUV lithography, " SPIE vol. 2437, p. 340-346.
National Science Foundation article, "Breakthrough Brings Laser Light to New Regions of the Spectrum," NSF PR 03-01; date: Jan. 2, 2003.
Office Action for corresponding Application No. JP 2008-529565, dated Dec. 7, 2009.
B. Tatian, "Nonrotationally Symmetric Systems: A New Problem for Optical Design and Fabrication, Applications of Geometrical Optics", Proc. SPIE, 39:205, (1973).
B. Tatian, "Testing an Unusual Optical Surface", International Lens Design Conference, Proc. SPIE, 554:139, (1985).
Taiwanese office action, with English translation thereof, for TW Appl No. 97 101 634, dated Sep. 10, 2013.
Chinese office action with English translation with respect to CN Appl No. 2003 1001 4400.3, dated May 6, 2014.
Japanese office action, with English translation thereof, for JP Appl No. 2013-098566, dated Jun. 9, 2014.
Chinese office action, with English translation thereof, for CN Appl No. 20131001440.3, dated August 20, 2015.
Chinese office action, with English translation thereof, for CN Appl No. 2013 1001 440.3, dated Feb. 2, 2015.
Chinese office action, with English translation thereof, for corresponding CN Appl No. 2013 1001 4400.3, dated Apr. 8, 2016.

* cited by examiner

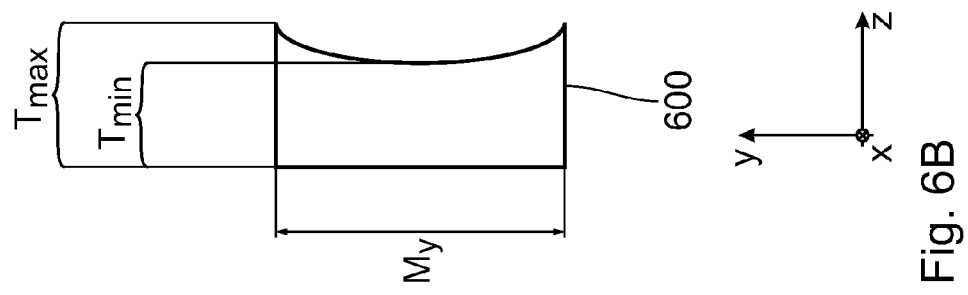
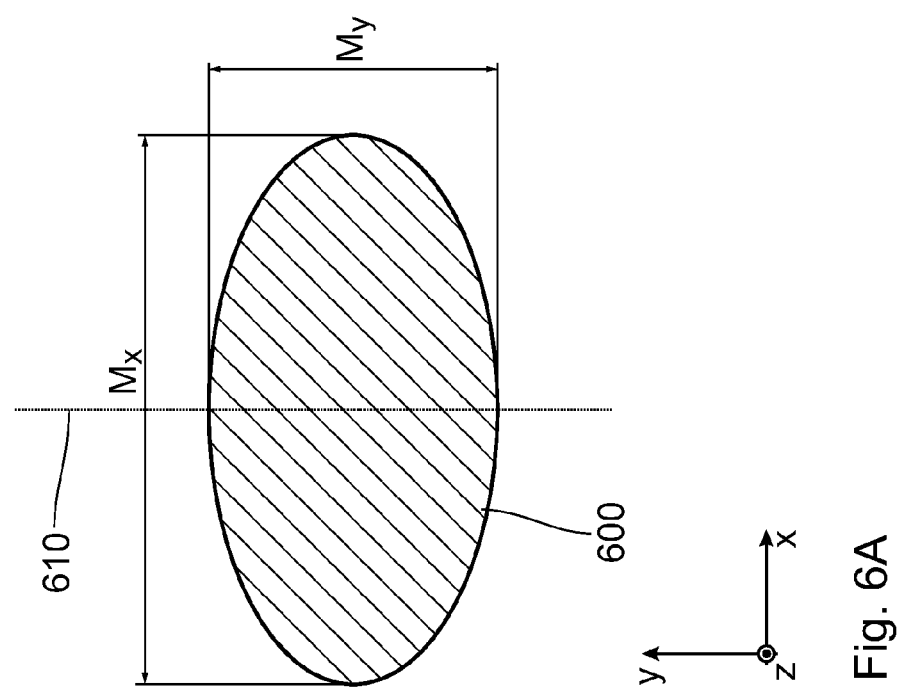
Fig. 6B
Fig. 6A

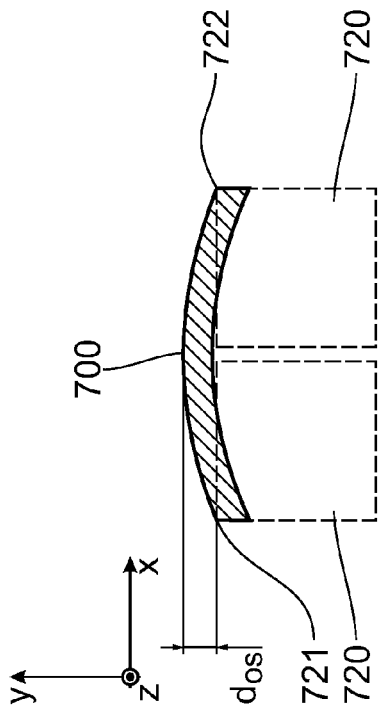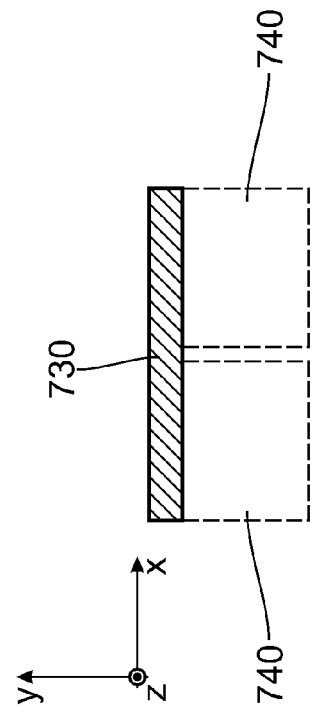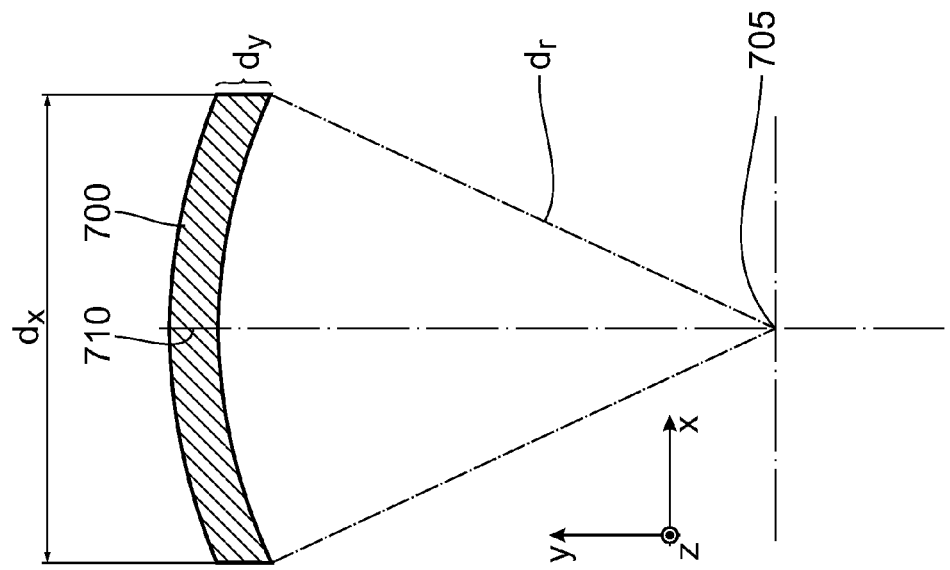

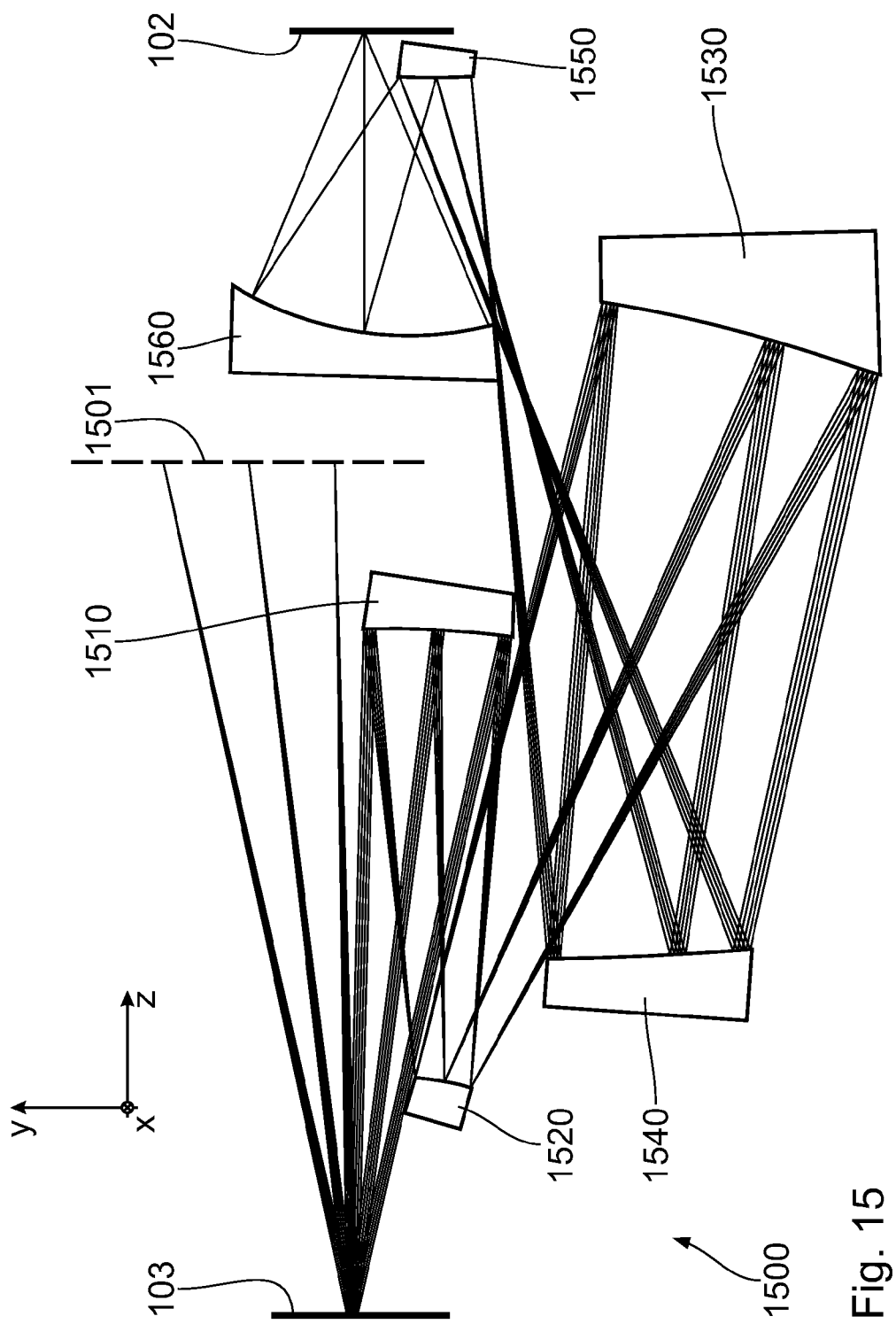

CATOPTRIC OBJECTIVES AND SYSTEMS USING CATOPTRIC OBJECTIVES

CROSS-REFERENCE TO RELATED APPLICATIONS

This application is a continuation of U.S. application Ser. No. 12/474,247, filed May 28, 2009, now U.S. Pat. No. 8,169,694, which is a continuation under 35 U.S.C. §120 of U.S. Ser. No. 12/166,406, filed Jul. 2, 2008, now U.S. Pat. No. 7,719,772, which is a continuation of U.S. Ser. No. 11/520,558, filed on Sep. 13, 2006, now U.S. Pat. No. 7,414,781, the entire contents of each of which are hereby incorporated by reference. U.S. Ser. No. 11/520,558 claims priority to Provisional Patent Application No. 60/793,387, filed on Apr. 7, 2006 and to Provisional Patent Application No. 60/716,437, filed on Sep. 13, 2005, the entire contents both of which are hereby incorporated by reference.

TECHNICAL FIELD

This disclosure relates to catoptric projection objectives and to systems that use catoptric projection objectives.

BACKGROUND

Projection objectives are widely used in microlithography to transfer a pattern from a reticle to a substrate by forming an image of the reticle on a layer of a photosensitive material disposed on the substrate. In general, projection objectives fall into three different classes: dioptric objectives; catoptric objectives; and catadioptric objectives. Dioptric objectives use refractive elements (e.g., lens elements) to image light from an object plane to an image plane. Catoptric objectives use reflective elements (e.g., mirror elements) to image light from an object plane to an image plane. Catadioptric objectives use both refractive and reflective elements to image light from an object plane to an image plane.

SUMMARY

In general, in a first aspect, the invention features a system that includes a microlithography projection optical system. The microlithography projection optical system includes a plurality of elements arranged so that during operation the plurality of elements image radiation at a wavelength λ from an object plane to an image plane. At least one of the elements is a reflective element that has a rotationally-asymmetric surface positioned in a path of the radiation. The rotationally-asymmetric surface deviates from a rotationally-symmetric reference surface by a distance of about λ or more at one or more locations of the rotationally-asymmetric surface.

In general, in another aspect, the invention features a system that includes a microlithography projection optical system. The microlithography projection optical system includes a plurality of elements arranged so that during operation the plurality of elements image radiation from an object plane to an image plane. At least one of the elements is a reflective element that has a rotationally-asymmetric surface positioned in a path of the radiation. The rotationally-asymmetric surface deviates from a rotationally-symmetric reference surface by a distance of about 10 nm or more at one or more locations of the rotationally-asymmetric surface.

In general, in another aspect, the invention features an optical system that includes a plurality of elements arranged so that during operation the plurality of elements image radiation from an object plane to an image plane. At least one of the elements is a reflective element that has a rotationally-asymmetric surface positioned in a path of the radiation. The rotationally-asymmetric surface deviates from a rotationally-symmetric reference surface by a distance of about 10 nm or more at one or more locations of the rotationally-asymmetric surface and the optical system is a reduction optical system.

In general, in a further aspect, the invention features an optical system that includes a plurality of elements arranged so that during operation the plurality of elements image radiation from an object plane to an image plane. At least one of the elements is a reflective element that has a rotationally-asymmetric surface positioned in a path of the radiation. The rotationally-asymmetric surface deviates from a rotationally-symmetric reference surface by a distance of about 10 nm or more at one or more locations of the rotationally-asymmetric surface and the image plane is parallel to the object plane.

In general, in another aspect, the invention features an optical system that includes a plurality of elements arranged so that during operation the plurality of elements image radiation from an object plane to an image plane. At least one of the elements is a reflective element that has a rotationally-asymmetric surface positioned in a path of the radiation. The rotationally-asymmetric surface deviates from a rotationally-symmetric reference surface by a distance of about 10 nm or more at one or more locations of the rotationally-asymmetric surface and the optical system has an image resolution less than 1 μm.

In general, in a further aspect, the invention features an optical system that includes a radiation source configured so that during operation the radiation source provides radiation at a wavelength λ to an object plane and a plurality of elements arranged so that during operation the plurality of elements image the radiation from the object plane to an image plane. At least one of the elements being a reflective element that has a rotationally-asymmetric surface positioned in a path of the radiation. The rotationally-asymmetric surface deviates from a rotationally-symmetric reference surface by a distance of more than λ at one or more locations of the rotationally-asymmetric surface and λ is about 300 nm or less.

In general, in another aspect, the invention features an optical system that includes a radiation source configured so that during operation the radiation source provides radiation at a wavelength λ to an object plane and a plurality of elements arranged so that during operation the plurality of elements image the radiation from the object plane to an image plane. During operation the optical system images a field at the image plane having a minimum radius of curvature of 300 mm or more and λ is less than about 100 nm.

In general, in a further aspect, the invention features an optical system that includes a radiation source configured so that during operation the radiation source provides radiation at a wavelength λ to an object plane and a plurality of elements arranged so that during operation the plurality of elements image the radiation from the object plane to an image plane. During operation the optical system provides an image field at the image plane having a minimum radius of curvature of more than 58 mm and λ is less than about 100 nm.

In general, in another aspect, the invention features an optical system that includes six or fewer elements arranged so that during operation the plurality of elements image radiation from an object plane to an image plane. During operation the optical system provides an image field having a first dimension in the image plane of more than 1 mm and a second dimension in the image plane of more than 1 mm, the first and second dimensions are orthogonal, and static distortion at the image field is about 10 nm or less. The optical system has an image side numerical aperture greater than 0.3, and the wavefront error at the image field is about $\lambda/14$ or less.

In general, in a further aspect, the invention features an optical system that includes a plurality of elements arranged so that during operation the plurality of elements image radiation from an object plane to an image plane. A path of the radiation through the optical system is characterized by chief rays that intersect the object plane at an angle non-parallel to the object plane normal. The optical system is a catoptric optical system that is a microlithography projection optical system and has an entrance pupil located more than 2.8 meters from the object plane.

In general, in another aspect, the invention features an optical system that includes a radiation source configured so that during operation the radiation source provides radiation at a wavelength $\lambda$ to an object plane and a plurality of elements arranged so that during operation the plurality of elements image radiation from the object plane to the image plane. $\lambda$ is about 100 nm or less and the optical system has an entrance pupil located more than 2.8 meters from the object plane.

In general, in a further aspect, the invention features a system that includes a catoptric microlithography projection optical system. The catoptric microlithography projection optical system includes a plurality of elements arranged so that during operation the plurality of elements image radiation from an object plane to an image plane. The catoptric microlithography projection optical system is telecentric at the object plane.

In general, in another aspect, the invention features a system that includes a catoptric microlithography projection optical system. The catoptric microlithography projection optical system includes a plurality of elements arranged so that during operation the plurality of elements image radiation from an object plane to an image plane. A path of the radiation through the catoptric microlithography projection optical system is characterized by chief rays that intersect the object plane at an angle non-parallel to the object plane normal. The catoptric microlithography projection optical system and the chief rays are parallel to each other to within 0.05° at the object plane.

In general, in a further aspect, the invention features an optical system that includes a plurality of elements arranged so that during operation the plurality of elements image radiation from an object plane to an image plane. A path of the radiation through the optical system is characterized by chief rays where at least one of the elements is a reflective element that has a rotationally-asymmetric surface positioned in the path of the radiation, and the chief rays diverge from each other at the object plane.

In general, in a further aspect, the invention features an optical system that includes a plurality of elements arranged so that during operation the plurality of elements image radiation from an object plane to an image plane. A path of the radiation through the optical system is characterized by chief rays where, for a meridional section of the optical system, the chief rays have a maximum angle of incidence on a surface of each of the elements of less than 20°. The chief rays diverge from each other at the object plane and the optical system has an image-side numerical aperture of more than 0.25.

In general, in another aspect, the invention features an optical system that includes a plurality of elements arranged so that during operation the plurality of elements image radiation from an object plane to an image plane. A path of the radiation through the optical system is characterized by chief rays where, for a meridional section of the optical system, the chief ray of a central field point has a maximum angle of incidence on a surface of each of the elements of less than 20°. The object plane is positioned between the plurality of elements and an entrance pupil of the optical system. The optical system has an image-side numerical aperture of more than 0.25 and the optical system is a catoptric optical system.

In general, in a further aspect, the invention features an optical system that includes a plurality of elements arranged so that during operation the plurality of elements image radiation from an object plane to an image plane. A path of the radiation through the optical system is characterized by chief rays where during operation the optical system provides an image field having a first dimension in the image plane of more than 1 mm and a second dimension in the image plane of more than 13 mm, the first and second dimensions are orthogonal, the chief rays diverge from each other at the object plane, the optical system has an image-side numerical aperture of more than 0.25, and the optical system is a catoptric optical system.

In general, in another aspect, the invention features an optical system that includes a plurality of elements arranged so that during operation the plurality of elements image radiation from an object plane to an image plane. During operation the optical system provides an image field having a first dimension in the image plane of more than 1 mm and a second dimension in the image plane of more than 13 mm, the first and second dimensions are orthogonal, the object plane is positioned between the plurality of elements and an entrance pupil of the optical system, the optical system has an image-side numerical aperture of more than 0.25, and the optical system is a catoptric optical system.

In general, in another aspect, the invention features an optical system that includes a plurality of elements arranged so that during operation the plurality of elements image radiation from an object plane to an image plane. A path of the radiation through the optical system is characterized by chief rays where, for a meridional section of the optical system, the chief ray of a central field point has a maximum angle of incidence on a surface of each of the elements of $\theta$ degrees, the optical system has an image side numeral aperture, NA, of more than 0.3, the ratio $\theta/NA$ is less than 68, the chief rays diverge from each other at the object plane, and the optical system is a catoptric optical system.

In general, in another aspect, the invention features an optical system that includes a plurality of elements arranged so that during operation the plurality of elements image radiation from an object plane to an image plane. A path of the radiation through the optical system is characterized by chief rays where, for a meridional section of the optical system, the chief ray of a central field point has a maximum angle of incidence on a surface of each of the elements of $\theta$ degrees, the optical system has an image side numeral aperture, NA, of more than 0.3, the ratio $\theta/NA$ is less than 68, the object plane is positioned between the plurality of elements and an entrance pupil of the optical system, and the optical system is a catoptric optical system.

In general, in a further aspect, the invention features an optical system that includes at least three elements arranged so that during operation the at least three elements direct radiation from an object plane to an image plane. A path of the radiation through the optical system is characterized by chief rays that intersect the object plane at an angle non-parallel to the object plane normal. A point in the image field is displaced less than 75 mm from an axis intersecting a corresponding point in the object field, the axis being normal to the object plane, the optical system has no obscuration of an exit pupil of the optical system, and the optical system is a catoptric optical system.

In general, in another aspect, the invention features an optical system that includes at least three elements arranged so that during operation the at least three elements direct radiation at a wavelength λ from an object plane to an image plane. A point in the image field is displaced less than 75 mm from an axis intersecting a corresponding point in the object field, the axis being normal to the object plane, the optical system has no obscuration of an exit pupil of the optical system, the optical system is a catoptric optical system, and λ is about 100 nm or less.

In general, in a further aspect, the invention features an optical system that includes a plurality of elements arranged so that during operation the plurality of elements image radiation from an object field at an object plane to an image field at an image plane. A path of the radiation through the optical system is characterized by chief rays that intersect the object plane at an angle non-parallel to the object plane normal. A point in the image field is displaced less than 75 mm from an axis intersecting a corresponding point in the object field, the axis is normal to the object plane, the optical system provides an image field having a first dimension in the image plane of more than 1 mm and a second dimension in the image plane of more than 1 mm, the first and second dimensions are orthogonal, and the optical system is a catoptric optical system.

In general, in a further aspect, the invention features an optical system that includes at least three elements arranged so that during operation the plurality of elements image radiation from an object field at an object plane to an image field at an image plane. A point in the image field is displaced less than 75 mm from an axis intersecting a corresponding point in the object field, the axis is normal to the object plane, the optical system is telecentric at the image plane, the optical system has a magnification of less than 100×, and the optical system is a catoptric optical system.

In general, in a further aspect, the invention features an optical system that includes at least three elements so that during operation the at least three elements image radiation from an object field at an object plane to an image field at an image plane. A path of the radiation through the optical system is characterized by chief rays that intersect the object plane at an angle non-parallel to the object plane normal. A point in the image field is displaced less than 75 mm from an axis intersecting a corresponding point in the object field, the axis is normal to the object plane, the optical system is telecentric at the image plane, the optical system has a magnification of less than 100×, and the optical system is a catoptric optical system.

In general, in another aspect, the invention features an optical system that includes a plurality of elements arranged so that during operation the plurality of elements image radiation from an object field at an object plane to an image field at an image plane. A path of the radiation through the optical system is characterized by chief rays that intersect the object plane at an angle non-parallel to the object plane normal. A point in the image field is displaced less than 75 mm from an axis intersecting a corresponding point in the object field, the axis is normal to the object plane, the optical system has no obscuration of an exit pupil of the optical system, the optical system is telecentric at the image plane, and the optical system is a catoptric optical system.

In general, in another aspect, the invention features an optical system that includes a plurality of elements arranged so that during operation the plurality of elements image radiation from an object plane to an image plane. A path of the radiation through the optical system is characterized by chief rays where the chief rays diverge from each other at the object plane. The plurality of elements includes no more than one element having a positive chief ray angle magnification, and the optical system is a catoptric optical system.

In general, in a further aspect, the invention features a system that includes a microlithography projection optical system. The microlithography projection optical system includes a plurality of elements arranged so that during operation the plurality of elements image radiation at a wavelength λ from an object plane to an image plane. At least one of the elements is a reflective element that has a rotationally-asymmetric surface positioned in a path of the radiation, where the rotationally-asymmetric surface deviates by a distance of about 0.5λ or less from a surface corresponding to the equation:

$$z = \frac{cr^2}{1 + \sqrt{1 - (1+k)c^2 r^2}} + \sum_{j=2}^{\alpha} C_j x^m y^n$$

where $$j = \frac{(m+n)^2 + m + 3n}{2} + 1,$$

z is a sag of the surface parallel to an axis, c is a vertex curvature and k is a conical constant, $C_j$ is a non-zero coefficient of the monomial $x^m y^n$, and α is an integer.

In general, in a further aspect, the invention features a method that includes forming a reflective element according to an optical design based on the equation:

$$z = \frac{cr^2}{1 + \sqrt{1 - (1+k)c^2 r^2}} + \sum_{j=2}^{\alpha} C_j x^m y^n$$

where $$j = \frac{(m+n)^2 + m + 3n}{2} + 1,$$

z is a sag of the surface parallel to an axis, c is a vertex curvature and k is a conical constant, $C_j$ is a non-zero coefficient of the monomial $x^m y^n$, and α is an integer. The method further includes arranging the reflective element with a plurality of other elements to provide a microlithography projection optical system.

Embodiments of the systems can include one or more of the following features. For example, the rotationally-asymmetric surface can deviate by about 0.1λ or less from a surface corresponding to the equation:

$$z = \frac{cr^2}{1 + \sqrt{1 - (1+k)c^2 r^2}} + \sum_{j=2}^{\alpha} C_j x^m y^n$$

-continued where $$j = \frac{(m+n)^2 + m + 3n}{2} + 1,$$

z is a sag of the surface parallel to an axis, c is a vertex curvature and k is a conical constant, $C_j$ is a non-zero coefficient of the monomial $x^m y^n$, and α is an integer. In some embodiments, α is 66. m can consist of even integers. In certain embodiments, m+n≥10.

The rotationally-asymmetric surface can deviate from the rotationally-symmetric reference surface by about 10λ or more (e.g., about 100λ or more) at the one or more locations. The rotationally-asymmetric surface deviates from the rotationally-symmetric reference surface by a distance of about 20 nm or more (e.g., about 50 nm or more, about 100 nm or more about 500 nm or more, about 1,000 nm or more) at the one or more locations.

In certain embodiments, the plurality of elements define a meridional plane and the elements are symmetric with respect to the meridional plane.

The plurality of elements can include four or more reflective elements. In some embodiments, the plurality of elements comprises six or more reflective elements. In certain embodiments, the plurality of elements includes two elements that are reflective elements that have rotationally-asymmetric surfaces positioned in a path of the radiation. In some embodiments, the plurality of elements includes four elements that are reflective elements that have rotationally-asymmetric surfaces positioned in a path of the radiation. In certain embodiments, the plurality of elements includes six elements that are reflective elements that have rotationally-asymmetric surfaces positioned in a path of the radiation.

The plurality of elements can include no more than two (e.g., no more than one) reflective elements that have a positive chief ray angle magnification.

In some embodiments, the microlithography projection optical system is a catoptric optical system.

The microlithography projection optical system has an image-side numerical aperture of about 0.2 or more (e.g., about 0.25 or more, about 0.3 or more, about 0.35 or more, about 0.4).

The image plane can be parallel to the object plane. In some embodiments, the image plane is non-parallel to the object plane.

The optical system can have a field at the image plane having a minimum radius of curvature of 300 mm. The optical system can have a rectangular field at the image plane. The rectangular field can have a minimum dimension of about 1 mm or more (e.g., about 2 mm). The rectangular field can have a first dimension of about 1 mm or more and a second dimension of about 1 mm or more, where the first and second dimensions are orthogonal. The second dimension can be about 10 mm or more (e.g., about 20 mm or more).

Static distortion at the image field can be about 10 nm or less. Wavefront error at the image field can be about λ/14 or less.

A path of the radiation through the microlithography projection optical system is characterized by chief rays that can intersect the object plane at an angle non-parallel to the object plane normal. The chief rays can intersect the object plane at an angle of about 3° or more (e.g., about 5° or more, about 7° or more) with respect to the object plane normal.

The chief rays can be parallel to each other to within 0.05° at the object plane. In some embodiments, the chief rays diverge from each other at the object plane.

For a meridional section of the microlithography projection optical system, the chief rays have a maximum angle of incidence on a surface of each of the elements of less than 20° (e.g., less than 18°, less than 15°).

The microlithography projection optical system can have an entrance pupil located more than 2.8 meters (e.g., more than about 10 meters) from the object plane.

The microlithography projection object plane can be positioned between the plurality of elements and an entrance pupil of the optical system. The microlithography projection optical system can have an entrance pupil located at infinity. The plurality of elements can be telecentric at the object plane. The plurality of elements can be telecentric at the image plane.

The imaged radiation can be reflected from an object positioned at the object plane. The object positioned at the object plane can be a reticle that is imaged by the plurality of elements to the image plane.

A path of the radiation through the optical system is characterized by chief rays and, for a meridional section of the microlithography projection optical system, the chief ray of a central field point can have a maximum angle of incidence on a surface of each of the elements of θ degrees, the microlithography projection optical system has an image side numeral aperture, NA, of more than 0.3, and the ratio θ/NA is less than 68 (e.g., about 60 or less, about 50 or less).

The microlithography projection optical system can have an object-image shift of about 75 mm or less (e.g., about 50 mm or less, about 25 mm or less). In some embodiments, the microlithography projection optical system has zero object-image shift.

The microlithography projection optical system can have a demagnification of 4×.

The plurality of elements can be arranged to image the radiation to an intermediate image plane between the object plane and the image plane. The system can include a field stop positioned at or near the intermediate image plane. The plurality of elements can include five elements and the intermediate image plane is located between a fourth element and a fifth element along the path of the radiation from the object plane to the image plane.

The object and image planes are separated by a distance, L, where L is about 1 m or more. An optical path length of the radiation from the object plane to the image plane is about 2L or more (e.g., about 3L or more, about 4L or more). The plurality of elements can include at least one pair of adjacent elements in the path of the radiation, where the pair of adjacent elements are separated by about 0.5L or more.

In certain embodiments, none of the plurality of elements cause an obscuration of the exit pupil at the image plane.

The plurality of elements can include four or more elements that have freeboards of about 25 mm or less. The four or more elements can have freeboards of about 5 mm or more.

The plurality of elements can include a first mirror and a second mirror, the first and second mirrors having a minimum distance from the object plane of $d_1$ and $d_2$, respectively, where $d_1/d_2$ is about two or more. The plurality of elements can include a first element in the path of the radiation from the object plane to the image plane, where the first element has positive optical power.

The system can include an aperture stop position between the object plane and the image plane. The plurality of elements can include three elements and the aperture stop is positioned between the second and third elements in the path of the radiation from the object plane to the image plane. In some embodiments, the radiation passes through the aperture stop once. In certain embodiments, the radiation passes through the aperture stop twice.

The system can include a radiation source configured so that during operation the radiation source provides the radiation at λ to the object plane. The radiation source can be a laser radiation source. λ is about 300 nm or less (e.g., about 200 nm or less, about 100 nm or less, about 20 nm or less). In some embodiments, λ is in a range from about 10 nm to about 15 nm.

The system can include an illumination system that includes one or more elements arranged so that during operation the one or more elements direct radiation from the radiation source to an object positioned at the object plane. The illumination system can include an element positioned at a location corresponding to an entrance pupil of the microlithography projection optical system. The system can include a first moveable stage configured so that during operation the first moveable stage positions a reticle at the object plane so that the microlithography projection optical system images the reticle to the image plane and a second moveable stage configured so that during operation the second moveable stage positions an article at the image plane so that the image of the reticle at a surface of the article.

In another aspect, the invention features a method that includes exposing a layer of a photosensitive material disposed on a wafer to patterned radiation using the system. The method can include forming an integrated circuit on the wafer.

Embodiments can include one or more of the following advantages. For example, embodiments include catoptric projection objectives that are telecentric at the image plane. This can provide for constant or nearly constant image magnification over a range of image-side working distances.

In certain embodiments, catoptric projection objectives have extremely high resolution. For example, projection objectives can have the capability of resolving structures smaller than about 50 nm. High resolution can be achieved in projection objectives that have a high image-side numerical aperture that are designed for operation at short wavelengths (e.g., about 10 nm to about 30 nm).

Projection objectives can provide images with low aberrations. In certain embodiments, projection objectives are corrected for wavefront error of about 30 mλ or less. In certain embodiments, projection objectives are corrected for distortion below values of about 2 nm or less.

Embodiments include catoptric objectives that have a high numerical aperture and provide imaging with low image distortion, low wavefront error, and telecentricity at the image plane over a relatively large image field. These features can be achieved by use of one or more rotationally-asymmetric mirrors.

In some embodiments, projection objective metrology can be easily implemented despite rotations of the projection objective about a rotation axis. For example, embodiments of projection objectives (e.g., high NA projection objectives) may have relatively small or zero object-image shift which result in little or no translation of an on-axis field point when the projection objective rotates about the axis. Thus, when the projection objective is subject to rotation, metrology can be repeatable performed in the same field position without having to relocate that field position.

Embodiments also include catoptric projection objections that have no field dependent pupil obscuration or no central pupil obscuration at all.

Embodiments of projection objectives can be adapted for operation at a variety of different wavelengths, including visible and ultraviolet (UV) wavelengths. Embodiments can be adapted for operation at Extreme UV (EUV) wavelengths. Furthermore, embodiments can be adapted for use at more than one wavelength, or over a range of wavelengths.

Embodiments of catoptric projection objectives can be used in lithography tools (e.g., lithography scanners) and can provide relatively low overscan. Low overscan is accomplished, for example, by using projection objectives with rectangular image fields. In such embodiments, the image can be aligned so that an edge of the rectangular field is parallel to the leading edge of the die sites, avoiding the need to scan the leading edge of the die sites beyond the edge of the image field in order to scan the site corners, as is typically the case when rectangular or square die sites are scanned relative to arcuate fields.

Embodiments include lithography tools with relatively high throughput. For example, embodiments having relatively low overscan are more efficient than comparable systems that have larger overscan. Accordingly, these low overscan systems can provide higher wafer throughput than the comparable systems.

In some embodiments, catoptric projection objectives are provided that have low or no field dependence of shading effects. For example, catoptric projection objectives can have their entrance pupil located far from the object plane (e.g., at infinity) providing uniform illumination angles of the chief rays on the object field. This can reduce or avoid field dependent shading effects that occurs where chief ray angles vary across the object field. Alternatively, or additionally, projection objectives can have relatively small values and small variations of chief ray incident angles for each mirror in the projection objective, resulting in an increased average reflectivity of each mirror.

In certain embodiments, projection objective can include features that allow a reduction in the complexity of the illumination system. For example, the location of the entrance pupil of projection objectives may be in front of the object plane. In other words, chief rays starting at different field points are divergent with respect to each other. This can make the entrance pupil of the projection objective/exit pupil of the illumination system accessible without using a telescope in the illumination system to relay the illumination system's exit pupil to the location of the projection objective's entrance pupil.

Other features and advantages will be apparent from the description, drawings, and the claims.

DESCRIPTION OF DRAWINGS

FIG. 6A is a view of a mirror's footprint.

FIG. 6B is a cross-section view of the mirror shown in FIG. 6A.

FIG. 7A is a plan view of an embodiment of a ring segment field.

FIG. 7B is a plan view of a ring segment field relative to a pair of wafer die sites.

FIG. 7C is a plan view of a rectangular field relative to a pair of wafer die sites.

FIG. 15 is a cross-sectional view of a projection objective shown in meridional section.

DETAILED DESCRIPTION

In an aspect, the disclosure relates to catoptric projection objectives that have one or more mirrors having a rotationally-asymmetric mirror surface (referred to as rotationally-asymmetric mirrors). Catoptric projection objectives with rotationally-asymmetric mirrors can be used in microlithography tools. Using mirrors whose surfaces are rotationally asymmetric provides an optical designer with more parameters with which to refine an optical system relative to systems that utilize only rotationally-symmetric surface. As a result, projection objectives can be designed to have various features that are not commonly designed into catoptric projection objectives. For example, in certain embodiments, catoptric projection objectives can have small or zero object-image shift. In some embodiments, projection objectives can be telecentric at the object plane. Alternatively, in certain embodiments, the chief rays of the system can be divergent at the object plane. In such configurations, the entrance pupil for the projection objective may be in a position relative to the mirrors that allows one to position additional optical elements at the entrance pupil. For example, a component of the illumination system can be positioned at the entrance pupil. As another example, rotationally-asymmetric mirrors can be used in projection objectives to provide rectangular fields. Examples of systems that include one or more of these features are discussed below.

Figure 1:
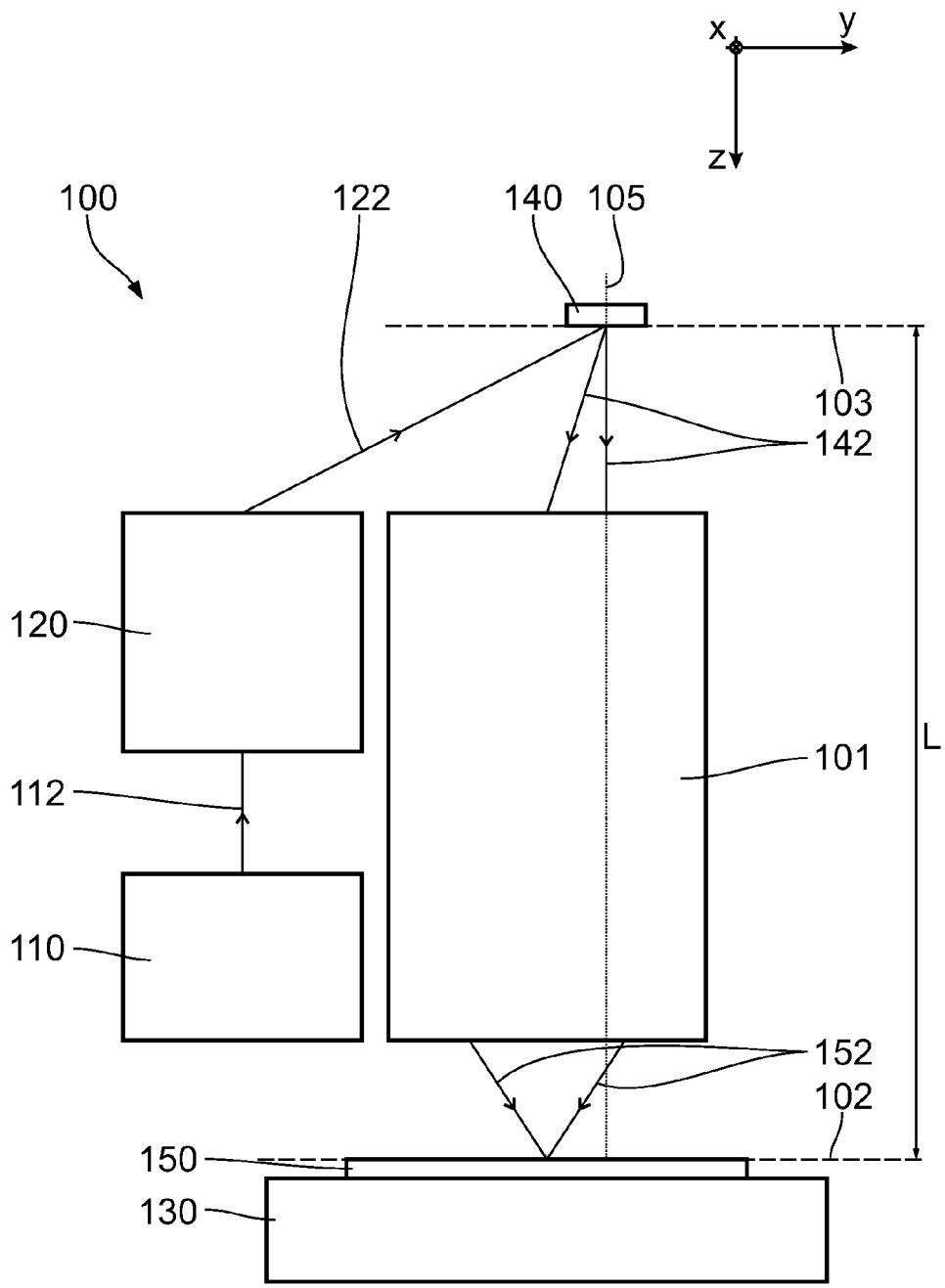
FIG. 1 is a schematic view of an embodiment of a microlithography tool.

Referring to FIG. 1, a microlithography tool 100 generally includes a light source 110, an illumination system 120, a projection objective 101, and a stage 130. A Cartesian co-ordinate system is shown for reference. Light source 110 produces radiation at a wavelength λ and directs a beam 112 of the radiation to illumination system 120. Illumination system 120 interacts with (e.g., expands and homogenizes) the radiation and directs a beam 122 of the radiation to a reticle 140 positioned at an object plane 103. Projection objective 101 images radiation 142 reflected from reticle 140 onto a surface of a substrate 150 positioned at an image plane 102. The radiation on the image-side of projection objective 101 is depicted as rays 152. As shown in FIG. 1, the rays are illustrative only and not intended to be accurately depict the path of the radiation with respect to reticle 140, for example. Substrate 150 is supported by stage 130, which moves substrate 150 relative to projection objective 101 so that projection objective 101 images reticle 140 to different portions of substrate 150.

Projection objective 101 includes a reference axis 105. In embodiments where projection objective is symmetric with respect to a meridional section, reference axis 105 is perpendicular to object plane 103 and passes through the center of the object field.

Light source 110 is selected to provide radiation at a desired operational wavelength, $\lambda$, of tool 100. In some embodiments, light source 110 is a laser light source, such as a KrF laser (e.g., having a wavelength of about 248 nm) or an ArF laser (e.g., having a wavelength of about 193 nm). Non-laser light sources that can be used include light-emitting diodes (LEDs), such as LEDs that emit radiation in the blue or UV portions of the electromagnetic spectrum, e.g., about 365 nm, about 280 nm or about 227 nm.

Typically, for projection objectives designed for operation in lithography tools, wavelength $\lambda$ is in the ultraviolet portion of the electromagnetic spectrum. For example, $\lambda$ can be about 400 nm or less (e.g., about 300 nm or less, about 200 nm or less, about 100 nm or less, about 50 nm or less, about 30 nm or less). $\lambda$ can be more than about 2 nm (e.g., about 5 nm or more, about 10 nm or more). In embodiments, $\lambda$ can be about 193 nm, about 157 nm, about 13 nm, or about 11 nm. Using a relatively short wavelength may be desirable because, in general, the resolution of a projection objective is approximately proportional to the wavelength. Therefore shorter wavelengths can allow a projection objective to resolve smaller features in an image than equivalent projection objectives that use longer wavelengths. In certain embodiments, however, $\lambda$ can be in non-UV portions of the electromagnetic spectrum (e.g., the visible portion).

Illumination system 120 includes optical components arranged to form a collimated radiation beam with a homogeneous intensity profile. Illumination system 120 typically also includes beam steering optics to direct beam 122 to reticle 140. In some embodiments, illumination system 120 also include components to provide a desired polarization profile for the radiation beam.

Typically, image plane 102 is parallel to object plane 103. However, in certain embodiments, image plane 102 is tilted with respect to object plane 103. For example, image plane 102 can be titled by an angle $\rho$, where $|\rho|$ is about 1° or more (e.g., about 2° or more, about 3° or more, about 4° or more, about 5° or more). In some embodiments, $\rho$ can be relatively large, such as about 40° or more (e.g., about 50° or more, about 60° or more). In certain embodiments, $\rho$ is about 45° or about 90°.

Image plane 102 is separated from object plane 103 by a distance L, which is also referred to as the lengthwise dimension, or tracklength, of projection objective 101. In embodiments where image plane 102 is non-parallel with object plane 103, the tracklength refers to the distance between object plane 103 and a reference plane parallel to object plane 103, where the reference plane is defined as the plane closest to object plane 103 such that the image field and optical elements forming projection objective 100 are located between the reference plane and object plane 103.

In general, this distance depends on the specific design of projection objective 101 and the wavelength of operation of tool 100. In some embodiments, such as in tools designed for EUV lithography, L is in a range from about 1 m to about 3 m (e.g., in a range from about 1.5 m to about 2.5 m). In certain embodiments, L is less than 2 m, such as about 1.9 m or less (e.g., about 1.8 m or less, about 1.7 m or less, about 1.6 m or less, about 1.5 m or less). L can be more than about 0.2 m or more (e.g., about 0.3 m or more, about 0.4 m or more, about 0.5 m or more, about 0.6 m or more, about 0.7 m or more, about 0.8 m or more, about 0.9 m or more, about 1 m or more).

The ratio of the optical path length of imaged radiation to the tracklength varies depending on the specific design of projection objective 101. In some embodiments, the ratio of this optical path length to tracklength can be relatively high. For example, the ratio of this optical path length to tracklength can be about two or more (e.g., about 2.5 or more, about three or more, about 3.5 or more, about four or more, about 4.5 or more, about five or more).

Projection objective 101 has a magnification ratio, which refers to the ratio of the dimensions of the field at object plane 103 to the corresponding dimensions of the field at image plane 102. Typically, projection objectives used in lithography tools are reduction projection objectives, meaning they reduce the dimensions of, or demagnify, the image. In some embodiments, therefore, projection objective 101 can produce a field at image plane 102 whose dimensions are reduced by about 2× or more (e.g., about 3× or more, about 4× or more, about 5× or more, about 6× or more, about 7× or more, about 8× or more, about 9× or more, about 10× or more) compared to the dimensions at object plane 103. In other words, projection objective 101 can have a demagnification of about 2× or more, (e.g., about 3× or more, about 4× or more, about 5× or more, about 6× or more, about 7× or more, about 8× or more, about 9× or more, about 10× or more). More generally, however, projection objectives can be designed to provide a magnified image or an image the same size as the object.

Figure 2A:
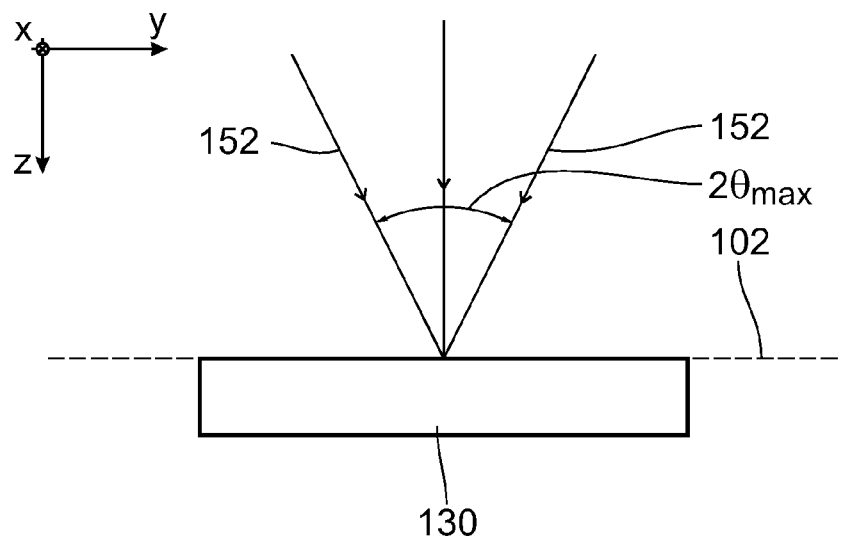
FIG. 2A is a schematic view showing a portion of the microlithography tool shown in FIG. 1.

Referring also to FIG. 2A, rays 152 define a cone of light paths that form the reticle image at image plane 102. The angle of the cone of rays is related to the image-side numerical aperture (NA) of projection objective 101. Image-side NA can be expressed as $$NA = n_o \sin \theta_{max},$$

where $n_o$ refers to the refractive index of the immersing medium adjacent the surface of substrate 150 (e.g., air, nitrogen, water, or evacuated environment), and $\theta_{max}$ is the half-angle of the maximum cone of image forming rays from projection objective 101.

In general, projection objective 101 can have an image side NA of about 0.1 or more (e.g., about 0.15 or more, about 0.2 or more, about 0.25 or more, about 0.3 or more, about 0.35 or more). In some embodiments, projection objective 101 has a relatively high image-side NA. For example, in some embodiments, projection objective 101 has an image-side NA of more than 0.4 (e.g., about 0.45 or more, about 0.5 or more, about 0.55 or more, about 0.6 or more). The image side NA can be about 0.5 or less (e.g., about 0.45 or less, about 0.4 or less). In general, the resolution of projection objective 101 varies depending on wavelength $\lambda$ and the image-side NA. Without wishing to be bound by theory, the resolution of a projection objective can be determined based on the wavelength and image-side NA based on the formula, $$R = k \frac{\lambda}{NA},$$

where R is the minimum dimension that can be printed and k is a dimensionless constant called the process factor. k varies depending on various factors associated with the radiation (e.g., the polarization properties), the illumination properties (e.g., partial coherence, annular illumination, dipole settings, quadrupole settings, etc.) and the resist material. Typically, k is in a range from about 0.4 to about 0.8, but can also be below 0.4 and higher than 0.8 for certain applications.

Projection objective 101 is also nominally telecentric at the image plane. For example, the chief rays can deviate by about 0.5° or less (e.g., about 0.4° or less, about 0.3° or less, about 0.2° or less, about 0.1° or less, about 0.05° or less, 0.01° or less, 0.001° or less) from being parallel to each other at the image plane over the exposed field. Thus, projection objective 101 can provide substantially constant magnification over a range of image-size working distances. In some embodiments, the chief rays are nominally orthogonal to image plane 102. Thus, a non flat topography of the wafer surface or a defocus of the image plane does not necessarily lead to distortion or shading effects in the image.

In certain embodiments, projection objective 101 has a relatively high resolution (i.e., the value of R can be relatively small). For example, R can be about 150 nm or less (e.g., about 130 nm or less, about 100 nm or less, about 75 nm or less, about 50 nm or less, about 40 nm or less, about 35 nm or less, about 32 nm or less, about 30 nm or less, about 28 nm or less, about 25 nm or less, about 22 nm or less, about 20 nm or less, about 18 nm or less, about 17 nm or less, about 16 nm or less, about 15 nm or less, about 14 nm or less, about 13 nm or less, about 12 nm or about 11 nm or less, such as about 10 nm).

The quality of images formed by projection objective 101 can be quantified in a variety of different ways. For example, images can be characterized based on the measured or calculated departures of the image from idealized conditions associated with Gaussian optics. These departures are generally known as aberrations. One metric used to quantify the deviation of a wavefront from the ideal or desired shape is the root-mean-square wavefront error ($W_{rms}$). $W_{rms}$ is i defined in the "Handbook of Optics," Vol. I, $2^{nd}$ Ed., edited by Michael Bass (McGraw-Hill, Inc., 1995), at page 35.3, which is incorporated herein by reference. In general, the lower the $W_{rms}$ value for an objective, the less the wavefront deviates from its desired or ideal shape, and the better the quality of the image. In certain embodiments, projection objective 101 can have a relatively small $W_{rms}$ for images at image plane 102. For example, projection objective 101 can have a $W_{rms}$ of about 0.1λ or less (e.g., about 0.07λ or less, about 0.06λ or less, about 0.05λ or less, about 0.045λ or less, about 0.04λ or less, about 0.035λ or less, about 0.03λ or less, about 0.025λ or less, about 0.02λ or less, about 0.015λ or less, about 0.01λ or less, such as about 0.005λ).

Another metric that can be used to evaluate the quality of the image is referred to as field curvature. Field curvature refers to the peak-to-valley distance for the field point dependent position of the focal plane. In some embodiments, projection objective 101 can have a relatively small field curvature for images at image plane 102. For example, projection objective 101 can have an image-side field curvature of about 50 nm or less (e.g., about 30 nm or less, about 20 nm or less, about 15 nm or less, about 12 nm or less, 10 nm or less).

A further metric that can be used to evaluate the optical performance is referred to as distortion. Distortion refers to the maximum absolute value of the field point dependent deviation from the ideal image point position in the image plane. In some embodiments, projection objective 101 can have a relatively small maximum distortion. For example, projection objective 101 can have a maximum distortion of about 50 nm or less, (e.g. about 40 nm or less, about 30 nm or less, about 20 nm or less, about 15 nm or less, about 12 nm or less, 10 nm or less, 9 nm or less, 8 nm or less, 7 nm or less, 6 nm or less, 5 nm or less, 4 nm or less, 3 nm or less, 2 nm or less, such as 1 nm).

Further, in certain embodiments, distortion can vary by a relatively small amount across the image field. For example, distortion can vary by about 5 nm or less (e.g., about 4 nm or less, about 3 nm or less, about 2 nm or less, about 1 nm or less) across the image field.

Being a catoptric system, projection objective 101 includes a number of mirrors arranged to direct radiation reflected from reticle 140 to substrate 150 in a way that forms an image of reticle 140 on the surface of substrate 150. Specific designs of projection objectives are described below. More generally, however, the number, size, and structure of the mirrors generally depends on the desired optical properties of projection objective 101 and the physical constraints of tool 100.

In general, the number of mirrors in projection objective 101 may vary. Typically, the number of mirrors is related to various performance trade-offs associated with the optical performance characteristics of the objective, such as the desired throughput (e.g., the intensity of radiation from the object that forms the image at image plane 102), the desired image-side NA and related image resolution, and the desired maximum pupil obscuration.

In general, projection objective 101 has at least four mirrors (e.g., five or more mirrors, six or more mirrors, seven or more mirrors, eight or more mirrors, nine or more mirrors, ten or more mirrors, eleven or more mirrors, twelve or more mirrors). In embodiments where it is desirable that all the mirrors of the objective are positioned between the object plane and the image plane, objective 101 will typically have an even number of mirrors (e.g., four mirrors, six mirrors, eight mirrors, ten mirrors). In certain embodiments, an odd number of mirrors can be used where all the mirrors of the projection objective are positioned between the object plane and image plane. For example, where one or more mirrors are tilted at relatively large angles, a projection objective can include an odd number of mirrors where all the mirrors are positioned between the object plane and image plane.

The curvature of the mirror surfaces is characterized by a first and second mean curvature, which are determined at the point on each mirror surface that reflects the chief ray of the central field point. First and second mean curvatures are calculated as described in *Handbook of Mathematics* by I. N. Bronshtein, et al., $4^{th}$ Ed. (Springer, 2004), p. 567. In general, the first mean curvature for a mirror can be different from the second mean curvature for that mirror. In some embodiments, the absolute value of the difference between the first and second mean curvatures can be about $10^{-8}$ or more (e.g., $10^{-7}$ or more, $5\times10^{-7}$ or more, about $10^{-6}$ or more, about $5\times10^{-6}$ or more, about $10^{-5}$ or more, about $5\times10^{-5}$ or more, about $10^{-4}$ or more, about $5\times10^{-4}$ or more, about $10^{-3}$ or more).

In general, the first and/or second mean curvatures can be positive or negative. The first and/or second mean curvatures for a mirror surface can be relatively small. For example, in some embodiments, the absolute value of the first mean curvature for one or more mirrors in projection objective 101 is about $10^{-2}$ or less (e.g., about $5\times10^{-3}$ or less, about $3\times10^{-3}$ or less, about $2\times10^{-3}$ or less, about $10^{-3}$ or less). The absolute value of the sum of the first mean curvatures for the mirrors in projective objective 101 can be about $10^{-3}$ or less (e.g., about $5\times10^{-4}$ or less, about $3\times10^{-4}$, about $2\times10^{-4}$ or less, about $10^{-4}$ or less, $5\times10^{-5}$ or less, $10^{-5}$ or less).

In certain embodiments, the absolute value of the second mean curvature for one or more mirrors in projection objective 101 is about $10^{-2}$ or less (e.g., about $5 \times 10^{-3}$ or less, about $3 \times 10^{-3}$ or less, about $2 \times 10^{-3}$ or less, about $10^{-3}$ or less). The absolute value of the sum of the second mean curvatures for the mirrors in projective objective 101 can be about $10^{-3}$ or less (e.g., about $5 \times 10^{-4}$ or less, about $3 \times 10^{-4}$, about $2 \times 10^{-4}$ or less, about $10^{-4}$ or less, $5 \times 10^{-5}$ or less, $10^{-5}$ or less).

The respective sum of the first and second mean curvatures of the mirrors in projection objective 101 can be relatively small. For example, the absolute value of the sum of the first and second mean curvatures of the mirrors can be about $10^{-3}$ or less (e.g., about $5 \times 10^{-4}$ or less, about $3 \times 10^{-4}$, about $2 \times 10^{-4}$ or less, about $10^{-4}$ or less, $5 \times 10^{-5}$ or less, $10^{-5}$ or less).

In general, at least one of the mirrors in projection objective 101 has a rotationally-asymmetric surface. Unlike spherical or aspherical mirrors, rotationally-asymmetric mirror surfaces do not have an axis of rotational symmetry. In certain embodiments, rotationally-asymmetric mirror surfaces can be described mathematically by the equation:

$$Z = \frac{cr^2}{1+\sqrt{1-(1+k)c^2r^2}} + \sum_{j=2}^{66} C_j X^m Y^n$$

where $$j = \frac{(m+n)^2 + m + 3n}{2} + 1$$

and Z is the sag of the surface parallel to a Z-axis (which may or may not be parallel to the z-axis in projection objective 101), c is a constant corresponding to the vertex curvature, k is a conic constant, and $C_j$ is the coefficient of the monomial $X^m Y^n$. Typically, the values of c, k, and $C_j$ are determined based on the desired optical properties of the mirror with respect to projection objective 101. Further, the order of the monomial, m+n, can vary as desired. Generally, a higher order monomial can provide a projection objective design with a higher level of aberration correction, however, higher order monomials are typically more computationally expensive to determine. In some embodiments, m+n is 10 or more (e.g., 15 or more, 20 or more). As discussed below, the parameters for the rotationally-asymmetric surface equation can be determined using commercially-available optical design software.

Generally, a rotationally-asymmetric surface deviates from a rotationally-symmetric reference surface (e.g., a spherical or aspherical rotationally-symmetric reference surface). As used herein, the term "rotationally-symmetric reference surface" refers to the rotationally-symmetric surface that most closely matches the rotationally-asymmetric surface.

Figure 2B:
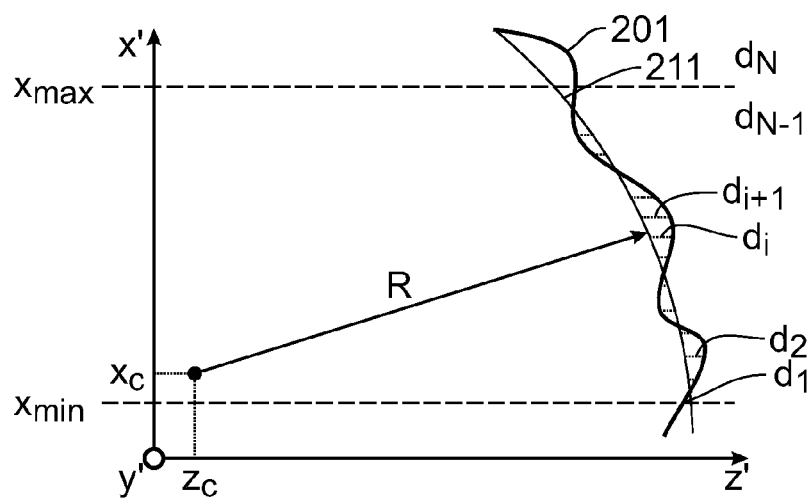
FIG. 2B is a cross-sectional view of a rotationally-asymmetric surface and a corresponding rotationally-symmetric reference surface.

Rotationally-symmetric reference surfaces can be determined for a rotationally-asymmetric surface as follows. First, one obtains information that characterizes the rotationally-asymmetric surface under consideration. In embodiments where optical data for the mirror is known, this information includes determining the basic radius of the mirror (e.g., 1/c, where c is the vertex curvature discussed above), a conic constant of the mirror, k, and polynomial coefficients characterizing the mirror. Alternatively, or additionally, the information characterizing the mirror can be obtained from a surface figure measurement of the mirror surface (e.g., obtained using an interferometer). A surface figure measurement can provide a function z' (x', y') describing the mirror's surface, where z' is the sag of the mirror surface along the z'-axis for different (x', y') co-ordinates, as illustrated in FIG. 2B. The initial step also includes determining the footprint for the mirror, which refers to area of the mirror surface that is actually used to reflect image-forming radiation in the objective. The footprint can be determined by tracing rays through the objective using a ray tracing program and extracting the mirror area contacted by the rays.

After obtaining the information characterizing the rotationally-asymmetric surface, a local co-ordinate system for the surface is established for which decentration and tilt of the surface is zero. Setting the tilt and decentration of the surface gives a well-defined starting point for an optimization algorithm to determine the reference surface and also defines an axis, z', along which the sag differences between the mirror surface and the reference surface can be determined. Where optical data for the mirror surface is known, the z'-axis is determined based on the conic constant, k, and basic radius, 1/c, for the rotationally-symmetric portion of the optical data. Specifically, the z'-axis is the symmetry axis of the rotationally-symmetric part of the rotationally asymmetric surface. In embodiments where the mirror surface is characterized from a surface figure measurement, the z'-axis corresponds to the metrology axis (e.g., the interferometer's optical axis). FIG. 2B illustrates this for a two-dimensional section of a rotationally-asymmetric mirror 201, where the local co-ordinate system is denoted by the x', y' and z' axes. The boundaries for the footprint of rotationally-asymmetric mirror 201 are shown as $x_{min}$ and $x_{max}$ for the cross-section shown in FIG. 2B.

An initial reference surface is then established with respect to the co-ordinate system. The initial reference surface has zero tilt and zero decentration. The initial reference surface is either a spherical surface or a rotationally-symmetric aspherical surface. The initial reference surface is established by one designating a rotationally-symmetric surface that approximates the rotationally-asymmetric mirror surface. The initial reference surface represents a starting point for an optimization algorithm. Once the initial reference surface is established, a local distance, $d_i$ (i=1 . . . N), between a number of points of the initial reference surface and points on the surface of the rotationally-asymmetric surface footprint measured along the z'-axis of the local co-ordinate system are determined.

Next, the rotationally-symmetric reference surface (surface 211 in FIG. 2B) is established by determining a minimal value for the local distances, $d_i$, using a number of fitting parameters and a fitting algorithm. In the event that the rotationally-symmetric reference surface is a spherical surface, the parameters include the location of the center of the sphere within the local co-ordinate system, the radius, of the reference surface. In FIG. 2B, decentering of the sphere center from the co-ordinate system origin is shown by co-ordinates $x_c$ and $z_c$ (decentration along the y'-axis by an amount $y_c$ is not shown in FIG. 2B). The radius of the spherical surface is designated as R. The parameters R, $x_c$, $y_c$ and $z_c$ are optimized to provide a minimal value for the local distances, $d_i$, based on the equation:

$$z' = (R^2 - (x' - x_c)^2 - (y' - y_c)^2)^{1/2} - z_c,$$

which is the equation for a spherical surface of radius R, centered at co-ordinate ($x_c$, $y_c$, $z_c$).

Where the rotationally-symmetric reference surface is an aspherical surface, the parameters can include decentration and tilt of the reference surface, base radius, conical constant, and aspherical coefficients. These parameters can be determined based on the equation $$z' = \frac{c'h^2}{1+\sqrt{1-(1+k')c'^2h^2}} + \sum_j A'_j h^{2j},$$

which is an equation describing conic and aspheric surfaces. Here, $h^2=x'^2+y'^2$, and $A'_j$ are coefficients characterizing the deviation of the rotationally-symmetric reference surface from a conic surface. Generally, the number of aspherical coefficients, $A'_j$, used to fit the reference surface to the mirror surface can vary depending on the computational power of the system being used to calculate the surface, the time available, and the desired level of accuracy. In some embodiments, the reference surface can be calculated using aspherical coefficients up to third order. In certain embodiments, coefficients higher than third order (e.g., fourth order, sixth order) are used. For additional discussion on parameterization of conic and aspheric surfaces see, for example, the product manual for Code V, available from Optical Research Associates (Pasadena, Calif.).

In general, fitting can be performed using a variety of optimization algorithms. For example, in some embodiments, a least squares fitting algorithm, such as a damped least squares fitting algorithm, can be used. Damped least squares fitting algorithms may be performed using commercially-available optical design software, such as Code V or ZEMAX (available from Optima Research, Ltd., Stansted, United Kingdom) for example.

After the rotationally-symmetric reference surface is determined, the local distance between additional points on the mirror surface can be determined and visualized. Additional characteristics of the rotationally-symmetric reference surface can be determined. For example, a maximum deviation of the rotationally-symmetric reference surface from the rotationally-asymmetric mirror surface can be determined. In some embodiments, a rotationally-asymmetric surface can have a maximum deviation from a spherical rotationally-symmetric reference surface of about $\lambda$ or more (e.g., about 10$\lambda$ or more, about 20$\lambda$ or more, about 50$\lambda$ or more, about 100$\lambda$ or more, about 150$\lambda$ or more, about 200$\lambda$ or more, about 500$\lambda$ or more, about 1,000$\lambda$ or more, about 10,000$\lambda$ or more, about 50,000$\lambda$ or more). In certain embodiments, a rotationally-asymmetric surface can have a maximum deviation from a spherical rotationally-symmetric reference surface of about 1,000$\lambda$ or less (e.g., about 900$\lambda$ or less, about 800$\lambda$ or less, about 700$\lambda$ or less, about 600$\lambda$ or less, about 500$\lambda$ or less).

A rotationally-asymmetric surface can have a maximum deviation from an aspherical rotationally-symmetric reference surface of about $\lambda$ or more (e.g., about 5$\lambda$ or more, about 10$\lambda$ or more, about 20$\lambda$ or more, about 50$\lambda$ or more, about 100$\lambda$ or more, about 200$\lambda$ or more, about 500$\lambda$ or more, about 1,000$\lambda$ or more, about 10,000$\lambda$ or more). In some embodiments, a rotationally-asymmetric surface can have a maximum deviation from an aspherical rotationally-symmetric reference surface of about 1,000$\lambda$ or less (e.g., about 900$\lambda$ or less, about 800$\lambda$ or less, about 700$\lambda$ or less, about 600$\lambda$ or less, about 500$\lambda$ or less).

In certain embodiments, rotationally-asymmetric surfaces have a maximum from spherical rotationally-symmetric reference surface by 10 nm or more (e.g., about 100 nm or more, about 500 nm or more, about 1 µm or more, about 5 µm or more, about 10 µm or more, about 50 µm or more, about 100 µm or more, about 200 µm or more, about 500 µm or more, about 1,000 µm, about 2,000 µm or more, about 3,000 µm or more). Rotationally-asymmetric surfaces can have a maximum deviation from a spherical rotationally-symmetric reference surface by about 10 mm or less (e.g., about 5 mm or less, about 3 mm or less, about 2 mm or less, about 1 mm or less, about 500 µm or less).

Rotationally-asymmetric surfaces can have a maximum from an aspherical rotationally-symmetric reference surface by 10 nm or more (e.g., about 100 nm or more, about 500 nm or more, about 1 µm or more, about 5 µm or more, about 10 µm or more, about 50 µm or more, about 100 µm or more, about 200 µm or more, about 500 µm or more, about 1,000 µm). Rotationally-asymmetric surfaces can have a maximum deviation from an aspherical rotationally-symmetric reference surface by about 10 mm or less (e.g., about 5 mm or less, about 3 mm or less, about 2 mm or less, about 1 mm or less, about 500 µm or less).

In general, the number and position of rotationally-asymmetric mirrors in projection objective 101 can vary. Embodiments include projection objectives with two or more rotationally-asymmetric mirrors (e.g., tree or more rotationally-asymmetric mirrors, four or more rotationally-asymmetric mirrors, five or more rotationally-asymmetric mirrors, six or more rotationally-asymmetric mirrors).

Figure 3:
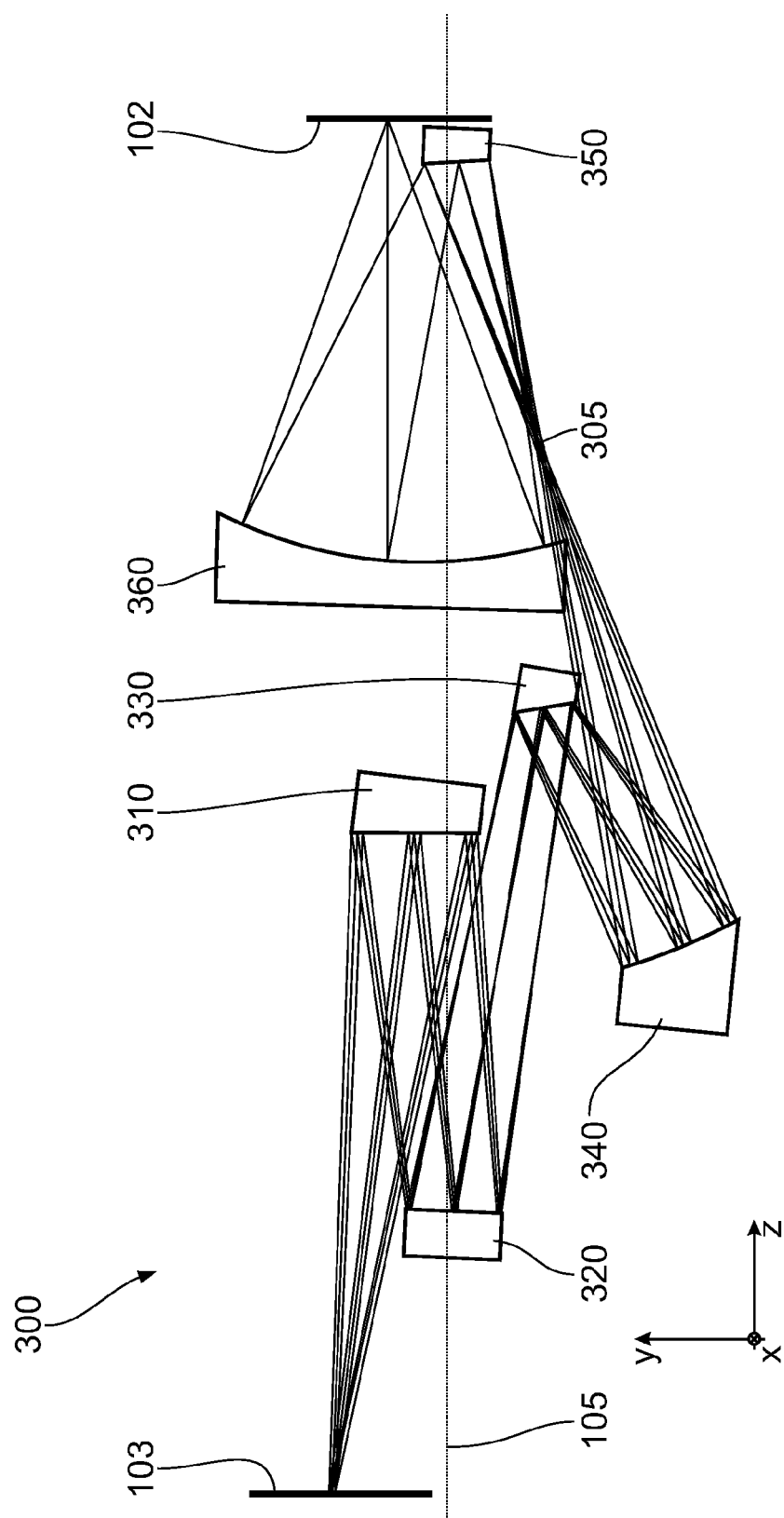
FIG. 3 is a cross-sectional view of an embodiment of a projection objective shown in meridional section.

An embodiment of a projection objective that includes six mirrors is shown in FIG. 3. Specifically, projection objective 300 includes six rotationally-asymmetric mirrors 310, 320, 330, 340, 350, and 360. Data for projection objective 300 is presented in Table 1A and Table 1B below. Table 1A presents optical data, while Table 1B presents rotationally-asymmetric constants for each of the mirror surfaces. For the purposes of Table 1A and Table 1B, the mirror designations correlate as follows: mirror 1 (M1) corresponds to mirror 310; mirror 2 (M2) corresponds to mirror 320; mirror 3 (M3) corresponds to mirror 330; mirror 4 (M4) corresponds to mirror 340; mirror 5 (M5) corresponds to mirror 350; and mirror 6 (M6) corresponds to mirror 360. "Spacing" in Table 1A and subsequent tables refers to the distance between adjacent elements in the radiation path. The monomial coefficients, $C_j$, for the rotationally-asymmetric mirrors, along with the amount the mirror is decentered and rotated from an initial projection objective design, are provided in Table 1B. R, the basic radius, is the inverse of the vertex curvature, c. Decenter is given in mm and rotation is given in degrees. Units for the monomial coefficients are $mm^{-j+1}$. Nradius is a unitless scaling factor.

In FIG. 3, projection objective 300 is shown in meridional section. The meridional plane is a symmetry plane for projection objective 300. Symmetry about the meridional plane is as the mirrors are decentered only with respect to the y-axis and tilted about the x-axis. Further, the coefficients for the rotationally-asymmetric mirrors having an odd degree in the x-coordinate (e.g., $x$, $x^3$, $x^5$, etc.) are zero.

Projection objective 300 is configured for operation with 13.5 nm radiation and has an image-side NA of 0.35 and a tracklength of 1,500 mm. The optical path length of imaged radiation is 3,833 mm. Accordingly, the ratio of optical path length to tracklength is approximately 2.56. Projection objective has a demagnification of 4×, a maximum distortion of less than 100 nm, $W_{rms}$ of 0.035$\lambda$, and a field curvature of 28 nm. Additional characteristics of projection objective 300 are presented in the discussion of projection objective 101 that follows.

Projection objective 101 generally includes one or more mirrors with positive optical power. In other words, the reflective portion of the mirror has a concave surface and is referred to as a concave mirror. Projection objective 101 can include two or more (e.g., three or more, four or more, five or more, six or more) concave mirrors. Projection objective 101 can also include one or more mirrors that have negative optical power. This means that one or more of the mirrors has a reflective portion with a convex surface (referred to as a convex mirror). In some embodiments, projection objective 101 includes two or more (e.g., three or more, four or more, five or more, six or more) convex mirrors.

For example, the first mirror in the radiation path from object plane 103, mirror 310, has positive optical power. Mirrors 320, 340, and 360 are also P mirrors. Mirrors 330 and 350 have (N) negative optical power. The sequence of mirrors in the radiation path in projection objective 300 is thus PPNPNP.

TABLE 1A

| Surface | Radius (mm) | Spacing (mm) | Mode |
|---|---|---|---|
| Object | INFINITY | 714.025 | |
| Mirror 1 | −1678.761 | −414.025 | REFL |
| Mirror 2 | 2754.233 | 564.025 | REFL |
| Mirror 3 | 350.451 | −316.293 | REFL |
| Mirror 4 | 590.379 | 906.948 | REFL |
| Mirror 5 | 433.060 | −435.447 | REFL |
| Mirror 6 | 521.283 | 480.767 | REFL |
| Image | INFINITY | 0.000 | |

For the mirrors in projection objective 300, the maximum deviation of the rotationally-asymmetric surfaces from a corresponding spherical rotationally-symmetric reference surface for each mirror is as follows: 154 μm for mirror 310; 43 μm for mirror 320, 240 μm for mirror 330; 1,110 μm for mirror 340; 440 μm for mirror 350; and 712 μm for mirror 360. The maximum deviation of the rotationally-asymmetric surfaces from a corresponding spherical rotationally-symmetric reference surface is 47 μm for mirror 310; 33 μm for mirror 320, 96 μm for mirror 330; 35 μm for mirror 340; 152 μm for mirror 350; and 180 μm for mirror 360.

The first and second mean curvature for mirror 310 are $9.51 \times 10^{-4}$ and $9.30 \times 10^{-4}$ respectively. Respective first and second mean curvatures for the other mirrors in projection objective 300 are as follows: $2.76 \times 10^{-5}$ and $1.56 \times 10^{-5}$ for mirror 320; $-2.38 \times 10^{-3}$ and $-2.17 \times 10^{-3}$ for mirror 330; $1.79 \times 10^{-3}$ and $1.75 \times 10^{-3}$ for mirror 340; $-2.64 \times 10^{-3}$ and $-2.10 \times 10^{-3}$ for mirror 350; and $1.93 \times 10^{-3}$ and $1.91 \times 10^{-3}$ for mirror 360. The sum of the first mean curvature for projection objective 300 is $-3.19 \times 10^{-4}$. The sum of the second mean curvature is $3.29 \times 10^{-4}$. The sum of the first and second mean curvatures is $9.97 \times 10^{-6}$ and the inverse sum of the first and second mean curvatures is $1.00 \times 10^{5}$.

In certain embodiments, the arrangement of mirrors in projection objective 101 images radiation from object plane 103 to one or more intermediate-image planes. For example, projection objective 300 images radiation from object plane 103 to an intermediate image at a location 305 near mirror 360. Embodiments that have one or more intermediate

TABLE 1B

| Coefficient | M1 | M2 | M3 | M4 | M5 | M6 |
|---|---|---|---|---|---|---|
| K | −4.724690E+00 | −9.830444E+01 | −3.914225E−01 | −8.227088E−01 | 7.162282E+00 | 9.391806E−02 |
| Y | 0.000000E+00 | 0.000000E+00 | 0.000000E+00 | 0.000000E+00 | 0.000000E+00 | 0.000000E+00 |
| $X^2$ | −1.641507E−04 | −1.736185E−04 | −2.373278E−04 | 2.451198E−05 | −1.557674E−04 | −6.667760E−06 |
| $Y^2$ | −1.752262E−04 | −1.741103E−04 | −9.708884E−04 | −3.130199E−05 | 1.398839E−04 | 9.098616E−06 |
| $X^2Y$ | −2.463783E−08 | −2.724028E−07 | 6.327587E−07 | −9.301810E−08 | 9.519017E−07 | −8.040311E−10 |
| $Y^3$ | −3.641831E−08 | −1.681535E−07 | −6.103587E−07 | 2.218271E−08 | 6.329282E−07 | −4.521618E−10 |
| $X^4$ | −1.405718E−10 | 1.314594E−09 | −1.671620E−08 | 4.569574E−10 | 7.852021E−10 | −5.450396E−11 |
| $X^2Y^2$ | −3.301633E−10 | 1.799995E−09 | 9.953323E−09 | −1.957005E−10 | 3.524719E−09 | −5.846553E−11 |
| $Y^4$ | 5.029041E−11 | 2.141266E−09 | 2.197236E−09 | 9.287687E−11 | 6.848802E−09 | −6.829886E−12 |
| $X^4Y$ | 2.090103E−13 | 4.363226E−12 | −5.435284E−11 | 1.915106E−13 | −2.016721E−11 | 5.660569E−15 |
| $X^2Y^3$ | −4.188774E−13 | 4.826497E−12 | 3.808642E−11 | −5.874603E−12 | −1.600920E−11 | −1.079542E−14 |
| $Y^5$ | −3.154238E−13 | −4.239647E−12 | −9.502949E−13 | 9.213338E−13 | 7.113886E−12 | −1.553415E−14 |
| $X^6$ | 1.150997E−16 | −5.978561E−15 | 1.819755E−13 | 1.113227E−15 | −7.841517E−15 | −1.105247E−16 |
| $X^4Y^2$ | −1.278596E−15 | −1.564797E−14 | −9.716106E−14 | 4.491475E−15 | 2.513948E−14 | −2.683146E−16 |
| $X^2Y^4$ | 4.862795E−15 | 2.347370E−14 | −8.086932E−14 | −1.357215E−14 | 7.550314E−13 | −1.006466E−16 |
| $Y^6$ | −2.281966E−15 | 6.013241E−15 | −9.790347E−15 | 9.777397E−16 | 5.013963E−13 | 2.221551E−17 |
| $X^6Y$ | 1.931804E−18 | −3.973144E−17 | 1.435292E−15 | 2.420914E−18 | 1.092143E−15 | 2.493748E−20 |
| $X^4Y^3$ | 1.873466E−17 | −2.704307E−16 | 6.491544E−16 | 1.627727E−18 | 4.414328E−15 | −3.302939E−21 |
| $X^2Y^5$ | −1.108422E−17 | −6.723973E−16 | 1.496578E−17 | −1.880319E−17 | 8.552963E−15 | −3.287503E−20 |
| $Y^7$ | 1.208226E−17 | −3.735956E−17 | 5.421342E−17 | −8.994976E−19 | 4.894980E−15 | −1.747517E−20 |
| $X^8$ | −6.860939E−22 | 3.733020E−20 | −1.370615E−17 | −3.978807E−21 | −1.975913E−18 | −3.996672E−22 |
| $X^6Y^2$ | −2.665919E−20 | −1.577571E−19 | 1.832427E−17 | −2.552872E−21 | −2.066761E−17 | −1.153602E−21 |
| $X^4Y^4$ | −1.606232E−19 | 9.112068E−19 | 3.422045E−18 | −4.011070E−20 | −4.034354E−17 | −9.786532E−22 |
| $X^2Y^6$ | −7.104780E−20 | 4.547933E−18 | 3.897160E−19 | 8.558317E−21 | 3.324806E−17 | −2.054121E−22 |
| $Y^8$ | −2.837115E−20 | 3.557864E−20 | −5.077104E−20 | 8.825661E−22 | 3.460507E−17 | 4.049399E−23 |
| $X^8Y$ | 1.837688E−23 | 1.087991E−21 | −7.892883E−20 | −4.154231E−23 | 3.418177E−20 | 2.593417E−25 |
| $X^6Y^3$ | 1.326930E−22 | 6.381757E−21 | 8.816591E−21 | −7.838712E−23 | −1.567137E−20 | 3.310704E−25 |
| $X^4Y5$ | 5.956987E−22 | 3.566833E−22 | 3.431915E−21 | −1.727422E−22 | −2.315754E−19 | 1.062541E−25 |
| $X^2Y^7$ | 4.749865E−22 | −1.305899E−20 | −1.115108E−21 | 2.927898E−23 | 0.000000E+00 | 5.083980E−27 |
| $Y^9$ | 2.880675E−23 | 3.134161E−21 | 4.687264E−21 | −2.354646E−24 | 0.000000E+00 | −4.697062E−26 |
| $X^{10}$ | 3.263322E−27 | −1.350621E−25 | 7.223418E−23 | 3.596439E−27 | 0.000000E+00 | −1.214434E−27 |
| $X^8Y^2$ | −7.476461E−26 | −8.102951E−24 | −1.439645E−22 | −6.842489E−26 | 0.000000E+00 | −7.139344E−27 |
| $X^6Y^4$ | −2.162180E−25 | −1.982986E−23 | 1.317953E−22 | −1.079450E−25 | 0.000000E+00 | −8.881170E−27 |
| $X^4Y^6$ | −8.415305E−25 | −1.821358E−26 | −5.971700E−24 | −1.561940E−25 | 0.000000E+00 | −3.378805E−27 |
| $X^2Y^8$ | −8.228853E−25 | 3.745838E−24 | −3.016526E−24 | 3.289669E−26 | 0.000000E+00 | 1.400401E−27 |
| $Y^{10}$ | 2.644302E−26 | −1.118733E−23 | 5.389015E−25 | −3.012754E−27 | 0.000000E+00 | 9.011434E−28 |
| Nradius | 1.00E+00 | 1.00E+00 | 1.00E+00 | 1.00E+00 | 1.00E+00 | 1.00E+00 |
| Y-decenter | −100.000 | −84.186 | 100.000 | 19.008 | 11.570 | 24.216 |
| X-rotation | −7.020 | −1.728 | −11.272 | −5.323 | −2.295 | −1.825 | images, also include two or more pupil planes. In some embodiments, at least one of these pupil planes is physically accessible for the purposes of placing an aperture stop substantially at that pupil plane. An aperture stop is used to define the size of the projection objective's aperture.

Coma at an intermediate image in projection objective 101 can be relatively large. Coma can be quantified by the distance between the chief ray and the upper and lower rays at the point where the upper and lower rays cross. In some embodiments, this distance can be about 1 mm or more (e.g., about 2 mm or more, about 3 mm or more, about 4 mm or more, about 5 mm or more, about 6 mm or more, such as about 7 mm).

In general, mirrors in projection objective 101 are formed so that they reflect a substantial amount of radiation of wavelength λ normally-incident thereon or incident thereon over a certain range of incident angles. Mirrors can be formed, for example, so that they reflect about 50% or more (e.g., about 60% or more, about 70% or more, about 80% or more, about 90% or more, about 95% or more, 98% or more) of normally incident radiation at λ.

In some embodiments, the mirrors include a multilayer stack of films of different materials arranged to substantially reflect normally incident radiation at λ. Each film in the stack can have an optical thickness of about λ/4. Multilayer stacks can include about 20 or more (e.g., about 30 or more, about 40 or more, about 50 or more) films. In general, the materials used to form the multilayer stacks are selected based on operational wavelength λ. For example, multiple alternating films of molybdenum and silicon or molybdenum and beryllium can be used to form mirrors for reflecting radiation in the 10 nm to 30 nm range (e.g., for λ of about 13 nm or about 11 nm, respectively).

In certain embodiments, the mirrors are made of quartz glass coated with a single layer of aluminum and overcoated with one or more layers of dielectric materials, such as layers formed from $MgF_2$, $LaF_2$, or, $Al_2O_3$. Mirrors formed from aluminum with dielectric coatings can be used, for example, for radiation having a wavelength of about 193 nm.

Figure 4:
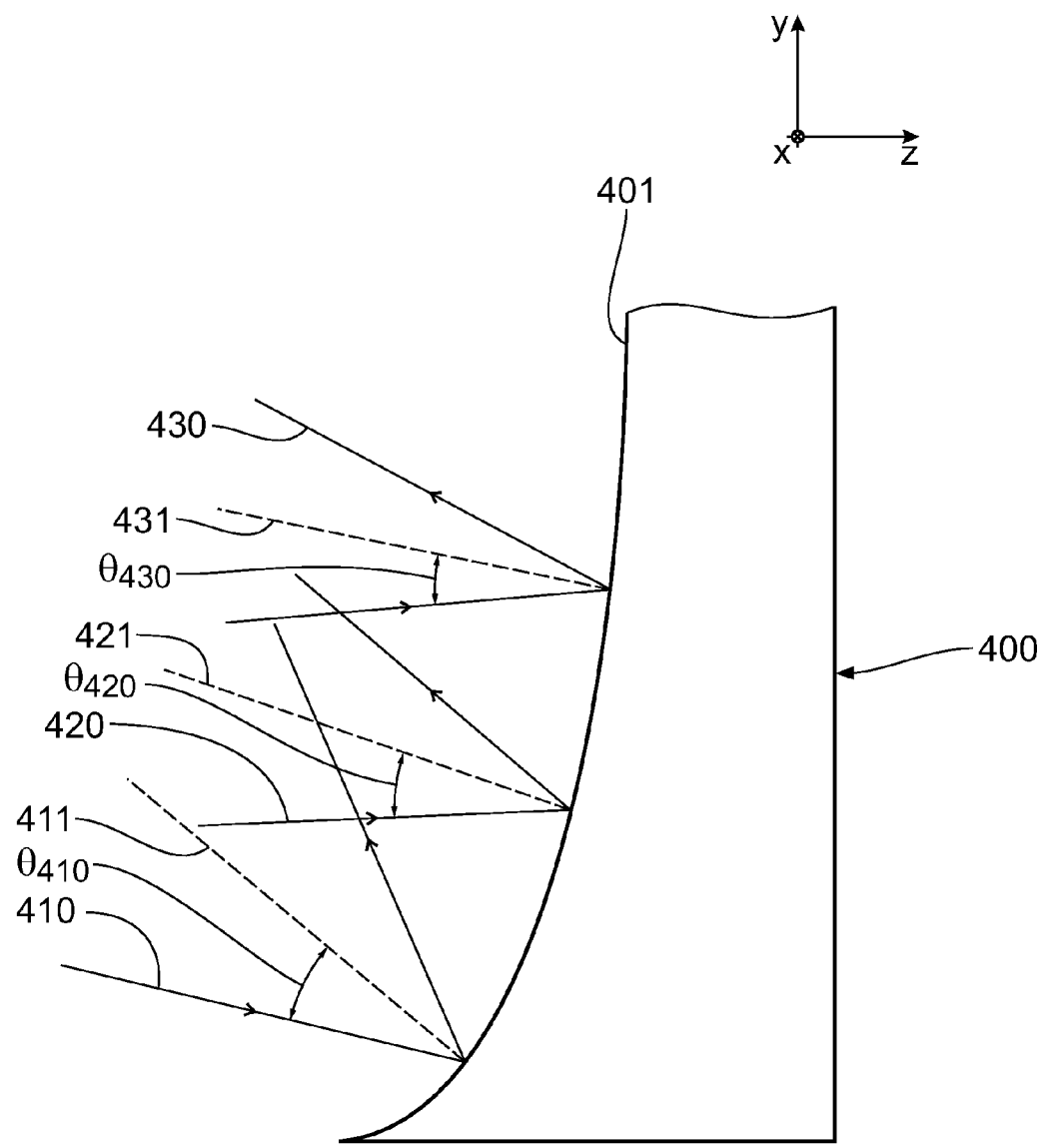
FIG. 4 is a cross-sectional view of a portion of a mirror from a projection objective shown in meridional section.

In general, the percentage of radiation at λ reflected by a mirror varies as a function of the angle of incidence of the radiation on the mirror surface. Because imaged radiation propagates through a catoptric projection objective along a number of different paths, the angle of incidence of the radiation on each mirror can vary. This effect is illustrated with reference to FIG. 4, which shows a portion of a mirror 400, in meridional section, that includes a concave reflective surface 401. Imaged radiation is incident on surface 401 along a number of different paths, including the paths shown by rays 410, 420, and 430. Rays 410, 420, and 430 are incident on portions of surface 401 where the surface normal is different. The direction of surface normal at these portions is shown by lines 411, 421, and 431, corresponding to rays 410, 420, and 430, respectively. Rays 410, 420, and 430 are incident on surface 401 at angles $\theta_{410}$, $\theta_{420}$, and $\theta_{430}$, respectively. In general, angles $\theta_{410}$, $\theta_{420}$, and $\theta_{430}$ may vary.

For each mirror in projection objective 101, the incident angles of imaged radiation can be characterized in a variety of ways. One characterization is the maximum angle of incidence of meridional rays on each mirror in a meridional section of projection objective 101. Meridional rays refer to rays lying in the meridional section. In general, $\theta_{max}$ can vary for different mirrors in projection objective 101.

In some embodiments, the maximum value of $\theta_{max}$ for all the mirrors in projection objective 101 is about 75° or less (e.g., about 70° or less, about 65° or less, about 60° or less, about 55° or less, about 50° or less, about 45° or less). $\theta_{max}$ can be more than about 5° (e.g., about 10° or more, about 20° or more). In some embodiments, the maximum value of $\theta_{max}$ can be relatively low. For example, the maximum value of $\theta_{max}$ can be about 40° or less (e.g., about 35° or less, about 30° or less, about 25° or less, about 20° or less, about 15° or less, about 13° or less, about 10° or less).

As an example, in projection objective 300, $\theta_{max}$ for mirror 310 is 8.22°, $\theta_{max}$ for mirror 320 is 10.38°, $\theta_{max}$ for mirror 330 is 22.35°, $\theta_{max}$ for mirror 340 is 7.49°, $\theta_{max}$ for mirror 350 is 24.58°, and $\theta_{max}$ for mirror 360 is 6.15°.

In some embodiments, the ratio of the maximum value of $\theta_{max}$ (in degrees) to image-side NA can be about 100 or less (e.g., about 80 or less, about 70 or less, 68 or less, about 60 or less, about 50 or less, about 40 or less, about 30 or less).

Another characterization is the angle of incidence of the chief ray corresponding to the central field point on each mirror in a meridional section of projection objective 101. This angle is referred to as $\theta_{CR}$. In general, $\theta_{CR}$ can vary. For projection objective 300, for example, mirror 310 has $\theta_{CR}$ of 6.59°, mirror 320 has $\theta_{CR}$ of 7.93°, mirror 330 has $\theta_{CR}$ of 20.00°, mirror 340 has $\theta_{CR}$ of 7.13°, mirror 350 has $\theta_{CR}$ of 13.06°, and mirror 360 has $\theta_{CR}$ of 5.02°. In some embodiments the maximum value of $\theta_{CR}$, $\theta_{CR}(max)$, in projection objective 101 can be relatively low. For example, $\theta_{CR}(max)$ can be about 35° or less (e.g., about 30° or less, about 25° or less, about 20° or less, about 15° or less, about 13° or less, about 10° or less, about 8° or less, about 5° or less). For projection objective 300, $\theta_{CR}(max)$, which is $\theta_{CR}$ for mirror 330, is 20.00°.

Each mirror in projection objective 101 can also be characterized by the range of angles of incidence, Δθ, of rays for a meridional section of projection objective 101. For each mirror, Δθ corresponds to the difference between $\theta_{max}$ and $\theta_{min}$, where $\theta_{min}$ is the minimum angle of incidence of rays on each mirror in a meridional section of projection objective 101. In general, Δθ may vary for each mirror in projection objective 101. For some mirrors, Δθ can be relatively small. For example, Δθ can be about 20° or less (e.g., about 15° or less, about 12° or less, about 10° or less, about 8° or less, about 5° or less, about 3° or less, 2° or less). Alternatively, for some mirrors in projection objective 101, Δθ can be relatively large. For example, Δθ for some mirrors can be about 20° or more (e.g., about 25° or more, about 30° or more, about 35° or more, about 40° or more). For projection objective 300, $\Delta\theta_{max}$ for mirror 310 is 3.34°, $\Delta\theta_{max}$ for mirror 320 is 4.92°, $\Delta\theta_{max}$ for mirror 330 is 5.18°, $\Delta\theta_{max}$ for mirror 340 is 0.98°, $\Delta\theta_{max}$ for mirror 350 is 24.07°, and $\Delta\theta_{max}$ for mirror 360 is 2.77°.

In some embodiments, the maximum value for Δθ, $\Delta\theta_{max}$, for all the mirrors in projection objective 101 can be relatively small. For example, $\Delta\theta_{max}$ can be about 25° or less (e.g., about 20° or less, about 15° or less, about 12° or less, about 10° or less, about 9° or less, about 8° or less, about 7° or less, about 6° or less, about 5° or less, such as 3°). For projection objective 300, $\Delta\theta_{max}$ is 24.07°.

Figure 5A:
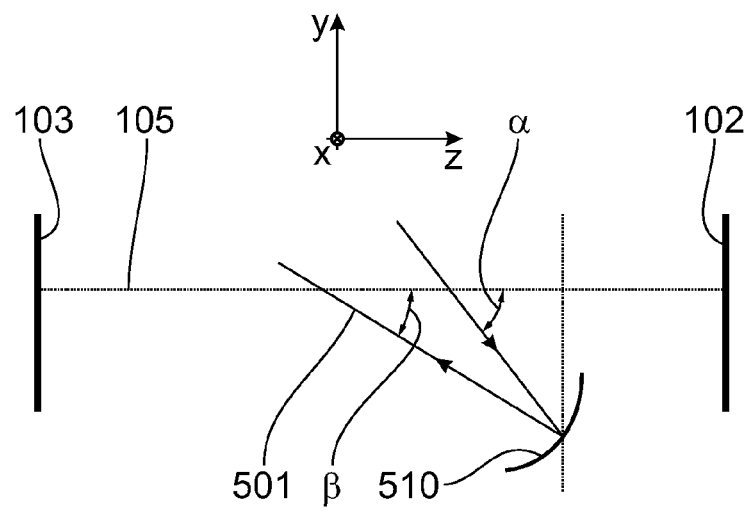
FIG. 5A is a schematic view of a ray path at a mirror having a positive chief ray angle magnification.
Figure 5B:
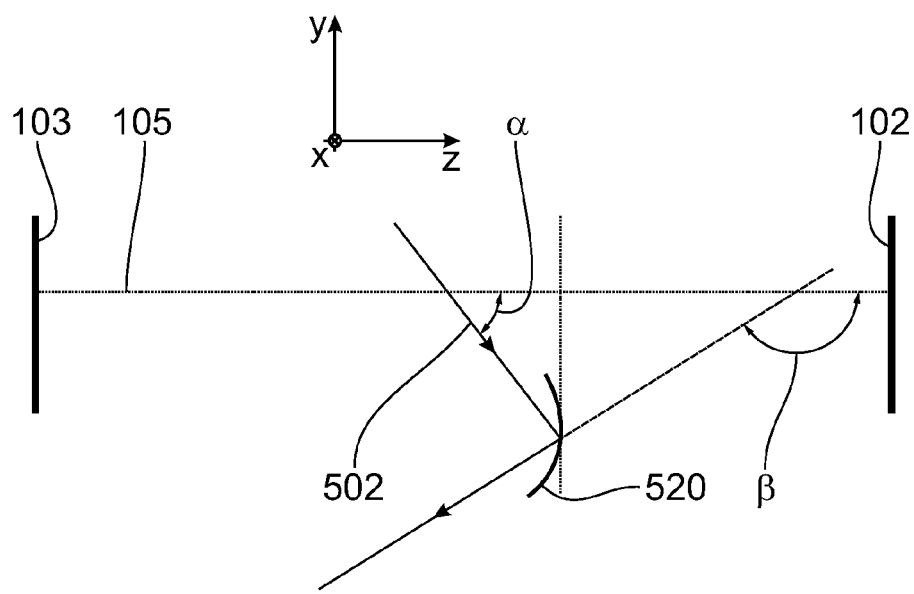
FIG. 5B is a schematic view of a ray path at a mirror having a negative chief ray angle magnification.

Another way to characterize the radiation path in projection objective 101 is by the chief ray magnification at each mirror, which refers to the quotient of the tangent of the angle between the chief ray and reference axis 105 before and after reflection from each mirror. For example, referring to FIG. 5A where a chief ray 501 diverges from reference axis 105 prior to reflection from a mirror 510, and reflects from mirror 510 back towards reference axis 105, mirror 510 has a positive chief ray angle magnification. Referring to FIG. 5B, alternatively, where a chief ray 502 diverges from reference axis 105 both before and after reflection from a mirror 520, mirror 520 has a negative chief ray angle magnification. In both cases, the chief ray magnification is given by $\tan(\alpha)/\tan(\beta)$. In certain embodiments, having multiple mirrors with positive chief ray angle magnification can correspond to relatively large incident angles on one or more mirrors in the projection objective. Accordingly, projection objectives having only one mirror with positive chief ray angle magnification can also exhibit relatively low incident ray angles on the mirrors. For projection objective 300, mirrors 310, 320, 330 and 350 have negative chief ray angle magnifications, while mirror 340 has positive chief ray angle magnification.

The relative spacing of mirrors in projection objective 101 can vary depending on the specific design of the projection objective. Relatively large distances between adjacent mirrors (with respect to the path of the radiation) can correspond to relatively low incident ray angles on the mirrors. In certain embodiments, projection objective 101 can include at least one pair of adjacent mirrors that separated by more than 50% of the projection objective tracklength. For example, in projection objective 300, mirrors 340 and 350 are separated by more than 50% of the projection objective's track length.

In certain embodiments, having a large relative distance, $d_{op-1}$, between the object plane and the first mirror in the radiation path compared to the distance, $d_{op-2}$, between the object plane and the second mirror in the radiation path can also correspond to relatively low incident ray angles on the mirrors. For example, embodiments where $d_{op-1}/d_{op-2}$ is about 2 or more (e.g., about 2.5 or more, about 3 or more, about 3.5 or more, about 4 or more, about 4.5 or more, about 5 or more) can also have relatively low incident ray angles. In projection objective 300, $d_{op-1}/d_{op-2}$ is 2.38.

In general, the footprint size and shape of the mirrors in projection objective 101 can vary. The footprint shape refers to the shape of the mirror projected onto the x-y plane. The footprint of the mirrors can be circular, oval, polygonal (e.g., rectangular, square, hexagonal), or irregular in shape. In embodiments, the footprint is symmetric with respect to the meridional plane of projection objective 101.

In certain embodiments, mirrors can have a footprint with a maximum dimension that is about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, about 400 mm or less, about 300 mm or less, about 200 mm or less, about 100 mm or less.) Mirrors may have footprint that has a maximum dimension that is more than about 10 mm (e.g., about 20 mm or more, about 50 mm or more).

An example of a mirror 600 with an oval footprint is shown in FIG. 6A. Mirror 600 has a maximum dimension in the x-direction given by $M_x$. In embodiments, $M_x$ can be about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, about 400 mm or less, about 300 mm or less, about 200 mm or less, about 100 mm or less). $M_x$ can be more than about 10 mm (e.g., about 20 mm or more, about 50 mm or more).

Mirror 600 is symmetric with respect to meridian 601. Mirror 600 has a dimension $M_y$ along meridian 601. For mirror 600 $M_y$ is smaller than $M_x$, however, more generally, $M_y$ can be smaller, the same size, or larger than $M_x$. In some embodiments, $M_y$ is in a range from about 0.1 $M_x$ to about $M_x$ (e.g., about 0.2 $M_x$ or more, about 0.3 $M_x$ or more, about 0.4 $M_x$ or more, about 0.5 $M_x$ or more, about 0.6 $M_x$ or more, about 0.7 $M_x$ or more about 0.8 $M_x$ or more, about 0.9 $M_x$ or more). Alternatively, in certain embodiments, $M_y$ can be about 1.1 $M_x$ or more (e.g., about 1.5 $M_x$ or more), such as in a range from about 2 $M_x$ to about 10 $M_x$. $M_y$ can be about 1,000 mm or less (e.g., about 900 mm or less, about 800 mm or less, about 700 mm or less, about 600 mm or less, about 500 mm or less, about 400 mm or less, about 300 mm or less, about 200 mm or less, about 100 mm or less). $M_y$ can be more than about 10 mm (e.g., about 20 mm or more, about 50 mm or more).

In projection objective 300, $M_x$ and $M_y$ for mirror 310 are 303 mm and 139 mm, respectively; $M_x$ and $M_y$ for mirror 320 are 187 mm and 105 mm, respectively; $M_x$ and $M_y$ for mirror 330 are 114 mm and 62 mm, respectively; $M_x$ and $M_y$ for mirror 340 are 299 mm and 118 mm, respectively; $M_x$ and $M_y$ for mirror 350 are 99 mm and 71 mm, respectively; and $M_x$ and $M_y$ for mirror 360 are 358 mm and 332 mm, respectively.

In some embodiments, the base of the mirrors may extend beyond the mirror surface (i.e., the portion of the mirror that reflects imaged radiation) in one or more directions. For example, a mirror's base can extend about 10 mm or more (e.g., about 20 mm or more, about 30 mm or more, about 40 mm or more, about 50 mm or more) beyond the optically active surface in the x- and/or y-directions. Mirror base extension can facilitate mounting the mirror in projection objective 101 by providing surfaces that are not optically active that can be attached to mounting apparatus.

Preferably, mirror base extensions should not be in a direction that occludes the radiation path in projection objective 101. The distance between the edge of a mirror and the radiation path as it passes the mirror is related to a parameter referred to as the "freeboard," which is the minimum distance between the rays closest to a mirror's edge and the rays nearest the mirror's edge that are reflected by the mirror. In some embodiments, projection objective 101 can include one or more mirrors with freeboards of about 20 mm or more (e.g., about 25 mm or more, about 30 mm or more, about 35 mm or more, about 40 mm or more, about 45 mm or more, about 50 mm or more). Large freeboards provide flexibility in mirror fabrication as the projection objective can accommodate an extended mirror base without occlusion of the imaged radiation. However, relatively small freeboards can correspond to low incident ray angles on the mirrors in the projection objective. In some embodiments, projection objective 101 can include one or more mirrors with freeboards of about 15 mm or less (e.g., about 12 mm or less, about 10 mm or less, about 8 mm or less, about 5 mm or less). In certain embodiments, projection objective 101 includes one or more mirrors having a freeboard between 5 mm and 25 mm. For example, in projection objective 300, mirrors 310, 320, 330, 350, and 360 have freeboards between 5 mm and 25 mm.

In general, the thickness of the mirrors in projection objective 101 may vary. Mirrors should generally have sufficient thickness to facilitate mounting within the projection objective. Referring to FIG. 6B, the thickness of mirror 600 can be characterized by a maximum thickness, $T_{max}$, and a minimum thickness, $T_{min}$. Typically, the difference between $T_{max}$ and $T_{min}$ will depend on the curvature of the mirror surface and the structure of the mirror's base. In some embodiments, $T_{max}$ is about 200 mm or less (e.g., about 150 mm or less, about 100 mm or less, about 80 mm or less, about 60 mm or less, about 50 mm or less, about 40 mm or less, about 30 mm or less, about 20 mm or less). In certain embodiments, $T_{min}$ is about 1 mm or more (e.g., about 2 mm or more, about 5 mm or more, about 10 mm or more, about 20 mm or more, about 50 mm or more, about 100 mm or more).

In some embodiments, the maximum dimension of any mirror in projection objective is about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, such as about 300 mm). In certain embodiments, the maximum dimension of any mirror in projection objective is about 10 mm or more (e.g., about 20 mm or more, about 30 mm or more, about 40 mm or more, about 50 mm or more, about 75 mm or more, about 100 mm or more).

In general, the shape of the field of projection objective 101 can vary. In some embodiments, the field has an arcuate shape, such as the shape of a segment of a ring. Referring to FIG. 7A, a ring-segment field 700 can be characterized by an x-dimension, $d_x$, a y-dimension, $d_y$, and a radial dimension, $d_r$. $d_x$ and $d_y$ correspond to the dimension of the field along the x-direction and y-direction, respectively. $d_r$ corresponds to the ring radius, as measured from an axis 705 to the inner boundary of field 700. Ring-segment field 700 is symmetric with respect to a plane parallel to the y-z plane and indicated by line 710. In general, the sizes of $d_x$, $d_y$, and $d_r$ vary depending on the design of projection objective 101. Typically $d_y$ is smaller than $d_x$. The relative sizes of field dimensions $d_x$, $d_y$, and $d_r$ at object plane 103 and image plane 102 vary depending on the magnification or demagnification of projection objective 101.

In some embodiments, $d_x$ is relatively large at image plane 102. For example, $d_x$ at image plane 102 can be more than 1 mm (e.g., about 3 mm or more, about 4 mm or more, about 5 mm or more, about 6 mm or more, about 7 mm or more, about 8 mm or more, about 9 mm or more, about 10 mm or more, about 11 mm or more, about 12 mm or more, about 13 mm or more, about 14 mm or more, about 15 mm or more, about 18 mm or more, about 20 mm or more, about 25 mm or more). $d_x$ can be about 100 mm or less (e.g., about 50 mm or less, about 30 mm or less). $d_y$ at image plane 102 can be in a range from about 0.5 mm to about 5 mm (e.g., about 1 mm, about 2 mm, about 3 mm, about 4 mm).

Typically, $d_r$ at image plane 102 is about 10 mm or more. $d_r$ can be, for example, about 15 mm or more (e.g., about 20 mm or more, about 25 mm or more, about 30 mm or more) at image plane 102. In some embodiments, $d_r$ can be extremely large (e.g., about 1 m or more, about 5 m or more, about 10 m or more). In certain embodiments, the field is rectangular in shape and $d_r$ is infinite. Projection objective 300, for example, has a rectangular field. Specifically, projection objective 300 has a rectangular field with a y-dimension of 2 mm and an x-dimension of 26 mm (measured at the image plane).

More generally, for other field shapes, projection objective 101 can have a maximum field dimension of more than 1 mm (e.g., about 3 mm or more, about 4 mm or more, about 5 mm or more, about 6 mm or more, about 7 mm or more, about 8 mm or more, about 9 mm or more, about 10 mm or more, about 11 mm or more, about 12 mm or more, about 13 mm or more, about 14 mm or more, about 15 mm or more, about 18 mm or more, about 20 mm or more, about 25 mm or more) at image plane 102. In certain embodiments, projection objective has a maximum field dimension of no more than about 100 mm (e.g., about 50 mm or less, about 30 mm or less).

In some embodiments, the image field shape can correspond (e.g., in one or more dimensions) to the shape of die sites on a wafer that is exposed using projection objective 101. For example, the image field can be shaped to reduce overscan when exposing the wafer. Overscan refers to the need to scan the image field beyond the edge of a die site to expose the entire site. Generally, this occurs where the shape of the image field does not conform to the shape of die site.

Overscan can be characterized by the ratio (e.g., expressed as a percentage) of the maximum distance between the leading edge of the image field and the trailing edge of the die site at the position where the corners at the trailing edge of the die site are exposed. Referring to FIG. 7B, overscan corresponds to the ratio of $d_{os}$ to $d_y$, where $d_{os}$ is the distance between the leading edge of image field 700 and the trailing edge of die sites 720 at the position where corners 721 and 722 are exposed. In certain embodiments, projection objective can have relatively low overscan. For example, projection objective can have an overscan of about 5% or less (e.g., about 4% or less, about 3% or less, about 2% or less, about 1% or less, about 0.5% or less, 0.1% or less).

In certain embodiments, projection objective 101 can be used with zero overscan. For example, referring to FIG. 7C, in embodiments where an image field 730 is used to expose square die sites 740, scanning can be achieved with zero overscan.

Figure 8:
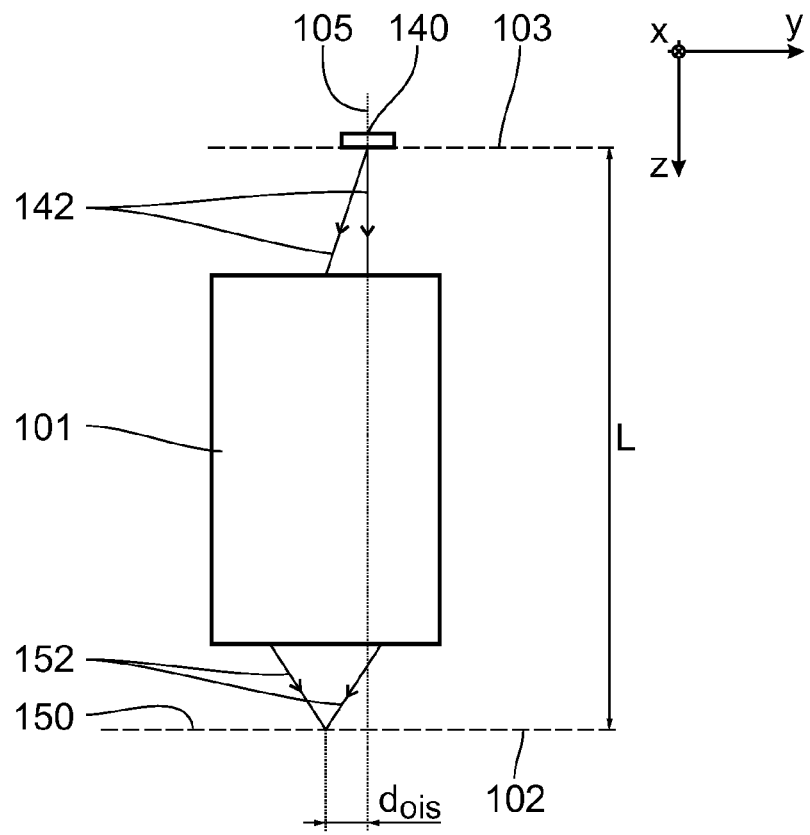
FIG. 8 a schematic view of the projection objective of the embodiment of microlithography tool shown in FIG. 1.

Referring to FIG. 8, in general, projection objective 101 introduces an object-image shift, $d_{ois}$, that varies depending on the specific design of the projection objective. The object-image shift refers to the distance of a point in the image field from the corresponding point in the object field, as measured in the x-y plane. For projection objectives that have an optical axis (a common axis of rotational symmetry for each mirror in the projection objective) the object-image shift can be calculated using the formula:

$$d_{ois} = h_o(1-M)$$

where $h_o$ refers to the distance in the x-y plane of the central field point in the object field from the optical axis and M is the projection objective magnification ratio. For example, for a projection objective have a demagnification of 4× (i.e., M=0.25) and where the central field point is 120 mm from the optical axis, $d_{ois}$ is 90 mm.

In some embodiments, projection objective 101 can have a relatively small object-image shift. For example, projection objective has zero object-image shift. Projection objectives having relatively small object image shifts can be have a relatively slim optical design. Furthermore, in embodiments that have zero object-image shift, projection objective 101 can be rotated about the axis intersecting the central field points in the object and image fields without the central field point translating with respect to, e.g., stage 130. This can be advantageous where, for example, metrology tools (e.g., detection optical systems, such as those disclosed in U.S. Pat. No. 6,240,158 B1) for inspecting and aligning wafers with respect to projection objective 101 are placed at a nominal position of the central field point because the central field point is not translated with respect to this position when the projection objective rotates. Accordingly, zero object-image shift can facilitate easier metrology and testing of projective objective 101 where the projection objective is subject to rotations during the course of operation.

In some embodiments, projection objective 101 has a $d_{ois}$ of about 80 mm or less (e.g., about 60 mm or less, about 50 mm or less, about 40 mm or less, about 30 mm or less, about 20 mm or less, about 15 mm or less, about 12 mm or less, about 10 mm or less, about 8 mm or less, about 5 mm or less, about 4 mm or less, about 3 mm or less, about 2 mm or less, about 1 mm or less). Projection objective 300, for example, has a dogs of 57 mm.

Figure 9:
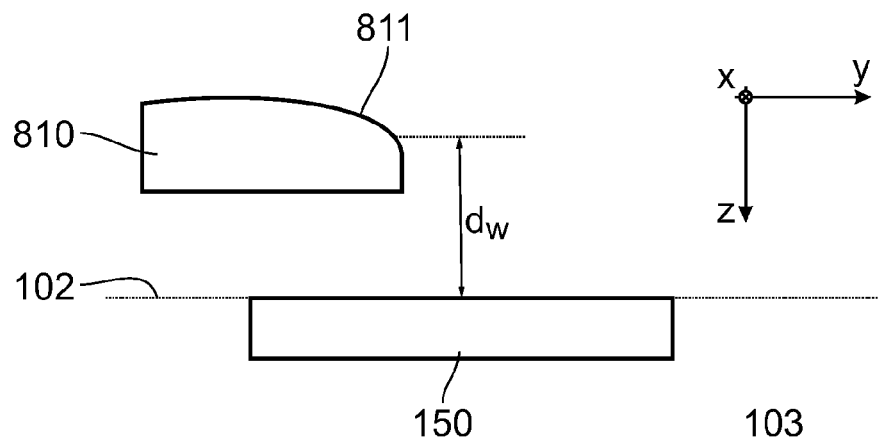
FIG. 9 is a cross-sectional view of a portion of a projection objective shown in meridional section.

Embodiments of projection objective 101 can have a relatively large image-side free working distance. The image-side free working distance refers to the shortest distance between image plane 102 and the surface of the mirror closest to image plane 102 that reflects imaged radiation. This is illustrated in FIG. 9A, which shows a mirror 810 as the closest mirror to image plane 102. Radiation reflects from surface 811 of mirror 810. The image-side free working distance is denoted $d_w$. In some embodiments, $d_w$ is about 25 mm or more (e.g., about 30 mm or more, about 35 mm or more, about 40 mm or more, about 45 mm or more, about 50 mm or more about 55 mm or more, about 60 mm or more, about 65 mm or more). In certain embodiments, $d_w$ is about 200 mm or less (e.g., about 150 mm or less, about 100 mm or less, about 50 mm or less). Projection objective 300, for example, has an image-side free working distance of approximately 45 mm. A relatively large working distance may be desirable because it can allow the surface of substrate 150 to be positioned at image plane 102 without contacting the side of mirror 810 facing image plane 102.

Analogously, the object-side free working distance refers to the shortest distance between object plane 103 and the mirror surface of the reflective side of the mirror in projection objective 101 closest to object plane 103 that reflects imaged radiation. In some embodiments, projection objective 101 has a relatively large object-side free working distance. For example, projection objective 101 can have an object-side free working distance of about 50 mm or more (e.g., about 100 mm or more, about 150 mm or more, about 200 mm or more, about 250 mm or more, about 300 mm or more, about 350 mm or more, about 400 mm or more, about 450 mm or more, about 500 mm or more, about 550 mm or more, about 600 mm or more, about 650 mm or more, about 700 mm or more, about 750 mm or more, about 800 mm or more, about 850 mm or more, about 900 mm or more, about 950 mm or more, about 1,000 mm or more). In certain embodiments, the object-side free working distance is no more than about 2,000 mm (e.g., about 1,500 mm or less, about 1,200 mm or less, about 1,000 mm or less). Projection objective 300, for example, has an object-side free working distance of approximately 300 mm. A relatively large object-side free working distance may be advantageous in embodiments where access to the space between projection objective 101 and object plane 103 is desired. For example, in embodiments where reticle 140 is a reflective reticle, it is necessary to illuminate the reticle from the side that faces objective 101. Therefore, there should be sufficient space between projection objective 101 and object plane 103 to allow the reticle to be illuminated by illumination system 120 at a desired illumination angle. Furthermore, in general, a larger object-side free working distance allows flexibility in design of the rest of tool, for example, by providing sufficient space to mount other components (e.g. an uniformity filter) between projection objective 101 and the support structure for reticle 140.

In general, projection objective 101 can be designed so that chief rays either converge, diverge, or are substantially parallel to each other at reticle 140. Correspondingly, the location of the entrance pupil of projection objective 101 with respect to object plane 103 can vary. For example, where chief rays converge at reticle 140, the entrance pupil is located on the image plane side of object plane 103. Conversely, where the chief rays diverge at reticle 140, object plane 103 is located between the entrance pupil and image plane 102. Furthermore, the distance between object plane 103 and the entrance pupil can vary. In some embodiments, the entrance pupil is located about 1 m or more (e.g., about 2 m or more, about 3 m or more, about 4 m or more, about 5 m or more, about 8 m or more, about 10 m or more) from object plane 103 (measured along an axis perpendicular to object plane 103). In some embodiments, the entrance pupil is located at infinity with respect to object plane 103. This corresponds to where the chief rays are parallel to each other at reticle 140. For projection objective 300, the incident angle of the chief ray at the central field point at object plane 103 is 7° and the maximum variation of the chief ray angle form the central field point chief ray is 0.82°. The entrance pupil is located 1,000 mm from object plane 103 on the opposite side of object plane 103 from image plane 102.

In certain embodiments, the chief rays are substantially parallel to each other at object plane 103. For example, the chief rays can be parallel to each other to within about 0.5° or less (e.g., about 0.4° or less, about 0.3° or less, about 0.2° or less, about 0.1° or less, about 0.05° or less, 0.01° or less) at object plane 103. Uniformity of the chief ray directions at the reticle can reduce or avoid field dependency of shading effects at the reticle. These effects can lead to a field dependency of the imaging properties of projection objective 101, such as, for example, the resolution limit. Accordingly, uniformity of the chief ray directions can reduce these field dependent imaging properties, providing an image that has improved uniformity across the field. Furthermore, it can allow for the use of phase shifting masks for reticle 140, especially for EUV wavelengths.

Illumination system 120 may be arranged so that the exit pupil of the illumination system is positioned substantially at the entrance pupil of projection objective 101. In certain embodiments, illumination system 120 includes a telescope subsystem which projects the illumination system's exit pupil to the location of the entrance pupil of projection objective 101. However, in some embodiments, the exit pupil of illumination system 120 is positioned at the entrance pupil of projection objective 101 without using a telescope in the illumination system. For example, when the object plane 103 is between projection objective 101 and the entrance pupil of the projection objective, the exit pupil of illumination system 120 may coincide with the projection objective's entrance pupil without using a telescope in the illumination system.

In general, projection objective 101 can be designed using commercially available optical design software like ZEMAX, OSLO, or Code V. Typically, a design is started by specifying an initial projection objective design (e.g., arrangement of mirrors) along with parameters such as the radiation wavelength, field size and numerical aperture, for example. The code then optimizes the design for specified optical performance criteria, such as, for example, wavefront error, distortion, telecentricity, and field curvature.

In certain embodiments, the initial projection objective is designated by rotationally-symmetric mirrors (e.g., spherical or aspherical mirrors) that are centered on an optical axis. Each mirror is then decentered from the optical axis to a position where the mirror satisfies some pre-established criterion. For example, each mirror can be decentered from the optical axis by and amount which minimizes the chief ray angle of incidence across the mirror for particular field. In embodiments, mirrors can be decentered by about 5 mm or more (e.g., about 10 mm or more, about 20 mm or more, about 30 mm or more, about 50 mm or more). In certain embodiments, mirrors are decentered by about 200 mm or less (e.g., about 180 mm or less, about 150 mm or less, about 120 mm or less, about 100 mm or less).

Alternatively, or additionally, each mirror can be tilted to a position where the mirror satisfies some pre-established criterion. The tilt refers to the orientation of each mirrors symmetry axis with respect to the optical axis of the initial configuration of the projection objective. Mirrors can be titled by about 1° or more (e.g., about 2° or more, about 3° or more, about 4° or more, about 5° or more). In some embodiments, mirrors are tilted by about 20° or less (e.g., about 15° or less, about 12° or less, about 10° or less).

After decentering and/or tilting, a rotationally-asymmetric shape for each mirror can be determined to optimize the projection objective design for specified optical performance criteria.

In addition to mirrors, projection objective 101 can include one or more other components, such as one or more aperture stops. In general, the shape of the aperture stop can vary. Examples of aperture stops include circular aperture stops, elliptical aperture stops, and/or polygonal aperture stops. Apertures stops can also be positioned so that the image radiation makes a double pass or a single pass through the aperture stop. Aperture stops can be interchanged in projection objective 101 and/or may have an adjustable aperture.

In some embodiments, projection objective 101 includes a field stop. For example, in embodiments where projective objective includes an intermediate image, the field stop can be positioned at or near the intermediate image.

Embodiments can include baffles (e.g., to shield the wafer from stray radiation). In some embodiments, projection objective 101 can include components (e.g., interferometers) for monitoring changes in the position of mirrors within the projection objective. This information can be used to adjust the mirrors to correct for any relative movement between the mirrors. Mirror adjustment can be automated. Examples of systems for monitoring/adjusting mirror position are disclosed in U.S. Pat. No. 6,549,270 B1.

Figure 10:
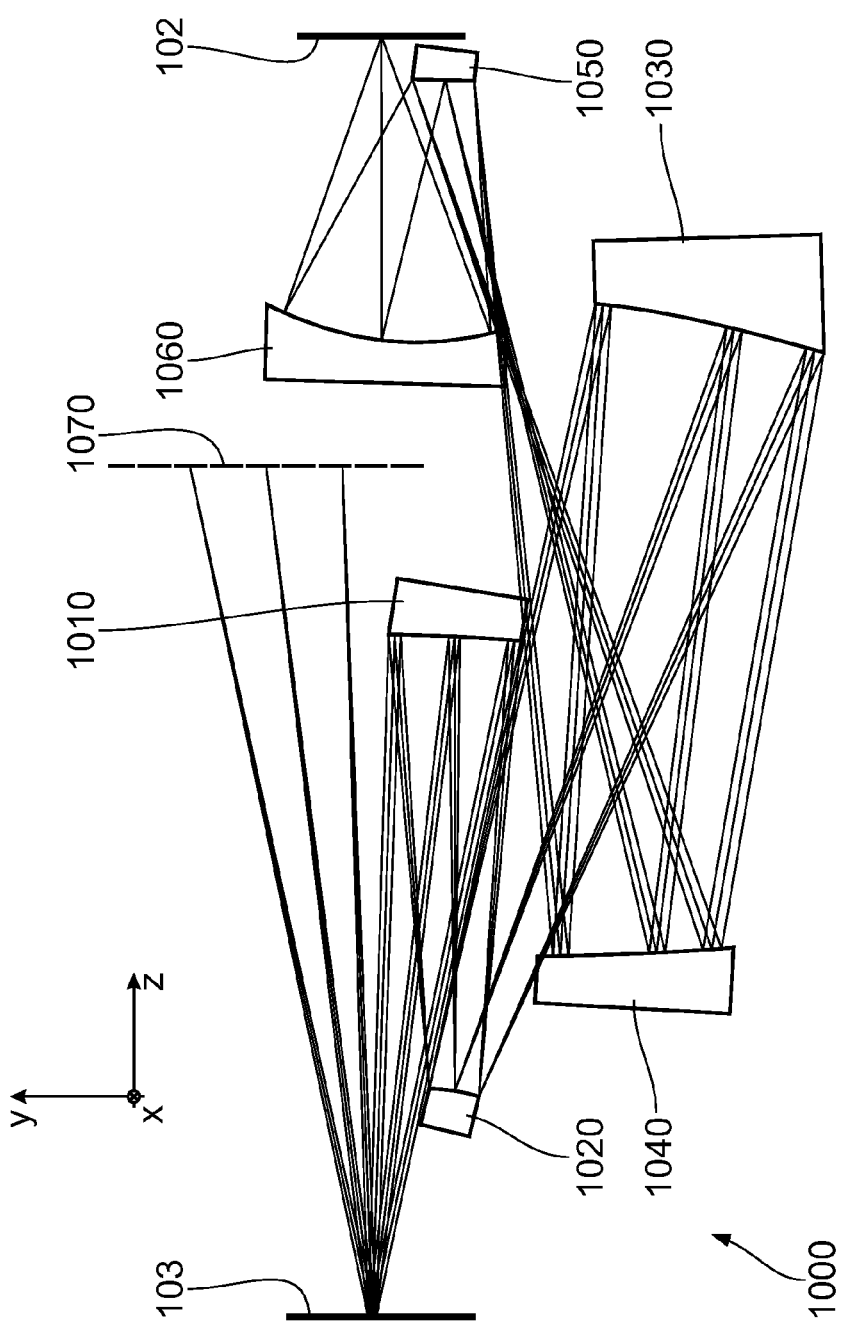
FIG. 10 is a cross-sectional view of a projection objective shown in meridional section.

Referring to FIG. 10, an embodiment of a projection objective 1000 includes six mirrors 1010, 1020, 1030, 1040, 1050, and 1060, and has an image-side numerical aperture of 0.35 and an operating wavelength of 13.5 nm. Mirrors 1010, 1020, 1030, 1040, 1050, and 1060 are all rotationally-asymmetric mirrors. Projection objective 1000 images radiation from object plane 103 to image plane 102 with a demagnification ratio of 4×. The tracklength of projection objective 1000 is 1,497 mm and the optical path length of imaged radiation is 4,760 mm. Accordingly, the ratio of the optical path length to tracklength is approximately 3.18.

The entrance pupil of projection objective 1000 is located 1,000 mm from object plane 103 with object plane positioned between the entrance pupil and the mirrors. Due to the reflective reticle positioned at object plane 103, an element of the illumination system can be positioned at location 1070, corresponding to the entrance pupil. The chief ray angle of the central field point at object plane 103 is 7°. The maximum variation of chief ray angles at object plane 103 is 0.82°.

Projection objective 1000 has a rectangular field. The image-side field width, $d_x$, is 26 mm. The image-side field length, $d_y$, is 2 mm. Projection objective 1000 has an object-image shift of 13 mm.

The performance of projection objective 1000 includes an image-side $W_{rms}$ of 0.021λ. Distortion is less than 10 nm, and image-side field curvature is 19 nm. Projection objective 1000 provides an intermediate image between mirrors 1040 and 1050. Coma at the intermediate image is relatively large. In particular, the distance between the chief ray and the upper and lower rays at the location where the upper and lower rays cross is 7 mm.

The optical power of the mirrors in the order of the radiation path from object plane 103 to image plane 102 is as follows: mirror 1010 has positive optical power; mirror 1020 has negative optical power; mirror 1030 has positive optical power; mirror 1040 has positive optical power; mirror 1050 has negative optical power; and mirror 1060 has positive optical power.

The dimension of the footprint of each mirror, given as $M_x \times M_y$, is as follows: 323 mm×152 mm for mirror 1010; 107 mm×59 mm for mirror 1020; 297 mm×261 mm for mirror 1030; 277 mm×194 mm for mirror 1040; 99 mm×72 mm for mirror 1050; and 268 mm×243 mm for mirror 1060.

The maximum deviation of mirror 1010 from a spherical rotationally-symmetric reference surface is 475 µm. Maximum deviation from a corresponding spherical rotationally-symmetric reference surface of mirrors 1020, 1030, 1040, 1050, and 1060 are 1,234 µm, 995 µm, 1,414 µm, 170 µm, and 416 µm, respectively. The maximum deviation of each mirror from a corresponding aspherical rotationally-symmetric reference surface is 236 µm, 102 µm, 102 µm, 148 µm, 54 µm, and 372 µm for mirrors 1010, 1020, 1030, 1040, 1050, and 1060, respectively.

The first and second mean curvature for mirror 1010 are $1.16 \times 10^{-3}$ and $1.05 \times 10^{-3}$ respectively. Respective first and second mean curvatures for the other mirrors in projection objective 1000 are as follows: $-3.02 \times 10^{-3}$ and $-1.13 \times 10^{-3}$ for mirror 1020; $5.97 \times 10^{-4}$ and $4.96 \times 10^{-4}$ for mirror 1030; $5.50 \times 10^{-4}$ and $3.63 \times 10^{-4}$ for mirror 1040; $-2.24 \times 10^{-3}$ and $-2.04 \times 10^{-3}$ for mirror 1050; and $2.57 \times 10^{-3}$ and $2.48 \times 10^{-3}$ for mirror 1060. The sum of the first mean curvature for projection objective 1000 is $-3.78 \times 10^{-4}$. The sum of the second mean curvature is $1.22 \times 10^{-3}$. The sum of the first and second mean curvatures is $8.45 \times 10^{-4}$ and the inverse sum of the first and second mean curvatures is $1.18 \times 10^3$.

The chief ray angle of incidence for the central field point is 3.40°, 9.86°, 6.48°, 10.13°, 13.66°, and 7.00° for mirrors 1010, 1020, 1030, 1040, 1050, and 1060, respectively. The maximum angle of incidence, $\theta_{max}$, on each mirror for the meridional section is 3.94°, 10.42°, 7.45°, 14.34°, 24.28°, and 8.61° for mirrors 1010, 1020, 1030, 1040, 1050, and 1060, respectively. Δθ for mirrors 1010, 1020, 1030, 1040, 1050, and 1060 are 1.13°, 2.74°, 3.42°, 9.96°, 23.69°, and 3.95°, respectively.

Mirrors 1010, 1020, 1030, 1050, and 1060 have freeboards that are more than 5 mm and less than 25 mm. Mirror 1030 has positive chief ray angle magnification while mirrors 1040 and 1050 have negative chief ray angle magnification.

The image-side free working distance of projection objective 1000 is 45 mm. The object-side free working distance is 252 mm.

In projection objective 1000, $d_{op-1}/d_{op-2}$ is 3.14. Furthermore, adjacent mirror pairs 1020 and 1030, 1030 and 1040, and 1040 and 1050 are separated by more than 50% of the projection objective's tracklength. Further, the distance between mirror 1010 and object plane 103 is more than 50% of the projection objective's tracklength.

Data for projection objective 1000 is presented in Table 2A and Table 2B below. The parameters and units for the parameters for Table 2A and 2B and subsequent tables are the same as the corresponding parameters and units presented in Table 1A and 1B above. Table 2A presents optical data, while Table 2B presents rotationally-asymmetric constants for each of the mirror surfaces. For the purposes of Table 2A and Table 2B, the mirror designations correlate as follows: mirror 1 (M1) corresponds to mirror 1010; mirror 2 (M2) corresponds to mirror 1020; mirror 3 (M3) corresponds to mirror 1030; mirror 4 (M4) corresponds to mirror 1040; mirror 5 (M5) corresponds to mirror 1050; and mirror 6 (M6) corresponds to mirror 1060.

TABLE 2A

| Surface | Radius (mm) | Spacing (mm) | Mode |
|---|---|---|---|
| Object | INFINITY | 788.884 | |
| Mirror 1 | −651.356 | −537.372 | REFL |
| Mirror 2 | −463.216 | 952.014 | REFL |
| Mirror 3 | −1710.243 | −783.854 | REFL |
| Mirror 4 | 1821.345 | 1032.444 | REFL |
| Mirror 5 | 309.420 | −306.504 | REFL |
| Mirror 6 | 405.847 | 351.549 | REFL |
| Image | INFINITY | 0.000 | |

TABLE 2B

| Coefficient | M1 | M2 | M3 | M4 | M5 | M6 |
|---|---|---|---|---|---|---|
| K | −5.925412E−01 | 1.525505E+00 | −1.851822E+00 | 3.314097E+00 | 1.983829E+00 | 2.009323E−01 |
| Y | 0.000000E+00 | 0.000000E+00 | 0.000000E+00 | 0.000000E+00 | 0.000000E+00 | 0.000000E+00 |
| $X^2$ | 2.471303E−04 | 6.505963E−04 | 7.593410E−05 | 2.922157E−05 | −4.716078E−04 | 1.426720E−05 |
| $Y^2$ | 1.863347E−04 | 6.677442E−05 | −2.868206E−05 | −7.428048E−05 | −3.446472E−04 | 5.312976E−05 |
| $X^2Y$ | −3.545294E−08 | −2.891983E−06 | 1.048420E−07 | 9.891278E−08 | 2.877558E−06 | −2.714955E−08 |
| $Y^3$ | −1.873281E−08 | −3.078489E−06 | −7.296056E−08 | −3.920160E−08 | 1.288669E−06 | −9.898583E−09 |
| $X^4$ | 1.180642E−11 | 3.342373E−10 | −3.287877E−11 | −8.971583E−11 | 3.862440E−10 | −8.982825E−11 |
| $X^2Y^2$ | 3.437144E−11 | 5.937123E−09 | −2.687658E−11 | −7.769409E−11 | 1.693138E−08 | 2.462964E−11 |
| $Y^4$ | 9.863178E−11 | −2.340521E−08 | −1.605207E−10 | −1.806038E−10 | −2.208217E−09 | −3.099379E−11 |
| $X^4Y$ | −4.051355E−14 | 1.381955E−13 | −2.895532E−14 | 5.170900E−14 | 4.797213E−11 | −4.214964E−14 |
| $X^2Y^3$ | −2.144219E−13 | −2.531232E−11 | −1.637831E−13 | 2.916068E−13 | 1.961281E−10 | −3.785260E−14 |
| $Y^5$ | −2.415401E−14 | 1.279499E−10 | −7.226386E−14 | 1.273503E−13 | 2.976407E−11 | 4.394992E−14 |
| $X^6$ | −2.920211E−17 | 1.949737E−14 | −1.774795E−17 | −2.785422E−16 | 8.466233E−14 | −5.281246E−16 |
| $X^4Y^2$ | 7.135583E−17 | −6.187267E−13 | −2.447653E−16 | −1.867205E−16 | 3.921385E−13 | −5.767253E−16 |
| $X^2Y^4$ | 5.606882E−16 | 4.378172E−13 | −4.812153E−16 | 4.588123E−16 | 7.309790E−13 | −7.534000E−17 |
| $Y^6$ | −7.879310E−16 | −6.710705E−13 | 6.992795E−19 | 3.331795E−16 | −3.185164E−13 | −9.186437E−17 |
| $X^6Y$ | 2.435160E−20 | −3.445743E−16 | −3.254844E−19 | −4.053237E−18 | 1.681642E−15 | −7.144774E−20 |
| $X^4Y^3$ | −1.325499E−18 | 2.205904E−15 | −4.637731E−19 | −1.132243E−18 | 6.530207E−15 | −1.155827E−19 |
| $X^2Y^5$ | 2.538976E−18 | 7.780251E−15 | −5.473994E−19 | 9.042940E−19 | 5.583512E−15 | 1.826925E−19 |
| $Y^7$ | 6.001333E−18 | 7.757557E−15 | −8.424804E−21 | 7.805993E−20 | −2.390583E−15 | 3.562442E−19 |
| $X^8$ | −2.140710E−22 | −1.536511E−18 | −5.293518E−23 | −7.757919E−22 | 1.098261E−18 | −2.871286E−21 |
| $X^6Y^2$ | −2.383343E−21 | −3.017606E−17 | −2.564847E−21 | −2.918509E−20 | −1.382527E−17 | −5.946767E−21 |
| $X^4Y^4$ | 4.328735E−21 | −3.407893E−17 | −3.923488E−22 | −6.995732E−21 | 2.738740E−17 | −2.968388E−21 |
| $X^2Y^6$ | −4.831336E−20 | −1.206126E−16 | −1.673186E−22 | 5.920827E−22 | 4.911090E−17 | 8.147751E−22 |
| $Y^8$ | −3.800647E−20 | −6.246834E−17 | −5.575611E−23 | −7.691743E−22 | −4.049646E−18 | −1.438562E−21 |
| $X^8Y$ | 2.973276E−24 | 6.697817E−20 | −9.383994E−25 | −1.349984E−23 | 8.777395E−22 | −9.763800E−25 |
| $X^6Y^3$ | 1.179538E−23 | 5.201215E−19 | −6.639018E−24 | −8.645373E−23 | −3.199889E−19 | −4.878981E−24 |
| $X^4Y^5$ | −1.203834E−23 | −4.705218E−20 | −1.462557E−25 | −1.508808E−23 | 8.645921E−20 | −3.908340E−24 |
| $X^2Y^7$ | 2.304206E−22 | 1.208243E−19 | 2.562699E−25 | 1.368282E−24 | 4.649092E−19 | 2.276452E−24 |
| $Y^9$ | 1.418250E−22 | −1.077428E−19 | 7.645118E−27 | −3.895996E−25 | 1.402632E−20 | 5.582547E−24 |
| $X^{10}$ | 4.021654E−28 | 2.141815E−23 | −3.668876E−27 | −1.991462E−26 | 1.059359E−22 | −2.694594E−26 |
| $X^8Y^2$ | −1.314266E−26 | −8.696134E−22 | −1.671744E−27 | −1.358518E−26 | −2.330392E−22 | −7.617627E−26 |
| $X^6Y^4$ | −7.356431E−27 | −3.656759E−21 | −5.748164E−27 | −9.269087E−26 | −2.103517E−21 | −6.065950E−26 |
| $X^4Y^6$ | 1.059736E−26 | 3.564328E−22 | −1.527905E−28 | −1.292503E−26 | −3.644105E−22 | 1.700246E−26 |
| $X^2Y^8$ | −3.817918E−25 | 2.574506E−21 | 1.902672E−28 | 1.728267E−27 | 1.530993E−21 | 1.267011E−26 |
| $Y^{10}$ | −2.256936E−25 | 1.804566E−21 | 1.126083E−29 | −2.712119E−28 | −1.135939E−22 | −1.049025E−26 |
| Nradius | 1.00E+00 | 1.00E+00 | 1.00E+00 | 1.00E+00 | 1.00E+00 | 1.00E+00 |
| Y-decenter | −141.222 | −91.036 | 45.162 | −4.535 | −0.554 | −8.496 |
| X-rotation | −9.184 | −15.081 | 1.443 | −3.391 | −6.975 | −1.780 |

Figure 11:
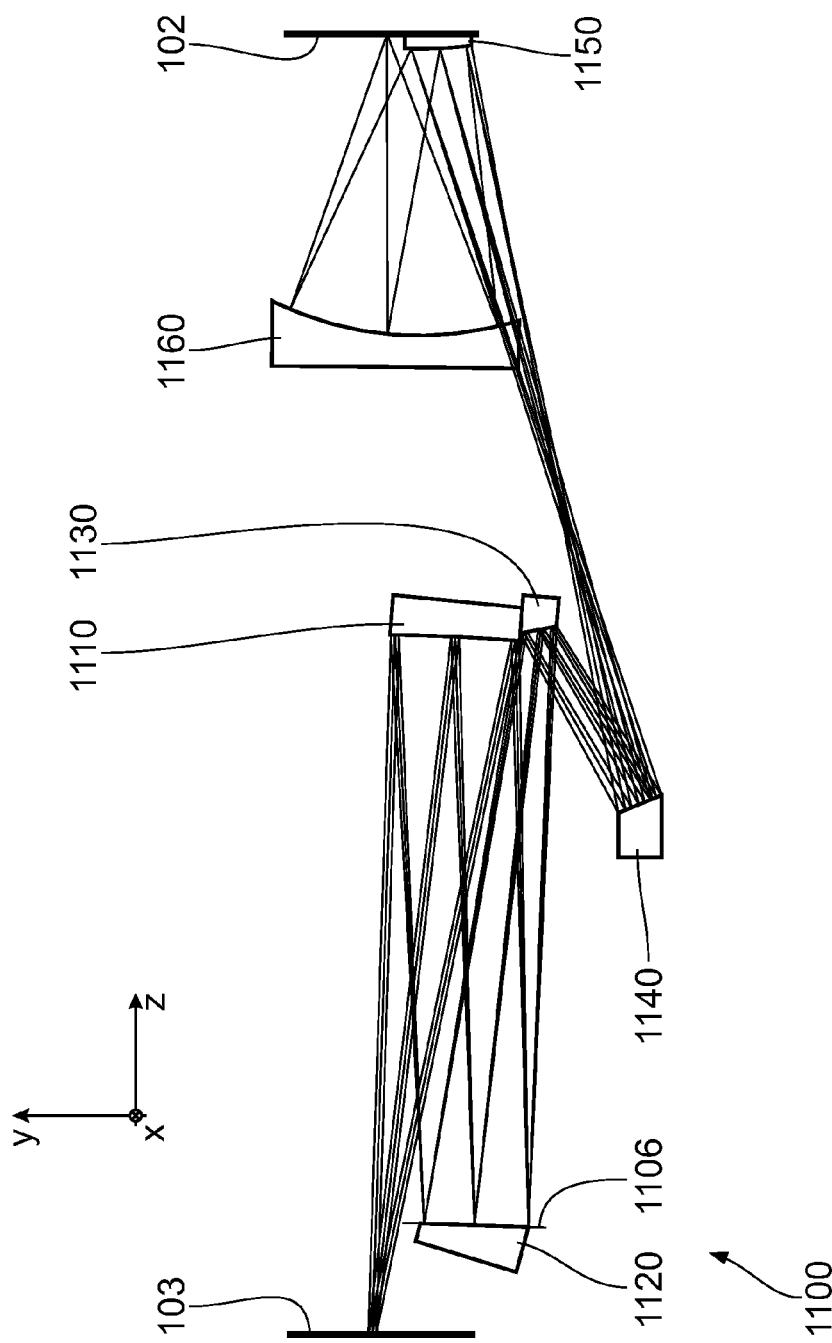
FIG. 11 is a cross-sectional view of a projection objective shown in meridional section.

Referring to FIG. 11, an embodiment of a projection objective 1000 includes six mirrors 1110, 1120, 1130, 1140, 1150, and 1160, and has an image-side numerical aperture of 0.35 and an operating wavelength of 13.5 nm. Mirrors 1110, 1120, 1130, 1140, 1150, and 1160 are all rotationally-asymmetric mirrors. Projection objective 1100 images radiation from object plane 103 to image plane 102 with a demagnification ratio of 4×. The tracklength of projection objective 1100 is 2,000 mm and the optical path length of imaged radiation is 5,337 mm. Accordingly, the ratio of the optical path length to tracklength is approximately 2.67. Projection objective 1100 has an aperture stop 1106 positioned at mirror 1120.

The entrance pupil of projection objective 1100 is located at infinity. The chief ray angle of the central field point at object plane 103 is 7°. The maximum variation of chief ray angles at object plane 103 is less than 0.06°.

Projection objective 1100 has a rectangular field. The image-side field width, $d_x$, is 26 mm. The image-side field length, $d_y$, is 2 mm. Projection objective 1100 has an object-image shift of 31 mm.

The performance of projection objective 1100 includes an image-side $W_{rms}$ of 0.025λ. Image-side field curvature is 10 nm. Projection objective 1100 provides an intermediate image between mirrors 1140 and 1150.

The optical power of the mirrors in the order of the radiation path from object plane 103 to image plane 102 is as follows: mirror 1110 has positive optical power; mirror 1120 has positive optical power; mirror 1130 has negative optical power; mirror 1140 has positive optical power; mirror 1150 has negative optical power; and mirror 1160 has positive optical power.

The dimension of the footprint of each mirror, given as $M_x \times M_y$, is as follows: 291 mm×195 mm for mirror 1110; 159 mm×152 mm for mirror 1120; 157 mm×53 mm for mirror 1130; 295 mm×66 mm for mirror 1140; 105 mm×86 mm for mirror 1150; and 345 mm×318 mm for mirror 1160.

The chief ray angle of incidence for the central field point is 4.38°, 4.03°, 18.37°, 7.74°, 12.64°, and 5.17° for mirrors

1110, 1120, 1130, 1140, 1150, and 1160, respectively. The maximum angle of incidence, $\theta_{max}$, on each mirror for the meridional section is 6.48°, 6.44°, 20.05°, 9.12°, 21.76°, and 7.22° for mirrors 1110, 1120, 1130, 1140, 1150, and 1160, respectively. $\Delta\theta$ for mirrors 1110, 1120, 1130, 1140, 1150, and 1160 are 4.27°, 4.92°, 4.09°, 3.12°, 19.37°, and 4.61°, respectively.

Mirrors 1110, 1150, and 1160 have freeboards that are more than 5 mm and less than 25 mm. Mirror 1140 has positive chief ray angle magnification while mirrors 1110, 1120, 1130, and 1150 have negative chief ray angle magnification.

The image-side free working distance of projection objective 1100 is 25 mm. The object-side free working distance is 163 mm.

mirror 4 (M4) corresponds to mirror 1140; mirror 5 (M5) corresponds to mirror 1150; and mirror 6 (M6) corresponds to mirror 1160.

TABLE 3A

| Surface | Radius (mm) | Spacing (mm) | Mode |
|---|---|---|---|
| Object | INFINITY | 1070.002 | |
| Mirror 1 | −2069.710 | −907.121 | REFL |
| Mirror 2 | 1710.596 | 0.000 | REFL |
| STOP | INFINITY | 907.500 | |
| Mirror 3 | 414.111 | −319.107 | REFL |
| Mirror 4 | 618.022 | 1223.709 | REFL |
| Mirror 5 | 406.139 | −436.552 | REFL |
| Mirror 6 | 522.609 | 461.570 | REFL |
| Image | INFINITY | 0.000 | |

TABLE 3B

| Coefficient | M1 | M2 | M3 | M4 | M5 | M6 |
|---|---|---|---|---|---|---|
| K | −2.012543E+00 | −7.790981E+00 | −9.061196E−01 | −4.714699E−01 | 5.253415E+00 | 1.051556E−01 |
| Y | −1.801229E−01 | −2.676895E−01 | 6.249715E−03 | 2.914352E−02 | 3.699848E−02 | 6.762162E−04 |
| $X^2$ | −3.718177E−05 | −1.568640E−04 | −4.213586E−04 | −1.680785E−04 | −6.132874E−05 | 2.479745E−06 |
| $Y^2$ | −5.757281E−05 | −1.359112E−04 | −3.015850E−04 | −9.908817E−05 | −6.383717E−05 | 1.909227E−06 |
| $X^2Y$ | −3.283304E−08 | −1.421641E−07 | −4.802304E−08 | −4.234719E−08 | 5.460366E−07 | −5.398408E−09 |
| $Y^3$ | −7.289267E−08 | −9.447144E−08 | 3.714670E−07 | 1.405667E−07 | 2.644773E−08 | −4.741511E−09 |
| $X^4$ | −3.792148E−11 | 2.173390E−10 | −8.723035E−10 | −2.377992E−11 | 1.030821E−09 | −1.926536E−11 |
| $X^2Y^2$ | −1.087876E−10 | 5.689855E−10 | −5.959943E−10 | −4.401654E−10 | 2.045233E−09 | −4.586698E−11 |
| $Y^4$ | −1.237594E−10 | 2.990476E−10 | 8.549602E−10 | −4.022663E−11 | 5.551510E−11 | −2.632066E−11 |
| $X^4Y$ | −3.587007E−14 | −1.028868E−12 | −8.033093E−12 | 1.716353E−13 | 5.551826E−12 | −2.577816E−14 |
| $X^2Y^3$ | 8.925822E−14 | 4.492952E−13 | −1.186636E−12 | −7.545064E−13 | −4.309344E−12 | −1.775797E−14 |
| $Y^5$ | −7.423435E−14 | 5.791519E−13 | 8.705928E−14 | −2.700779E−13 | −7.302230E−12 | −9.309635E−15 |
| $X^6$ | 1.876383E−17 | 2.916278E−16 | −2.307341E−14 | −1.670466E−15 | 8.878140E−15 | −3.351380E−17 |
| $X^4Y^2$ | −3.009967E−16 | −3.620666E−16 | −2.232847E−15 | 1.589023E−15 | 4.463758E−14 | −1.408427E−16 |
| $X^2Y^4$ | 1.992400E−16 | 3.916129E−16 | 1.756497E−15 | 3.477633E−16 | 1.478648E−13 | −1.372823E−16 |
| $Y^6$ | 8.315953E−18 | −6.580116E−16 | 8.232062E−16 | 1.253553E−16 | 3.691569E−14 | −3.799352E−17 |
| $X^6Y$ | −2.621825E−20 | −1.237101E−17 | −3.125465E−16 | −7.682746E−18 | 3.293829E−16 | −1.214309E−19 |
| $X^4Y^3$ | −1.344388E−18 | 3.730815E−17 | 1.376670E−16 | 5.918289E−18 | 8.409538E−16 | 5.369262E−20 |
| $X^2Y^5$ | −6.157858E−19 | 3.202677E−17 | 4.387074E−19 | 2.707480E−18 | 4.875870E−16 | −1.363873E−20 |
| $Y^7$ | 2.770009E−20 | 8.487049E−18 | 2.518948E−18 | 1.820744E−19 | 1.274511E−16 | 2.776746E−21 |
| $X^8$ | 2.265356E−23 | −1.881878E−20 | 6.916970E−19 | 3.815768E−20 | −1.030207E−19 | −2.085793E−23 |
| $X^6Y^2$ | −1.848041E−22 | −1.667898E−19 | −1.070800E−18 | 1.947584E−20 | −6.071205E−19 | −1.191227E−22 |
| $X^4Y^4$ | −1.617091E−21 | −4.471313E−20 | −2.039154E−19 | −1.469302E−21 | 8.581801E−18 | −2.848570E−22 |
| $X^2Y^6$ | −1.152811E−21 | −1.417078E−19 | −4.885470E−20 | 8.329380E−22 | 2.867618E−18 | 8.073429E−24 |
| $Y^8$ | 5.021478E−23 | −1.270497E−20 | −2.834042E−20 | −1.011971E−21 | 1.813992E−18 | −6.757839E−23 |
| $X^8Y$ | 0.000000E+00 | 0.000000E+00 | 7.973679E−21 | 2.492982E−22 | 0.000000E+00 | −2.465296E−25 |
| $X^6Y^3$ | 0.000000E+00 | 0.000000E+00 | 7.629111E−22 | 1.401277E−22 | 0.000000E+00 | 2.930653E−25 |
| $X^4Y5$ | 0.000000E+00 | 0.000000E+00 | −7.196032E−21 | −4.219890E−23 | 0.000000E+00 | 1.194933E−25 |
| $X^2Y^7$ | 0.000000E+00 | 0.000000E+00 | −1.090375E−22 | −3.791571E−24 | 0.000000E+00 | 5.412579E−25 |
| $Y^9$ | 0.000000E+00 | 0.000000E+00 | −5.080252E−23 | 1.076602E−24 | 0.000000E+00 | 3.891280E−26 |
| $X^{10}$ | 0.000000E+00 | 0.000000E+00 | −6.129418E−25 | −1.289913E−27 | 0.000000E+00 | 0.000000E+00 |
| $X^8Y^2$ | 0.000000E+00 | 0.000000E+00 | 2.295090E−23 | 4.078311E−25 | 0.000000E+00 | 0.000000E+00 |
| $X^6Y^4$ | 0.000000E+00 | 0.000000E+00 | 5.951785E−24 | 1.728297E−25 | 0.000000E+00 | 0.000000E+00 |
| $X^4Y^6$ | 0.000000E+00 | 0.000000E+00 | −1.732732E−23 | −5.280557E−26 | 0.000000E+00 | 0.000000E+00 |
| $X^2Y^8$ | 0.000000E+00 | 0.000000E+00 | 0.000000E+00 | −1.410994E−27 | 0.000000E+00 | 0.000000E+00 |
| $Y^{10}$ | 0.000000E+00 | 0.000000E+00 | 0.000000E+00 | 3.484416E−27 | 0.000000E+00 | 0.000000E+00 |
| Nradius | 1.000000E+00 | 1.000000E+00 | 1.000000E+00 | 1.000000E+00 | 1.000000E+00 | 1.000000E+00 |
| Y-decenter | 194.936 | −49.734 | 36.609 | 9.442 | 30.019 | 40.956 |
| X-rotation | −5.944 | −17.277 | −5.569 | −0.579 | 0.301 | −0.924 |

In projection objective 1100, $d_{op-1}/d_{op-2}$ is 6.57. Furthermore, adjacent mirror pair 1040 and 1050 are separated by more than 50% of the projection objective's tracklength. Further, the distance between mirror 1110 and object plane 103 is more than 50% of the projection objective's tracklength.

Figure 12:
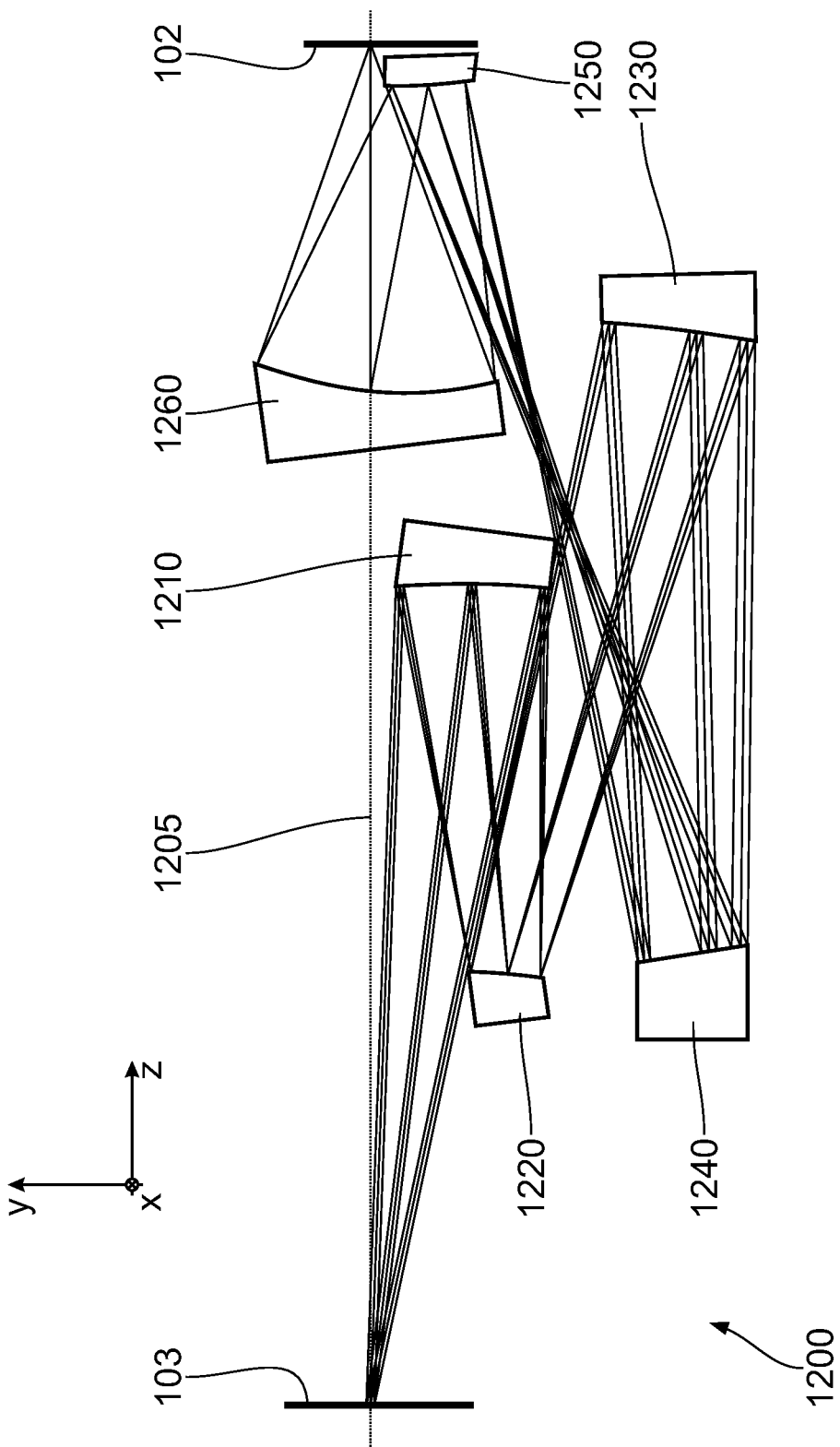
FIG. 12 is a cross-sectional view of a projection objective shown in meridional section.

Data for projection objective 1100 is presented in Table 3A and Table 3B below. Table 3A presents optical data, while Table 3B presents aspherical constants for each of the mirror surfaces. For the purposes of Table 3A and Table 3B, the mirror designations correlate as follows: mirror 1 (M1) corresponds to mirror 1110; mirror 2 (M2) corresponds to mirror 1120; mirror 3 (M3) corresponds to mirror 1130;

Referring to FIG. 12, an embodiment of a projection objective 1200 includes six mirrors 1210, 1220, 1230, 1240, 1250, and 1260, and has an image-side numerical aperture of 0.35 and an operating wavelength of 13.5 nm. Mirrors 1210, 1220, 1230, 1240, 1250, and 1260 are all rotationally-asymmetric mirrors. Projection objective 1200 images radiation from object plane 103 to image plane 102 with a demagnification ratio of 4×. A reference axis 1205, orthogonal to object plane 103 and image plane 102 intersects corresponding field points in the object and image fields. The tracklength of projection objective 1200 is 1,385 mm and the optical path length of imaged radiation is 4,162 mm. Accordingly, the ratio of the optical path length to tracklength is approximately 3.01. Projection objective 1200 has an aperture stop positioned at mirror 1220.

The entrance pupil of projection objective 1200 is at infinity with object plane positioned between the entrance pupil and the mirrors. The chief ray angle of the central field point at object plane 103 is 7°. The maximum variation of chief ray angles at object plane 103 is less than 0.06°.

Projection objective 1200 has a rectangular field. The image-side field width, $d_x$, is 26 mm. The image-side field length, $d_y$, is 2 mm. Projection objective 1200 has zero object-image shift.

Projection objective 1200 provides an intermediate image between mirrors 1240 and 1250.

The optical power of the mirrors in the order of the radiation path from object plane 103 to image plane 102 is as follows: mirror 1210 has positive optical power; mirror 1220 has negative optical power; mirror 1230 has positive optical power; mirror 1240 has positive optical power; mirror 1250 has negative optical power; and mirror 1260 has positive optical power.

The dimension of the footprint of each mirror, given as $M_x \times M_y$, is as follows: 250 mm×153 mm for mirror 1210; 70 mm×69 mm for mirror 1020; 328 mm×153 mm for mirror 1230; 325 mm×112 mm for mirror 1240; 87 mm×75 mm for mirror 1250; and 269 mm×238 mm for mirror 1260.

The chief ray angle of incidence for the central field point is 6.13°, 10.61°, 8.65°, 8.26°, 14.22°, and 5.23° for mirrors 1210, 1220, 1230, 1240, 1250, and 1260, respectively. The maximum angle of incidence, $\theta_{max}$, on each mirror for the meridional section is 6.53°, 11.63°, 8.91°, 11.39°, 24.26°, and 7.44° for mirrors 1210, 1220, 1230, 1240, 1250, and 1260, respectively. $\Delta\theta$ for mirrors 1210, 1220, 1230, 1240, 1250, and 1260 are 1.07°, 3.64°, 1.74°, 7.44°, 21.70°, and 4.51°, respectively.

Mirrors 1210, 1220, 1250, and 1260 have freeboards that are more than 5 mm and less than 25 mm. Mirror 1240 has positive chief ray angle magnification while mirrors 1210, 1220, 1230, and 1250 have negative chief ray angle magnification.

The image-side free working distance of projection objective 1200 is 40 mm. The object-side free working distance is 439 mm.

In projection objective 1200, $d_{op-1}/d_{op-2}$ is 1.91. Furthermore, adjacent mirror pair 1240 and 1250 are separated by more than 50% of the projection objective's tracklength. Further, the distance between mirror 1210 and object plane 103 is more than 50% of the projection objective's tracklength.

Data for projection objective 1200 is presented in Table 4A and Table 4B below. Table 4A presents optical data, while Table 4B presents aspherical constants for each of the mirror surfaces. For the purposes of Table 4A and Table 4B, the mirror designations correlate as follows: mirror 1 (M1) corresponds to mirror 1210; mirror 2 (M2) corresponds to mirror 1220; mirror 3 (M3) corresponds to mirror 1230; mirror 4 (M4) corresponds to mirror 1240; mirror 5 (M5) corresponds to mirror 1250; and mirror 6 (M6) corresponds to mirror 1260.

TABLE 4A

| Surface | Radius (mm) | Spacing (mm) | Mode |
| --- | --- | --- | --- |
| Object | INFINITY | 836.375 | |
| Mirror 1 | −614.878 | −397.397 | REFL |
| Mirror 2 | −383.358 | 0.000 | REFL |
| STOP | INFINITY | 655.992 | |
| Mirror 3 | −1204.989 | −659.631 | REFL |
| Mirror 4 | 1885.915 | 909.840 | REFL |
| Mirror 5 | 302.954 | −308.805 | REFL |
| Mirror 6 | 403.492 | 348.850 | REFL |
| Image | INFINITY | 0.000 | |

TABLE 4B

| Coefficient | M1 | M2 | M3 | M4 | M5 | M6 |
| --- | --- | --- | --- | --- | --- | --- |
| K | −6.673329E−01 | −2.825442E−01 | −1.843864E+00 | 2.076932E+00 | 3.340547E+00 | 1.990979E−01 |
| Y | −5.045837E−02 | 2.263660E−01 | −1.277806E−01 | −3.310548E−02 | −1.935522E−01 | 1.783092E−02 |
| $X^2$ | 1.827144E−04 | 1.686990E−04 | 9.963384E−05 | 5.203052E−05 | −3.849892E−04 | 3.792405E−05 |
| $Y^2$ | 1.737812E−04 | 2.093994E−04 | −1.747764E−05 | −7.184095E−05 | −3.329705E−04 | 1.662759E−05 |
| $X^2Y$ | 4.765150E−08 | −1.595967E−06 | −5.515151E−08 | −8.752119E−10 | 1.213426E−06 | 5.552151E−08 |
| $Y^3$ | 5.091508E−08 | −1.231538E−06 | −1.294839E−07 | −1.939381E−07 | 1.502735E−06 | 9.165146E−08 |
| $X^4$ | −4.718889E−11 | −6.941238E−09 | −7.002011E−11 | −5.996832E−11 | −2.342602E−09 | 9.552648E−12 |
| $X^2Y^2$ | −4.340357E−11 | −7.827867E−09 | −1.801185E−10 | −7.139217E−11 | −1.234047E−08 | −1.611525E−10 |
| $Y^4$ | 1.234053E−10 | −3.130174E−09 | −7.281275E−11 | −1.598859E−10 | −1.206604E−08 | −1.662004E−10 |
| $X^4Y$ | 1.205203E−13 | −6.495768E−11 | −3.614883E−14 | −4.344276E−14 | 2.268270E−11 | 2.930397E−13 |
| $X^2Y^3$ | 2.259661E−13 | −4.304439E−11 | −1.048629E−13 | −7.811421E−16 | 2.977954E−11 | 8.493936E−13 |
| $Y^5$ | −5.198478E−13 | −1.485266E−11 | 5.022687E−15 | −1.422459E−14 | −1.556209E−11 | 4.051187E−13 |
| $X^6$ | −1.306395E−16 | −4.159695E−14 | 0.000000E+00 | −3.767576E−17 | 1.374773E−14 | −9.890588E−17 |
| $X^4Y^2$ | 8.838986E−17 | 1.462867E−14 | 0.000000E+00 | −1.369883E−16 | −3.320990E−13 | −1.312584E−15 |
| $X^2Y^4$ | −1.745854E−16 | 4.353978E−13 | 0.000000E+00 | −7.920443E−17 | −1.008910E−13 | −2.069868E−15 |
| $Y^6$ | 1.020155E−15 | −1.927189E−13 | 0.000000E+00 | −3.431888E−17 | −9.148646E−14 | −6.650861E−16 |
| $X^6Y$ | 1.090627E−19 | 0.000000E+00 | 0.000000E+00 | 0.000000E+00 | 0.000000E+00 | 1.607288E−18 |
| $X^4Y^3$ | −4.158749E−19 | 0.000000E+00 | 0.000000E+00 | 0.000000E+00 | 0.000000E+00 | 4.652411E−18 |
| $X^2Y^5$ | −1.758731E−18 | 0.000000E+00 | 0.000000E+00 | 0.000000E+00 | 0.000000E+00 | 4.087290E−18 |
| $Y^7$ | −3.081679E−18 | 0.000000E+00 | 0.000000E+00 | 0.000000E+00 | 0.000000E+00 | 9.802736E−19 |
| $X^8$ | 0.000000E+00 | 0.000000E+00 | 0.000000E+00 | 0.000000E+00 | 0.000000E+00 | 0.000000E+00 |
| $X^6Y^2$ | 0.000000E+00 | 0.000000E+00 | 0.000000E+00 | 0.000000E+00 | 0.000000E+00 | 0.000000E+00 |
| $X^4Y^4$ | 0.000000E+00 | 0.000000E+00 | 0.000000E+00 | 0.000000E+00 | 0.000000E+00 | 0.000000E+00 |
| $X^2Y^6$ | 0.000000E+00 | 0.000000E+00 | 0.000000E+00 | 0.000000E+00 | 0.000000E+00 | 0.000000E+00 |
| $Y^8$ | 0.000000E+00 | 0.000000E+00 | 0.000000E+00 | 0.000000E+00 | 0.000000E+00 | 0.000000E+00 |
| $X^8Y$ | 0.000000E+00 | 0.000000E+00 | 0.000000E+00 | 0.000000E+00 | 0.000000E+00 | 0.000000E+00 |
| $X^6Y^3$ | 0.000000E+00 | 0.000000E+00 | 0.000000E+00 | 0.000000E+00 | 0.000000E+00 | 0.000000E+00 |
| $X^4Y5$ | 0.000000E+00 | 0.000000E+00 | 0.000000E+00 | 0.000000E+00 | 0.000000E+00 | 0.000000E+00 |

TABLE 4B-continued

| Coefficient | M1 | M2 | M3 | M4 | M5 | M6 |
|---|---|---|---|---|---|---|
| $X^2Y^7$ | 0.000000E+00 | 0.000000E+00 | 0.000000E+00 | 0.000000E+00 | 0.000000E+00 | 0.000000E+00 |
| $Y^9$ | 0.000000E+00 | 0.000000E+00 | 0.000000E+00 | 0.000000E+00 | 0.000000E+00 | 0.000000E+00 |
| $X^{10}$ | 0.000000E+00 | 0.000000E+00 | 0.000000E+00 | 0.000000E+00 | 0.000000E+00 | 0.000000E+00 |
| $X^8Y^2$ | 0.000000E+00 | 0.000000E+00 | 0.000000E+00 | 0.000000E+00 | 0.000000E+00 | 0.000000E+00 |
| $X^6Y^4$ | 0.000000E+00 | 0.000000E+00 | 0.000000E+00 | 0.000000E+00 | 0.000000E+00 | 0.000000E+00 |
| $X^4Y^6$ | 0.000000E+00 | 0.000000E+00 | 0.000000E+00 | 0.000000E+00 | 0.000000E+00 | 0.000000E+00 |
| $X^2Y^8$ | 0.000000E+00 | 0.000000E+00 | 0.000000E+00 | 0.000000E+00 | 0.000000E+00 | 0.000000E+00 |
| $Y^{10}$ | 0.000000E+00 | 0.000000E+00 | 0.000000E+00 | 0.000000E+00 | 0.000000E+00 | 0.000000E+00 |
| Nradius | 1.00E+00 | 1.00E+00 | 1.00E+00 | 1.00E+00 | 1.00E+00 | 1.00E+00 |
| Y-decenter | −118.847 | −100.000 | 100.000 | 24.472 | −11.760 | −37.772 |
| X-rotation | −7.782 | 7.388 | 1.406 | −2.140 | −8.177 | 6.989 |

Figure 13:
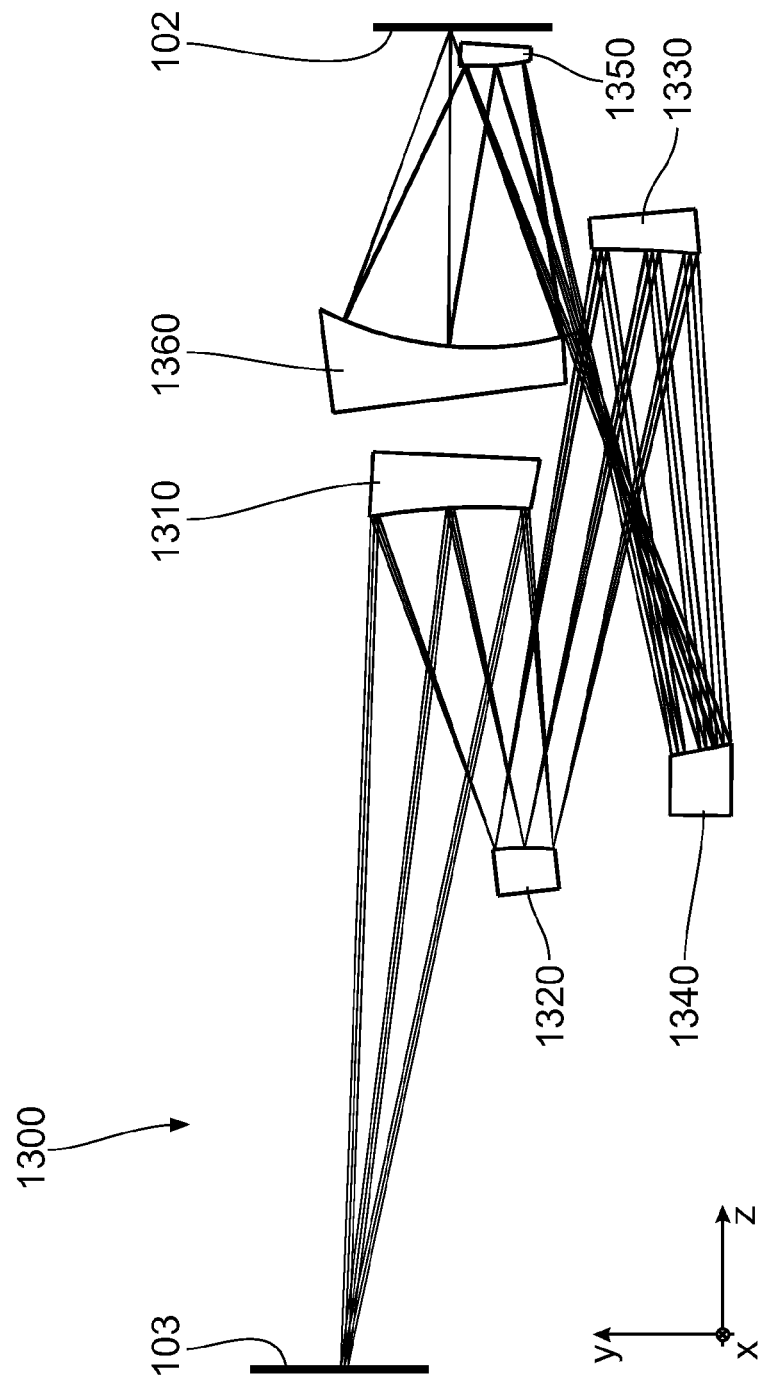
FIG. 13 is a cross-sectional view of a projection objective shown in meridional section.

Referring to FIG. 13, an embodiment of a projection objective 1300 includes six mirrors 1310, 1320, 1330, 1340, 1350, and 1360, and has an image-side numerical aperture of 0.35 and an operating wavelength of 13.5 nm. Mirrors 1310, 1320, 1330, 1340, 1350, and 1360 are all rotationally-asymmetric mirrors. Projection objective 1300 images radiation from object plane 103 to image plane 102 with a demagnification ratio of 4×. The tracklength of projection objective 1300 is 1,500 mm and the optical path length of imaged radiation is 4,093 mm. Accordingly, the ratio of the optical path length to tracklength is approximately 2.73. Projection objective 1300 has an aperture stop positioned at mirror 1320.

The entrance pupil of projection objective 1300 is at infinity. The chief ray angle of the central field point at object plane 103 is 7°. The maximum variation of chief ray angles at object plane 103 is less than 0.1°.

Projection objective 1300 has a rectangular field. The image-side field width, $d_x$, is 26 mm. The image-side field length, $d_y$, is 2 mm. Projection objective 1000 has an object-image shift of 119 mm.

Projection objective 1300 provides an intermediate image between mirrors 1340 and 1350.

The optical power of the mirrors in the order of the radiation path from object plane 103 to image plane 102 is as follows: mirror 1310 has positive optical power; mirror 1320 has negative optical power; mirror 1330 has positive optical power; mirror 1340 has positive optical power; mirror 1350 has negative optical power; and mirror 1360 has positive optical power.

The dimension of the footprint of each mirror, given as $M_x \times M_y$, is as follows: 271 mm×273 mm for mirror 1310; 69 mm×65 mm for mirror 1320; 290 mm×115 mm for mirror 1330; 272 mm×66 mm for mirror 1340; 81 mm×67 mm for mirror 1350; and 274 mm×243 mm for mirror 1360.

The chief ray angle of incidence for the central field point is 9.66°, 12.15°, 9.10°, 5.45°, 13.31°, and 4.60° for mirrors 1310, 1320, 1330, 1340, 1350, and 1360, respectively. The maximum angle of incidence, $\theta_{max}$, on each mirror for the meridional section is 11.20°, 15.46°, 9.63°, 8.64°, 23.31°, and 6.17° for mirrors 1310, 1320, 1330, 1340, 1350, and 1360, respectively. $\Delta\theta$ for mirrors 1310, 1320, 1330, 1340, 1350, and 1360 are 3.25°, 7.32°, 1.57°, 6.92°, 21.18°, and 3.63°, respectively.

Mirror 1340 has positive chief ray angle magnification while mirrors 1310, 1320, 1330, and 1350 have negative chief ray angle magnification.

The image-side free working distance of projection objective 1300 is 40 mm. The object-side free working distance is 582 mm, which provides a lot of space for components of the illumination system, such as additional folding mirrors and/or uniformity filters, for example.

In projection objective 1300, $d_{op-1}/d_{op-2}$ is 1.63. Furthermore, adjacent mirror pairs 1340 and 1350 is separated by more than 50% of the projection objective's tracklength. Further, the distance between mirror 1310 and object plane 103 is more than 50% of the projection objective's tracklength.

Data for projection objective 1300 is presented in Table 5A and Table 5B below. Table 5A presents optical data, while Table 5B presents aspherical constants for each of the mirror surfaces. For the purposes of Table 5A and Table 5B, the mirror designations correlate as follows: mirror 1 (M1) corresponds to mirror 1310; mirror 2 (M2) corresponds to mirror 1320; mirror 3 (M3) corresponds to mirror 1330; mirror 4 (M4) corresponds to mirror 1340; mirror 5 (M5) corresponds to mirror 1350; and mirror 6 (M6) corresponds to mirror 1360.

TABLE 5A

| Surface | Radius (mm) | Spacing (mm) | Mode |
|---|---|---|---|
| Object | INFINITY | 946.404 | |
| Mirror 1 | −605.890 | −364.901 | REFL |
| Mirror 2 | −368.417 | 0.000 | REFL |
| STOP | INFINITY | 626.468 | |
| Mirror 3 | −1202.217 | −556.441 | REFL |
| Mirror 4 | 1949.768 | 808.432 | REFL |
| Mirror 5 | 276.499 | −313.562 | REFL |
| Mirror 6 | 401.291 | 353.600 | REFL |
| Image | INFINITY | 0.000 | |

TABLE 5B

| Coefficient | M1 | M2 | M3 | M4 | M5 | M6 |
|---|---|---|---|---|---|---|
| K | −5.95606E−01 | −1.82166E+00 | −5.82444E−01 | −2.38948E+00 | 3.35329E+00 | 1.67263E−01 |
| Y | 1.96214E−02 | 1.05243E−01 | −1.91165E−01 | −6.23536E−02 | −4.99892E−02 | 1.30034E−02 |
| $X^2$ | 1.71425E−04 | 1.61788E−04 | 8.52106E−05 | 7.49004E−05 | −2.48914E−04 | 3.88103E−05 |
| $Y^2$ | 1.59322E−04 | 1.15506E−04 | −1.78602E−05 | −9.20778E−05 | −2.00659E−04 | 4.01025E−05 |
| $X^2Y$ | 3.03035E−08 | −8.08249E−07 | −6.98999E−08 | −6.74632E−08 | 7.56105E−07 | 5.29501E−09 |
| $Y^3$ | 2.86899E−08 | −3.26183E−07 | −9.54345E−08 | −1.51650E−07 | 2.54367E−07 | 8.86827E−09 |
| $X^4$ | 0.00000E+00 | 0.00000E+00 | 0.00000E+00 | 0.00000E+00 | 0.00000E+00 | 0.00000E+00 |

TABLE 5B-continued

| Coefficient | M1 | M2 | M3 | M4 | M5 | M6 |
|---|---|---|---|---|---|---|
| $X^2Y^2$ | 0.00000E+00 | 0.00000E+00 | 0.00000E+00 | 0.00000E+00 | 0.00000E+00 | 0.00000E+00 |
| $Y^4$ | 0.00000E+00 | 0.00000E+00 | 0.00000E+00 | 0.00000E+00 | 0.00000E+00 | 0.00000E+00 |
| $X^4Y$ | 0.00000E+00 | 0.00000E+00 | 0.00000E+00 | 0.00000E+00 | 0.00000E+00 | 0.00000E+00 |
| $X^2Y^3$ | 0.00000E+00 | 0.00000E+00 | 0.00000E+00 | 0.00000E+00 | 0.00000E+00 | 0.00000E+00 |
| $Y^5$ | 0.00000E+00 | 0.00000E+00 | 0.00000E+00 | 0.00000E+00 | 0.00000E+00 | 0.00000E+00 |
| $X^6$ | 0.00000E+00 | 0.00000E+00 | 0.00000E+00 | 0.00000E+00 | 0.00000E+00 | 0.00000E+00 |
| $X^4Y^2$ | 0.00000E+00 | 0.00000E+00 | 0.00000E+00 | 0.00000E+00 | 0.00000E+00 | 0.00000E+00 |
| $X^2Y^4$ | 0.00000E+00 | 0.00000E+00 | 0.00000E+00 | 0.00000E+00 | 0.00000E+00 | 0.00000E+00 |
| $Y^6$ | 0.00000E+00 | 0.00000E+00 | 0.00000E+00 | 0.00000E+00 | 0.00000E+00 | 0.00000E+00 |
| $X^6Y$ | 0.00000E+00 | 0.00000E+00 | 0.00000E+00 | 0.00000E+00 | 0.00000E+00 | 0.00000E+00 |
| $X^4Y^3$ | 0.00000E+00 | 0.00000E+00 | 0.00000E+00 | 0.00000E+00 | 0.00000E+00 | 0.00000E+00 |
| $X^2Y^5$ | 0.00000E+00 | 0.00000E+00 | 0.00000E+00 | 0.00000E+00 | 0.00000E+00 | 0.00000E+00 |
| $Y^7$ | 0.00000E+00 | 0.00000E+00 | 0.00000E+00 | 0.00000E+00 | 0.00000E+00 | 0.00000E+00 |
| $X^8$ | 0.00000E+00 | 0.00000E+00 | 0.00000E+00 | 0.00000E+00 | 0.00000E+00 | 0.00000E+00 |
| $X^6Y^2$ | 0.00000E+00 | 0.00000E+00 | 0.00000E+00 | 0.00000E+00 | 0.00000E+00 | 0.00000E+00 |
| $X^4Y^4$ | 0.00000E+00 | 0.00000E+00 | 0.00000E+00 | 0.00000E+00 | 0.00000E+00 | 0.00000E+00 |
| $X^2Y^6$ | 0.00000E+00 | 0.00000E+00 | 0.00000E+00 | 0.00000E+00 | 0.00000E+00 | 0.00000E+00 |
| $Y^8$ | 0.00000E+00 | 0.00000E+00 | 0.00000E+00 | 0.00000E+00 | 0.00000E+00 | 0.00000E+00 |
| $X^8Y$ | 0.00000E+00 | 0.00000E+00 | 0.00000E+00 | 0.00000E+00 | 0.00000E+00 | 0.00000E+00 |
| $X^6Y^3$ | 0.00000E+00 | 0.00000E+00 | 0.00000E+00 | 0.00000E+00 | 0.00000E+00 | 0.00000E+00 |
| $X^4Y^5$ | 0.00000E+00 | 0.00000E+00 | 0.00000E+00 | 0.00000E+00 | 0.00000E+00 | 0.00000E+00 |
| $X^2Y^7$ | 0.00000E+00 | 0.00000E+00 | 0.00000E+00 | 0.00000E+00 | 0.00000E+00 | 0.00000E+00 |
| $Y^9$ | 0.00000E+00 | 0.00000E+00 | 0.00000E+00 | 0.00000E+00 | 0.00000E+00 | 0.00000E+00 |
| $X^{10}$ | 0.00000E+00 | 0.00000E+00 | 0.00000E+00 | 0.00000E+00 | 0.00000E+00 | 0.00000E+00 |
| $X^8Y^2$ | 0.00000E+00 | 0.00000E+00 | 0.00000E+00 | 0.00000E+00 | 0.00000E+00 | 0.00000E+00 |
| $X^6Y^4$ | 0.00000E+00 | 0.00000E+00 | 0.00000E+00 | 0.00000E+00 | 0.00000E+00 | 0.00000E+00 |
| $X^4Y^6$ | 0.00000E+00 | 0.00000E+00 | 0.00000E+00 | 0.00000E+00 | 0.00000E+00 | 0.00000E+00 |
| $X^2Y^8$ | 0.00000E+00 | 0.00000E+00 | 0.00000E+00 | 0.00000E+00 | 0.00000E+00 | 0.00000E+00 |
| $Y^{10}$ | 0.00000E+00 | 0.00000E+00 | 0.00000E+00 | 0.00000E+00 | 0.00000E+00 | 0.00000E+00 |
| Nradius | 1.00E+00 | 1.00E+00 | 1.00E+00 | 1.00E+00 | 1.00E+00 | 1.00E+00 |
| Y-decenter | −200.000 | −82.208 | 200.000 | 44.996 | −23.759 | −73.032 |
| X-rotation | −11.492 | 6.153 | 4.904 | −0.617 | −3.814 | 7.081 |

Figure 14A:
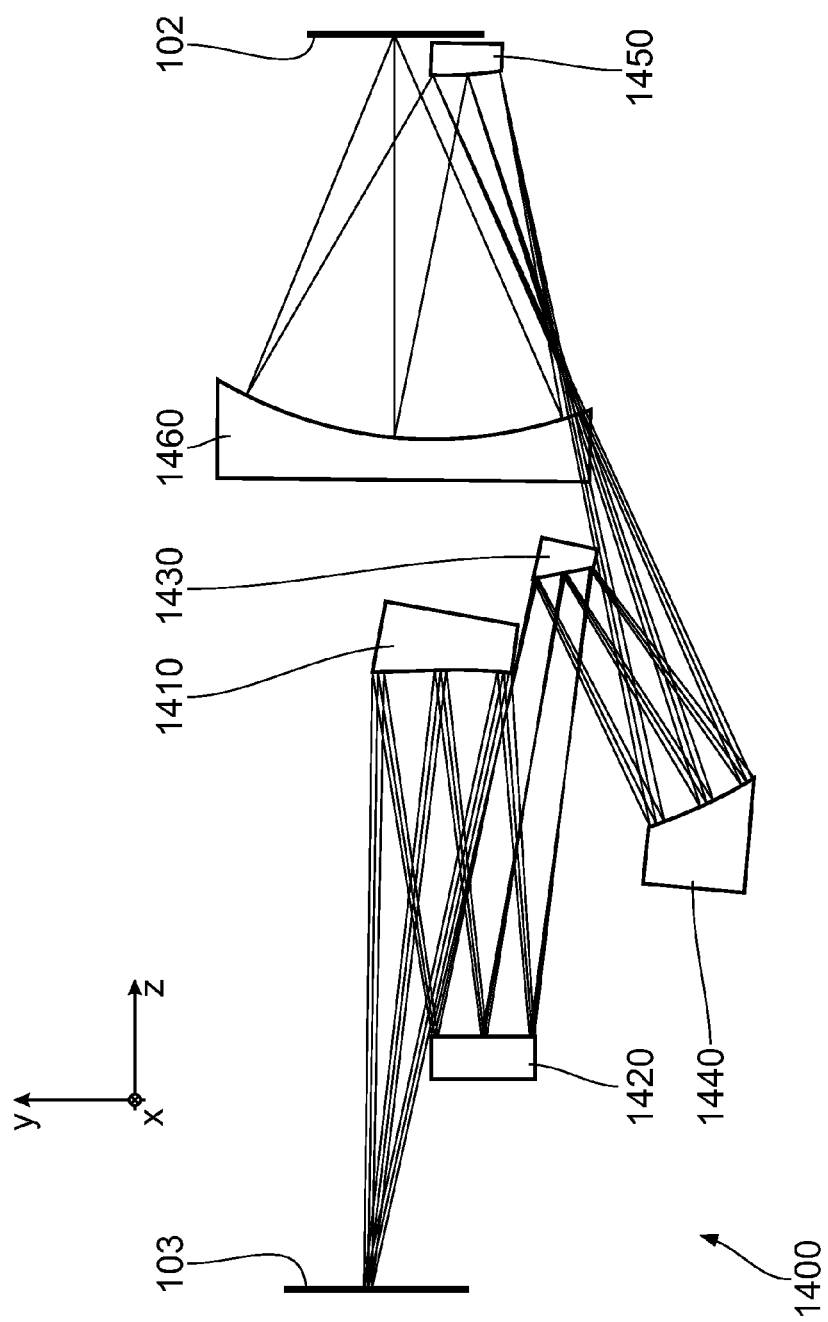
FIG. 14A is a cross-sectional view of a projection objective shown in meridional section.

Referring to FIG. 14A, an embodiment of a projection objective 1400 includes six mirrors 1410, 1420, 1430, 1440, 1450, and 1460, and has an image-side numerical aperture of 0.40 and an operating wavelength of 13.5 nm. Mirrors 1410, 1420, 1430, 1440, 1450, and 1460 are all rotationally-asymmetric mirrors. Projection objective 1400 images radiation from object plane 103 to image plane 102 with a demagnification ratio of 4×. The tracklength of projection objective 1400 is 1,498 mm and the optical path length of imaged radiation is 3,931 mm. Accordingly, the ratio of the optical path length to tracklength is approximately 2.62. Projection objective 1400 has a pupil plane positioned between mirrors 1420 and 1430.

The entrance pupil of projection objective 1400 is located 1,000 mm from object plane 103. The chief ray angle of the central field point at object plane 103 is 7°. The maximum variation of chief ray angles at object plane 103 is 0.82°.

Projection objective 1400 has a rectangular field. The image-side field width, $d_x$, is 26 mm. The image-side field length, $d_y$, is 2 mm. Projection objective 1000 has an object-image shift of 38 mm.

The performance of projection objective 1000 includes an image-side $W_{rms}$ of 0.083λ. Distortion is approximately 100 nm, and image-side field curvature is 36 nm. Projection objective 1400 provides an intermediate image between mirrors 1440 and 1450.

The optical power of the mirrors in the order of the radiation path from object plane 103 to image plane 102 is as follows: mirror 1410 has positive optical power; mirror 1420 has positive optical power; mirror 1430 has negative optical power; mirror 1440 has positive optical power; mirror 1050 has negative optical power; and mirror 1460 has positive optical power.

The dimension of the footprint of each mirror, given as $M_x \times M_y$, is as follows: 326 mm×159 mm for mirror 1410; 210 mm×123 mm for mirror 1420; 120 mm×66 mm for mirror 1430; 312 mm×119 mm for mirror 1440; 112 mm×83 mm for mirror 1450; and 405 mm×379 mm for mirror 1460.

The chief ray angle of incidence for the central field point is 6.70°, 8.08°, 20.41°, 6.68°, 14.52°, and 5.67° for mirrors 1410, 1420, 1430, 1440, 1450, and 1460, respectively. The maximum angle of incidence, $\theta_{max}$, on each mirror for the meridional section is 8.61°, 10.91°, 21.98°, 7.41°, 27.19°, and 6.86° for mirrors 1410, 1420, 1430, 1440, 1450, and 1460, respectively. Δθ for mirrors 1410, 1420, 1430, 1440, 1450, and 1460 are 3.92°, 5.69°, 3.82°, 1.79°, 26.83°, and 3.20°, respectively.

Mirrors 1410, 1420, 1430, 1450, and 1460 have freeboards that are more than 5 mm and less than 25 mm. Mirror 1440 has positive chief ray angle magnification while mirrors 1410, 1420, 1430, and 1450 have negative chief ray angle magnification.

The image-side free working distance of projection objective 1400 is 45 mm. The object-side free working distance is 291 mm.

In projection objective 1400, $d_{op-1}/d_{op-2}$ is 2.47. Furthermore, adjacent mirror pair 1440 and 1450 is separated by more than 50% of the projection objective's tracklength. Data for projection objective 1400 is presented in Table 6A and Table 6B below.

Table 6A presents optical data, while Table 6B presents aspherical constants for each of the mirror surfaces. For the purposes of Table 6A and Table 6B, the mirror designations correlate as follows: mirror 1 (M1) corresponds to mirror 1010; mirror 2 (M2) corresponds to mirror 1020; mirror 3 (M3) corresponds to mirror 1030; mirror 4 (M4) corresponds to mirror 1040; mirror 5 (M5) corresponds to mirror 1050; and mirror 6 (M6) corresponds to mirror 1060.

TABLE 6A

| Surface | Radius (mm) | Spacing (mm) | Mode |
|---|---|---|---|
| Object | INFINITY | 719.154 | |
| Mirror 1 | −1768.086 | −427.871 | REFL |
| Mirror 2 | 2334.525 | 575.634 | REFL |
| Mirror 3 | 352.553 | −347.888 | REFL |
| Mirror 4 | 610.853 | 933.638 | REFL |
| Mirror 5 | 431.588 | −434.965 | REFL |
| Mirror 6 | 521.464 | 479.940 | REFL |
| Image | INFINITY | 0.000 | |

TABLE 6B

| Coefficient | M1 | M2 | M3 | M4 | M5 | M6 |
|---|---|---|---|---|---|---|
| K | −7.735395E+00 | −6.005799E+01 | −3.751432E−01 | −8.758413E−01 | 6.604547E+00 | 8.612526E−02 |
| Y | 0.000000E+00 | 0.000000E+00 | 0.000000E+00 | 0.000000E+00 | 0.000000E+00 | 0.000000E+00 |
| $X^2$ | −1.485069E−04 | −1.263679E−04 | −2.624294E−04 | 1.347923E−05 | −1.388138E−04 | −6.931036E−06 |
| $Y^2$ | −1.726040E−04 | −1.711814E−04 | −1.005287E−03 | −3.665045E−05 | 1.295215E−04 | 8.615161E−06 |
| $X^2Y$ | −5.200823E−08 | −4.156617E−07 | 7.669496E−07 | −5.478449E−08 | 9.580682E−07 | −4.043887E−09 |
| $Y^3$ | −3.734392E−08 | −4.637041E−08 | −5.212076E−07 | 4.563436E−08 | 1.158899E−07 | −6.370253E−09 |
| $X^4$ | −1.602036E−10 | 1.080674E−09 | −1.784900E−08 | 3.290440E−10 | 2.227159E−09 | −4.223672E−11 |
| $X^2Y^2$ | −5.655636E−10 | 1.150736E−09 | 9.356049E−09 | −1.772824E−10 | 7.086270E−09 | −3.649540E−11 |
| $Y^4$ | 7.840007E−11 | 1.816509E−09 | 1.947612E−09 | 9.043201E−11 | 3.962050E−09 | 5.321857E−12 |
| $X^4Y$ | −9.204024E−14 | 2.366905E−12 | −2.677935E−11 | −8.314955E−13 | −1.528996E−11 | 2.788263E−15 |
| $X^2Y^3$ | 1.079182E−12 | 3.100338E−12 | 3.708016E−11 | −5.930044E−12 | −2.181691E−11 | −3.366047E−14 |
| $Y^5$ | −4.579479E−13 | −6.879640E−12 | −4.466462E−13 | 9.529833E−13 | −2.295402E−11 | −2.906642E−14 |
| $X^6$ | 6.241273E−17 | −3.829664E−15 | 1.521283E−13 | 1.097127E−15 | −3.501249E−14 | −6.862154E−17 |
| $X^4Y^2$ | 1.666766E−15 | 1.243647E−14 | 5.320614E−14 | 7.533431E−16 | 8.652054E−14 | −1.407857E−16 |
| $X^2Y^4$ | −2.345440E−15 | 2.162639E−15 | −5.453363E−14 | −1.396841E−14 | 4.036247E−13 | 1.131588E−17 |
| $Y^6$ | −3.012261E−15 | −1.224080E−14 | −1.034267E−14 | 9.519542E−16 | 1.105527E−13 | 3.923271E−17 |
| $X^6Y$ | 3.484859E−18 | −9.656525E−18 | −6.882044E−16 | 7.124323E−18 | 8.790794E−16 | 2.032080E−20 |
| $X^4Y^3$ | −2.997302E−18 | −1.020453E−16 | −4.147278E−16 | 1.059357E−17 | 9.581262E−16 | −8.784820E−20 |
| $X^2Y^5$ | 3.436846E−18 | 2.303857E−17 | −1.104525E−16 | −1.635704E−17 | −1.619074E−15 | −2.001426E−19 |
| $Y^7$ | 1.247042E−17 | 1.643841E−16 | 4.675424E−17 | −7.809506E−19 | −3.824576E−15 | −5.405817E−20 |
| $X^8$ | 6.566049E−22 | 4.616940E−20 | −8.583253E−18 | 1.135128E−21 | −4.651481E−19 | −3.090479E−22 |
| $X^6Y^2$ | −1.894284E−20 | −2.084017E−19 | −4.140672E−18 | 3.271179E−20 | −2.096068E−17 | −7.650033E−22 |
| $X^4Y^4$ | −4.216883E−21 | −3.239553E−19 | −3.670866E−18 | 4.460462E−20 | −8.776559E−17 | −1.201625E−22 |
| $X^2Y^6$ | −2.826171E−21 | −3.920562E−19 | 3.151001E−20 | 7.969094E−21 | −5.615799E−17 | 3.016401E−22 |
| $Y^8$ | −1.315593E−20 | −3.058425E−19 | 2.416437E−20 | 8.284460E−22 | −1.006196E−17 | 1.721317E−22 |
| $X^8Y$ | −9.935149E−25 | −5.168771E−24 | −2.316832E−20 | −2.523681E−24 | 1.540486E−20 | −3.155606E−26 |
| $X^6Y^3$ | 3.001708E−23 | 1.226818E−21 | −2.812819E−21 | 3.078069E−23 | −1.510545E−19 | −4.150182E−25 |
| $X^4Y^5$ | 7.941504E−24 | 1.371322E−21 | −5.440197E−21 | 3.362723E−23 | −6.912241E−19 | −2.930215E−25 |
| $X^2Y^7$ | −9.194045E−25 | 7.101398E−22 | 4.152263E−22 | 1.093452E−23 | −4.418575E−19 | 3.377883E−25 |
| $Y^9$ | 0.000000E+00 | 0.000000E+00 | 0.000000E+00 | 0.000000E+00 | 0.000000E+00 | 0.000000E+00 |
| $X^{10}$ | 0.000000E+00 | 0.000000E+00 | 0.000000E+00 | 0.000000E+00 | 0.000000E+00 | 0.000000E+00 |
| $X^8Y^2$ | 0.000000E+00 | 0.000000E+00 | 0.000000E+00 | 0.000000E+00 | 0.000000E+00 | 0.000000E+00 |
| $X^6Y^4$ | 0.000000E+00 | 0.000000E+00 | 0.000000E+00 | 0.000000E+00 | 0.000000E+00 | 0.000000E+00 |
| $X^4Y^6$ | 0.000000E+00 | 0.000000E+00 | 0.000000E+00 | 0.000000E+00 | 0.000000E+00 | 0.000000E+00 |
| $X^2Y^8$ | 0.000000E+00 | 0.000000E+00 | 0.000000E+00 | 0.000000E+00 | 0.000000E+00 | 0.000000E+00 |
| $Y^{10}$ | 0.000000E+00 | 0.000000E+00 | 0.000000E+00 | 0.000000E+00 | 0.000000E+00 | 0.000000E+00 |
| Nradius | 1.00E+00 | 1.00E+00 | 1.00E+00 | 1.00E+00 | 1.00E+00 | 1.00E+00 |
| Y-decenter | −182.329 | −165.907 | 121.386 | 20.437 | 21.141 | 28.282 |
| X-rotation | −10.857 | −0.974 | −13.061 | −5.217 | −2.314 | −0.850 |

Figure 14B:
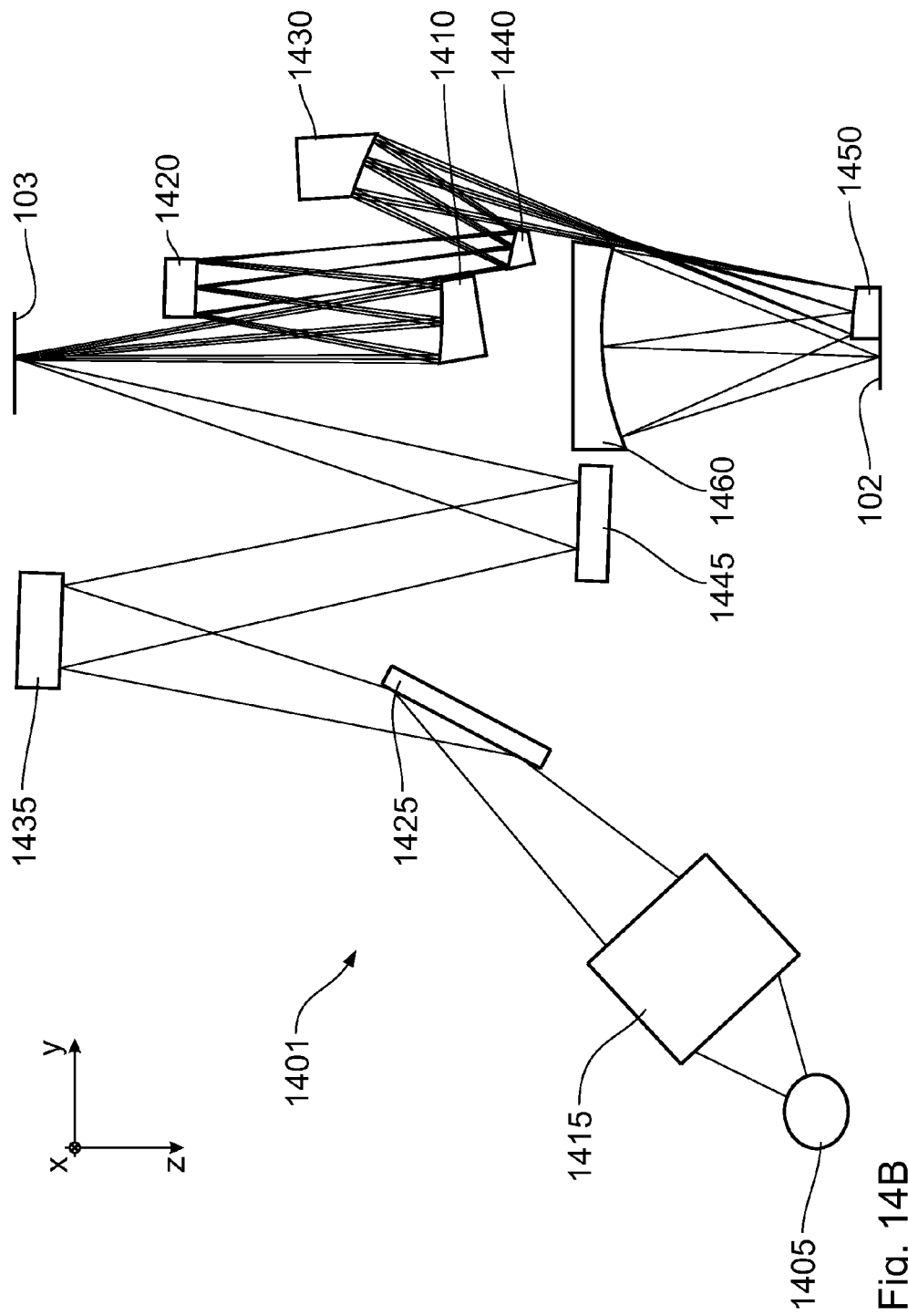
FIG. 14B is a cross-sectional view of an optical system that includes the projection objective shown in FIG. 14A and an illumination system.

Referring to FIG. 14B, projection objective 1400 can be used in an optical system 1401 that includes a light source 1405 and illumination optics including a collector unit 1415, a spectral purity filter 1425, a field fact mirror 1435 and a pupil facet mirror 1445. Light source 1405 is an EUV light source configured to provide radiation at 13.5 nm to the projection objective. Collector unit 1415 gathers radiation from source 1405 and directs the radiation towards spectral purity filter 1415 which filters incident radiation at wavelengths other than 13.5 nm and directs the radiation at 13.5 nm towards field facet mirror 1425. Together with pupil facet mirror 1445, field facet mirror illuminates a reflective reticle positioned at object plane 103 with radiation at 13.5 nm. The radiation is provided so that the chief rays diverge from the reticle. The radiation is provided to the reticle in this way without the use of additional components, such as a grazing incidence mirror.

Referring to FIG. 15, an embodiment of a projection objective 1500 includes six mirrors 1510, 1520, 1530, 1540, 1550, and 1560, and has an image-side numerical aperture of 0.40 and an operating wavelength of 13.5 nm. Mirrors 1510, 1520, 1530, 1540, 1550, and 1460 are all rotationally-asymmetric mirrors. Projection objective 1500 images radiation from object plane 103 to image plane 102 with a demagnification ratio of 4×. The tracklength of projection objective 1500 is 1,499 mm and the optical path length of imaged radiation is 4,762 mm. Accordingly, the ratio of the optical path length to tracklength is approximately 3.18.

The entrance pupil of projection objective 1500 is located 1,000 mm from object plane 103 with object plane positioned between the entrance pupil and the mirrors. Due to the reflective reticle positioned at object plane 103, an element of the illumination system can be positioned at location 1501, corresponding to the entrance pupil. The chief ray angle of the central field point at object plane 103 is 7°. The maximum variation of chief ray angles at object plane 103 is 0.82°.

Projection objective 1500 has a rectangular field. The image-side field width, $d_x$, is 26 mm. The image-side field length, $d_y$, is 2 mm. Projection objective 1500 has an object-image shift of 7 mm.

Figure 16B:
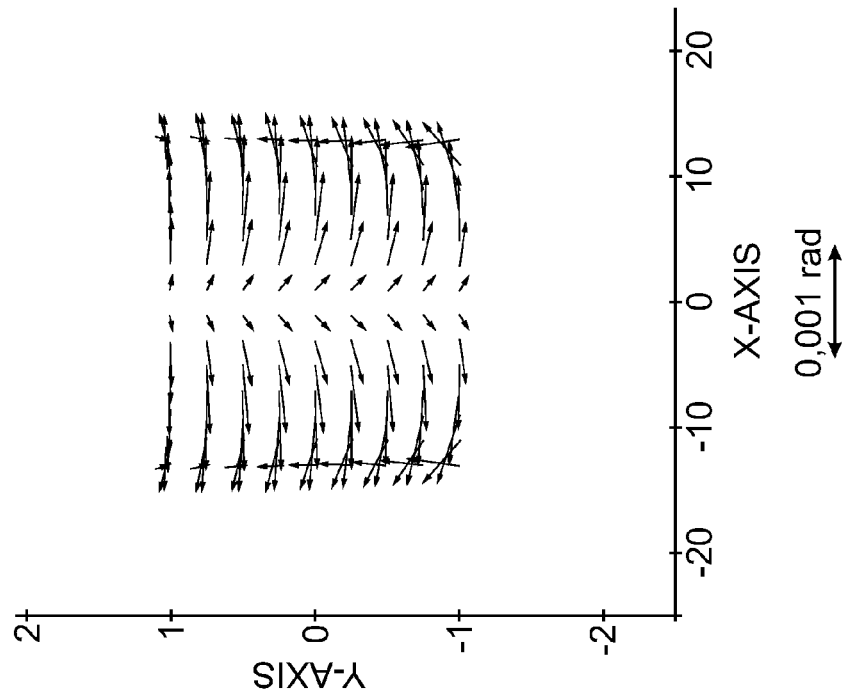
FIG. 16B is an x-y vector plot showing calculated chief ray angle as a function of position in the image field for the projection objective shown in FIG. 15.
Figure 16A:
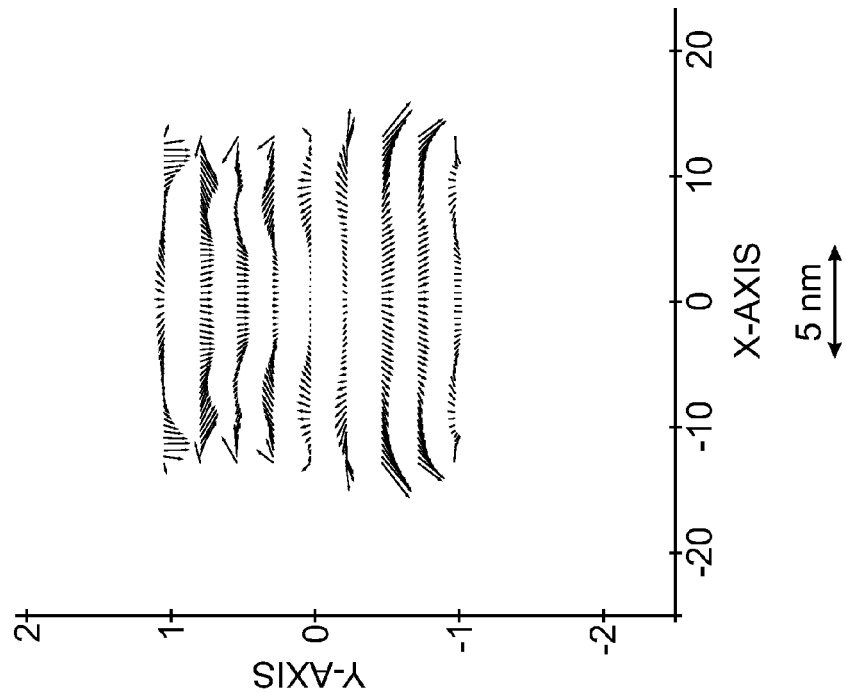
FIG. 16A is an x-y vector plot showing calculated distortion as a function of position in the image field for the projection objective shown in FIG. 15.

The performance of projection objective 1500 includes an image-side $W_{rms}$ of 0.040λ. Referring also to FIG. 16A, distortion is less than about 3 nm across the image field. Image-side field curvature is 35 nm. Projection objective 1500 provides an intermediate image between mirrors 1540 and 1550. Referring to FIG. 16B, the chief rays are orthogonal to image plane 102 to within about 0.001 rad (0.06°) at the image field.

The optical power of the mirrors in the order of the radiation path from object plane 103 to image plane 102 is as follows: mirror 1510 has positive optical power; mirror 1520 has negative optical power; mirror 1530 has positive optical power; mirror 1540 has positive optical power; mirror 1550 has negative optical power; and mirror 1560 has positive optical power.

The dimension of the footprint of each mirror, given as $M_x \times M_y$, is as follows: 253 mm×162 mm for mirror 1510; 105 mm×66 mm for mirror 1520; 227 mm×301 mm for mirror 1530; 182 mm×220 mm for mirror 1540; 111 mm×85 mm for mirror 1550; and 289 mm×275 mm for mirror 1560.

The chief ray angle of incidence for the central field point is 3.96°, 12.21°, 7.51°, 11.98°, 15.82°, and 8.08° for mirrors 1510, 1520, 1530, 1540, 1550, and 1560, respectively. The maximum angle of incidence, $\theta_{max}$, on each mirror for the meridional section is 4.47°, 12.81°, 8.55°, 16.91°, 27.68°, and 9.96° for mirrors 1510, 1520, 1530, 1540, 1550, and 1560, respectively. $\Delta\theta$ for mirrors 1510, 1520, 1530, 1540, 1550, and 1560 are 1.10°, 3.61°, 4.19°, 12.12°, 27.17°, and 4.79°, respectively.

Mirrors 1510, 1520, 1540, 1550, and 1560 have freeboards that are more than 5 mm and less than 25 mm. Mirror 1530 has positive chief ray angle magnification while mirrors 1510, 1520, 1540, and 1550 have negative chief ray angle magnification.

The image-side free working distance of projection objective 1500 is 45 mm. The object-side free working distance is 260 mm.

In projection objective 1500, $d_{op-1}/d_{op-2}$ is 3.05. Furthermore, adjacent mirror pairs 1520 and 1530, 1530 and 1540, and 1540 and 1550 are separated by more than 50% of the projection objective's tracklength. Further, the distance between mirror 1510 and object plane 103 is more than 50% of the projection objective's tracklength.

Data for projection objective 1500 is presented in Table 7A and Table 7B below. Table 7A presents optical data, while Table 7B presents aspherical constants for each of the mirror surfaces. For the purposes of Table 7A and Table 7B, the mirror designations correlate as follows: mirror 1 (M1) corresponds to mirror 1510; mirror 2 (M2) corresponds to mirror 1520; mirror 3 (M3) corresponds to mirror 1530; mirror 4 (M4) corresponds to mirror 1540; mirror 5 (M5) corresponds to mirror 1550; and mirror 6 (M6) corresponds to mirror 1560.

TABLE 7A

| Surface | Radius (mm) | Spacing (mm) | Mode |
| --- | --- | --- | --- |
| Object | INFINITY | 793.452 | |
| Mirror 1 | −652.351 | −533.717 | REFL |
| Mirror 2 | −459.234 | 946.263 | REFL |
| Mirror 3 | −1711.458 | −789.999 | REFL |
| Mirror 4 | 1814.404 | 1037.812 | REFL |
| Mirror 5 | 310.131 | −304.837 | REFL |
| Mirror 6 | 407.712 | 349.882 | REFL |
| Image | INFINITY | 0.000 | |

TABLE 7B

| Coefficient | M1 | M2 | M3 | M4 | M5 | M6 |
| --- | --- | --- | --- | --- | --- | --- |
| K | −5.917992E−01 | 1.401977E+00 | −1.852312E+00 | 3.134672E+00 | 1.276852E+00 | 2.162747E−01 |
| Y | 0.000000E+00 | 0.000000E+00 | 0.000000E+00 | 0.000000E+00 | 0.000000E+00 | 0.000000E+00 |
| $X^2$ | 2.486175E−04 | 6.462590E−04 | 8.097144E−05 | 3.683589E−05 | −5.694587E−04 | 1.127522E−05 |
| $Y^2$ | 1.796052E−04 | −1.218131E−05 | −3.272168E−05 | −7.479058E−05 | −3.798909E−04 | 5.142215E−05 |
| $X^2Y$ | −3.704365E−08 | −3.061838E−06 | 1.166808E−07 | 1.073313E−07 | 3.054784E−06 | −1.901527E−08 |
| $Y^3$ | −8.473076E−09 | −4.336504E−06 | −6.831514E−08 | −2.680850E−08 | 1.944165E−06 | 2.077407E−09 |
| $X^4$ | 1.525482E−11 | 2.440415E−10 | −2.839993E−11 | −8.352784E−11 | 1.477727E−09 | −1.231925E−10 |
| $X^2Y^2$ | 4.909383E−11 | 1.819997E−09 | −2.639958E−11 | −7.953809E−11 | 1.884598E−08 | −4.030921E−11 |
| $Y^4$ | 7.241758E−11 | −1.924132E−08 | −1.611187E−10 | −1.805904E−10 | 2.829058E−09 | −6.788132E−11 |
| $X^4Y$ | −3.944773E−14 | −3.384346E−12 | 4.634420E−14 | 1.089774E−13 | 4.746215E−11 | 7.092901E−15 |
| $X^2Y^3$ | −2.485019E−13 | −1.985647E−10 | −1.749321E−13 | 2.706968E−13 | 1.878106E−10 | 7.623271E−14 |
| $Y^5$ | −6.222758E−14 | 1.546404E−10 | −7.306272E−14 | 1.121470E−13 | 2.713089E−11 | 1.059625E−13 |
| $X^6$ | −2.853060E−17 | 1.499373E−14 | −3.327224E−16 | −3.396117E−16 | 1.122966E−13 | −7.141998E−16 |
| $X^4Y^2$ | 5.428060E−17 | −4.560639E−13 | −2.729510E−17 | 1.958645E−17 | 4.975385E−13 | −1.157245E−15 |
| $X^2Y^4$ | 9.034205E−16 | 4.633694E−13 | −4.803414E−16 | 4.337124E−16 | 9.650331E−13 | −6.079561E−16 |
| $Y^6$ | 9.726812E−16 | −1.567936E−12 | −9.119915E−19 | 3.224937E−16 | −4.013641E−13 | −1.910957E−16 |
| $X^6Y$ | 7.541120E−20 | −5.491590E−16 | −3.248735E−18 | −4.999870E−18 | 1.809992E−15 | 1.533677E−19 |
| $X^4Y^3$ | −7.407407E−19 | 1.626025E−15 | −4.175176E−19 | −1.121906E−18 | 4.277794E−15 | 7.709209E−19 |
| $X^2Y^5$ | −3.053897E−18 | −1.459850E−15 | −5.190383E−19 | 9.702383E−19 | 5.157566E−15 | 9.414679E−19 |
| $Y^7$ | −1.167661E−17 | 1.377526E−14 | −3.283791E−21 | 9.398678E−20 | −3.053184E−15 | 3.954522E−19 |
| $X^8$ | −1.128385E−22 | −2.091289E−19 | −1.560172E−21 | −2.941200E−21 | 2.054965E−18 | −3.788563E−21 |
| $X^6Y^2$ | −2.424101E−21 | −5.485841E−18 | −1.205060E−20 | −3.188366E−20 | 8.911569E−18 | −9.560288E−21 |
| $X^4Y^4$ | 4.347588E−22 | −3.722786E−17 | −1.249304E−21 | −8.368608E−21 | 1.007777E−17 | −8.789392E−21 |
| $X^2Y^6$ | 2.577199E−21 | −2.687589E−17 | −2.354061E−22 | 8.597809E−22 | 1.143993E−17 | −3.545101E−21 |
| $Y^8$ | 5.215288E−20 | −7.369037E−17 | −4.229309E−23 | −6.689468E−22 | −7.499429E−18 | −1.703637E−21 |
| $X^8Y$ | 7.792174E−25 | 0.000000E+00 | −7.813650E−24 | −2.516130E−23 | 0.000000E+00 | 8.396981E−25 |
| $X^6Y^3$ | 8.992421E−24 | 0.000000E+00 | −1.921637E−23 | −8.262460E−23 | 0.000000E+00 | 4.664369E−24 |
| $X^4Y^5$ | −4.714974E−25 | 0.000000E+00 | −1.610571E−24 | −1.778199E−23 | 0.000000E+00 | 9.398752E−24 |
| $X^2Y^7$ | 6.059892E−24 | 0.000000E+00 | 3.848059E−26 | 1.222213E−24 | 0.000000E+00 | 1.042278E−23 |
| $Y^9$ | −8.700880E−23 | 0.000000E+00 | 6.368781E−27 | −2.288415E−25 | 0.000000E+00 | 7.789109E−24 |
| $X^{10}$ | 0.000000E+00 | 0.000000E+00 | −5.411923E−27 | −1.603639E−26 | 0.000000E+00 | −3.929816E−26 |
| $X^8Y^2$ | 0.000000E+00 | 0.000000E+00 | −8.609679E−27 | −4.538477E−26 | 0.000000E+00 | −1.453997E−25 |
| $X^6Y^4$ | 0.000000E+00 | 0.000000E+00 | −1.127835E−26 | −7.710579E−26 | 0.000000E+00 | −1.839705E−25 |
| $X^4Y^6$ | 0.000000E+00 | 0.000000E+00 | −8.495275E−28 | −1.413945E−26 | 0.000000E+00 | −8.230974E−26 |
| $X^2Y^8$ | 0.000000E+00 | 0.000000E+00 | 4.740792E−29 | 1.022008E−27 | 0.000000E+00 | −8.755646E−27 |
| $Y^{10}$ | 0.000000E+00 | 0.000000E+00 | 1.728076E−29 | 1.964912E−28 | 0.000000E+00 | −7.204080E−27 |

TABLE 7B-continued

| Coefficient | M1 | M2 | M3 | M4 | M5 | M6 |
|---|---|---|---|---|---|---|
| Nradius | 1.00E+00 | 1.00E+00 | 1.00E+00 | 1.00E+00 | 1.00E+00 | 1.00E+00 |
| Y-decenter | −144.660 | −98.223 | 42.173 | −14.449 | 2.986 | −10.929 |
| X-rotation | −8.868 | −16.235 | 1.500 | −3.658 | −7.600 | −1.635 |

Figure 17:
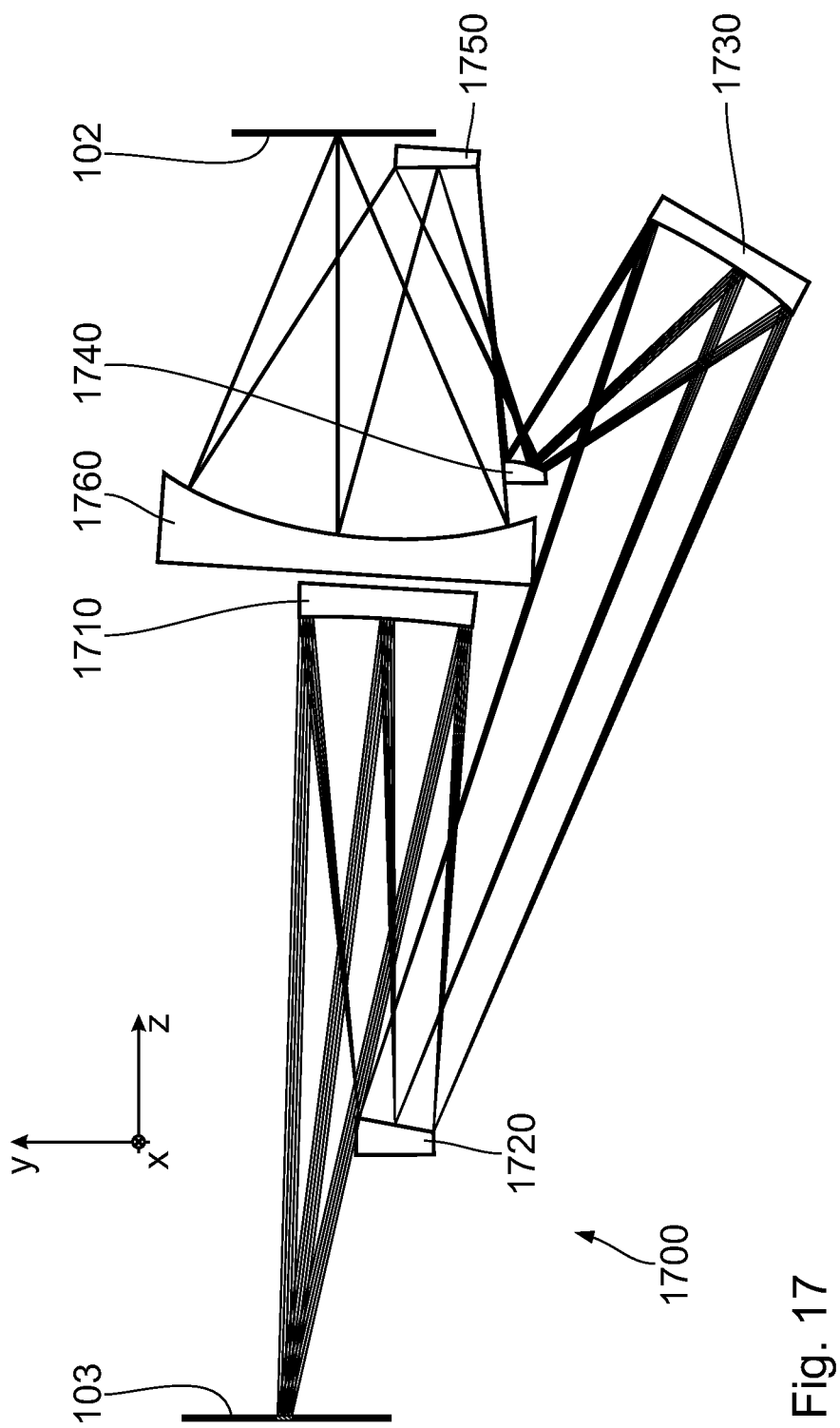
FIG. 17 is a cross-sectional view of a projection objective shown in meridional section.

Referring to FIG. 17, an embodiment of a projection objective 1700 includes six mirrors 1710, 1720, 1730, 1740, 1750, and 1760, and has an image-side numerical aperture of 0.40 and an operating wavelength of 13.5 nm. Mirrors 1710, 1720, 1730, 1740, 1750, and 1760 are all rotationally-asymmetric mirrors. Projection objective 1700 images radiation from object plane 103 to image plane 102 with a demagnification ratio of 4×. The tracklength of projection objective 1700 is 1,736 mm and the optical path length of imaged radiation is 4,827 mm. Accordingly, the ratio of the optical path length to tracklength is approximately 2.78.

The entrance pupil of projection objective 1700 is located 1,000 mm from object plane 103 with object plane positioned between the entrance pupil and the mirrors. Due to the reflective reticle positioned at object plane 103, an element of the illumination system (e.g., a pupil faceted mirror) can be positioned at location 1770, corresponding to the entrance pupil. The chief ray angle of the central field point at object plane 103 is 7°. The maximum variation of chief ray angles at object plane 103 is 0.82°.

Projection objective 1700 has a rectangular field. The image-side field width, $d_x$, is 26 mm. The image-side field length, $d_y$, is 2 mm. Projection objective 1700 has an object-image shift of 65 mm.

The performance of projection objective 1700 includes an image-side $W_{rms}$ of 0.037λ. Distortion is less than 12 nm, and image-side field curvature is 25 nm. Projection objective 1700 provides an intermediate image between mirrors 1740 and 1750.

The optical power of the mirrors in the order of the radiation path from object plane 103 to image plane 102 is as follows: mirror 1710 has positive optical power; mirror 1720 has negative optical power; mirror 1730 has positive optical power; mirror 1740 has negative optical power; mirror 1750 has negative optical power; and mirror 1760 has positive optical power.

The dimension of the footprint of each mirror, given as $M_x \times M_y$, is as follows: 323 mm×215 mm for mirror 1710; 131 mm×102 mm for mirror 1720; 267 mm×183 mm for mirror 1730; 70 mm×52 mm for mirror 1740; 124 mm×109 mm for mirror 1750; and 447 mm×433 mm for mirror 1760.

The chief ray angle of incidence for the central field point is 4.06°, 11.34°, 12.20°, 31.60°, 12.27°, and 7.64° for mirrors 1710, 1720, 1730, 1740, 1750, and 1760, respectively. The maximum angle of incidence, $\theta_{max}$, on each mirror for the meridional section is 4.69°, 12.38°, 16.54°, 41.24°, 29.42°, and 9.25° for mirrors 1710, 1720, 1730, 1740, 1750, and 1760, respectively. Δθ for mirrors 1710, 1720, 1730, 1740, 1750, and 1760 are 1.08°, 2.71°, 9.83°, 22.72°, 29.13°, and 4.28°, respectively.

Mirrors 1720 and 1740 have freeboards that are more than 5 mm and less than 25 mm. Mirror 1730 has positive chief ray angle magnification while mirrors 1710, 1720, 1740 and 1750 have negative chief ray angle magnification.

The image-side free working distance of projection objective 1700 is 45 mm. The object-side free working distance is 400 mm.

In projection objective 1700, $d_{op-1}/d_{op-2}$ is 2.67. Furthermore, adjacent mirror pairs 1720 and 1730 are separated by more than 50% of the projection objective's tracklength. Further, the distance between mirror 1710 and object plane 103 is more than 50% of the projection objective's tracklength.

Data for projection objective 1700 is presented in Table 8A and Table 8B below. The parameters and units for the parameters for Table 8A and 8B and subsequent tables are the same as the corresponding parameters and units presented in Table 1A and 1B above. Table 8A presents optical data, while Table 8B presents rotationally-asymmetric constants for each of the mirror surfaces. For the purposes of Table 8A and Table 8B, the mirror designations correlate as follows: mirror 1 (M1) corresponds to mirror 1710; mirror 2 (M2) corresponds to mirror 1720; mirror 3 (M3) corresponds to mirror 1730; mirror 4 (M4) corresponds to mirror 1740; mirror 5 (M5) corresponds to mirror 1750; and mirror 6 (M6) corresponds to mirror 1760.

TABLE 8A

| Surface | Radius | Spacing | Mode |
|---|---|---|---|
| Object | INFINITY | 1067.761 | |
| Mirror 1 | −1219.687 | −668.241 | REFL |
| Mirror 2 | −747.811 | 1291.054 | REFL |
| Mirror 3 | −969.893 | −374.588 | REFL |
| Mirror 4 | −549.105 | 374.588 | REFL |
| Mirror 5 | 470.063 | −502.811 | REFL |
| Mirror 6 | 618.025 | 547.811 | REFL |
| Image | INFINITY | 0.000 | |

TABLE 8B

| Coefficient | M1 | M2 | M3 | M4 | M5 | M6 |
|---|---|---|---|---|---|---|
| K | 5.078166E−01 | 2.515234E+00 | 4.458912E−01 | −5.135256E+00 | 3.709497E+00 | 1.305537E−01 |
| Y | 0.000000E+00 | 0.000000E+00 | 0.000000E+00 | 0.000000E+00 | 0.000000E+00 | 0.000000E+00 |
| $X^2$ | −4.229616E−06 | 4.423002E−05 | −1.137338E−04 | 6.243736E−04 | −4.439433E−04 | 1.714681E−05 |
| $Y^2$ | −2.042693E−05 | −3.200090E−04 | −1.490188E−04 | 4.230830E−05 | −3.941063E−04 | 1.369711E−05 |
| $X^2Y$ | −2.456512E−08 | −1.681122E−06 | 1.278895E−08 | 1.439095E−06 | 1.109021E−07 | −7.066857E−09 |
| $Y^3$ | −1.017618E−08 | −1.085440E−06 | −9.040764E−08 | −8.248306E−07 | 6.038369E−07 | −8.198184E−09 |
| $X^4$ | 2.532498E−11 | −4.655202E−10 | −6.082020E−11 | −7.879275E−09 | −9.475896E−10 | −9.236663E−12 |
| $X^2Y^2$ | 2.917327E−11 | −4.875362E−09 | −7.951092E−11 | −6.364830E−09 | −2.626820E−09 | −1.778520E−11 |
| $Y^4$ | 1.116055E−11 | 9.584332E−10 | −1.259982E−10 | 2.921676E−09 | −8.367567E−10 | −1.348267E−11 |
| $X^4Y$ | −7.018800E−15 | −9.924549E−12 | −5.700215E−14 | −7.337153E−11 | −3.015573E−13 | −5.057127E−15 |

TABLE 8B-continued

| Coefficient | M1 | M2 | M3 | M4 | M5 | M6 |
|---|---|---|---|---|---|---|
| $X^2Y^3$ | −2.588267E−14 | −2.065300E−11 | −1.623609E−13 | −4.830483E−11 | −3.421535E−12 | −8.177430E−15 |
| $Y^5$ | −5.631482E−14 | 1.175099E−13 | −3.257076E−14 | 2.900148E−11 | −5.156003E−12 | −7.754740E−16 |
| $X^6$ | 2.507037E−17 | 7.181890E−15 | −6.970398E−17 | 1.896541E−13 | −2.402650E−14 | −1.687447E−17 |
| $X^4Y^2$ | 1.805398E−16 | 2.845435E−14 | −1.726885E−16 | −3.660328E−13 | −3.460882E−14 | −5.258270E−17 |
| $X^2Y^4$ | 3.234883E−16 | 4.275982E−14 | −3.443645E−16 | −1.119940E−13 | −2.515640E−14 | −4.418332E−17 |
| $Y^6$ | 5.139221E−17 | 1.240058E−14 | −4.807113E−19 | 2.665448E−14 | −3.989968E−14 | −9.729792E−18 |
| $X^6Y$ | −1.655261E−20 | 2.112846E−16 | −6.490967E−20 | 2.217817E−15 | 3.565159E−17 | −2.533468E−21 |
| $X^4Y^3$ | 6.406762E−19 | 7.287537E−16 | −1.578781E−19 | −1.022968E−15 | −2.246920E−17 | −9.556211E−21 |
| $X^2Y^5$ | 1.095531E−18 | 4.084428E−16 | −1.899934E−19 | 8.581644E−18 | −4.609677E−16 | −8.095822E−21 |
| $Y^7$ | 3.534107E−19 | −1.119501E−16 | −6.323108E−20 | −1.566387E−16 | −4.089822E−16 | 7.022063E−21 |
| $X^8$ | −2.127854E−23 | 5.631762E−20 | −1.645304E−22 | −2.809082E−18 | −2.426092E−19 | −2.519698E−23 |
| $X^6Y^2$ | −2.911239E−22 | 1.595162E−18 | 1.240419E−22 | 8.883017E−18 | −3.131391E−18 | −1.169336E−22 |
| $X^4Y^4$ | 2.052045E−21 | 3.313410E−18 | −2.644748E−22 | −1.246599E−18 | −8.074234E−18 | −1.413514E−22 |
| $X^2Y^6$ | 2.303292E−21 | 8.331439E−19 | −5.379641E−23 | 2.833584E−19 | −6.891166E−18 | −6.982184E−23 |
| $Y^8$ | 7.915735E−22 | −4.495038E−19 | −9.241853E−23 | −3.000322E−19 | −2.367176E−18 | −1.361196E−23 |
| $X^8Y$ | −3.633622E−25 | −1.145501E−22 | −8.423039E−26 | −1.268652E−20 | 2.592347E−21 | 4.570116E−27 |
| $X^6Y^3$ | −1.500591E−24 | 1.545859E−21 | 6.330084E−25 | 1.171733E−20 | 1.459272E−21 | 1.168279E−26 |
| $X^4Y^5$ | 2.954923E−24 | 3.997308E−21 | 1.050127E−26 | −4.257185E−23 | −1.756358E−22 | 1.479131E−26 |
| $X^2Y^7$ | 1.472672E−24 | 3.951572E−22 | 8.889089E−29 | −7.100170E−25 | 5.863402E−23 | 6.095900E−27 |
| $Y^9$ | 4.265712E−25 | −3.958881E−23 | −1.136961E−30 | −9.034885E−27 | 7.298215E−25 | 4.531322E−28 |
| $X^{10}$ | 1.301003E−29 | 1.955419E−24 | 0.000000E+00 | 0.000000E+00 | 0.000000E+00 | 0.000000E+00 |
| $X^8Y^2$ | −6.199954E−28 | −8.094414E−25 | 0.000000E+00 | 0.000000E+00 | 0.000000E+00 | 0.000000E+00 |
| $X^6Y^4$ | −1.564267E−27 | −8.554437E−24 | 0.000000E+00 | 0.000000E+00 | 0.000000E+00 | 0.000000E+00 |
| $X^4Y^6$ | 2.214569E−27 | 1.149257E−24 | 0.000000E+00 | 0.000000E+00 | 0.000000E+00 | 0.000000E+00 |
| $X^2Y^8$ | −6.083137E−29 | 6.386629E−26 | 0.000000E+00 | 0.000000E+00 | 0.000000E+00 | 0.000000E+00 |
| $Y^{10}$ | 1.486303E−30 | 1.060932E−26 | 0.000000E+00 | 0.000000E+00 | 0.000000E+00 | 0.000000E+00 |
| Nradius | 1.00E+00 | 1.00E+00 | 1.00E+00 | 1.00E+00 | 1.00E+00 | 1.00E+00 |
| Y-decenter | 248.450 | 92.818 | −2.826 | 26.446 | −4.799 | 29.811 |
| X-rotation | 8.882 | −0.938 | 1.151 | −1.082 | −3.174 | −3.333 |

Figure 18:
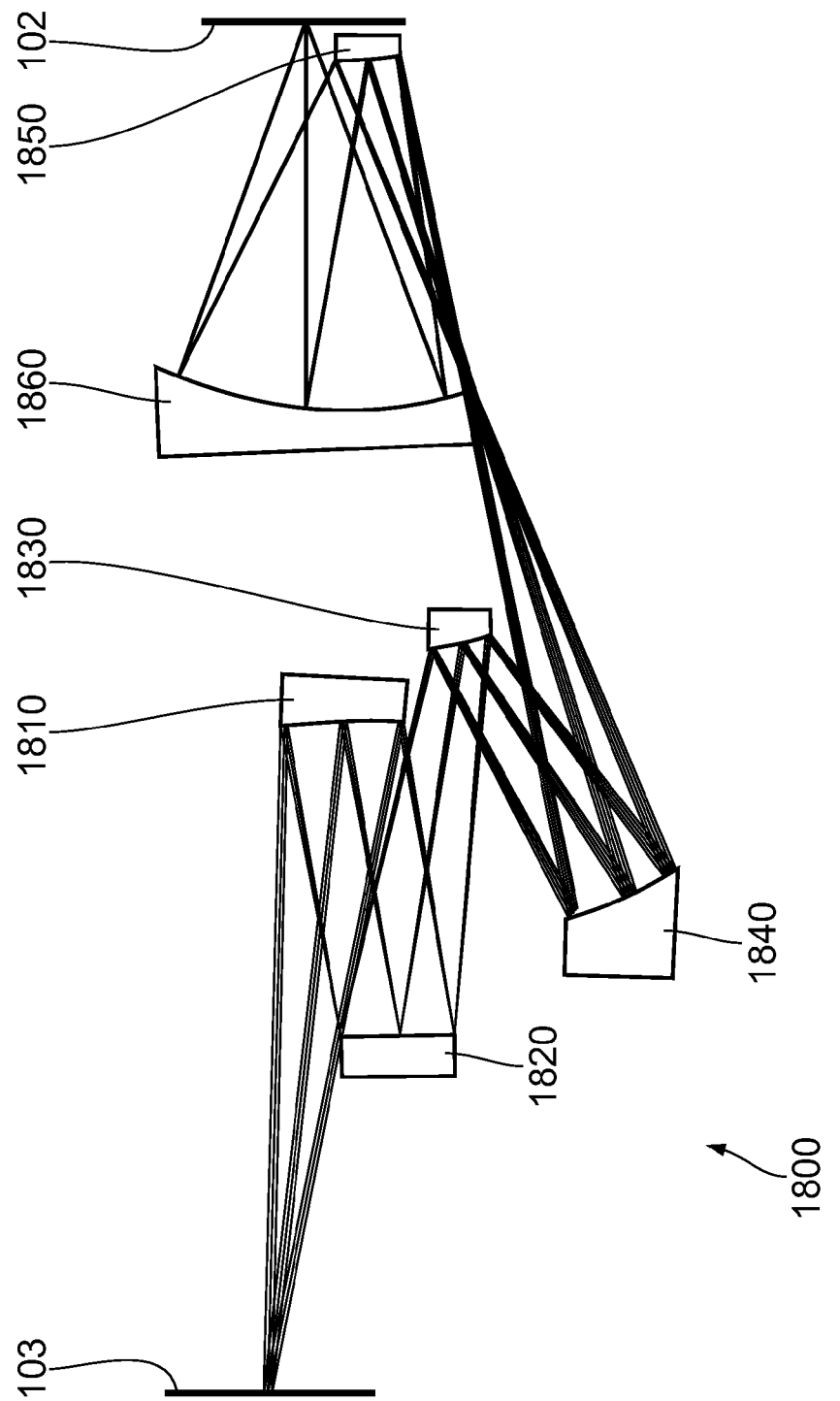
FIG. 18 is a cross-sectional view of a projection objective shown in meridional section.

Referring to FIG. 18, an embodiment of a projection objective 1800 includes six mirrors 1810, 1820, 1830, 1840, 1850, and 1860, and has an image-side numerical aperture of 0.35 and an operating wavelength of 13.5 nm. Mirrors 1810, 1820, 1830, 1840, 1850, and 1860 are all rotationally-asymmetric mirrors. Projection objective 1800 images radiation from object plane 103 to image plane 102 with a demagnification ratio of 4×. The tracklength of projection objective 1800 is 1,700 mm and the optical path length of imaged radiation is 4,156 mm. Accordingly, the ratio of the optical path length to tracklength is approximately 2.44. Projection objective 1800 has an aperture stop positioned at mirror 1820.

The entrance pupil of projection objective 1800 is located 1,749 mm from object plane 103 with the entrance pupil on the same side of object plane 103 as the mirrors. In other words, the chief rays are convergent at the reticle. The chief ray angle of the central field point at object plane 103 is 6°. The maximum variation of chief ray angles at object plane 103 is 0.58°.

Projection objective 1800 has a rectangular field. The image-side field width, $d_x$, is 26 mm. The image-side field length, $d_y$, is 2 mm. Projection objective 1800 has an object-image shift of 41 mm.

The performance of projection objective 1800 includes an image-side $W_{rms}$ of 0.020λ. Distortion is less than 1.1 nm, and image-side field curvature is 17 nm. Projection objective 1800 provides an intermediate image between mirrors 1840 and 1850.

The optical power of the mirrors in the order of the radiation path from object plane 103 to image plane 102 is as follows: mirror 1810 has positive optical power; mirror 1820 has positive optical power; mirror 1830 has negative optical power; mirror 1840 has positive optical power; mirror 1850 has negative optical power; and mirror 1860 has positive optical power.

The dimension of the footprint of each mirror, given as $M_x \times M_y$, is as follows: 169 mm×148 mm for mirror 1810; 159 mm×136 mm for mirror 1820; 120 mm×61 mm for mirror 1830; 265 mm×118 mm for mirror 1840; 101 mm×77 mm for mirror 1850; and 345 mm×329 mm for mirror 1860.

The chief ray angle of incidence for the central field point is 8.11°, 9.49°, 21.03°, 8.01°, 13.67°, and 5.03° for mirrors 1810, 1820, 1830, 1840, 1850, and 1860, respectively. The maximum angle of incidence, $θ_{max}$, on each mirror for the meridional section is 10.31°, 12.06°, 21.56°, 8.45°, 24.59°, and 6.36° for mirrors 1810, 1820, 1830, 1840, 1850, and 1860, respectively. Δθ for mirrors 1810, 1820, 1830, 1840, 1850, and 1860 are 4.56°, 5.34°, 1.85°, 1.23°, 22.98°, and 3.16°, respectively.

Mirror 1840 has positive chief ray angle magnification while mirrors 1810, 1820, 183, and 1850 have negative chief ray angle magnification.

The image-side free working distance of projection objective 1800 is 45 mm. The object-side free working distance is 441 mm.

In projection objective 1800, $d_{op-1}/d_{op-2}$ is 1.89. Furthermore, adjacent mirror pair 1840 and 1850 is separated by more than 50% of the projection objective's tracklength.

Data for projection objective 1800 is presented in Table 9A and Table 9B below. The parameters and units for the parameters for Table 9A and 9B and subsequent tables are the same as the corresponding parameters and units presented in Table 1A and 1B above. Table 9A presents optical data, while Table 9B presents rotationally-asymmetric constants for each of the mirror surfaces. For the purposes of Table 9A and Table 9B, the mirror designations correlate as follows: mirror 1 (M1) corresponds to mirror 1810; mirror 2 (M2) corresponds to mirror 1820; mirror 3 (M3) corresponds to mirror 1830; mirror 4 (M4) corresponds to mirror 1840; mirror 5 (M5) corresponds to mirror 1850; and mirror 6 (M6) corresponds to mirror 1860.

TABLE 9A

| Surface | Radius | Spacing | Mode |
|---|---|---|---|
| Object | INFINITY | 831.483 | |
| Mirror 1 | −2519.290 | −390.700 | REFL |
| Mirror 2 | 1736.318 | 0.000 | REFL |
| STOP | INFINITY | 510.700 | |
| Mirror 3 | 353.216 | −404.591 | REFL |
| Mirror 4 | 691.089 | 1108.132 | REFL |
| Mirror 5 | 454.789 | −432.650 | REFL |
| Mirror 6 | 522.649 | 477.625 | REFL |
| Image | INFINITY | 0.000 | |

TABLE 9B

| Coefficient | M1 | M2 | M3 | M4 | M5 | M6 |
|---|---|---|---|---|---|---|
| K | −5.620176E+01 | −8.079329E+00 | −8.913161E−01 | −1.320517E+00 | 4.540035E+00 | 8.058603E−02 |
| Y | 0.000000E+00 | 0.000000E+00 | 0.000000E+00 | 0.000000E+00 | 0.000000E+00 | 0.000000E+00 |
| $X^2$ | −8.081674E−05 | −2.443257E−05 | −2.909041E−04 | −5.514277E−05 | −2.176416E−04 | −1.481415E−05 |
| $Y^2$ | −1.409006E−04 | −8.853894E−05 | −5.146801E−04 | −2.593301E−05 | 1.796509E−04 | 7.215641E−06 |
| $X^2Y$ | 1.932586E−07 | 4.504714E−08 | 9.969292E−07 | −1.801177E−07 | 1.153365E−06 | 5.683301E−09 |
| $Y^3$ | −1.223280E−07 | −1.884294E−08 | −4.877028E−07 | 1.179942E−07 | −2.117705E−07 | −5.600182E−09 |
| $X^4$ | −7.040228E−11 | 7.425419E−11 | 2.136430E−09 | 4.622733E−10 | −1.333652E−09 | −5.926598E−11 |
| $X^2Y^2$ | −1.318594E−10 | 1.067519E−10 | 9.622356E−09 | −4.928633E−10 | 1.322772E−08 | −2.894278E−11 |
| $Y^4$ | 6.586919E−11 | 1.598749E−10 | 9.675806E−10 | 8.019884E−10 | 3.924061E−09 | 1.500259E−11 |
| $X^4Y$ | −1.333049E−12 | 9.551370E−14 | 4.142100E−11 | 7.245165E−13 | −2.333334E−11 | 8.269178E−15 |
| $X^2Y^3$ | −7.486772E−12 | −5.744418E−13 | 2.571945E−11 | −5.121409E−12 | −4.081436E−11 | −1.142259E−14 |
| $Y^5$ | −7.859762E−14 | −1.146786E−12 | 1.015135E−12 | 7.149294E−13 | −3.294173E−11 | −6.514010E−14 |
| $X^6$ | −1.349693E−17 | −2.093126E−15 | 5.786287E−14 | 7.466543E−16 | 3.666869E−14 | −1.312132E−16 |
| $X^4Y^2$ | −4.117907E−15 | 3.600153E−15 | 1.917870E−13 | 4.761724E−15 | 1.666994E−13 | −1.600140E−16 |
| $X^2Y^4$ | 2.686652E−14 | 2.433374E−14 | 1.452311E−14 | −1.001928E−14 | 1.713311E−13 | 4.528614E−17 |
| $Y^6$ | −6.985464E−15 | −1.574024E−15 | −4.040479E−15 | 1.285725E−15 | 3.233877E−13 | 1.795344E−16 |
| $X^6Y$ | −6.324670E−18 | 1.672711E−17 | 6.549813E−16 | 7.589572E−18 | 1.109670E−15 | 7.389564E−20 |
| $X^4Y^3$ | 1.633680E−16 | −5.475446E−17 | 2.838607E−16 | 1.219368E−17 | 1.040774E−15 | −3.901601E−20 |
| $X^2Y^5$ | 2.578083E−17 | −2.114042E−17 | −8.191058E−17 | −1.112382E−17 | −4.281539E−15 | −8.922758E−19 |
| $Y^7$ | −5.352170E−18 | −4.852332E−17 | −8.778735E−18 | 1.658599E−18 | −1.041652E−15 | −5.361021E−19 |
| $X^8$ | 3.930907E−20 | −3.041873E−20 | 1.620935E−18 | 3.142617E−21 | −2.044671E−18 | −3.471237E−22 |
| $X^6Y^2$ | 2.642712E−19 | 1.926793E−19 | 2.461846E−18 | 4.103145E−20 | 9.496169E−18 | −5.396836E−22 |
| $X^4Y^4$ | −1.209256E−18 | 7.815308E−19 | 2.461216E−20 | 2.400689E−20 | 2.006336E−17 | 4.153767E−23 |
| $X^2Y^6$ | −5.242330E−19 | −2.345008E−19 | −1.129636E−20 | −4.573196E−22 | −8.505126E−18 | 2.958769E−21 |
| $Y^8$ | 5.723961E−20 | −4.523191E−19 | 2.359743E−20 | 2.441529E−21 | 2.039563E−17 | 1.076978E−21 |
| $X^8Y$ | −5.843186E−22 | 4.059084E−22 | 1.256052E−20 | 1.926704E−23 | −6.283441E−20 | 8.511910E−25 |
| $X^6Y^3$ | −1.725684E−21 | −3.122858E−21 | 2.334258E−21 | 9.329420E−23 | −1.729457E−19 | 2.027558E−25 |
| $X^4Y^5$ | 4.331458E−21 | −1.961697E−21 | 8.015847E−22 | 2.907419E−23 | 2.503951E−19 | −5.006594E−24 |
| $X^2Y^7$ | 1.628473E−21 | −1.158132E−20 | 2.742066E−22 | 8.412546E−24 | −3.164177E−19 | −7.133872E−24 |
| $Y^9$ | −2.174037E−22 | −5.641899E−21 | −6.405172E−23 | 1.117517E−24 | 1.693513E−19 | −7.896547E−25 |
| $X^{10}$ | 3.942480E−26 | −1.611794E−24 | −3.181193E−25 | 1.249724E−27 | −2.648224E−23 | −6.952534E−28 |
| $X^8Y^2$ | 2.026760E−24 | 2.715637E−24 | 2.416966E−23 | 3.491430E−26 | −5.242301E−22 | −5.078551E−27 |
| $X^6Y^4$ | 3.177651E−24 | 1.517348E−23 | −1.929381E−24 | 8.815740E−26 | −7.406490E−22 | −1.604907E−26 |
| $X^4Y^6$ | −6.089337E−24 | −2.527074E−23 | 2.506522E−24 | 2.875808E−26 | 3.978023E−21 | 4.391294E−28 |
| $X^2Y^8$ | −1.609759E−24 | −7.803424E−23 | 1.589355E−25 | 1.072608E−26 | −2.716665E−21 | 4.653881E−27 |
| $Y^{10}$ | 2.665008E−25 | −1.428174E−23 | −2.253314E−25 | 5.234796E−28 | 1.510394E−21 | −1.026184E−27 |
| Nradius | 1.00E+00 | 1.00E+00 | 1.00E+00 | 1.00E+00 | 1.00E+00 | 1.00E+00 |
| Y-decenter | −107.723 | −48.244 | 142.711 | 9.140 | 15.331 | 1.453 |
| X-rotation | −3.086 | 0.713 | −20.000 | −1.900 | 0.245 | 2.474 |

Figure 19:
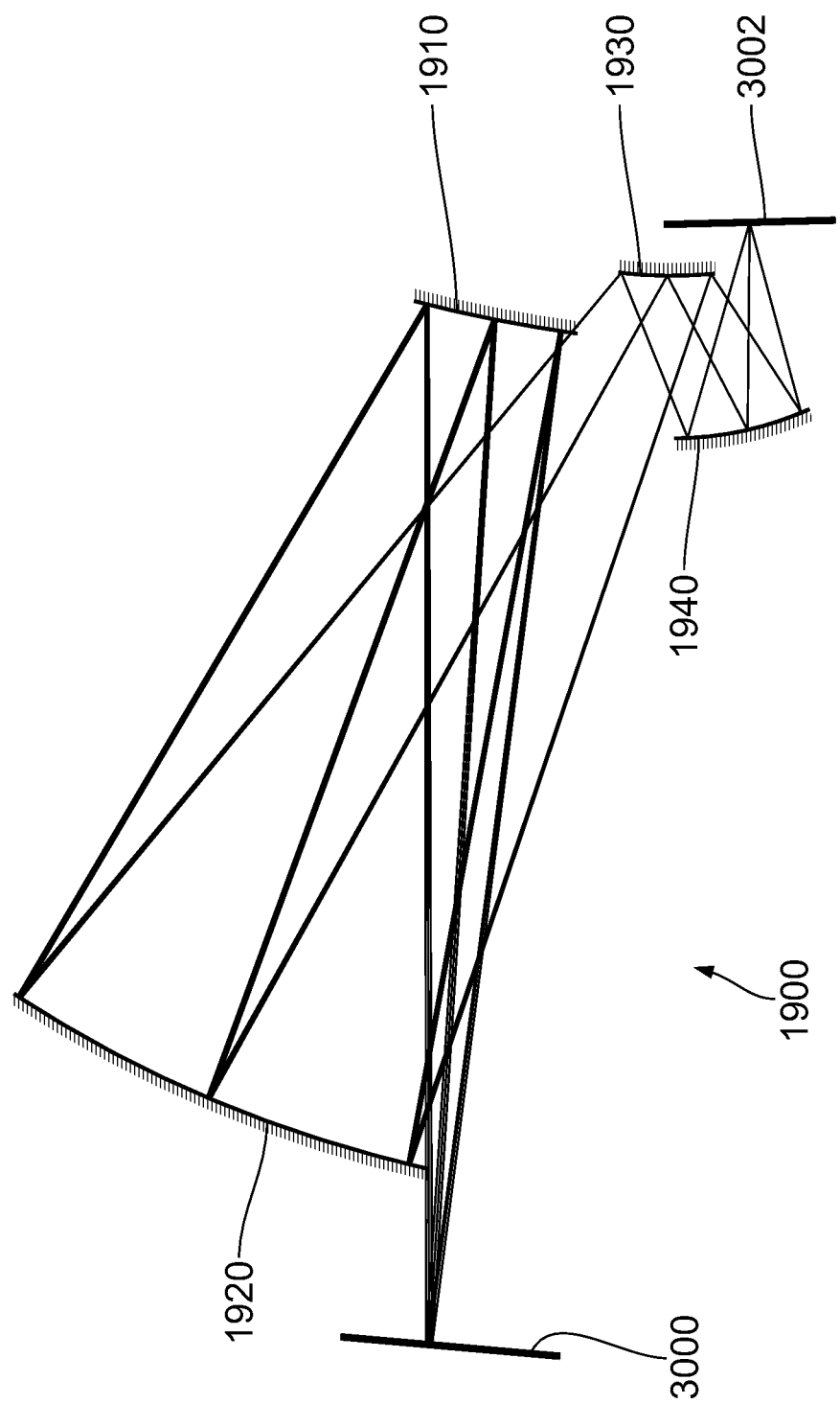
FIG. 19 is a cross-sectional view of a projection objective shown in meridional section.

Referring to FIG. 19, an embodiment of a projection objective 1900 includes four rotationally-asymmetric mirrors 1910, 1920, 1930, and 1940, which direct radiation from an object plane 3000 to an image plane 3002. Projection objective 1900 images radiation from an object plane 3000 to an image plane 3002 with a demagnification ratio of 4×.

Projection objective 1900 has an image-side NA of 0.26. Projection objective 1900 has a rectangular field. The height and width of the field at object plane 3000 is 8 mm and 100 mm, respectively. The tracklength of projection objective 1900 is 2,360 mm. Image plane 3002 is tilted with respect to object plane 3000 by −3.84°.

Data for projection objective 1900 is presented in Tables 10A, 10B, 10C, and 10D below. Table 10A presents optical data, Tables 10B and 10C present rotationally-asymmetric constants for each of the mirror surfaces. For the purposes of Tables 10A-10D, the mirror designations correlate as follows: mirror 1 (M1) corresponds to mirror 1910; mirror 2 (M2) corresponds to mirror 1920; mirror 3 (M3) corresponds to mirror 1930; and mirror 4 (M4) corresponds to mirror 1940.

TABLE 10A

| Surface | Radius | Spacing | Mode |
|---|---|---|---|
| Object | INFINITY | 2102.043 | |
| Mirror 1 | 3004.821 | −1812.311 | REFL |
| Mirror 2 | 2545.365 | 1957.316 | REFL |
| Mirror 3 | 706.710 | 0.000 | REFL |
| STOP | INFINITY | −339.990 | |
| Mirror 4 | 741.656 | 453.302 | REFL |
| Image | INFINITY | 0.000 | |

TABLE 10B

| Coefficient | M1 | M2 | M3 | M4 | Image |
|---|---|---|---|---|---|
| Y-decenter | −65.523 | 54.692 | 48.905 | 47.778 | 23.755 |
| X-rotation | −2.620 | −2.374 | −2.706 | −1.585 | −3.084 |

TABLE 10C

| Coefficient | M1 | M2 | M3 | M4 |
|---|---|---|---|---|
| K | −1.09E+00 | 5.80E−02 | 2.06E+00 | 6.72E−01 |
| Y | 0.00E+00 | 0.00E+00 | 0.00E+00 | 0.00E+00 |
| $X^2$ | 3.54E−04 | 9.93E−06 | −5.35E−04 | 1.23E−04 |
| $Y^2$ | 1.97E−04 | 1.07E−05 | 1.23E−05 | 2.97E−04 |
| $X^2Y$ | −6.42E−07 | −2.47E−08 | −4.37E−07 | −2.44E−07 |
| $Y^3$ | 3.69E−07 | 1.89E−08 | −1.34E−06 | −4.72E−07 |
| $X^4$ | 2.63E−09 | 3.01E−12 | −2.94E−08 | −5.08E−09 |
| $X^2Y^2$ | −1.09E−10 | 2.13E−11 | −3.33E−08 | −5.07E−09 |
| $Y^4$ | −6.07E−11 | −1.88E−11 | −1.42E−08 | −1.36E−09 |
| $X^4Y$ | −2.66E−11 | −7.36E−14 | 4.84E−11 | −4.80E−12 |
| $X^2Y^3$ | 2.61E−11 | 3.55E−14 | −5.06E−11 | −1.05E−11 |
| $Y^5$ | −1.67E−12 | −6.53E−15 | 7.86E−11 | −1.06E−11 |
| $X^6$ | −8.14E−13 | −2.93E−16 | −7.71E−13 | −1.04E−13 |
| $X^4Y^2$ | 1.29E−13 | 6.33E−17 | −1.53E−12 | −4.13E−13 |
| $X^2Y^4$ | −4.50E−14 | −7.40E−17 | 2.40E−13 | −3.31E−13 |
| $Y^6$ | 1.04E−15 | 1.42E−17 | −6.88E−13 | 1.99E−14 |
| $X^6Y$ | 1.96E−14 | 3.20E−18 | −6.34E−15 | −1.31E−15 |
| $X^4Y^3$ | −2.85E−16 | 2.38E−19 | −1.30E−14 | −5.72E−15 |
| $X^2Y^5$ | −1.60E−16 | −4.36E−20 | 1.43E−14 | −9.75E−16 |
| $Y^7$ | 1.93E−18 | 1.20E−20 | 1.61E−15 | 2.08E−15 |
| $X^8$ | −1.62E−17 | −1.41E−21 | −8.44E−19 | −7.70E−18 |
| $X^6Y^2$ | −1.69E−16 | −1.19E−20 | 1.72E−16 | −1.13E−16 |
| $X^4Y^4$ | 3.10E−18 | 5.44E−22 | 2.91E−16 | −1.26E−16 |
| $X^2Y^6$ | −2.80E−19 | 8.10E−22 | 9.83E−18 | 4.36E−17 |
| $Y^8$ | 8.73E−21 | −4.31E−24 | 4.37E−17 | 3.31E−17 |
| $X^8Y$ | 1.79E−19 | 6.79E−24 | 1.76E−18 | −4.84E−19 |
| $X^6Y^3$ | 6.22E−19 | 1.62E−23 | 6.22E−18 | −2.33E−18 |
| $X^4Y^5$ | −2.21E−20 | −3.41E−24 | −1.22E−19 | −1.19E−18 |
| $X^2Y^7$ | 4.10E−21 | −2.28E−24 | −2.47E−18 | 5.49E−19 |
| $Y^9$ | 9.75E−23 | −5.21E−26 | −5.68E−19 | 2.75E−19 |
| $X^{10}$ | −3.29E−23 | −8.73E−28 | −5.00E−21 | −4.71E−22 |
| $X^8Y^2$ | −4.75E−22 | −7.40E−27 | −6.76E−20 | −6.64E−21 |
| $X^6Y^4$ | −8.19E−22 | −6.01E−27 | −1.52E−19 | −1.46E−20 |
| $X^4Y^6$ | 4.25E−23 | 3.34E−27 | −4.79E−20 | −4.03E−21 |
| $X^2Y^8$ | −6.29E−24 | 2.20E−27 | 5.65E−21 | 1.87E−21 |
| $Y^{10}$ | −3.17E−25 | 9.18E−29 | 2.89E−21 | 8.49E−22 |
| Nradius | 3.00E+00 | 3.00E+00 | 3.00E+00 | 3.00E+00 |

TABLE 10D

| $x_{Object}/mm$ | $y_{Object}/mm$ | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 600 | 0 | −0.960073 | 0.960073 | 0.0196465 | 0.027195 |
| 0 | 602 | 0 | −1.46082 | 1.46082 | 0.0111602 | 0.019766 |
| 0 | 604 | 0 | −1.14157 | 1.14157 | 0.00258716 | 0.015522 |
| 0 | 606 | 0 | −0.708422 | 0.708422 | 0.00607316 | 0.01395 |
| 0 | 608 | 0 | −0.868087 | 0.868087 | 0.0148213 | 0.032279 |
| 12.5 | 600 | −0.702813 | −0.349919 | 0.785105 | 0.0226563 | 0.026075 |
| 12.5 | 602 | −0.506161 | −0.815296 | 0.959639 | 0.0159931 | 0.018251 |
| 12.5 | 604 | −0.214821 | −0.491402 | 0.536306 | 0.011916 | 0.01476 |
| 12.5 | 606 | 0.161171 | −0.084304 | 0.181888 | 0.0132822 | 0.014764 |
| 12.5 | 608 | 0.611783 | −0.300692 | 0.681685 | 0.0190686 | 0.032953 |
| 25 | 600 | −0.828473 | 0.99838 | 1.29736 | 0.0299227 | 0.025603 |
| 25 | 602 | −0.613329 | 0.633853 | 0.882011 | 0.0254871 | 0.014924 |
| 25 | 604 | −0.210678 | 0.966257 | 0.988958 | 0.0234105 | 0.012561 |
| 25 | 606 | 0.359349 | 1.28961 | 1.33874 | 0.0243974 | 0.016745 |
| 25 | 608 | 1.07663 | 0.89729 | 1.40152 | 0.028208 | 0.035061 |
| 37.5 | 600 | −0.079109 | 1.6231 | 1.62502 | 0.0391462 | 0.033551 |
| 37.5 | 602 | −0.207297 | 1.40928 | 1.42444 | 0.036144 | 0.015412 |
| 37.5 | 604 | −0.058849 | 1.73794 | 1.73893 | 0.035006 | 0.008795 |
| 37.5 | 606 | 0.335888 | 1.90321 | 1.93262 | 0.0359723 | 0.018708 |
| 37.5 | 608 | 0.946577 | 1.1986 | 1.5273 | 0.0389452 | 0.038658 |
| 50 | 600 | 1.28921 | −0.96207 | 1.60861 | 0.0492443 | 0.056489 |
| 50 | 602 | 0.261464 | −1.00092 | 1.03450 | 0.0471902 | 0.03219 |
| 50 | 604 | −0.405953 | −0.714664 | 0.821914 | 0.0466375 | 0.018965 |
| 50 | 606 | −0.753775 | −0.809016 | 1.10575 | 0.0476858 | 0.02652 |
| 50 | 608 | −0.82272 | −1.99027 | 2.15361 | 0.0502807 | 0.047096 |

With respect to Table 10D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength $\lambda=13.5$ nm. As the optical system is mirror symmetric with respect to the yz-plane it is sufficient to give data for fieldpoints having positive x-coordinates in the object plane.

Figure 20:
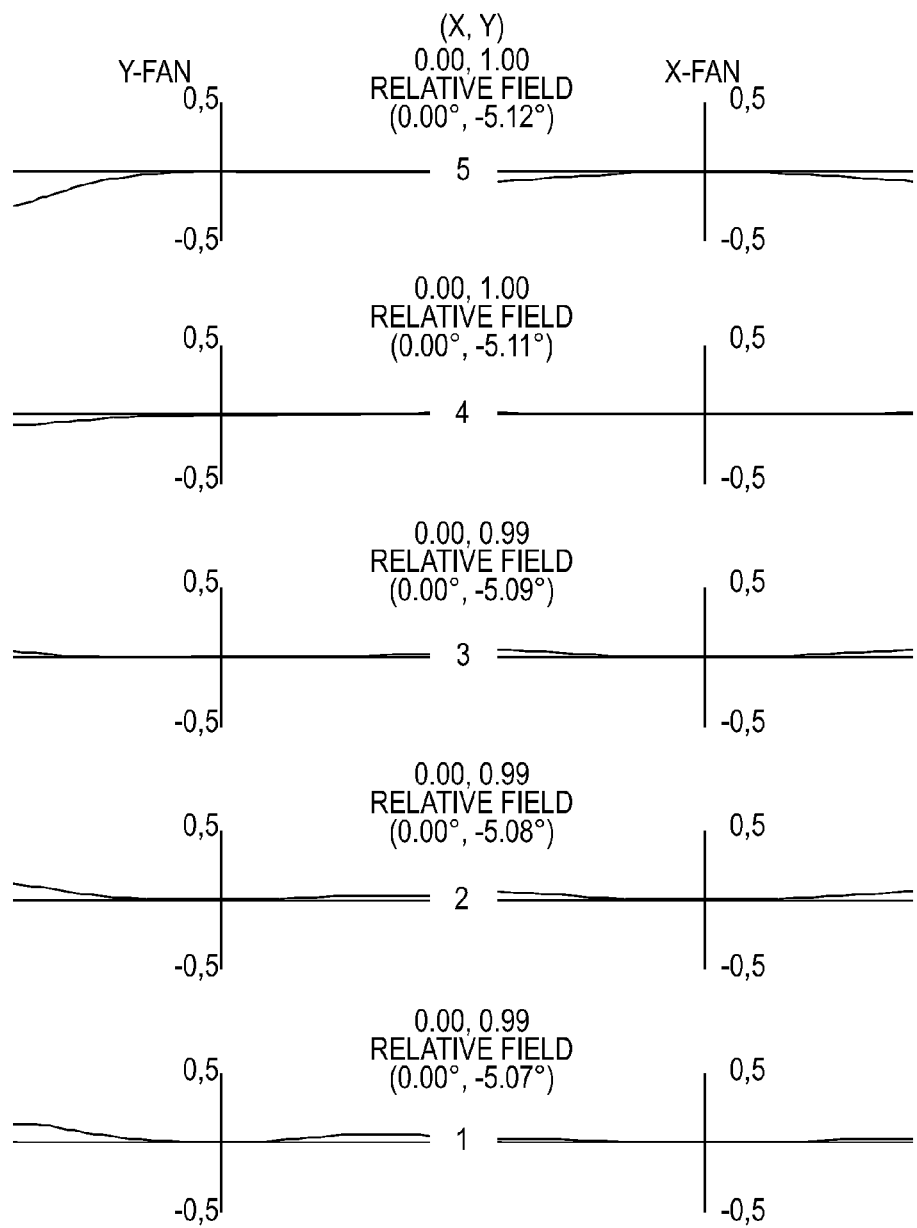
FIGS. 20, 21 and 22 are plots showing lateral aberrations as a function of position in the image field for the projection objective shown in FIG. 19.
Figure 21:
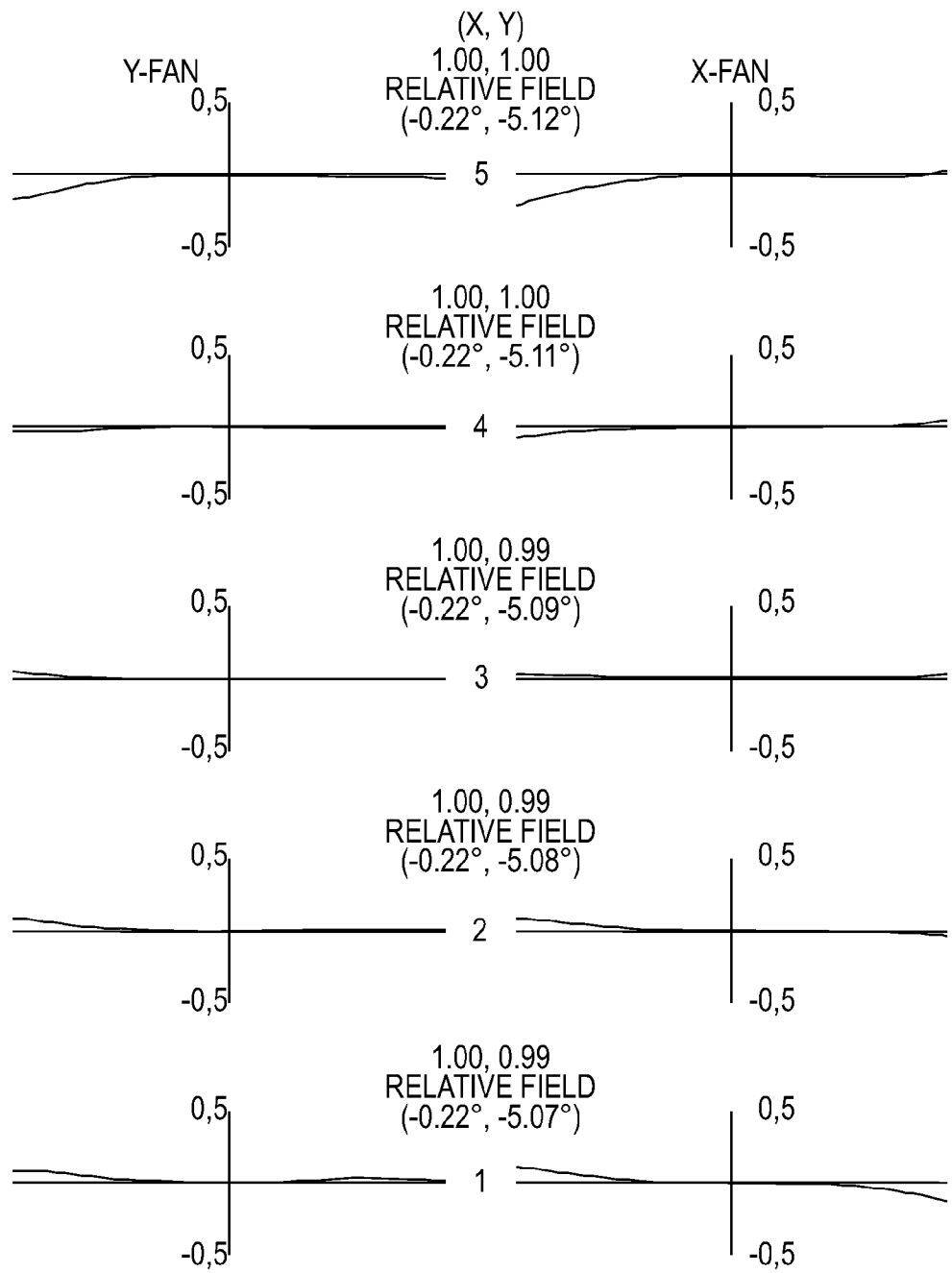
Figure 22:
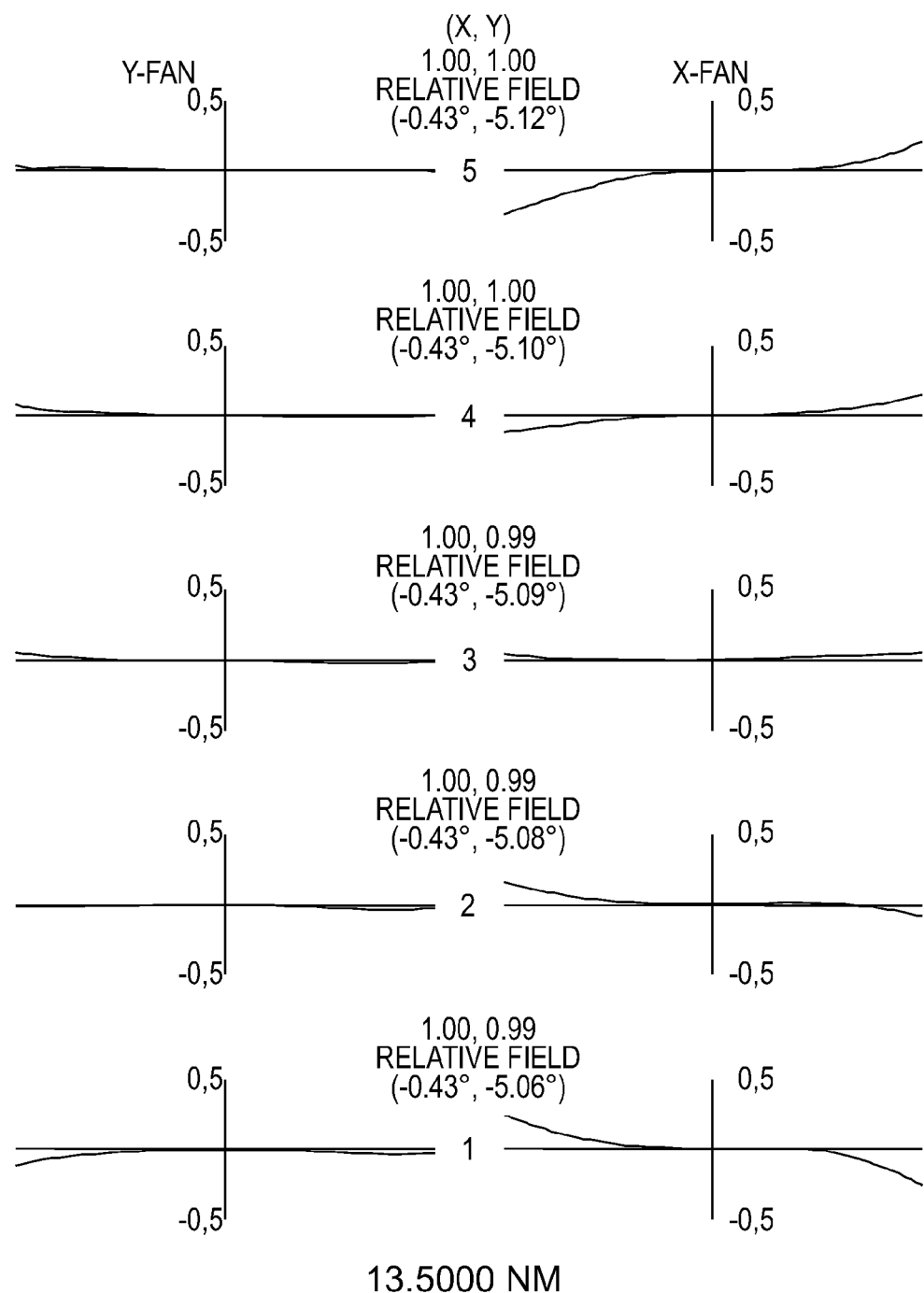

FIGS. 20, 21, and 22 show lateral aberrations in the coordinate system of the exit pupil of projection objective 1900. These aberration plots show the wavefront error for 15 fieldpoints. The fieldpoints correspond to five equidistant y-coordinates between $y_{min}$ and $y_{max}$ at the center of the object field at x=0, at $x=x_{max}/2$ and at $x=x_{max}$.

Figure 23:
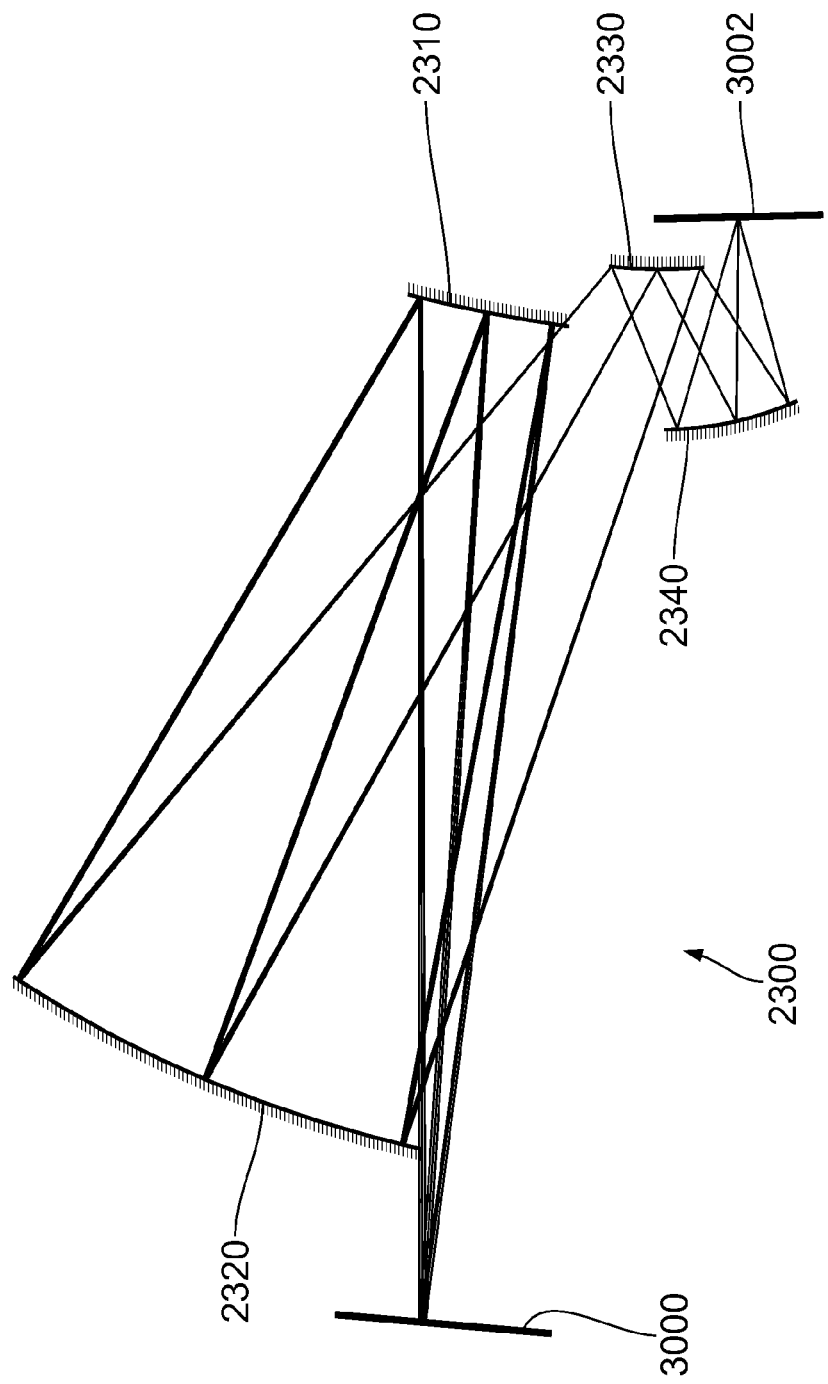
FIG. 23 is a cross-sectional view of a projection objective shown in meridional section.

Referring to FIG. 23, another embodiment of a projection objective 2300 includes four rotationally-asymmetric mirrors 2310, 2320, 2330, and 2340, which direct radiation from object plane 3000 to image plane 3002. Projection objective 2300 images radiation from an object plane 3000 to an image plane 3002 with a demagnification ratio of 4×.

Projection objective 2300 has an image-side NA of 0.3. Projection objective 1900 has a rectangular field. The height and width of the field at object plane 3000 is 8 mm and 100 mm, respectively. The tracklength of projection objective 2300 is 2,354 mm. Image plane 3002 is tilted with respect to object plane 3000 by −3,798°.

Data for projection objective 2300 is presented in Tables 11A, 11B, 11C, and 11D below. Table 11A presents optical data, Tables 11B and 11C present rotationally-asymmetric constants for each of the mirror surfaces. For the purposes of Tables 11A-11D, the mirror designations correlate as follows: mirror 1 (M1) corresponds to mirror 2310; mirror 2 (M2) corresponds to mirror 2320; mirror 3 (M3) corresponds to mirror 2330; and mirror 4 (M4) corresponds to mirror 2340.

TABLE 11A

| Surface  | Radius   | Spacing   | Mode |
|----------|----------|-----------|------|
| Object   | INFINITY | 2102.043  |      |
| Mirror 1 | 3030.572 | −1827.768 | REFL |
| Mirror 2 | 2546.206 | 1949.851  | REFL |
| Mirror 3 | 689.344  | 0.000     | REFL |
| STOP     | INFINITY | −322.728  |      |
| Mirror 4 | 734.331  | 452.552   | REFL |
| Image    | INFINITY | 0.000     |      |

TABLE 11B

| Coefficient | M1      | M2     | M3     | M4     | Image  |
|-------------|---------|--------|--------|--------|--------|
| Y-decenter  | −60.435 | 53.835 | 51.299 | 48.788 | 20.674 |
| X-rotation  | −2.524  | −2.393 | −2.965 | −1.494 | −3.798 |

TABLE 11C

| Coefficient | M1        | M2        | M3        | M4        |
|-------------|-----------|-----------|-----------|-----------|
| K           | −1.64E+00 | 5.42E−02  | 2.28E+00  | 7.41E−01  |
| Y           | 0.00E+00  | 0.00E+00  | 0.00E+00  | 0.00E+00  |
| $X^2$       | 3.01E−04  | 8.11E−06  | −2.17E−04 | 3.12E−04  |
| $Y^2$       | 1.85E−04  | 9.90E−06  | 1.37E−05  | 3.77E−04  |
| $X^2Y$      | −8.52E−07 | −2.68E−08 | −8.61E−07 | −3.91E−07 |
| $Y^3$       | 3.22E−07  | 1.35E−08  | −1.77E−06 | −3.44E−07 |
| $X^4$       | 1.85E−09  | −4.10E−12 | −3.25E−08 | −3.95E−09 |
| $X^2Y^2$    | 1.66E−09  | 2.16E−11  | −4.52E−08 | −3.73E−09 |
| $Y^4$       | −2.66E−10 | −2.70E−11 | −1.63E−08 | 1.07E−09  |
| $X^4Y$      | −1.09E−11 | −4.58E−14 | 2.88E−11  | −5.23E−12 |
| $X^2Y^3$    | 2.59E−11  | 1.36E−14  | −5.03E−11 | −3.04E−12 |
| $Y^5$       | −2.08E−12 | −8.16E−15 | 5.68E−11  | 9.47E−13  |

TABLE 11C-continued

| Coefficient | M1        | M2        | M3        | M4        |
|-------------|-----------|-----------|-----------|-----------|
| $X^6$       | −3.36E−13 | −1.32E−16 | −1.05E−12 | −8.91E−14 |
| $X^4Y^2$    | 4.77E−14  | 2.14E−18  | −2.39E−12 | −2.67E−13 |
| $X^2Y^4$    | −1.05E−13 | −8.15E−17 | −5.56E−13 | −1.48E−13 |
| $Y^6$       | 2.44E−15  | 1.81E−17  | −8.66E−13 | −9.89E−14 |
| $X^6Y$      | 7.74E−15  | 1.24E−18  | −2.94E−15 | 6.43E−17  |
| $X^4Y^3$    | −1.33E−16 | 3.33E−19  | −7.65E−15 | −1.59E−15 |
| $X^2Y^5$    | 6.38E−17  | 1.05E−20  | 2.25E−15  | −1.75E−15 |
| $Y^7$       | 1.78E−17  | −9.61E−21 | 5.45E−15  | −1.44E−15 |
| $X^8$       | −5.84E−18 | −6.31E−22 | −2.12E−17 | −2.74E−18 |
| $X^6Y^2$    | −6.51E−17 | −4.73E−21 | −2.21E−17 | −2.49E−17 |
| $X^4Y^4$    | 1.12E−18  | −1.06E−21 | 1.03E−17  | −4.22E−17 |
| $X^2Y^6$    | −1.87E−19 | 3.30E−23  | −3.82E−17 | −1.56E−17 |
| $Y^8$       | −1.84E−20 | −2.35E−23 | 4.83E−17  | −2.21E−18 |
| $X^8Y$      | 6.56E−20  | 3.32E−24  | 5.90E−19  | −1.29E−19 |
| $X^6Y^3$    | 2.32E−19  | 6.89E−24  | 2.59E−18  | −5.99E−19 |
| $X^4Y^5$    | −7.44E−21 | 1.27E−24  | 2.28E−19  | −4.47E−19 |
| $X^2Y^7$    | 2.48E−21  | −3.15E−25 | 3.92E−19  | −9.74E−20 |
| $Y^9$       | 4.79E−23  | 3.01E−26  | −8.17E−20 | 7.95E−20  |
| $X^{10}$    | −1.93E−23 | −6.89E−28 | −3.94E−21 | −2.24E−22 |
| $X^8Y^2$    | −1.74E−22 | −4.55E−27 | −2.48E−20 | −2.04E−21 |
| $X^6Y^4$    | −2.97E−22 | −4.06E−27 | −4.24E−20 | −4.46E−21 |
| $X^4Y^6$    | 1.36E−23  | −1.24E−27 | −3.93E−21 | −1.90E−21 |
| $X^2Y^8$    | −4.52E−24 | 3.71E−28  | 9.91E−21  | −3.41E−22 |
| $Y^{10}$    | −2.43E−25 | −8.40E−31 | 2.16E−21  | 3.64E−22  |
| Nradius     | 3.00E+00  | 3.00E+00  | 3.00E+00  | 3.00E+00  |

TABLE 11D

| $x_{Object}/mm$ | $y_{Object}/mm$ | Distortion (x)/nm | Distortion (y)/nm | Absolute Value of Distortion/nm | Telecentricity/ Degrees | Wavefront Error at 13.5 nm |
|------|-----|-----------|-----------|----------|-----------|----------|
| 0    | 600 | 0         | −2.20023  | 2.20023  | 0.0179382 | 0.046052 |
| 0    | 602 | 0         | −1.79021  | 1.79021  | 0.0109101 | 0.029756 |
| 0    | 604 | 0         | −1.28717  | 1.28717  | 0.00378722| 0.023987 |
| 0    | 606 | 0         | −0.891336 | 0.891336 | 0.00343113| 0.017834 |
| 0    | 608 | 0         | −0.799202 | 0.799202 | 0.0107455 | 0.043696 |
| 12.5 | 600 | −1.08427  | −1.27001  | 1.66991  | 0.0239704 | 0.043224 |
| 12.5 | 602 | −0.470847 | −0.877877 | 0.996175 | 0.0193253 | 0.026959 |
| 12.5 | 604 | 0.0397523 | −0.421226 | 0.423098 | 0.0164496 | 0.024212 |
| 12.5 | 606 | 0.437494  | −0.10014  | 0.448809 | 0.016432  | 0.020337 |
| 12.5 | 608 | 0.712381  | −0.110954 | 0.72097  | 0.0193876 | 0.042811 |
| 25   | 600 | −1.45171  | 0.861628  | 1.68815  | 0.0365032 | 0.04072  |
| 25   | 602 | −0.473724 | 1.1945    | 1.28501  | 0.0337094 | 0.021812 |
| 25   | 604 | 0.296494  | 1.50628   | 1.53518  | 0.0322325 | 0.025914 |
| 25   | 606 | 0.838851  | 1.59734   | 1.80421  | 0.0323169 | 0.027051 |
| 25   | 608 | 1.13332   | 1.27182   | 1.70351  | 0.0340121 | 0.041958 |
| 37.5 | 600 | −0.729082 | 2.21013   | 2.32728  | 0.0509314 | 0.052463 |
| 37.5 | 602 | 0.112795  | 2.42562   | 2.42824  | 0.0490538 | 0.021672 |
| 37.5 | 604 | 0.637771  | 2.47706   | 2.55785  | 0.0481478 | 0.026628 |
| 37.5 | 606 | 0.815622  | 2.16558   | 2.31408  | 0.0483103 | 0.033809 |
| 37.5 | 608 | 0.616222  | 1.29608   | 1.43512  | 0.0495729 | 0.044712 |
| 50   | 600 | 0.775128  | −0.556886 | 0.954435 | 0.0660057 | 0.083092 |
| 50   | 602 | 0.722695  | −0.544482 | 0.904847 | 0.0646623 | 0.033187 |
| 50   | 604 | 0.238001  | −0.896861 | 0.927904 | 0.0640826 | 0.022442 |
| 50   | 606 | −0.719402 | −1.81183  | 1.94942  | 0.0643192 | 0.040278 |
| 50   | 608 | −2.18984  | −3.48339  | 4.11454  | 0.0653953 | 0.058456 |

With respect to Table 11D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength λ=13.5 nm. As the optical system is mirror symmetric with respect to the yz-plane it is sufficient to give data for fieldpoints having positive x-coordinates in the object plane.

Figure 24:
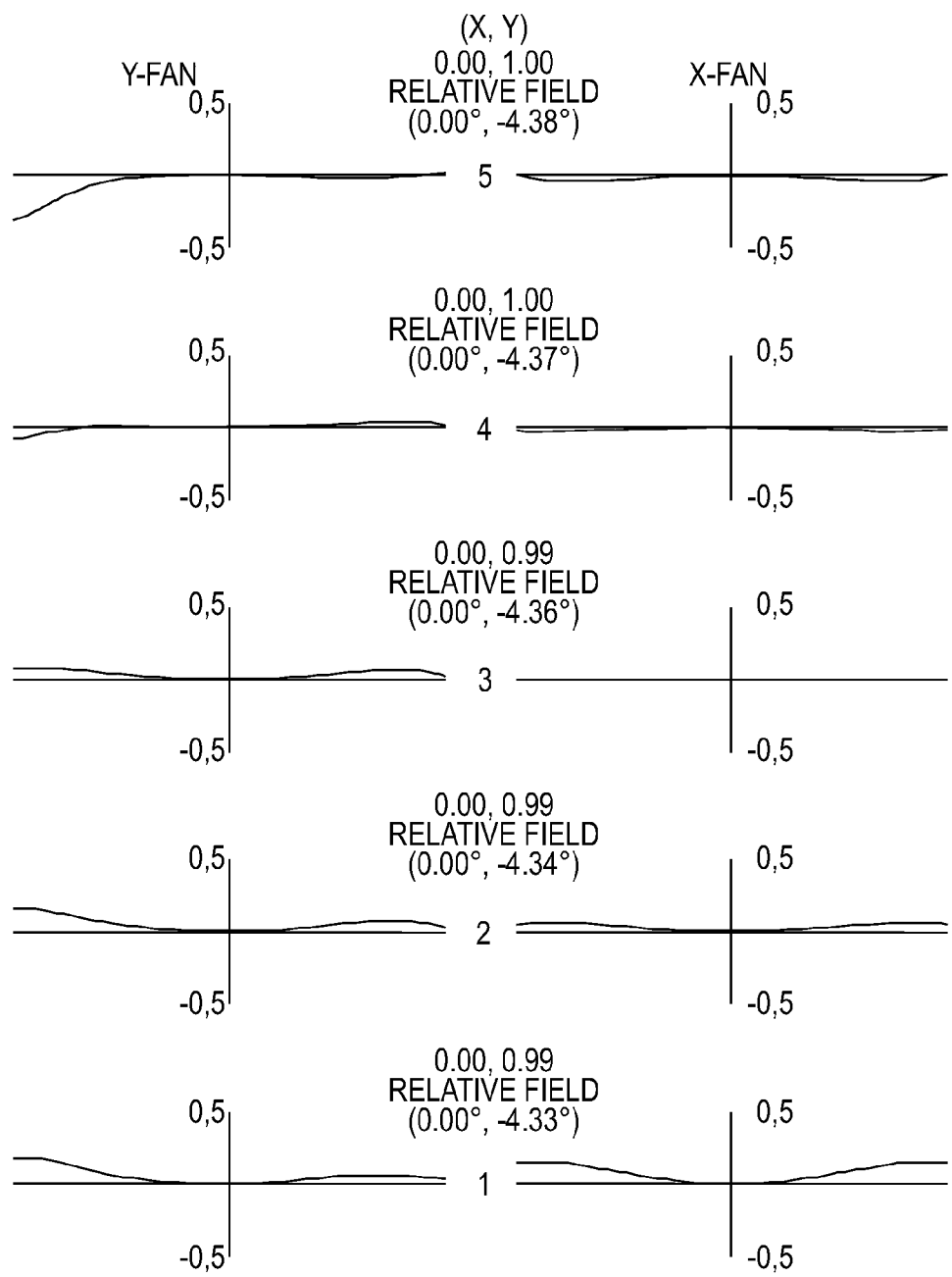
FIGS. 24, 25, and 26 are plots showing aberrations as a function of position in the image field for the projection objective shown in FIG. 23.
Figure 25:
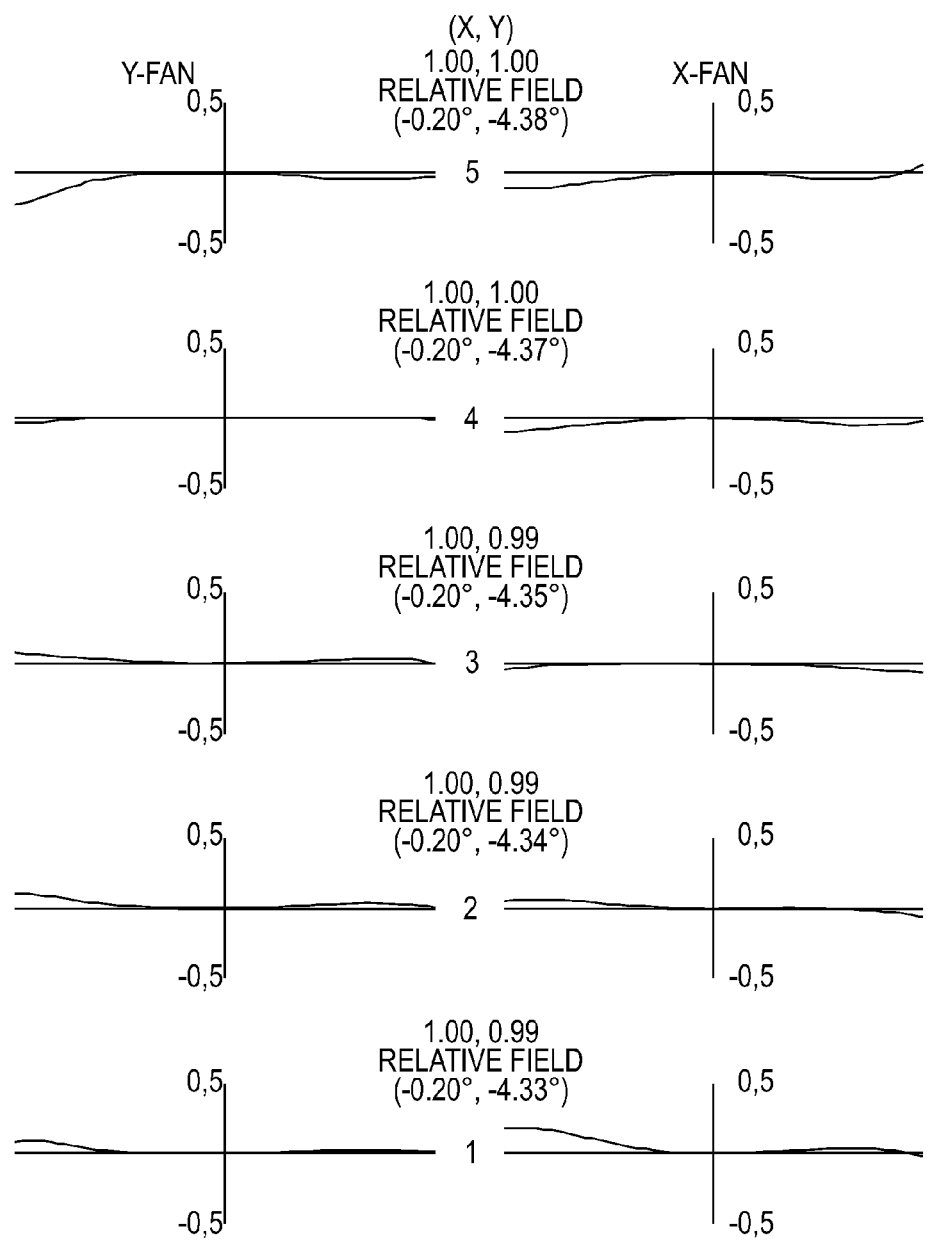
Figure 26:
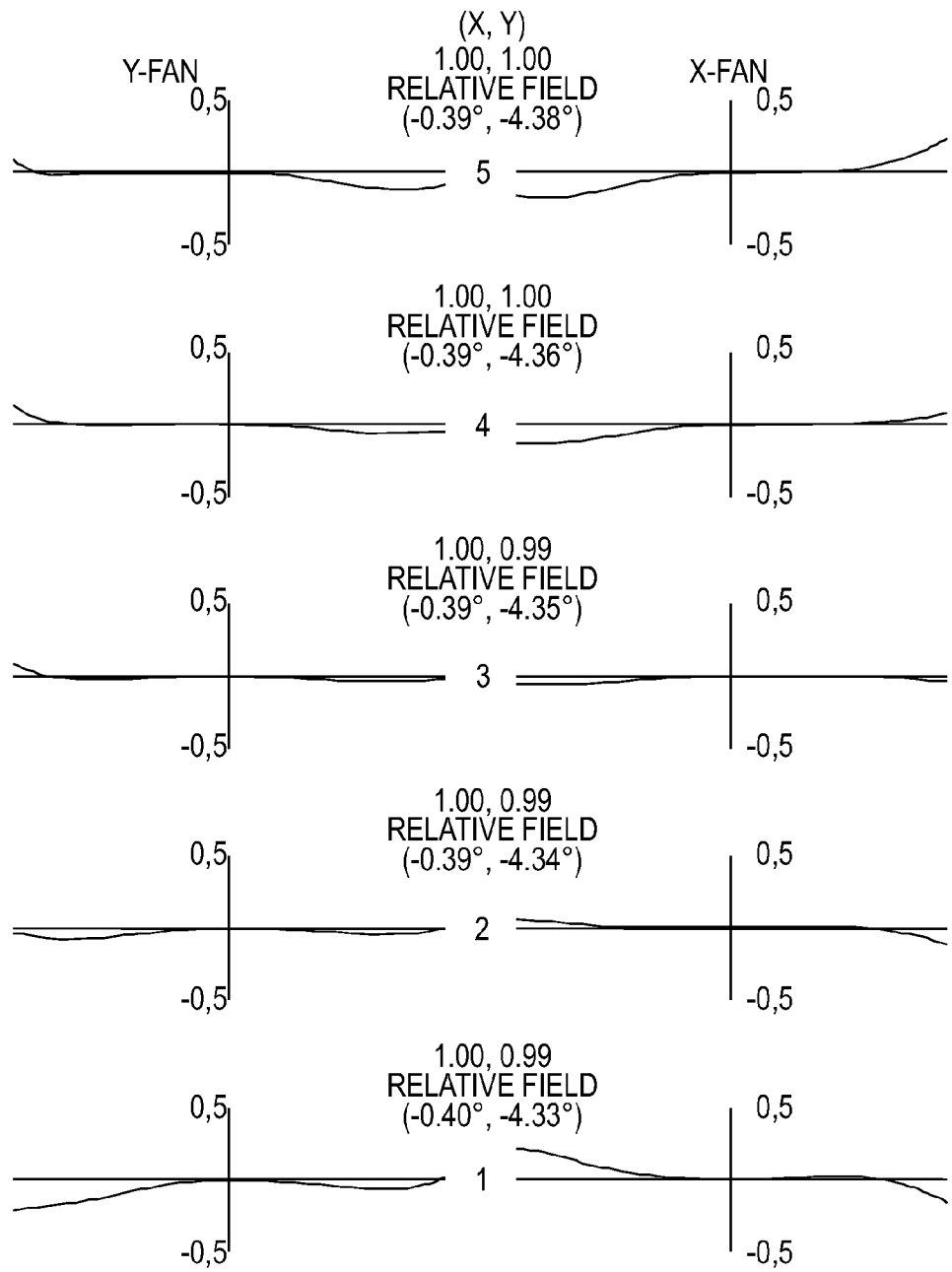

FIGS. 24, 25, and 26 show lateral aberrations in the coordinate system of the exit pupil of projection objective 2300. These aberration plots show the wavefront error for 15 fieldpoints. The fieldpoints correspond to five equidistant y-coordinates between $y_{min}$ and $y_{max}$ at the center of the object field at x=0, at x=$x_{max}$/2 and at x=$x_{max}$.

Figure 27:
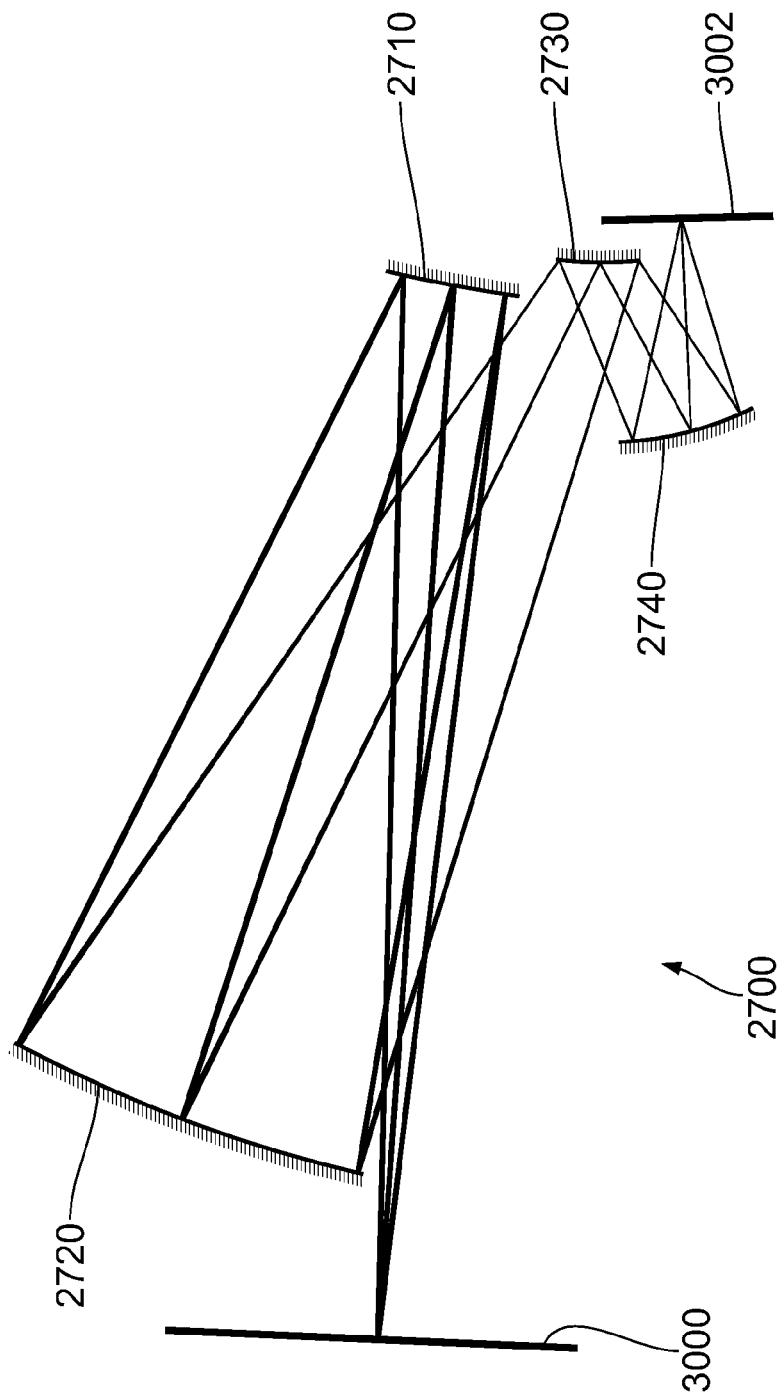
FIG. 27 is a cross-sectional view of a projection objective shown in meridional section.

Referring to FIG. 27, another embodiment of a projection objective 2700 includes four rotationally-asymmetric mirrors 2710, 2720, 2730, and 2740, which direct radiation from object plane 3000 to image plane 3002. Projection objective 2700 images radiation from an object plane 3000 to an image plane 3002 with a demagnification ratio of 5×.

Projection objective 2700 has an image-side NA of 0.25. Projection objective 1900 has a rectangular field. The height and width of the field at object plane 3000 is 8 mm and 100 mm, respectively. The tracklength of projection objective 2300 is 3,030 mm. Image plane 3002 is parallel to object plane 3000.

Data for projection objective 2700 is presented in Tables 12A, 12B, 12C, and 12D below. Table 12A presents optical data, Tables 12B and 12C present rotationally-asymmetric constants for each of the mirror surfaces. For the purposes of Tables 12A-12D, the mirror designations correlate as follows: mirror 1 (M1) corresponds to mirror 2710; mirror 2 (M2) corresponds to mirror 2720; mirror 3 (M3) corresponds to mirror 2730; and mirror 4 (M4) corresponds to mirror 2740.

TABLE 12A

| Surface | Radius (mm) | Spacing (mm) | Mode |
|---|---|---|---|
| Object | INFINITY | 2802.724 | |
| Mirror 1 | 3724.091 | −2465.218 | REFL |
| Mirror 2 | 3395.652 | 2585.049 | REFL |
| Mirror 3 | 966.548 | 0.000 | REFL |
| STOP | INFINITY | −489.055 | |
| Mirror 4 | 977.692 | 596.613 | REFL |
| Image | INFINITY | 0.000 | |

TABLE 12B

| Coefficient | M1 | M2 | M3 | M4 | Image |
|---|---|---|---|---|---|
| Y-decenter | −100.324 | 68.520 | 71.277 | 70.971 | 11.261 |
| X-rotation | −2.639 | −2.442 | −1.362 | −1.500 | 0.000 |

TABLE 12C

| Coefficient | M1 | M2 | M3 | M4 |
|---|---|---|---|---|
| K | −1.16E+00 | 2.46E−02 | 1.91E+00 | 6.14E−01 |
| Y | 0.00E+00 | 0.00E+00 | 0.00E+00 | 0.00E+00 |
| $X^2$ | 7.57E−04 | −5.51E−06 | −1.67E−03 | −7.26E−05 |
| $Y^2$ | 3.91E−04 | 1.41E−05 | 2.55E−04 | 5.59E−04 |
| $X^2Y$ | 3.33E−07 | 4.07E−08 | 7.06E−06 | 1.39E−06 |
| $Y^3$ | 7.43E−07 | 3.00E−08 | −1.85E−06 | −7.26E−07 |
| $X^4$ | −3.29E−10 | −1.40E−11 | −3.83E−08 | −9.63E−09 |
| $X^2Y^2$ | −5.31E−09 | 4.16E−11 | −2.00E−08 | −9.67E−09 |
| $Y^4$ | −1.29E−10 | 3.16E−11 | 1.30E−09 | −5.34E−10 |
| $X^4Y$ | 5.56E−11 | −8.02E−16 | 2.62E−10 | 2.05E−11 |
| $X^2Y^3$ | 9.40E−11 | 5.57E−14 | 1.95E−10 | −4.65E−11 |
| $Y^5$ | −4.49E−12 | −1.18E−13 | 1.24E−10 | −2.50E−11 |
| $X^6$ | −1.02E−13 | −2.32E−17 | −7.28E−13 | −2.01E−13 |
| $X^4Y^2$ | −6.56E−13 | 6.60E−16 | 3.35E−13 | −7.74E−13 |
| $X^2Y^4$ | −2.69E−13 | 8.67E−16 | 3.48E−12 | −1.39E−12 |
| $Y^6$ | −1.18E−15 | 1.46E−16 | 4.55E−13 | −6.59E−14 |
| $X^6Y$ | 1.01E−15 | −3.25E−19 | 1.32E−14 | −1.08E−15 |
| $X^4Y^3$ | 3.51E−15 | −1.59E−18 | 2.19E−14 | −5.45E−15 |
| $X^2Y^5$ | −1.34E−16 | −2.11E−18 | 2.46E−14 | −1.09E−14 |
| $Y^7$ | −2.06E−17 | 9.07E−21 | 1.98E−15 | −1.21E−17 |
| $X^8$ | 6.20E−19 | 7.45E−23 | −7.70E−18 | −5.96E−18 |
| $X^6Y^2$ | −3.16E−18 | 1.52E−21 | 4.77E−17 | −3.66E−17 |
| $X^4Y^4$ | −7.05E−18 | 2.84E−21 | 2.42E−16 | −4.83E−17 |
| $X^2Y^6$ | 1.15E−18 | 2.33E−21 | −1.14E−17 | −4.02E−17 |
| $Y^8$ | 8.47E−20 | −8.82E−23 | 9.94E−17 | 6.83E−19 |
| $X^8Y$ | 0.00E+00 | 0.00E+00 | 0.00E+00 | 0.00E+00 |
| $X^6Y^3$ | 0.00E+00 | 0.00E+00 | 0.00E+00 | 0.00E+00 |
| $X^4Y^5$ | 0.00E+00 | 0.00E+00 | 0.00E+00 | 0.00E+00 |
| $X^2Y^7$ | 0.00E+00 | 0.00E+00 | 0.00E+00 | 0.00E+00 |
| $Y^9$ | 0.00E+00 | 0.00E+00 | 0.00E+00 | 0.00E+00 |
| $X^{10}$ | 0.00E+00 | 0.00E+00 | 0.00E+00 | 0.00E+00 |
| $X^8Y^2$ | 0.00E+00 | 0.00E+00 | 0.00E+00 | 0.00E+00 |
| $X^6Y^4$ | 0.00E+00 | 0.00E+00 | 0.00E+00 | 0.00E+00 |
| $X^4Y^6$ | 0.00E+00 | 0.00E+00 | 0.00E+00 | 0.00E+00 |
| $X^2Y^8$ | 0.00E+00 | 0.00E+00 | 0.00E+00 | 0.00E+00 |
| $Y^{10}$ | 0.00E+00 | 0.00E+00 | 0.00E+00 | 0.00E+00 |
| Nradius | 4.00E+00 | 4.00E+00 | 4.00E+00 | 4.00E+00 |

TABLE 12D

| $x_{Object}$/mm | $y_{Object}$/mm | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 800 | 0 | −0.340392 | 0.340392 | 0.0258308 | 0.017169 |
| 0 | 802 | 0 | −0.548595 | 0.548595 | 0.0138699 | 0.019794 |
| 0 | 804 | 0 | −0.199318 | 0.199318 | 0.00186948 | 0.024128 |
| 0 | 806 | 0 | 0.121535 | 0.121535 | 0.0101706 | 0.014148 |
| 0 | 808 | 0 | −0.173787 | 0.173787 | 0.0222505 | 0.035190 |
| 12.5 | 800 | 0.0450163 | −0.176646 | 0.182292 | 0.0264815 | 0.018897 |
| 12.5 | 802 | −0.0866232 | −0.387405 | 0.396971 | 0.0151773 | 0.020501 |
| 12.5 | 804 | −0.0707759 | −0.0498264 | 0.0865557 | 0.00674106 | 0.024709 |
| 12.5 | 806 | 0.0891365 | 0.250161 | 0.265567 | 0.0122229 | 0.015804 |
| 12.5 | 808 | 0.389682 | −0.0752142 | 0.396874 | 0.0233473 | 0.036331 |
| 25 | 800 | 0.164298 | 0.201778 | 0.260208 | 0.0283526 | 0.021433 |
| 25 | 802 | −0.143816 | −0.0170961 | 0.144828 | 0.0185673 | 0.020512 |
| 25 | 804 | −0.157147 | 0.284935 | 0.325397 | 0.0131056 | 0.024535 |
| 25 | 806 | 0.117459 | 0.521867 | 0.534922 | 0.0169632 | 0.017161 |
| 25 | 808 | 0.673133 | 0.105856 | 0.681406 | 0.0263743 | 0.038085 |
| 37.5 | 800 | 0.382136 | 0.456584 | 0.595397 | 0.0312476 | 0.023030 |
| 37.5 | 802 | −0.192076 | 0.222698 | 0.294088 | 0.0231726 | 0.017658 |
| 37.5 | 804 | −0.324591 | 0.463967 | 0.566237 | 0.0195923 | 0.021537 |
| 37.5 | 806 | −0.025688 | 0.594265 | 0.59482 | 0.022802 | 0.014965 |
| 37.5 | 808 | 0.694325 | 0.0256282 | 0.694798 | 0.0307906 | 0.038495 |
| 50 | 800 | 0.623063 | 0.0244512 | 0.623543 | 0.0349462 | 0.032248 |

TABLE 12D-continued

| $x_{Object/mm}$ | $y_{Object/mm}$ | Distortion (x)/nm | Distortion (y)/nm | Absolute Value of Distortion/nm | Telecentricity/ Degrees | Wavefront Error at 13.5 nm |
|---|---|---|---|---|---|---|
| 50 | 802 | −0.351568 | −0.233592 | 0.422096 | 0.0284496 | 0.023561 |
| 50 | 804 | −0.738167 | −0.0805832 | 0.742553 | 0.0261558 | 0.025133 |
| 50 | 806 | −0.550452 | −0.102823 | 0.559974 | 0.0291262 | 0.020735 |
| 50 | 808 | 0.197816 | −0.888445 | 0.910201 | 0.0361232 | 0.042244 |

With respect to Table 12D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength $\lambda=13.5$ nm. As the optical system is mirror symmetric with respect to the yz-plane it is sufficient to give data for fieldpoints having positive x-coordinates in the object plane.

Figure 28:
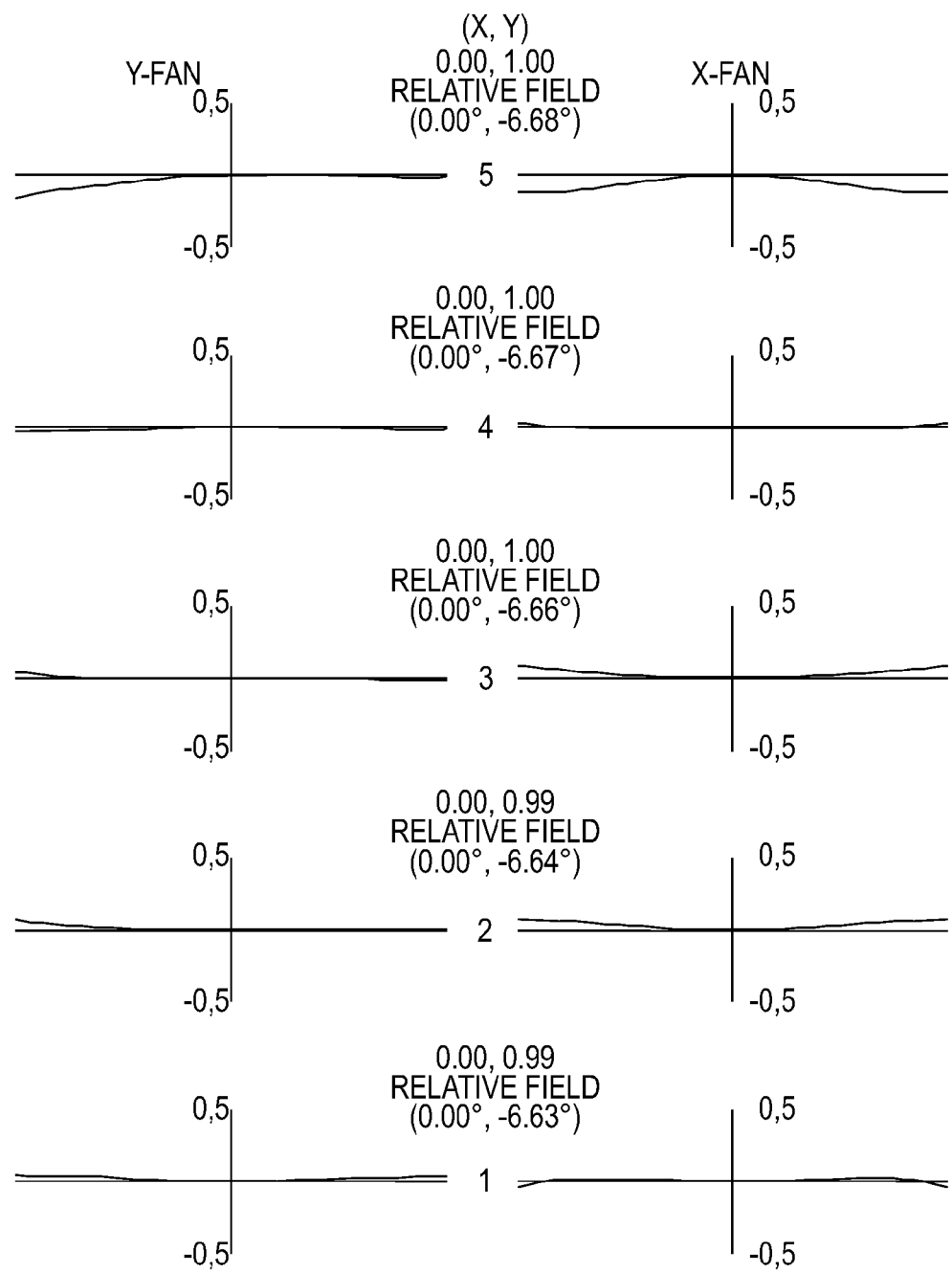
FIGS. 28, 29, and 30 are plots showing aberrations as a function of position in the image field for the projection objective shown in FIG. 27.
Figure 29:
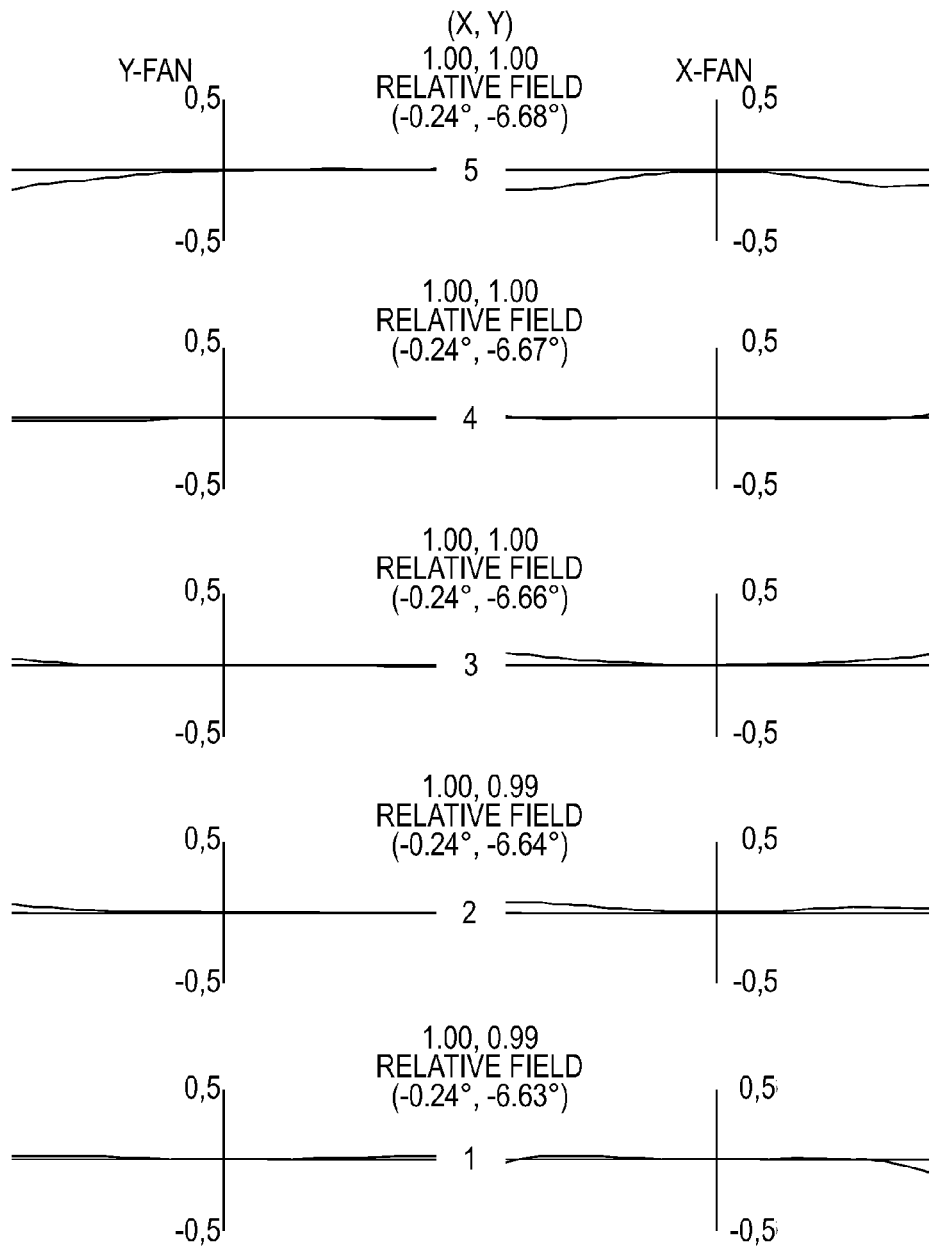
Figure 30:
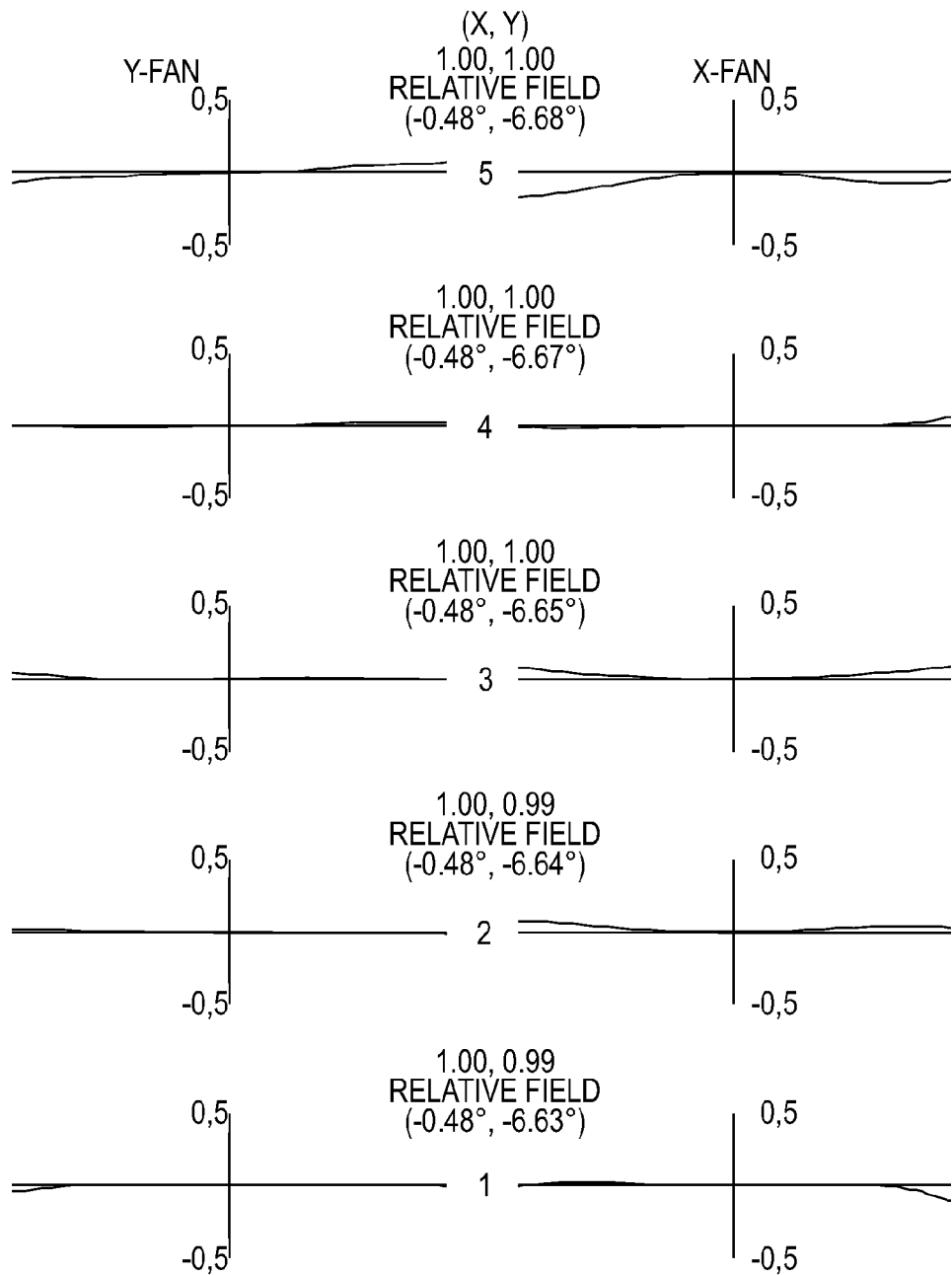

FIGS. 28, 29, and 30 show lateral aberrations in the coordinate system of the exit pupil of projection objective 2700. These aberration plots show the wavefront error for 15 fieldpoints. The fieldpoints correspond to five equidistant y-coordinates between $y_{min}$ and $y_{max}$ at the center of the object field at x=0, at $x=x_{max}/2$ and at $x=x_{max}$.

Figure 31:
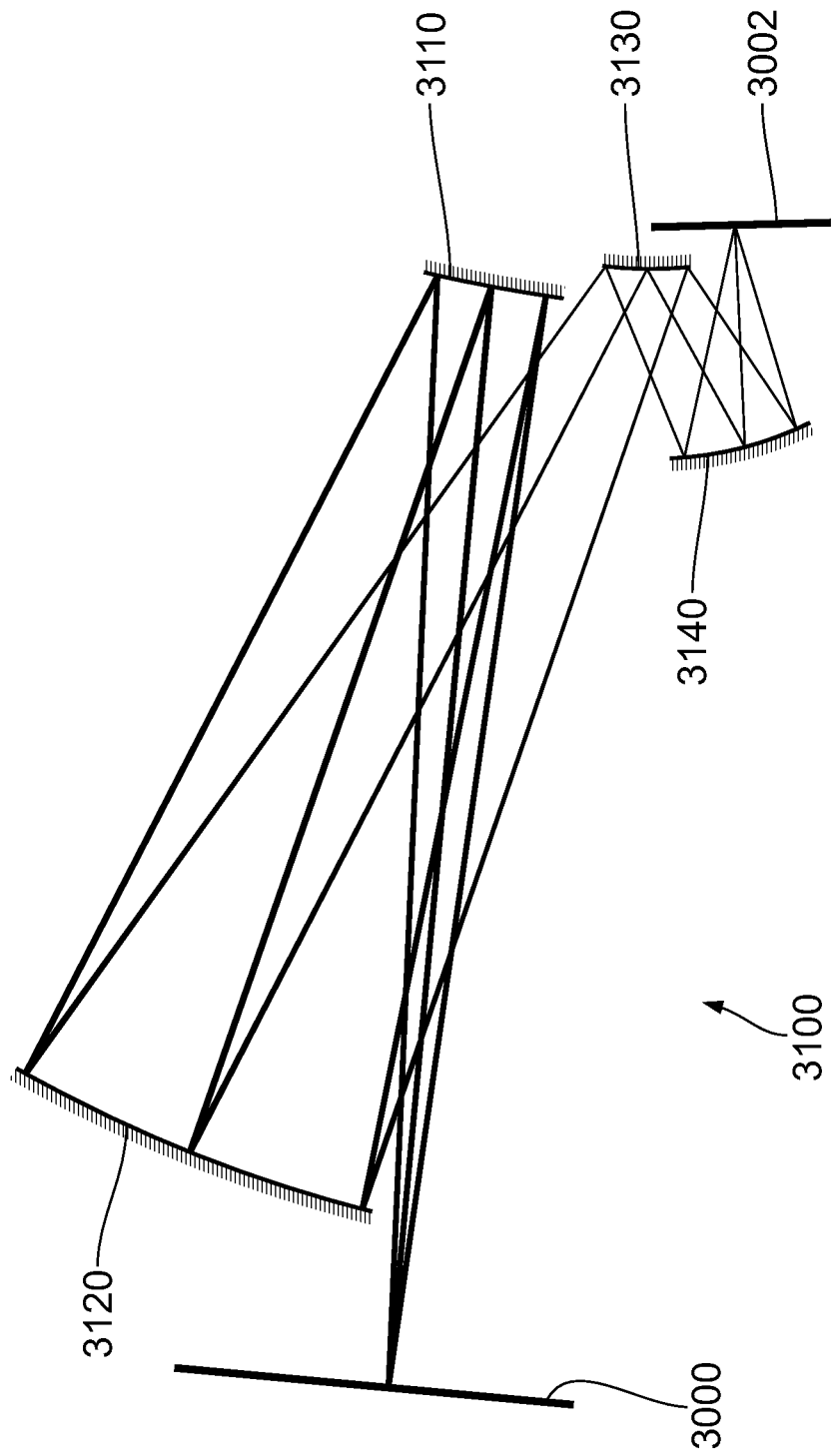
FIG. 31 is a cross-sectional view of a projection objective shown in meridional section.

Referring to FIG. 31, another embodiment of a projection objective 3100 includes four rotationally-asymmetric mirrors 3110, 3120, 3130, and 3140, which direct radiation from object plane 3000 to image plane 3002. Projection objective 3100 images radiation from an object plane 3000 to an image plane 3002 with a demagnification ratio of 5×.

Projection objective 3100 has an image-side NA of 0.24. Projection objective 3100 has a rectangular field. The height and width of the field at object plane 3000 is 8 mm and 100 mm, respectively. The tracklength of projection objective 2300 is 2,273 mm. Image plane 3002 is parallel to object plane 3000.

Data for projection objective 3100 is presented in Tables 13A, 13B, 13C, and 13D below. Table 13A presents optical data, Tables 13B and 13C present rotationally-asymmetric constants for each of the mirror surfaces. For the purposes of Tables 13A-13D, the mirror designations correlate as follows: mirror 1 (M1) corresponds to mirror 3110; mirror 2 (M2) corresponds to mirror 3120; mirror 3 (M3) corresponds to mirror 3130; and mirror 4 (M4) corresponds to mirror 3140.

TABLE 13A

| Surface | Radius (mm) | Spacing (mm) | Mode |
|---|---|---|---|
| Object | INFINITY | 2102.043 | |
| Mirror 1 | 2793.659 | −1848.726 | REFL |
| Mirror 2 | 2546.811 | 1938.769 | REFL |
| Mirror 3 | 724.789 | 0.000 | REFL |
| STOP | INFINITY | −366.800 | |
| Mirror 4 | 733.040 | 447.458 | REFL |
| Image | INFINITY | 0.000 | |

TABLE 13B

| Coefficient | M1 | M2 | M3 | M4 | Image |
|---|---|---|---|---|---|
| Y-decenter | −75.087 | 51.394 | 53.563 | 53.215 | 8.406 |
| X-rotation | −2.635 | −2.442 | −1.373 | −1.503 | 0.000 |

TABLE 13C

| Coefficient | M1 | M2 | M3 | M4 |
|---|---|---|---|---|
| K | −1.18E+00 | 2.43E−02 | 1.79E+00 | 6.25E−01 |
| Y | 0.00E+00 | 0.00E+00 | 0.00E+00 | 0.00E+00 |
| $X^2$ | 5.63E−04 | −4.21E−06 | −1.24E−03 | −5.32E−05 |
| $Y^2$ | 2.93E−04 | 1.06E−05 | 1.91E−04 | 4.21E−04 |
| $X^2Y$ | 3.27E−07 | 3.31E−08 | 5.31E−06 | 1.03E−06 |
| $Y^3$ | 5.55E−07 | 2.25E−08 | −1.34E−06 | −5.45E−07 |
| $X^4$ | −4.83E−11 | −1.05E−11 | −2.55E−08 | −7.45E−09 |
| $X^2Y^2$ | −4.43E−09 | 2.08E−11 | −8.22E−09 | −8.28E−09 |
| $Y^4$ | −1.07E−10 | 2.38E−11 | 5.97E−09 | −1.14E−09 |
| $X^4Y$ | 2.99E−11 | −1.99E−14 | 2.05E−10 | 1.41E−11 |
| $X^2Y^3$ | 6.95E−11 | 5.53E−14 | 1.56E−10 | −5.12E−11 |
| $Y^5$ | −3.40E−12 | −8.87E−14 | 1.05E−10 | −2.19E−11 |
| $X^6$ | −3.28E−14 | 6.98E−18 | −3.80E−13 | −1.62E−13 |
| $X^4Y^2$ | −3.27E−13 | 6.59E−16 | 6.90E−13 | −6.77E−13 |
| $X^2Y^4$ | −1.84E−13 | 6.85E−16 | 3.09E−12 | −1.35E−12 |
| $Y^6$ | −8.30E−16 | 1.08E−16 | 3.25E−13 | −5.27E−14 |
| $X^6Y$ | 2.31E−16 | −3.71E−19 | 9.39E−15 | −9.01E−16 |
| $X^4Y^3$ | 1.75E−15 | −1.64E−18 | 1.82E−14 | −5.23E−15 |
| $X^2Y^5$ | −1.54E−16 | −1.71E−18 | 2.00E−14 | −1.08E−14 |
| $Y^7$ | −1.38E−17 | 4.97E−21 | 1.64E−16 | −8.50E−18 |
| $X^8$ | 4.46E−19 | 6.17E−23 | 2.58E−18 | −4.70E−18 |
| $X^6Y^2$ | −8.01E−19 | 1.33E−21 | 8.08E−17 | −2.87E−17 |
| $X^4Y^4$ | −3.59E−18 | 2.58E−21 | 2.26E−16 | −4.48E−17 |
| $X^2Y^6$ | 9.06E−19 | 1.87E−21 | −2.45E−17 | −4.08E−17 |
| $Y^8$ | 6.53E−20 | −4.81E−23 | 8.45E−17 | −2.43E−19 |
| $X^8Y$ | 0.00E+00 | 0.00E+00 | 0.00E+00 | 0.00E+00 |
| $X^6Y^3$ | 0.00E+00 | 0.00E+00 | 0.00E+00 | 0.00E+00 |
| $X^4Y^5$ | 0.00E+00 | 0.00E+00 | 0.00E+00 | 0.00E+00 |
| $X^2Y^7$ | 0.00E+00 | 0.00E+00 | 0.00E+00 | 0.00E+00 |
| $Y^9$ | 0.00E+00 | 0.00E+00 | 0.00E+00 | 0.00E+00 |
| $X^{10}$ | 0.00E+00 | 0.00E+00 | 0.00E+00 | 0.00E+00 |
| $X^8Y^2$ | 0.00E+00 | 0.00E+00 | 0.00E+00 | 0.00E+00 |
| $X^6Y^4$ | 0.00E+00 | 0.00E+00 | 0.00E+00 | 0.00E+00 |
| $X^4Y^6$ | 0.00E+00 | 0.00E+00 | 0.00E+00 | 0.00E+00 |
| $X^2Y^8$ | 0.00E+00 | 0.00E+00 | 0.00E+00 | 0.00E+00 |
| $Y^{10}$ | 0.00E+00 | 0.00E+00 | 0.00E+00 | 0.00E+00 |
| Nradius | 3.00E+00 | 3.00E+00 | 3.00E+00 | 3.00E+00 |

TABLE 13D

| $x_{Object}/mm$ | $y_{Object}/mm$ | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 600 | 0 | −0.303712 | 0.303712 | 0.0350766 | 0.023748 |
| 0 | 602 | 0 | −0.943417 | 0.943417 | 0.0190794 | 0.022355 |
| 0 | 604 | 0 | −0.508069 | 0.508069 | 0.00301184 | 0.029861 |
| 0 | 606 | 0 | 0.00377447 | 0.003775 | 0.0131266 | 0.017655 |
| 0 | 608 | 0 | −0.410098 | 0.410098 | 0.0293362 | 0.037546 |
| 12.5 | 600 | −0.0976702 | −0.0397139 | 0.105436 | 0.0359221 | 0.024194 |
| 12.5 | 602 | −0.336727 | −0.658804 | 0.73987 | 0.0208196 | 0.021336 |
| 12.5 | 604 | −0.305426 | −0.223582 | 0.378515 | 0.00938223 | 0.028592 |
| 12.5 | 606 | −0.0115266 | 0.267305 | 0.267554 | 0.0161529 | 0.016575 |
| 12.5 | 608 | 0.537176 | −0.188439 | 0.569269 | 0.0309678 | 0.038828 |
| 25 | 600 | 0.0740798 | 0.543069 | 0.548099 | 0.0383664 | 0.025529 |
| 25 | 602 | −0.488733 | −0.0159655 | 0.488994 | 0.0253625 | 0.019218 |
| 25 | 604 | −0.511562 | 0.417058 | 0.660025 | 0.0180672 | 0.025576 |
| 25 | 606 | −0.00993471 | 0.843229 | 0.843287 | 0.0229845 | 0.014322 |
| 25 | 608 | 1.00055 | 0.259991 | 1.03377 | 0.0354364 | 0.042367 |
| 37.5 | 600 | 0.635211 | 0.816881 | 1.03479 | 0.0421854 | 0.027832 |
| 37.5 | 602 | −0.420855 | 0.35196 | 0.548629 | 0.0315907 | 0.018948 |
| 37.5 | 604 | −0.668773 | 0.775246 | 1.02385 | 0.0269974 | 0.023314 |
| 37.5 | 606 | −0.131864 | 1.08739 | 1.09535 | 0.0312902 | 0.013747 |
| 37.5 | 608 | 1.16644 | 0.285392 | 1.20085 | 0.0418989 | 0.047139 |
| 50 | 600 | 1.40779 | −0.264954 | 1.43251 | 0.0471254 | 0.033617 |
| 50 | 602 | −0.396014 | −0.610703 | 0.727863 | 0.0387971 | 0.027129 |
| 50 | 604 | −1.12571 | −0.213831 | 1.14584 | 0.0360974 | 0.028277 |
| 50 | 606 | −0.812445 | −0.0743145 | 0.815836 | 0.0402623 | 0.020092 |
| 50 | 608 | 0.512487 | −1.19576 | 1.30095 | 0.0496609 | 0.052034 |

With respect to Table 13D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength $\lambda=13.5$ nm. As the optical system is mirror symmetric with respect to the yz-plane it is sufficient to give data for fieldpoints having positive x-coordinates in the object plane.

Figure 32:
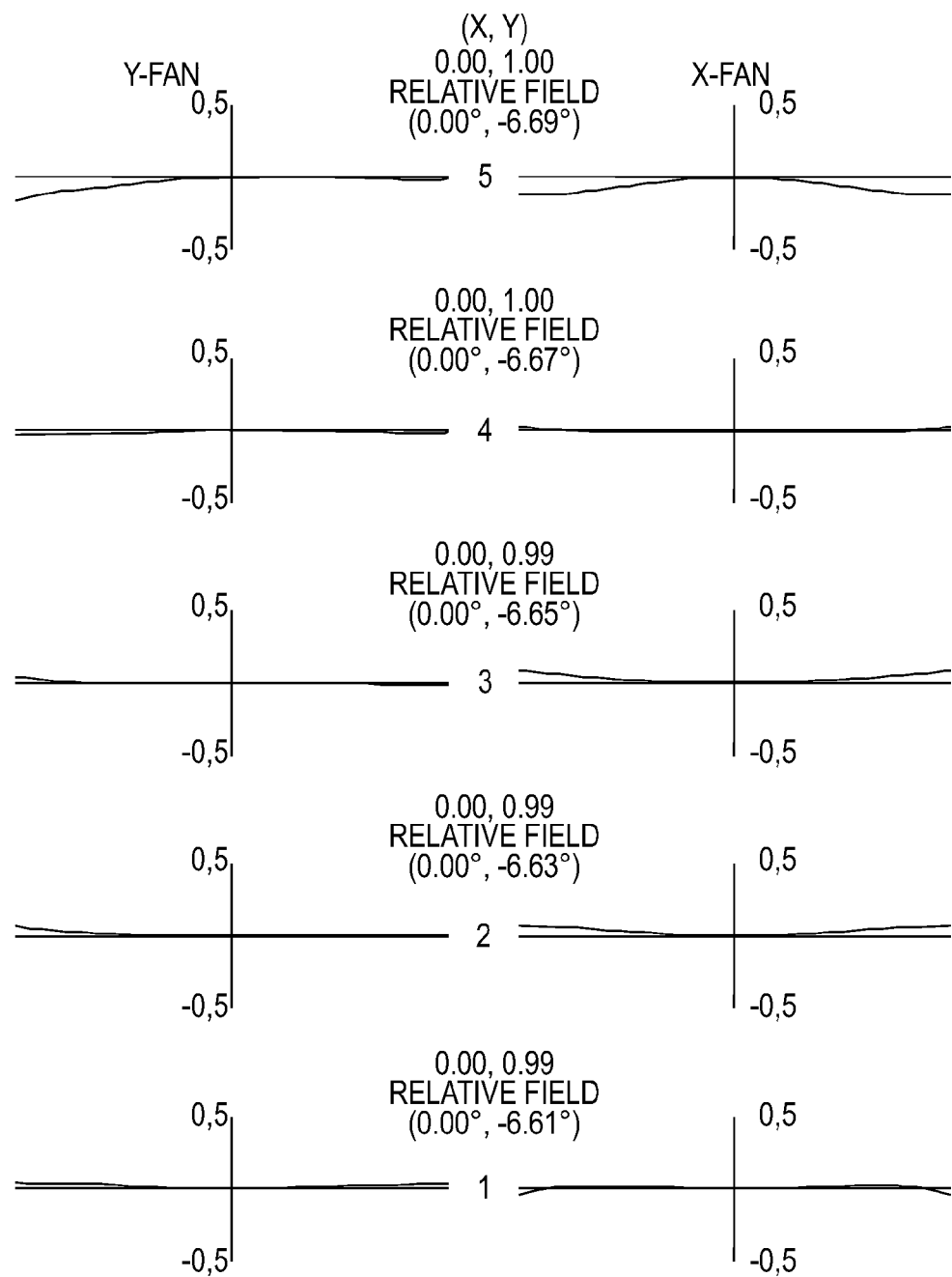
FIGS. 32, 33, and 34 are plots showing aberrations as a function of position in the image field for the projection objective shown in FIG. 31.
Figure 33:
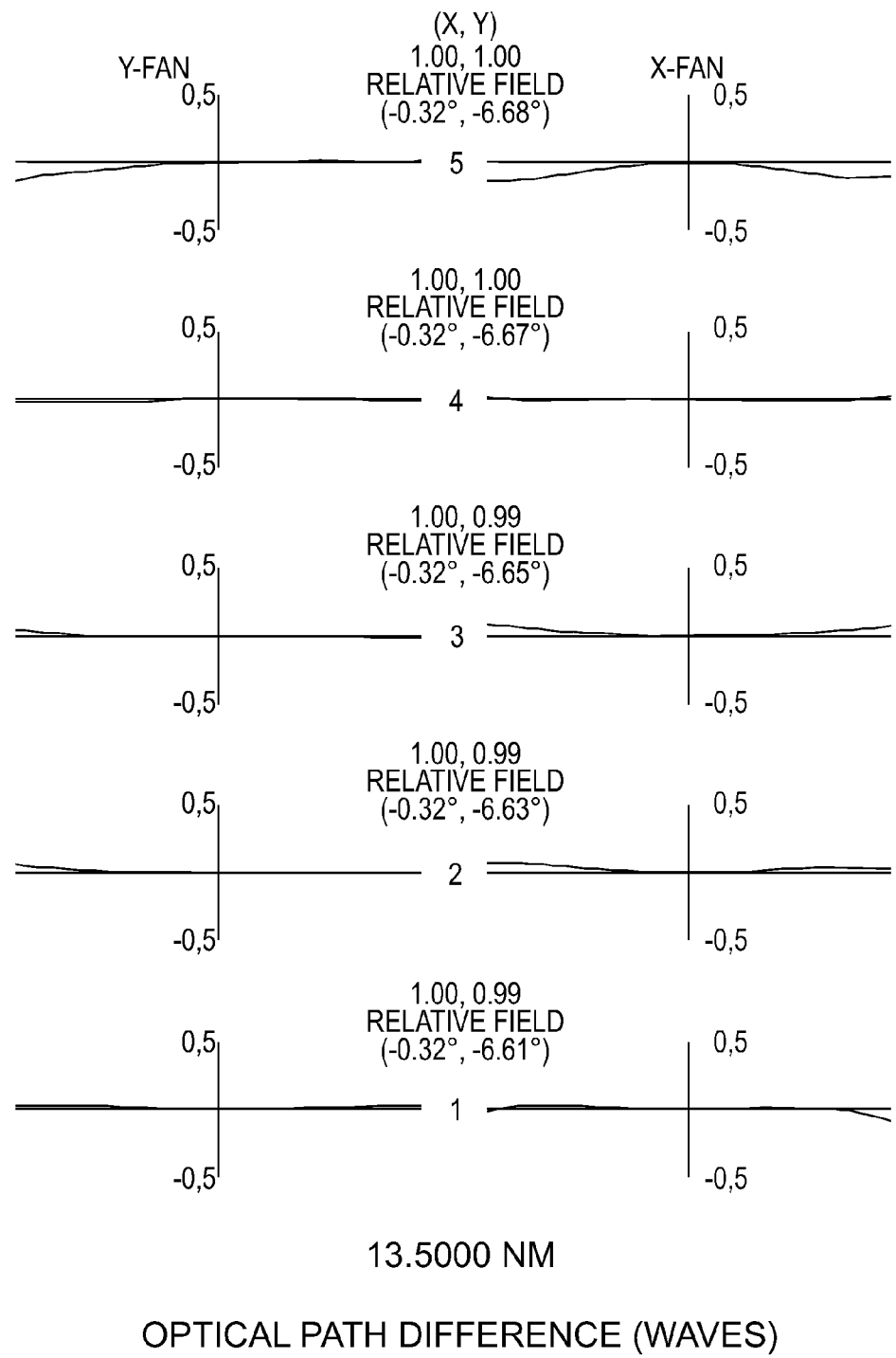
Figure 34:
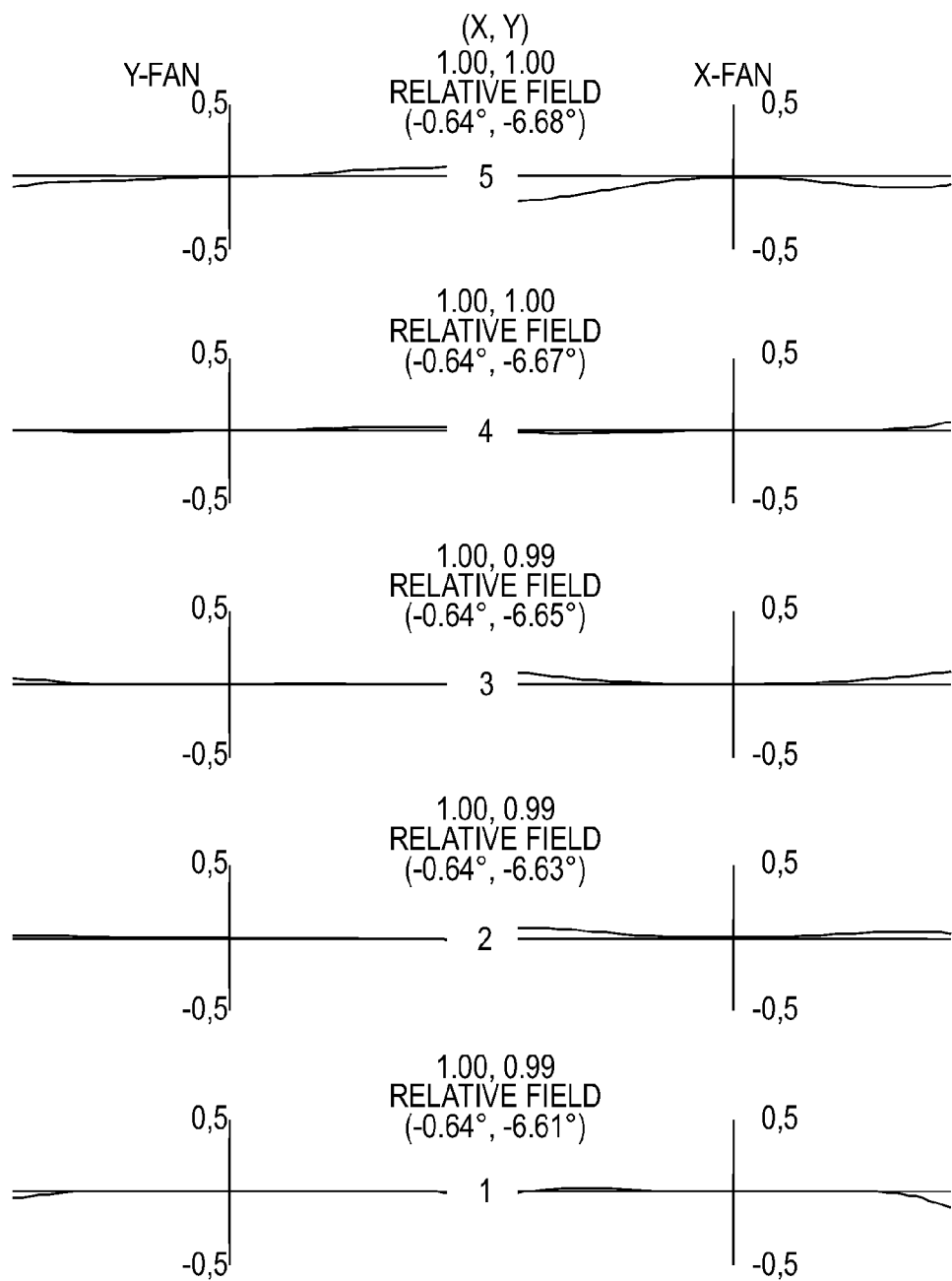

FIGS. 32, 33, and 34 show lateral aberrations in the coordinate system of the exit pupil of projection objective 3100. These aberration plots show the wavefront error for 15 fieldpoints. The fieldpoints correspond to five equidistant y-coordinates between $y_{min}$ and $y_{max}$ at the center of the object field at x=0, at $x=x_{max}/2$ and at $x=x_{max}$.

Figure 35:
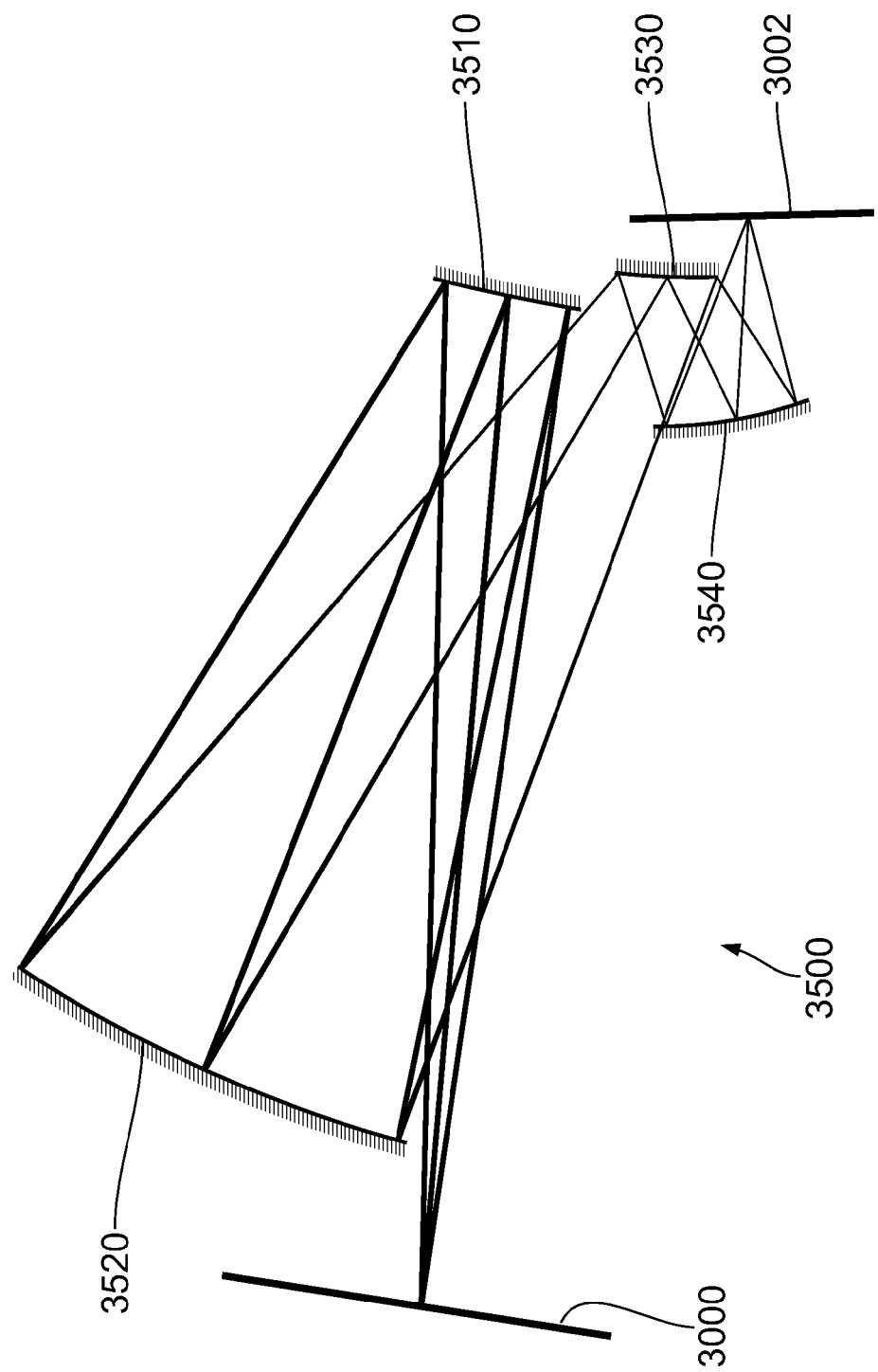
FIG. 35 is a cross-sectional view of a projection objective shown in meridional section.

Referring to FIG. 35, another embodiment of a projection objective 3500 includes four rotationally-asymmetric mirrors 3510, 3520, 3530, and 3540, which direct radiation from object plane 3000 to image plane 3002. Projection objective 3500 images radiation from an object plane 3000 to an image plane 3002 with a demagnification ratio of 5×.

Projection objective 3500 has an image-side NA of 0.3. Projection objective 1900 has a rectangular field. The height and width of the field at object plane 3000 is 8 mm and 100 mm, respectively. The tracklength of projection objective 3500 is 2,332 mm. Image plane 3002 is tilted with respect to object plane 3000 by −4,515°.

Data for projection objective 3500 is presented in Tables 14A, 14B, 14C, and 14D below. Table 14A presents optical data, Tables 14B and 14C present rotationally-asymmetric constants for each of the mirror surfaces. For the purposes of Tables 14A-14D, the mirror designations correlate as follows: mirror 1 (M1) corresponds to mirror 3510; mirror 2 (M2) corresponds to mirror 3520; mirror 3 (M3) corresponds to mirror 3530; and mirror 4 (M4) corresponds to mirror 3540.

TABLE 14A

| Surface | Radius | Spacing | Mode |
|---|---|---|---|
| Object | INFINITY | 2102.043 | |
| Mirror 1 | 2806.084 | −1838.550 | REFL |
| Mirror 2 | 2547.909 | 1937.744 | REFL |
| Mirror 3 | 678.009 | 0.000 | REFL |
| STOP | INFINITY | −321.297 | |
| Mirror 4 | 724.986 | 451.996 | REFL |
| Image | INFINITY | 0.000 | |

TABLE 14B

| Coefficient | M1 | M2 | M3 | M4 | Image |
|---|---|---|---|---|---|
| Y-decenter | −60.550 | 48.435 | 58.618 | 51.407 | 8.786 |
| X-rotation | −2.354 | −2.502 | −3.516 | −1.667 | −4.515 |

TABLE 14C

| Coefficient | M1 | M2 | M3 | M4 |
|---|---|---|---|---|
| K | −9.97E−01 | 3.10E−02 | 2.78E+00 | 8.33E−01 |
| Y | 0.00E+00 | 0.00E+00 | 0.00E+00 | 0.00E+00 |
| $X^2$ | 5.76E−04 | 3.29E−05 | 3.77E−04 | 7.34E−04 |
| $Y^2$ | 2.85E−04 | 8.60E−06 | −2.80E−04 | 4.86E−04 |
| $X^2Y$ | −1.58E−06 | 7.59E−11 | 2.37E−06 | 4.69E−08 |
| $Y^3$ | 5.91E−07 | 1.16E−08 | −3.82E−07 | −6.08E−07 |
| $X^4$ | 2.12E−09 | 2.57E−11 | −2.39E−08 | 4.09E−10 |
| $X^2Y^2$ | 1.66E−08 | 1.07E−10 | −5.49E−08 | −8.60E−10 |
| $Y^4$ | −4.86E−11 | 3.13E−11 | −4.63E−08 | −1.53E−09 |
| $X^4Y$ | −3.03E−11 | −5.49E−14 | 1.73E−10 | 3.15E−12 |
| $X^2Y^3$ | −6.10E−11 | −1.55E−13 | 1.88E−10 | −7.52E−12 |
| $Y^5$ | −4.20E−12 | −4.44E−14 | 1.11E−10 | −3.72E−12 |
| $X^6$ | 9.54E−15 | 3.01E−17 | −7.68E−13 | −2.46E−14 |
| $X^4Y^2$ | 2.14E−13 | 4.63E−16 | −2.74E−12 | −1.59E−13 |
| $X^2Y^4$ | 1.12E−14 | 3.89E−16 | −3.32E−12 | −1.92E−13 |
| $Y^6$ | 1.65E−15 | 2.47E−17 | −1.30E−12 | −7.78E−14 |
| $X^6Y$ | −2.26E−16 | −1.54E−19 | 8.48E−15 | −1.53E−16 |
| $X^4Y^3$ | −5.47E−16 | −7.87E−19 | 1.15E−14 | −6.67E−16 |
| $X^2Y^5$ | 5.78E−16 | −3.98E−19 | 3.95E−15 | −3.91E−16 |
| $Y^7$ | 1.29E−18 | −6.38E−21 | −3.30E−15 | 4.66E−16 |
| $X^8$ | 2.43E−19 | 3.50E−23 | −1.57E−17 | −1.17E−18 |

TABLE 14C-continued

| Coefficient | M1 | M2 | M3 | M4 |
|---|---|---|---|---|
| $X^6Y^2$ | 3.79E−19 | 4.92E−22 | −9.74E−17 | −7.71E−18 |
| $X^4Y^4$ | 2.03E−21 | 1.04E−21 | −1.74E−16 | −1.21E−17 |
| $X^2Y^6$ | −1.22E−18 | 4.66E−22 | −1.42E−16 | −7.08E−18 |
| $Y^8$ | 1.73E−20 | 1.30E−23 | −4.17E−17 | 1.05E−18 |
| $X^8Y$ | 0.00E+00 | 0.00E+00 | 0.00E+00 | 0.00E+00 |
| $X^6Y^3$ | 0.00E+00 | 0.00E+00 | 0.00E+00 | 0.00E+00 |
| $X^4Y^5$ | 0.00E+00 | 0.00E+00 | 0.00E+00 | 0.00E+00 |
| $X^2Y^7$ | 0.00E+00 | 0.00E+00 | 0.00E+00 | 0.00E+00 |
| $Y^9$ | 0.00E+00 | 0.00E+00 | 0.00E+00 | 0.00E+00 |
| $X^{10}$ | 0.00E+00 | 0.00E+00 | 0.00E+00 | 0.00E+00 |
| $X^8Y^2$ | 0.00E+00 | 0.00E+00 | 0.00E+00 | 0.00E+00 |
| $X^6Y^4$ | 0.00E+00 | 0.00E+00 | 0.00E+00 | 0.00E+00 |
| $X^4Y^6$ | 0.00E+00 | 0.00E+00 | 0.00E+00 | 0.00E+00 |
| $X^2Y^8$ | 0.00E+00 | 0.00E+00 | 0.00E+00 | 0.00E+00 |
| $Y^{10}$ | 0.00E+00 | 0.00E+00 | 0.00E+00 | 0.00E+00 |
| Nradius | 3.00E+00 | 3.00E+00 | 3.00E+00 | 3.00E+00 |

TABLE 14D

| $x_{Object}/mm$ | $y_{Object}/mm$ | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 600 | 0 | −0.166318 | 0.166318 | 0.0148053 | 0.053501 |
| 0 | 602 | 0 | −0.731572 | 0.731572 | 0.00884521 | 0.019284 |
| 0 | 604 | 0 | −0.661487 | 0.661487 | 0.00282744 | 0.038268 |
| 0 | 606 | 0 | −0.504836 | 0.504836 | 0.0032483 | 0.021472 |
| 0 | 608 | 0 | −0.810627 | 0.810627 | 0.00938234 | 0.047628 |
| 12.5 | 600 | −0.852921 | 0.132616 | 0.863169 | 0.0186158 | 0.052338 |
| 12.5 | 602 | −0.193958 | −0.398416 | 0.44312 | 0.0145478 | 0.024553 |
| 12.5 | 604 | 0.181685 | −0.303572 | 0.353787 | 0.0121468 | 0.042437 |
| 12.5 | 606 | 0.270096 | −0.131573 | 0.300439 | 0.012504 | 0.02662 |
| 12.5 | 608 | 0.0673771 | −0.431381 | 0.436611 | 0.0154976 | 0.048115 |
| 25 | 600 | −1.29433 | 0.754312 | 1.49809 | 0.0270423 | 0.048536 |
| 25 | 602 | −0.101019 | 0.323398 | 0.338808 | 0.0247903 | 0.031643 |
| 25 | 604 | 0.524636 | 0.489914 | 0.717815 | 0.0238524 | 0.049015 |
| 25 | 606 | 0.574789 | 0.705289 | 0.909844 | 0.0244236 | 0.033313 |
| 25 | 608 | 0.0416169 | 0.420711 | 0.422764 | 0.0264463 | 0.04856 |
| 37.5 | 600 | −1.11433 | 0.871449 | 1.41462 | 0.0371683 | 0.044918 |
| 37.5 | 602 | 0.363273 | 0.598909 | 0.700471 | 0.0359881 | 0.032203 |
| 37.5 | 604 | 0.986834 | 0.876191 | 1.31968 | 0.0357827 | 0.049123 |
| 37.5 | 606 | 0.744538 | 1.15498 | 1.37416 | 0.0365972 | 0.031801 |
| 37.5 | 608 | −0.375406 | 0.886699 | 0.962894 | 0.0383944 | 0.049913 |
| 50 | 600 | −0.505166 | −0.901506 | 1.03339 | 0.0480691 | 0.060875 |
| 50 | 602 | 0.879494 | −0.970155 | 1.30947 | 0.0476135 | 0.036681 |
| 50 | 604 | 1.12068 | −0.556047 | 1.25104 | 0.0479137 | 0.044354 |
| 50 | 606 | 0.202525 | −0.20714 | 0.289695 | 0.0489775 | 0.03033 |

With respect to Table 14D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength λ=13.5 nm. As the optical system is mirror symmetric with respect to the yz-plane it is sufficient to give data for fieldpoints having positive x-coordinates in the object plane.

Figure 36:
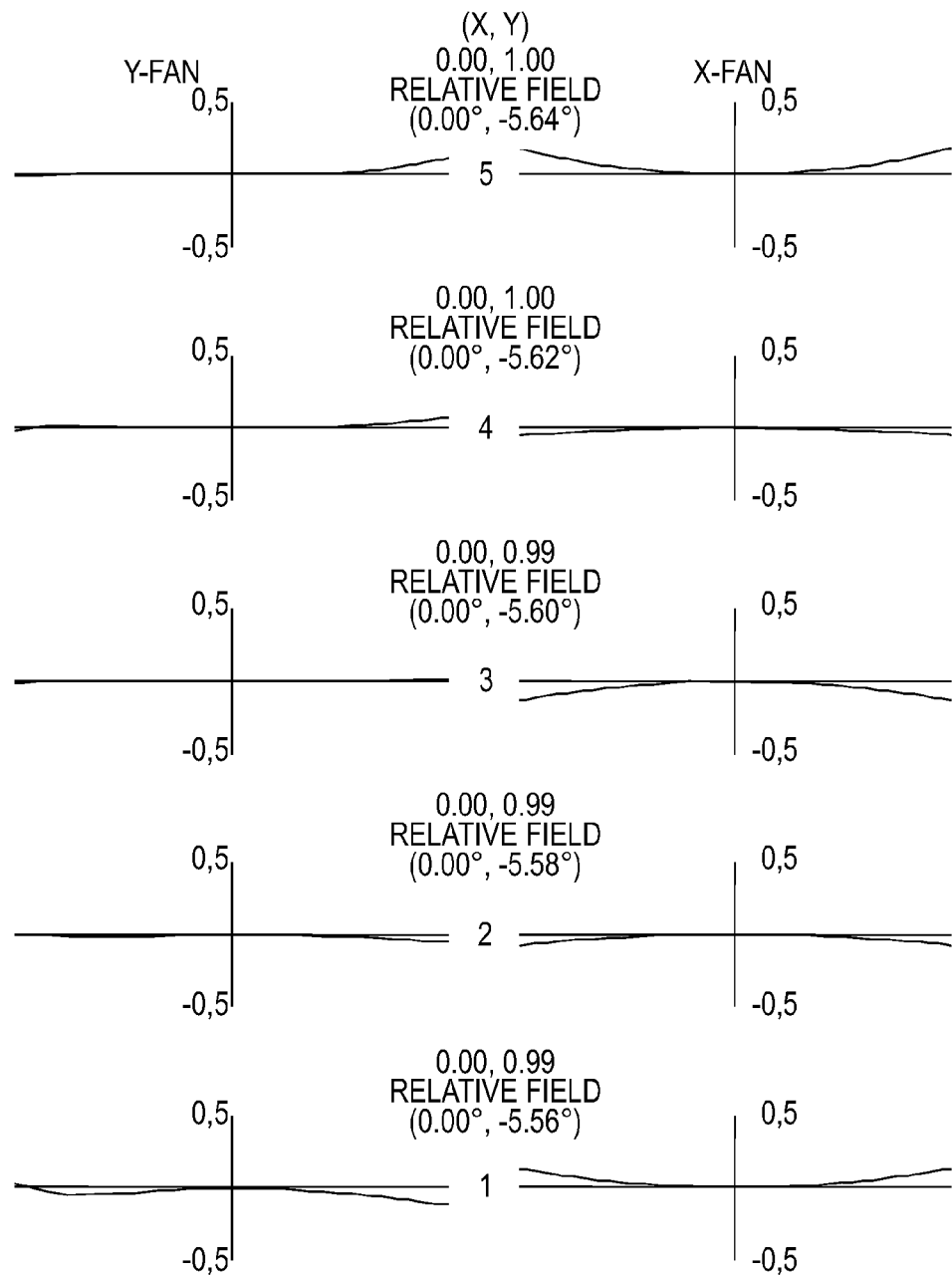
FIGS. 36, 37, and 38 are plots showing aberrations as a function of position in the image field for the projection objective shown in FIG. 35.
Figure 37:
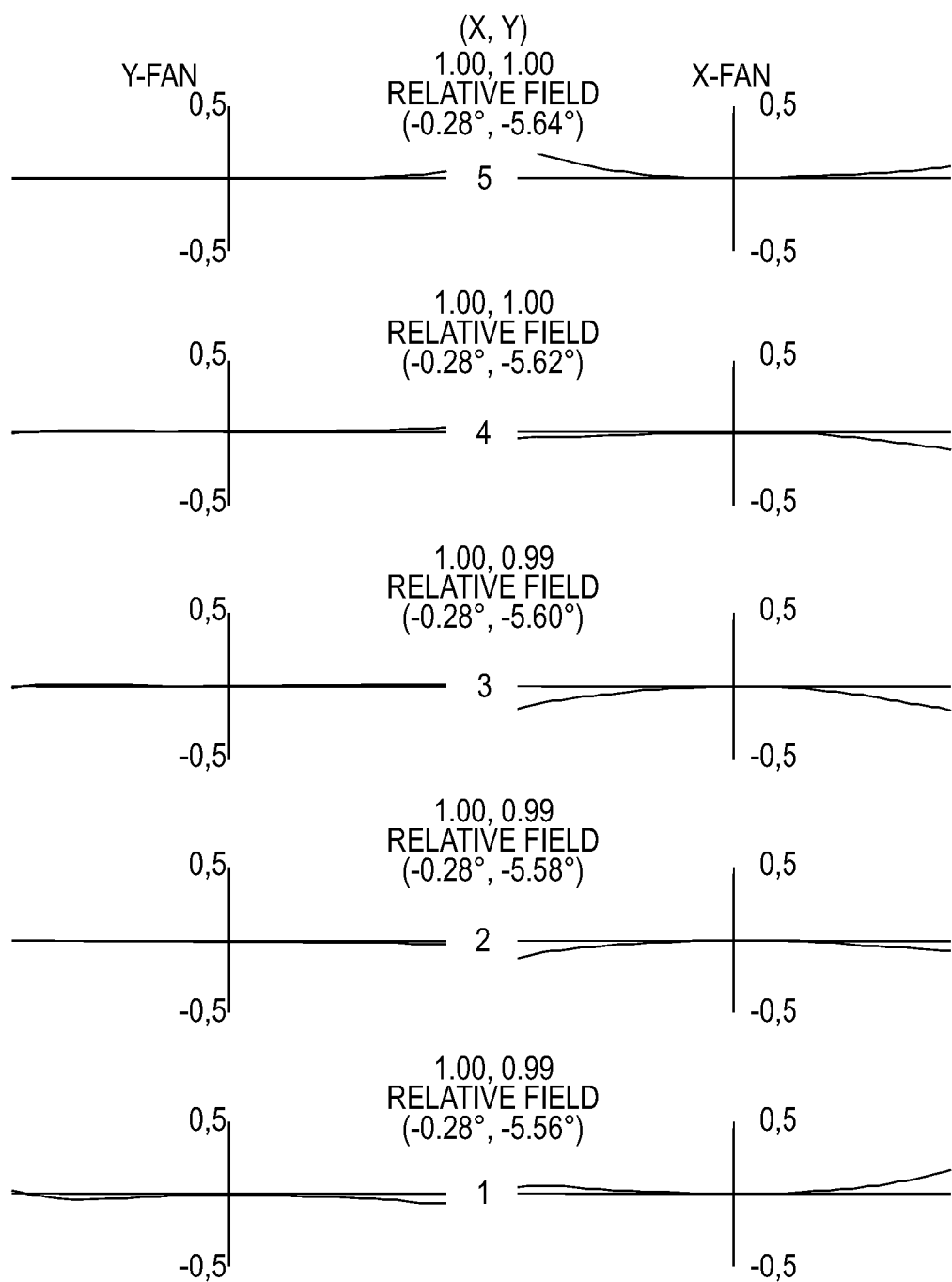
Figure 38:
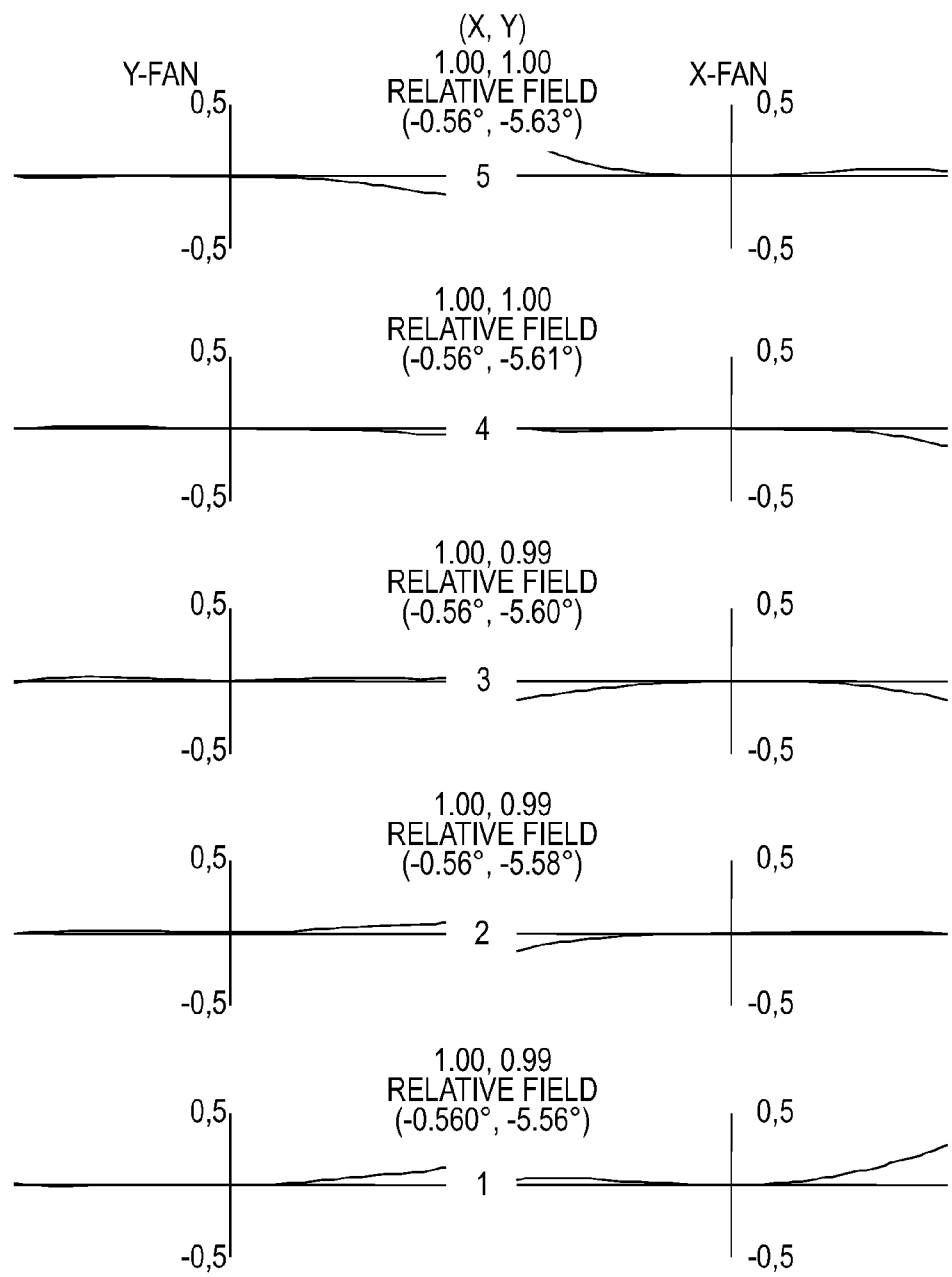

FIGS. 36, 37, and 38 show lateral aberrations in the coordinate system of the exit pupil of projection objective 3500. These aberration plots show the wavefront error for 15 fieldpoints. The fieldpoints correspond to five equidistant y-coordinates between $y_{min}$ and $y_{max}$ at the center of the object field at x=0, at x=$x_{max}$/2 and at x=$x_{max}$.

Figure 39:
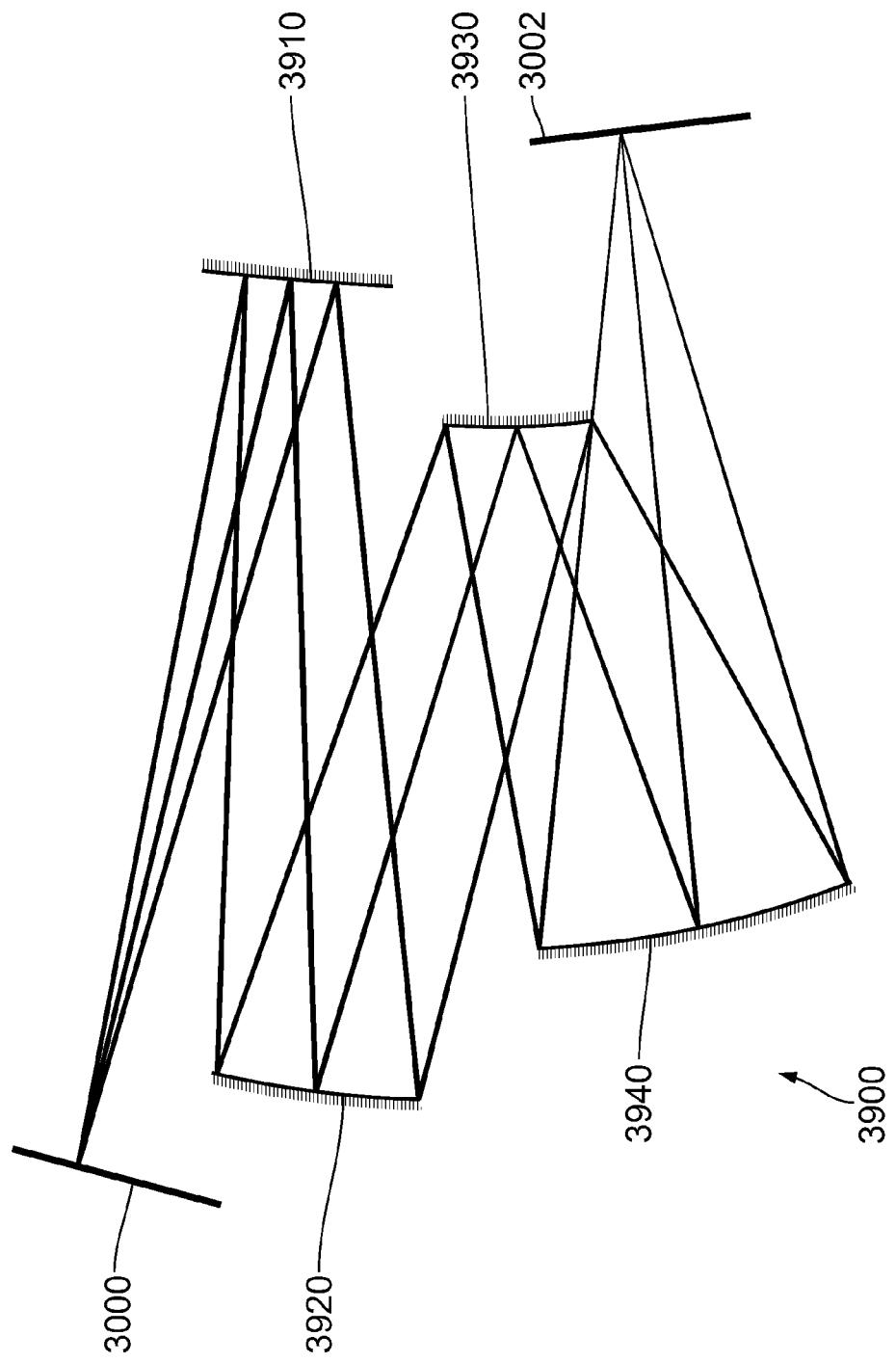
FIG. 39 is a cross-sectional view of a projection objective shown in meridional section.

Referring to FIG. 39, another embodiment of a projection objective 3900 includes four rotationally-asymmetric mirrors 3910, 3920, 3930, and 3940, which direct radiation from object plane 3000 to image plane 3002. Projection objective 3900 images radiation from an object plane 3000 to an image plane 3002 with a demagnification ratio of 4×.

Projection objective 3900 has an image-side NA of 0.2. Projection objective 3900 has a rectangular field. The height and width of the field at object plane 3000 is 8 mm and 100 mm, respectively. The tracklength of projection objective 3900 is 2,084 mm. Image plane 3002 is tilted with respect to object plane 3000 by +6,890°.

Data for projection objective 3900 is presented in Tables 15A, 15B, 15C, and 15D below. Table 15A presents optical data, Tables 15B and 15C present rotationally-asymmetric constants for each of the mirror surfaces. For the purposes of Tables 15A-15D, the mirror designations correlate as follows: mirror 1 (M1) corresponds to mirror 3910; mirror 2 (M2) corresponds to mirror 3920; mirror 3 (M3) corresponds to mirror 3930; and mirror 4 (M4) corresponds to mirror 3940.

TABLE 15A

| Surface | Radius | Spacing | Mode |
|---|---|---|---|
| Object | INFINITY | 1781.972 | |
| Mirror 1 | 21581.586 | −1639.081 | REFL |
| Mirror 2 | 4053.640 | 1376.461 | REFL |
| Mirror 3 | 1254.488 | 0.000 | REFL |
| STOP | INFINITY | −1067.803 | |
| Mirror 4 | 1733.205 | 1632.838 | REFL |
| Image | INFINITY | 0.000 | |

TABLE 15B

| Coefficient | M1 | M2 | M3 | M4 | Image |
|---|---|---|---|---|---|
| Y-decenter | −29.501 | −2.134 | −5.508 | −0.487 | 5.838 |
| X-rotation | −0.812 | 0.034 | 2.908 | 1.105 | 6.890 |

TABLE 15C

| Coefficient | M1 | M2 | M3 | M4 |
|---|---|---|---|---|
| K | 0.00E+00 | 0.00E+00 | 0.00E+00 | 0.00E+00 |
| Y | 0.00E+00 | 0.00E+00 | 0.00E+00 | 0.00E+00 |
| $X^2$ | 2.80E-04 | 1.47E-05 | -6.54E-04 | -1.23E-04 |
| $Y^2$ | 1.13E-04 | 7.15E-05 | -1.55E-04 | -2.14E-05 |
| $X^2Y$ | -8.62E-09 | -9.59E-08 | -2.20E-07 | -1.32E-08 |
| $Y^3$ | 1.51E-07 | 5.42E-08 | 1.12E-07 | 3.86E-08 |
| $X^4$ | 2.07E-09 | -1.04E-10 | -6.16E-10 | -7.05E-11 |
| $X^2Y^2$ | -3.64E-09 | -1.00E-10 | -4.18E-10 | -3.95E-11 |
| $Y^4$ | -2.70E-11 | -3.46E-10 | 1.32E-09 | 5.30E-11 |
| $X^4Y$ | -2.72E-11 | -2.99E-13 | 1.86E-13 | -6.90E-15 |
| $X^2Y^3$ | 1.52E-11 | 1.29E-13 | -1.45E-12 | 8.75E-14 |
| $Y^5$ | -1.49E-12 | 4.09E-13 | 5.04E-12 | 2.35E-14 |
| $X^6$ | -2.54E-14 | -8.99E-17 | -3.11E-16 | -5.52E-17 |
| $X^4Y^2$ | 7.40E-14 | 1.26E-15 | -2.70E-15 | -2.62E-17 |
| $X^2Y^4$ | -1.14E-14 | -2.54E-15 | 1.21E-14 | 1.83E-16 |
| $Y^6$ | 1.69E-15 | 1.03E-16 | -3.69E-15 | 6.00E-17 |
| $X^6Y$ | -6.30E-17 | 4.44E-20 | -8.25E-18 | 2.20E-20 |
| $X^4Y^3$ | 6.36E-17 | -1.53E-18 | -3.51E-17 | 2.26E-19 |
| $X^2Y^5$ | -7.58E-17 | 4.16E-18 | 3.32E-17 | -9.30E-20 |
| $Y^7$ | -9.34E-19 | -2.88E-19 | 3.35E-17 | 8.72E-20 |
| $X^8$ | 7.35E-18 | 3.66E-21 | -3.46E-20 | -7.26E-24 |
| $X^6Y^2$ | 3.71E-18 | 1.22E-20 | -3.57E-20 | 5.68E-22 |
| $X^4Y^4$ | 3.71E-18 | -4.74E-21 | 3.56E-19 | -5.19E-22 |
| $X^2Y^6$ | 1.26E-19 | 1.19E-21 | 4.63E-20 | -8.91E-22 |
| $Y^8$ | 3.67E-21 | -8.04E-22 | 3.00E-20 | 1.91E-22 |
| $X^8Y$ | -6.70E-20 | -8.52E-23 | 8.72E-23 | 1.96E-24 |
| $X^6Y^3$ | -1.92E-20 | -1.06E-22 | 6.48E-22 | 2.15E-24 |
| $X^4Y^5$ | -4.59E-21 | -2.85E-23 | 9.86E-22 | -3.07E-24 |
| $X^2Y^7$ | 7.55E-23 | -1.72E-23 | 1.23E-21 | -2.46E-24 |
| $Y^9$ | 3.46E-26 | 3.04E-24 | -2.25E-22 | 3.35E-25 |
| $X^{10}$ | 5.05E-23 | 6.75E-26 | 1.03E-24 | 1.46E-27 |
| $X^8Y^2$ | 1.43E-22 | 2.53E-25 | 4.57E-24 | 4.54E-27 |
| $X^6Y^4$ | 2.81E-23 | 2.06E-25 | 2.76E-24 | 2.39E-27 |
| $X^4Y^6$ | 7.66E-24 | 9.23E-26 | -2.58E-24 | -1.86E-27 |
| $X^2Y^8$ | -1.40E-25 | 2.75E-26 | -6.32E-25 | -2.02E-27 |
| $Y^{10}$ | 1.61E-27 | -2.48E-27 | 6.81E-25 | 1.93E-28 |
| Nradius | 2.00E+00 | 2.00E+00 | 2.00E+00 | 2.00E+00 |

TABLE 15D

| $x_{Object}/mm$ | $y_{Object}/mm$ | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 800 | 0 | -0.366434 | 0.366434 | 0.0198854 | 0.093978 |
| 0 | 802 | 0 | -0.0892875 | 0.0892875 | 0.0104067 | 0.015958 |
| 0 | 804 | 0 | -0.0777646 | 0.0777646 | 0.0009187 | 0.032744 |
| 0 | 806 | 0 | 0.0405964 | 0.0405964 | 0.0085785 | 0.042489 |
| 0 | 808 | 0 | 0.661542 | 0.661542 | 0.018085 | 0.028159 |
| 12.5 | 800 | 0.0955838 | -0.353342 | 0.366042 | 0.0306806 | 0.091554 |
| 12.5 | 802 | -0.0573173 | -0.0687788 | 0.089531 | 0.0256084 | 0.020828 |
| 12.5 | 804 | -0.106637 | -0.0760641 | 0.130985 | 0.0234513 | 0.03637 |
| 12.5 | 806 | -0.0613664 | -0.00241775 | 0.061414 | 0.0249869 | 0.044044 |
| 12.5 | 808 | 0.0696061 | 0.548237 | 0.552638 | 0.0296558 | 0.030805 |
| 25 | 800 | 0.115633 | -0.279658 | 0.302621 | 0.0507857 | 0.08257 |
| 25 | 802 | -0.184329 | 0.0221776 | 0.185658 | 0.047943 | 0.024249 |
| 25 | 804 | -0.278855 | -0.0466988 | 0.282738 | 0.0468785 | 0.040154 |
| 25 | 806 | -0.1860 | -0.112547 | 0.2174 | 0.0477167 | 0.043512 |
| 25 | 808 | 0.0763955 | 0.221706 | 0.234499 | 0.050368 | 0.032565 |
| 37.5 | 800 | 0.146594 | -0.0521759 | 0.155602 | 0.072869 | 0.065923 |
| 37.5 | 802 | -0.292306 | 0.261705 | 0.392342 | 0.0709743 | 0.020204 |
| 37.5 | 804 | -0.42743 | 0.0728035 | 0.433586 | 0.0703175 | 0.037534 |
| 37.5 | 806 | -0.286029 | -0.243519 | 0.375651 | 0.0709367 | 0.034303 |
| 37.5 | 808 | 0.104968 | -0.288511 | 0.307012 | 0.0728031 | 0.030384 |
| 50 | 800 | 0.555156 | 0.451152 | 0.715358 | 0.095576 | 0.062457 |
| 50 | 802 | -0.0193915 | 0.746217 | 0.746469 | 0.0941997 | 0.044595 |
| 50 | 804 | -0.197219 | 0.352291 | 0.403738 | 0.0937666 | 0.049527 |
| 50 | 806 | -0.0149766 | -0.352951 | 0.353268 | 0.0942927 | 0.040292 |
| 50 | 808 | 0.491125 | -0.968364 | 1.08579 | 0.0957648 | 0.053486 |

With respect to Table 15D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength λ=13.5 nm. As the optical system is mirror symmetric with respect to the yz-plane it is sufficient to give data for fieldpoints having positive x-coordinates in the object plane.

Figure 40:
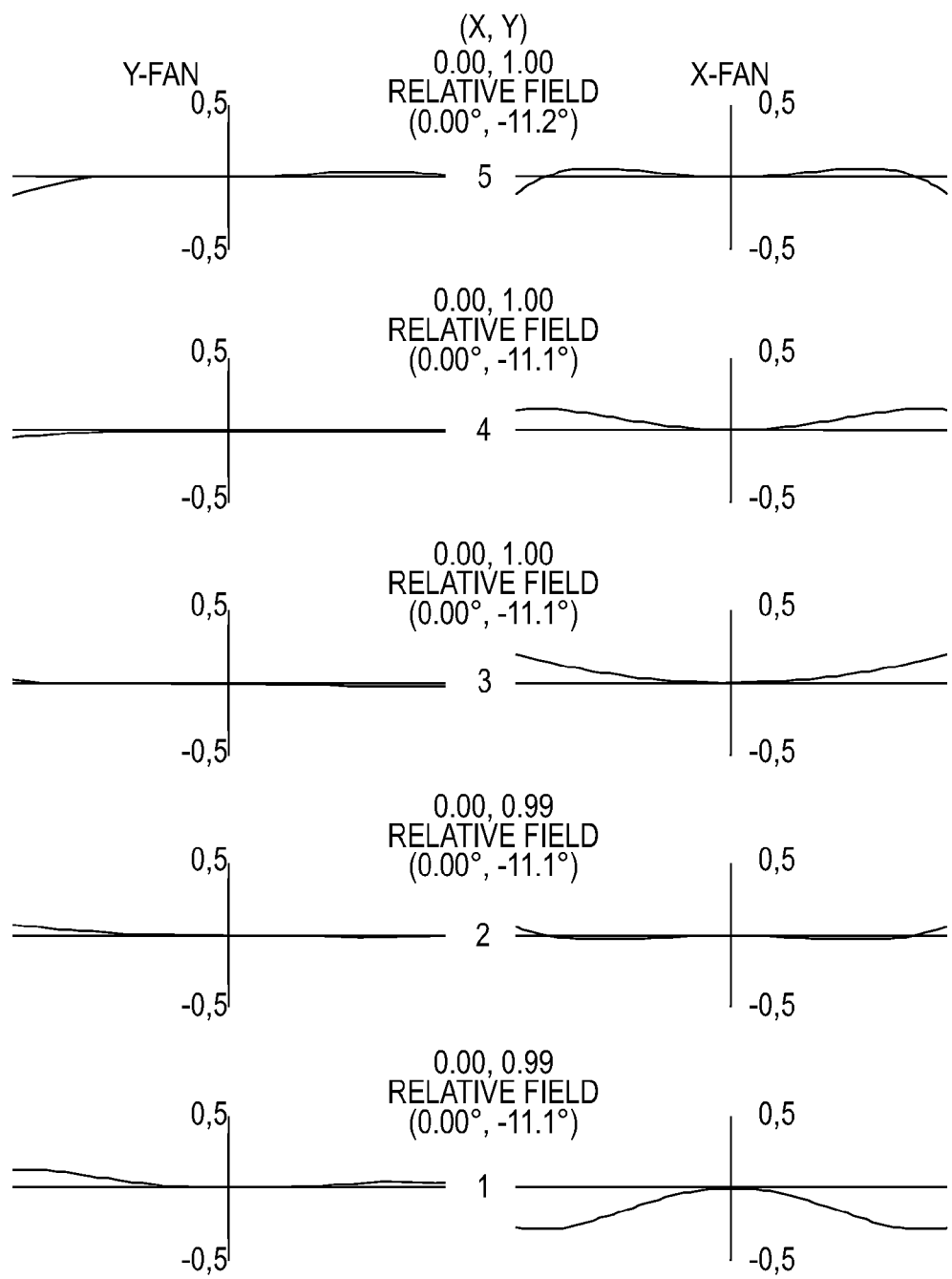
FIGS. 40, 41, and 42 are plots showing aberrations as a function of position in the image field for the projection objective shown in FIG. 39.
Figure 41:
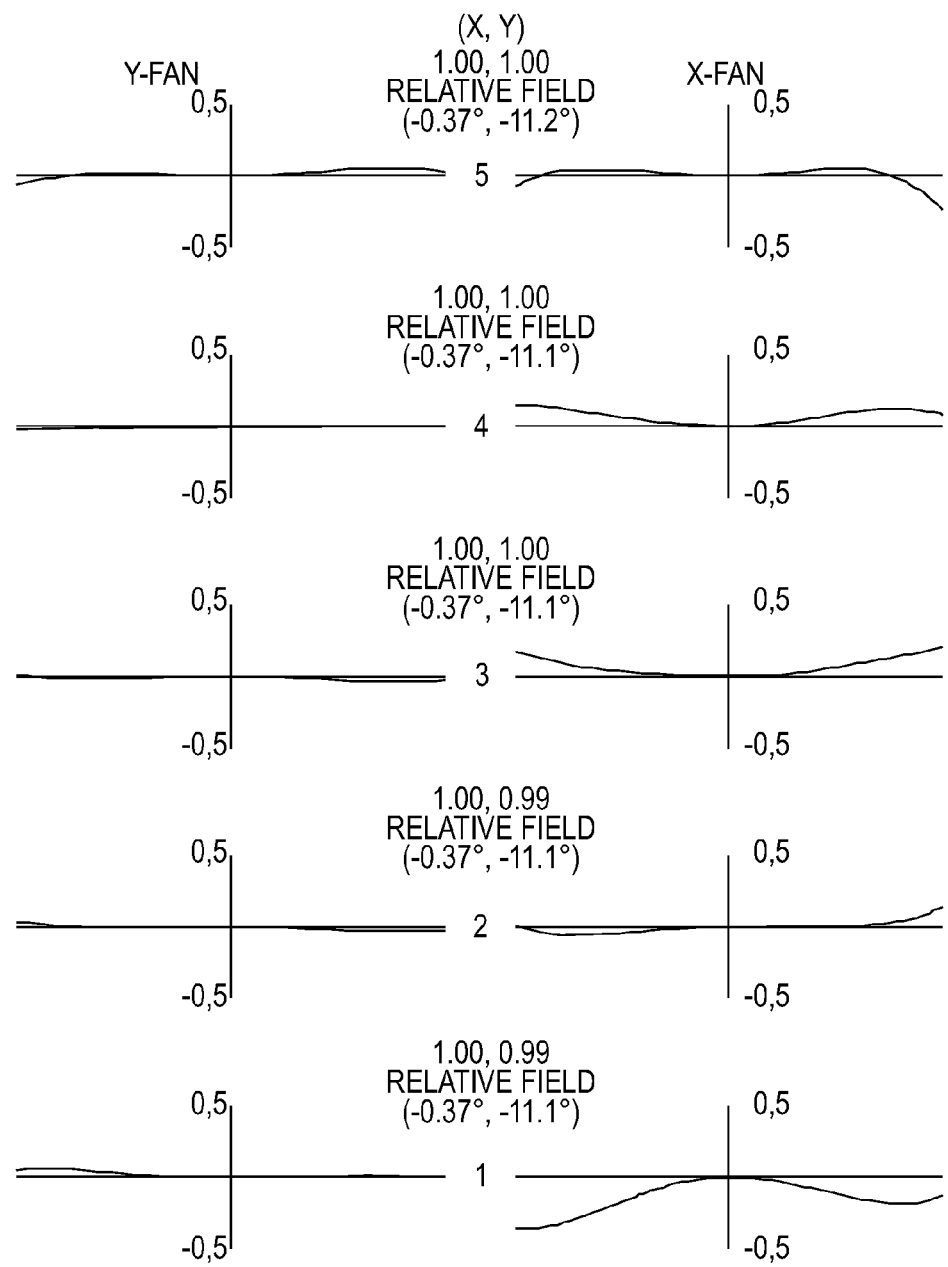
Figure 42:
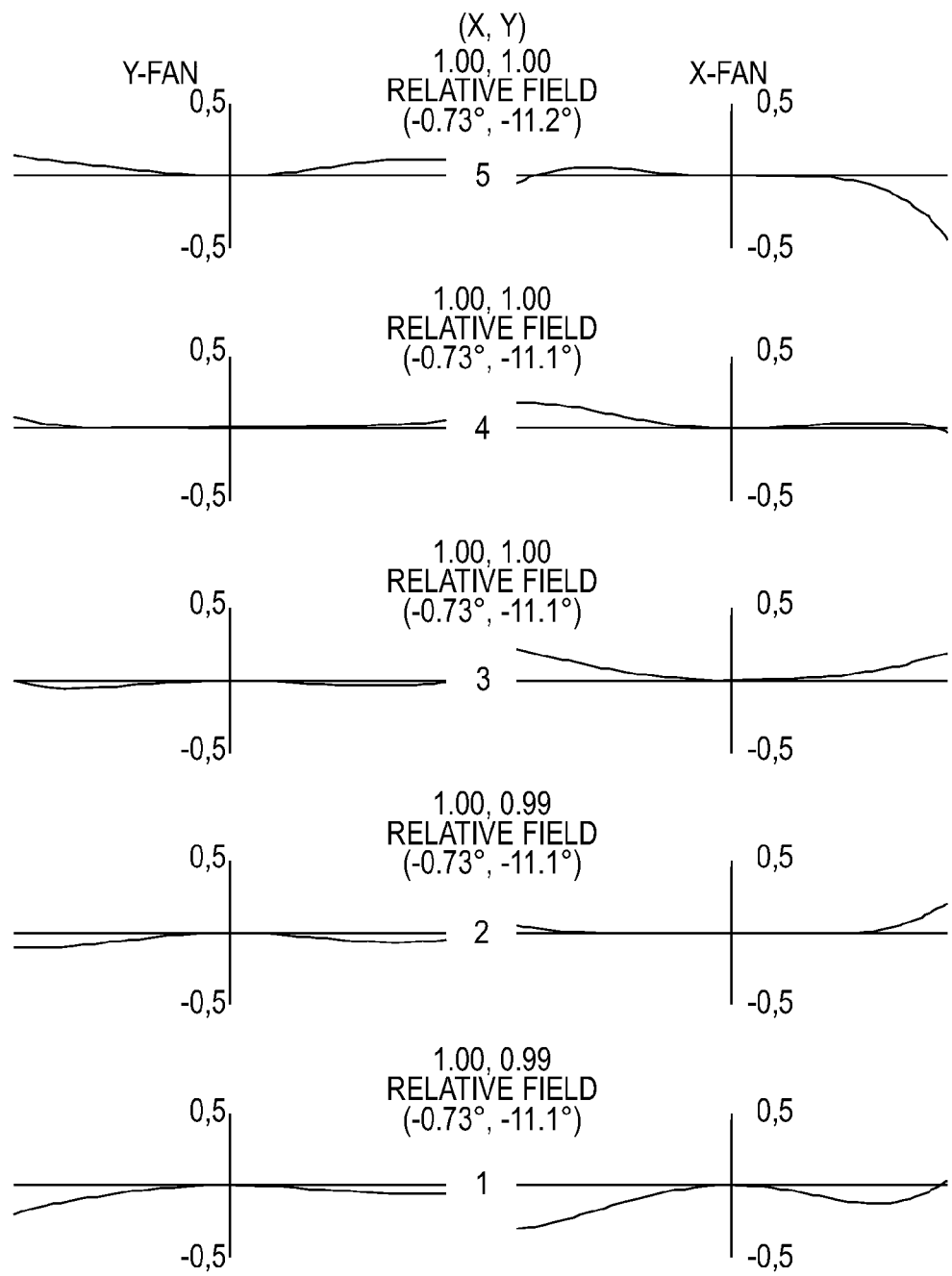

FIGS. 40, 41, and 42 show lateral aberrations in the coordinate system of the exit pupil of projection objective 3900. These aberration plots show the wavefront error for 15 fieldpoints. The fieldpoints correspond to five equidistant y-coordinates between $y_{min}$ and $y_{max}$ at the center of the object field at x=0, at x=$x_{max}$/2 and at x=$x_{max}$.

Figure 43:
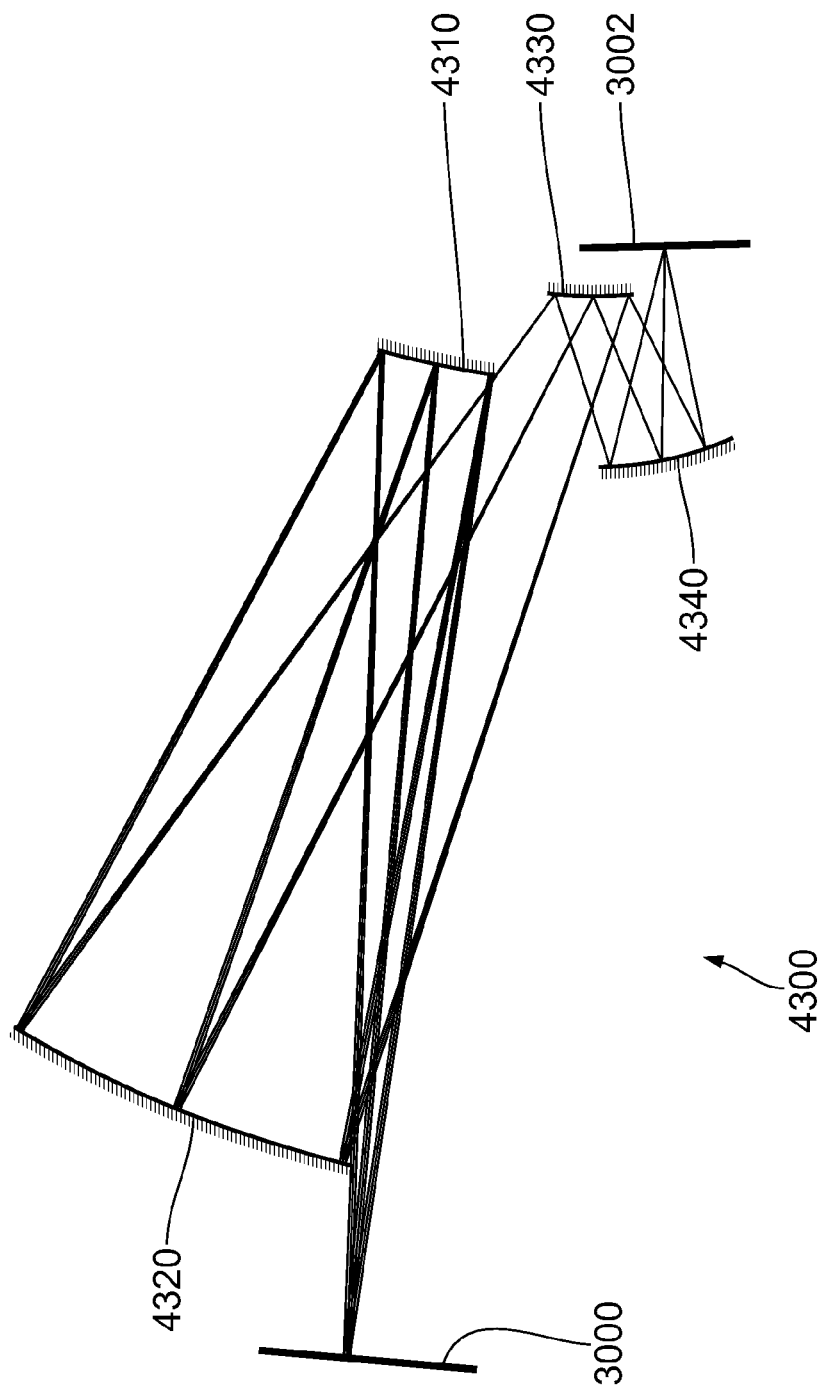
FIG. 43 is a cross-sectional view of a projection objective shown in meridional section.

Referring to FIG. 43, another embodiment of a projection objective 4300 includes four rotationally-asymmetric mirrors 4310, 4320, 4330, and 4340, which direct radiation from object plane 3000 to image plane 3002. Projection objective 4300 images radiation from an object plane 3000 to an image plane 3002 with a demagnification ratio of 4×.

Projection objective 4300 has an image-side NA of 0.22. Projection objective 4300 has a rectangular field. The height and width of the field at object plane 3000 is 6 mm and 100 mm, respectively. The tracklength of projection objective 4300 is 1,610 mm. Image plane 3002 is tilted with respect to object plane 3000 by −3,269°.

Data for projection objective 4300 is presented in Tables 16A, 16B, 16C, and 16D below. Table 16A presents optical data, Tables 16B and 16C present rotationally-asymmetric constants for each of the mirror surfaces. For the purposes of Tables 16A-16D, the mirror designations correlate as follows: mirror 1 (M1) corresponds to mirror 4310; mirror 2 (M2) corresponds to mirror 4320; mirror 3 (M3) corresponds to mirror 4330; and mirror 4 (M4) corresponds to mirror 4340.

TABLE 16A

| Surface | Radius | Spacing | Mode |
|---|---|---|---|
| Object | INFINITY | 1401.362 | |
| Mirror 1 | 2056.786 | −1173.664 | REFL |
| Mirror 2 | 1698.638 | 1307.130 | REFL |
| Mirror 3 | 485.224 | 0.000 | REFL |
| STOP | INFINITY | −242.471 | |
| Mirror 4 | 500.544 | 317.875 | REFL |
| Image | INFINITY | 0.000 | |

TABLE 16B

| Coefficient | M1 | M2 | M3 | M4 | Image |
|---|---|---|---|---|---|
| Y-decenter | −39.335 | 41.119 | 28.409 | 29.500 | 20.214 |
| X-rotation | −2.559 | −2.218 | −2.171 | −1.946 | −3.269 |

TABLE 16C

| Coefficient | M1 | M2 | M3 | M4 |
|---|---|---|---|---|
| K | 1.99E−01 | 1.77E−02 | −1.87E+00 | 4.88E−01 |
| Y | 2.81E−02 | 1.37E−02 | 3.55E−02 | 7.69E−03 |
| $X^2$ | 2.26E−04 | 3.48E−06 | −4.91E−04 | −4.94E−05 |
| $Y^2$ | 1.03E−04 | 5.88E−06 | 4.66E−05 | 1.24E−04 |
| $X^2Y$ | −2.82E−07 | −2.37E−09 | 6.97E−07 | 5.91E−08 |
| $Y^3$ | 2.75E−07 | 1.70E−08 | 1.19E−07 | −2.41E−07 |
| $X^4$ | 9.82E−10 | 1.81E−11 | 4.96E−08 | −2.57E−09 |
| $X^2Y^2$ | 3.25E−10 | 7.65E−11 | 1.17E−07 | −1.97E−09 |
| $Y^4$ | 3.00E−10 | 3.51E−11 | 5.55E−08 | −1.12E−09 |
| $X^4Y$ | 1.63E−12 | −5.37E−14 | 6.00E−11 | −1.49E−12 |
| $X^2Y^3$ | 7.72E−12 | −1.83E−13 | 5.59E−11 | −5.50E−12 |
| $Y^5$ | −1.69E−12 | −2.87E−14 | 1.06E−10 | −7.08E−12 |
| $X^6$ | −7.06E−13 | −2.35E−16 | 7.97E−13 | −3.51E−14 |
| $X^4Y^2$ | −1.89E−13 | 2.95E−16 | 2.92E−12 | −2.27E−13 |
| $X^2Y^4$ | −2.95E−14 | 8.47E−16 | 3.43E−12 | −8.71E−14 |
| $Y^6$ | −6.58E−15 | 6.72E−17 | 1.51E−12 | 2.45E−13 |
| $X^6Y$ | 1.66E−14 | 2.27E−18 | −5.35E−15 | −1.05E−16 |

TABLE 16C-continued

| Coefficient | M1 | M2 | M3 | M4 |
|---|---|---|---|---|
| $X^4Y^3$ | 3.03E−16 | −1.68E−18 | −1.54E−14 | −4.92E−15 |
| $X^2Y^5$ | 3.34E−17 | −1.58E−18 | 8.39E−15 | −7.28E−18 |
| $Y^7$ | 6.29E−18 | −9.72E−20 | −1.58E−14 | 4.60E−15 |
| $X^8$ | −8.43E−18 | −5.58E−22 | 3.34E−17 | −1.03E−18 |
| $X^6Y^2$ | −1.36E−16 | −3.42E−21 | 2.48E−16 | −4.99E−17 |
| $X^4Y^4$ | 1.67E−17 | 1.04E−20 | 5.35E−16 | −1.22E−16 |
| $X^2Y^6$ | −1.28E−19 | 2.47E−21 | 1.70E−16 | 1.96E−17 |
| $Y^8$ | 2.31E−20 | 2.12E−22 | 1.26E−17 | 2.70E−17 |
| $X^8Y$ | 6.81E−20 | −6.83E−25 | 1.95E−18 | −2.10E−19 |
| $X^6Y^3$ | 4.40E−19 | −1.21E−23 | 8.94E−18 | −1.50E−18 |
| $X^4Y^5$ | −1.14E−19 | −2.41E−23 | 2.11E−18 | −1.40E−18 |
| $X^2Y^7$ | 1.00E−21 | −2.59E−24 | −2.62E−18 | 2.58E−19 |
| $Y^9$ | 1.76E−22 | −1.04E−25 | 4.55E−19 | 4.95E−20 |
| $X^{10}$ | 4.15E−23 | 1.40E−27 | 1.03E−21 | −3.22E−22 |
| $X^8Y^2$ | −8.40E−23 | 8.23E−27 | −2.65E−20 | −3.81E−21 |
| $X^6Y^4$ | −4.40E−22 | 2.75E−26 | −1.15E−19 | −1.13E−20 |
| $X^4Y^6$ | 2.15E−22 | 2.05E−26 | −6.68E−20 | −5.18E−21 |
| $X^2Y^8$ | −2.36E−24 | 2.35E−27 | 1.73E−20 | 1.16E−21 |
| $Y^{10}$ | −4.82E−25 | 1.60E−28 | 7.05E−21 | 6.71E−23 |
| Nradius | 2.0e+00 | 2.0e+00 | 2.0e+00 | 2.0e+00 |

TABLE 16D

| $x_{Object}/mm$ | $y_{Object}/mm$ | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 400 | 0 | −1.00949 | 1.00949 | 0.0229582 | 0.016806 |
| 0 | 401.5 | 0 | −1.95078 | 1.95078 | 0.0133671 | 0.014259 |
| 0 | 403 | 0 | −1.62222 | 1.62222 | 0.00369148 | 0.023621 |
| 0 | 404.5 | 0 | −1.10626 | 1.10626 | 0.00606921 | 0.019377 |
| 0 | 406 | 0 | −1.48681 | 1.48681 | 0.0159156 | 0.012538 |
| 12.5 | 400 | −0.880918 | −0.237177 | 0.912288 | 0.0242612 | 0.029659 |
| 12.5 | 401.5 | −0.966915 | −1.11354 | 1.47475 | 0.0158373 | 0.024479 |
| 12.5 | 403 | −0.748886 | −0.752973 | 1.06198 | 0.00983379 | 0.029615 |
| 12.5 | 404.5 | −0.234325 | −0.238253 | 0.334175 | 0.0114533 | 0.0278 |
| 12.5 | 406 | 0.569207 | −0.653615 | 0.866723 | 0.0189539 | 0.028612 |
| 25 | 400 | −0.712509 | 1.51156 | 1.67107 | 0.0278372 | 0.041582 |
| 25 | 401.5 | −1.05587 | 0.817705 | 1.33548 | 0.0216593 | 0.031971 |
| 25 | 403 | −0.794449 | 1.26023 | 1.48974 | 0.0186545 | 0.033731 |
| 25 | 404.5 | 0.0563116 | 1.75538 | 1.75628 | 0.0204067 | 0.035112 |
| 25 | 406 | 1.48083 | 1.21794 | 1.91735 | 0.0260668 | 0.043885 |
| 37.5 | 400 | 0.775815 | 2.32893 | 2.45475 | 0.0330354 | 0.035552 |
| 37.5 | 401.5 | −0.220665 | 1.89815 | 1.91094 | 0.0289732 | 0.019017 |
| 37.5 | 403 | −0.318211 | 2.43041 | 2.45116 | 0.0278179 | 0.018555 |
| 37.5 | 404.5 | 0.458907 | 2.84034 | 2.87718 | 0.0299911 | 0.023281 |
| 37.5 | 406 | 2.08622 | 2.04109 | 2.91862 | 0.0349482 | 0.041572 |
| 50 | 400 | 2.20545 | −1.61745 | 2.73499 | 0.0393365 | 0.049861 |
| 50 | 401.5 | −0.163904 | −1.76675 | 1.77434 | 0.0370418 | 0.045563 |
| 50 | 403 | −1.35027 | −1.20714 | 1.81119 | 0.0372211 | 0.042817 |
| 50 | 404.5 | −1.38792 | −1.02622 | 1.72611 | 0.0399036 | 0.036919 |
| 50 | 406 | −0.3114 | −2.31311 | 2.33398 | 0.0446971 | 0.041068 |

With respect to Table 16D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength λ=13.5 nm. As the optical system is mirror symmetric with respect to the yz-plane it is sufficient to give data for fieldpoints having positive x-coordinates in the object plane.

Figure 44:
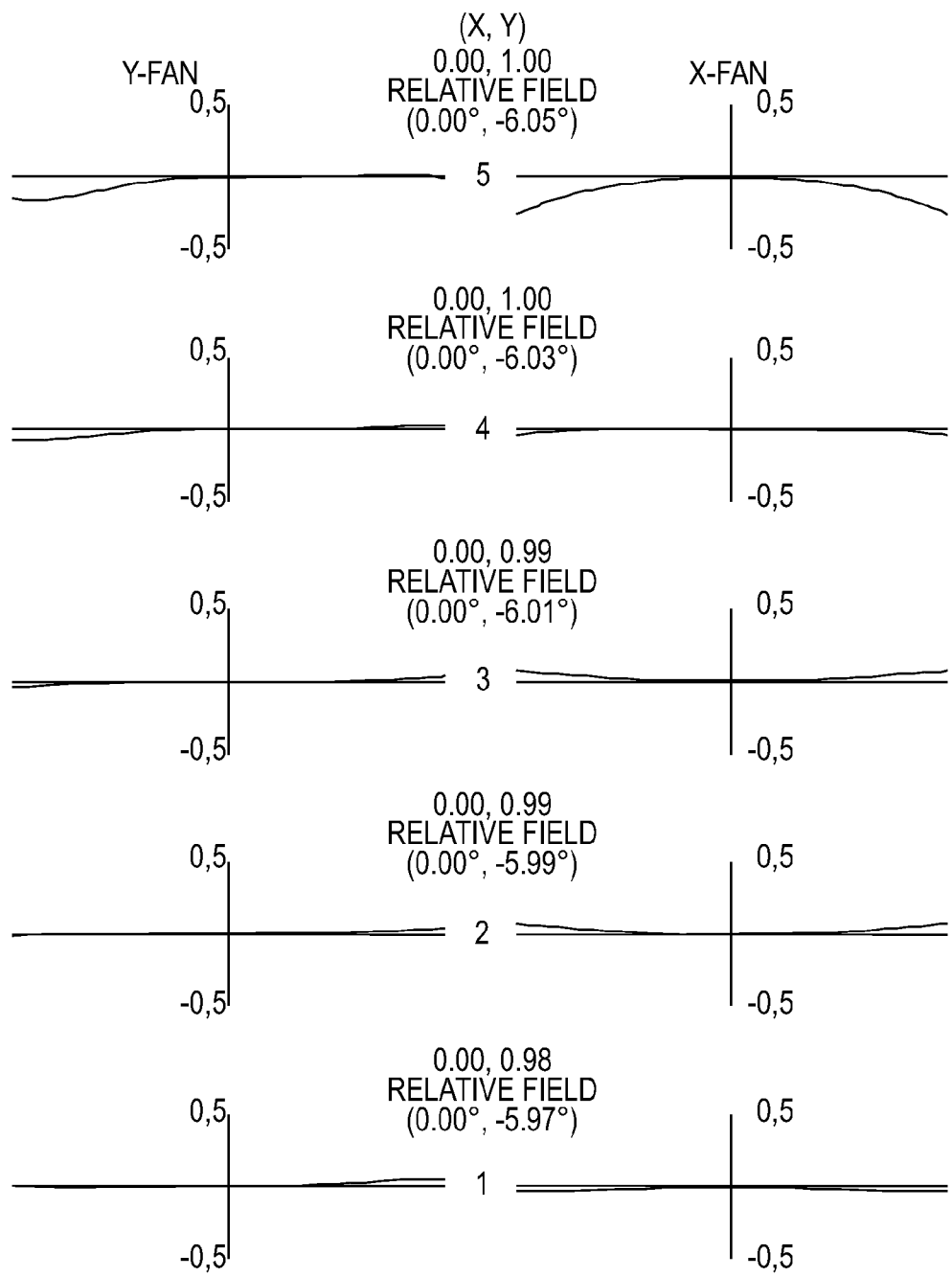
FIGS. 44, 45, and 46 are plots showing aberrations as a function of position in the image field for the projection objective shown in FIG. 43.
Figure 45:
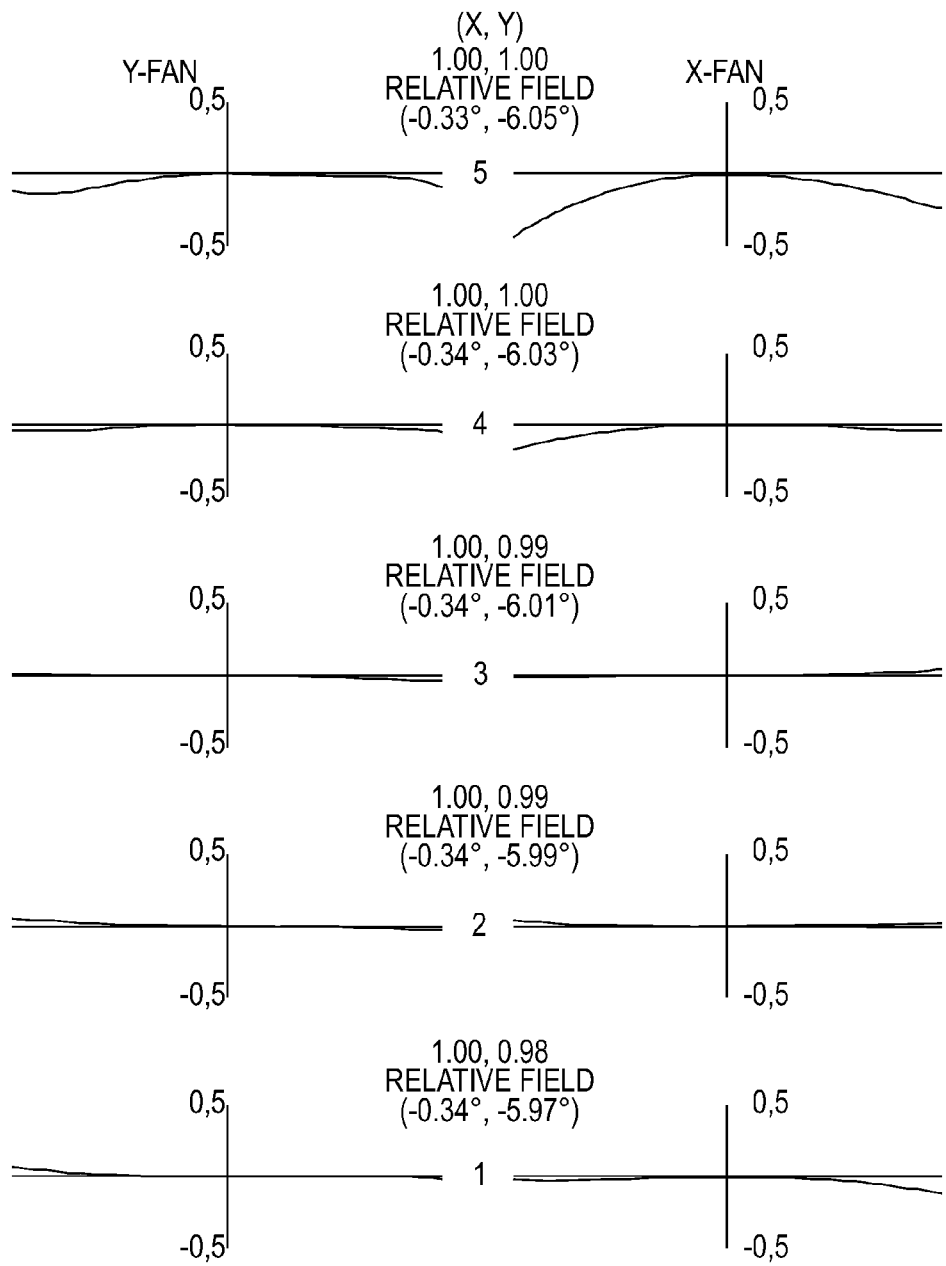
Figure 46:
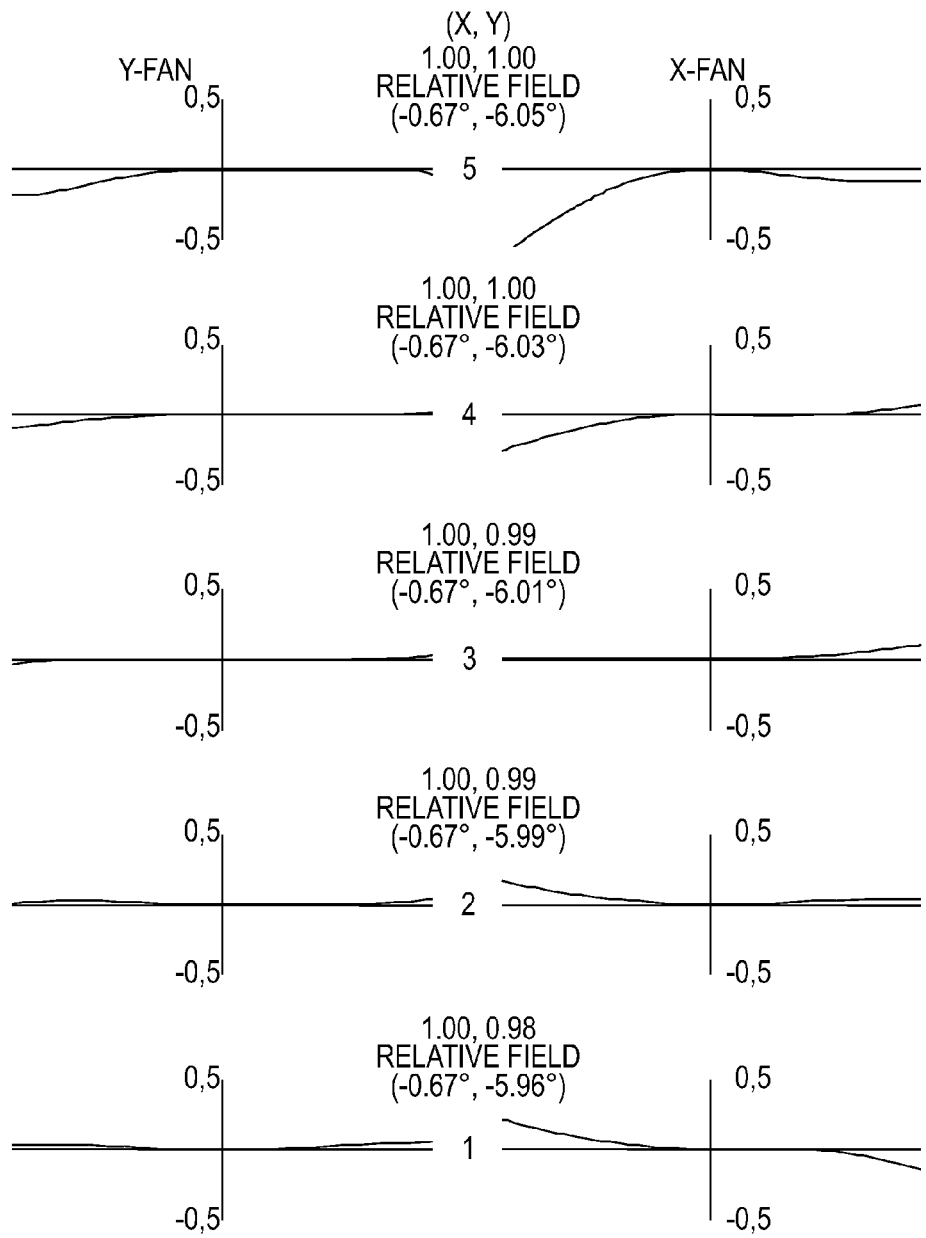

FIGS. 44, 45, and 46 show lateral aberrations in the coordinate system of the exit pupil of projection objective 4300. These aberration plots show the wavefront error for 15 fieldpoints. The fieldpoints correspond to five equidistant y-coordinates between $y_{min}$ and $y_{max}$ at the center of the object field at x=0, at x=$x_{max}$/2 and at x=$x_{max}$.

Figure 47:
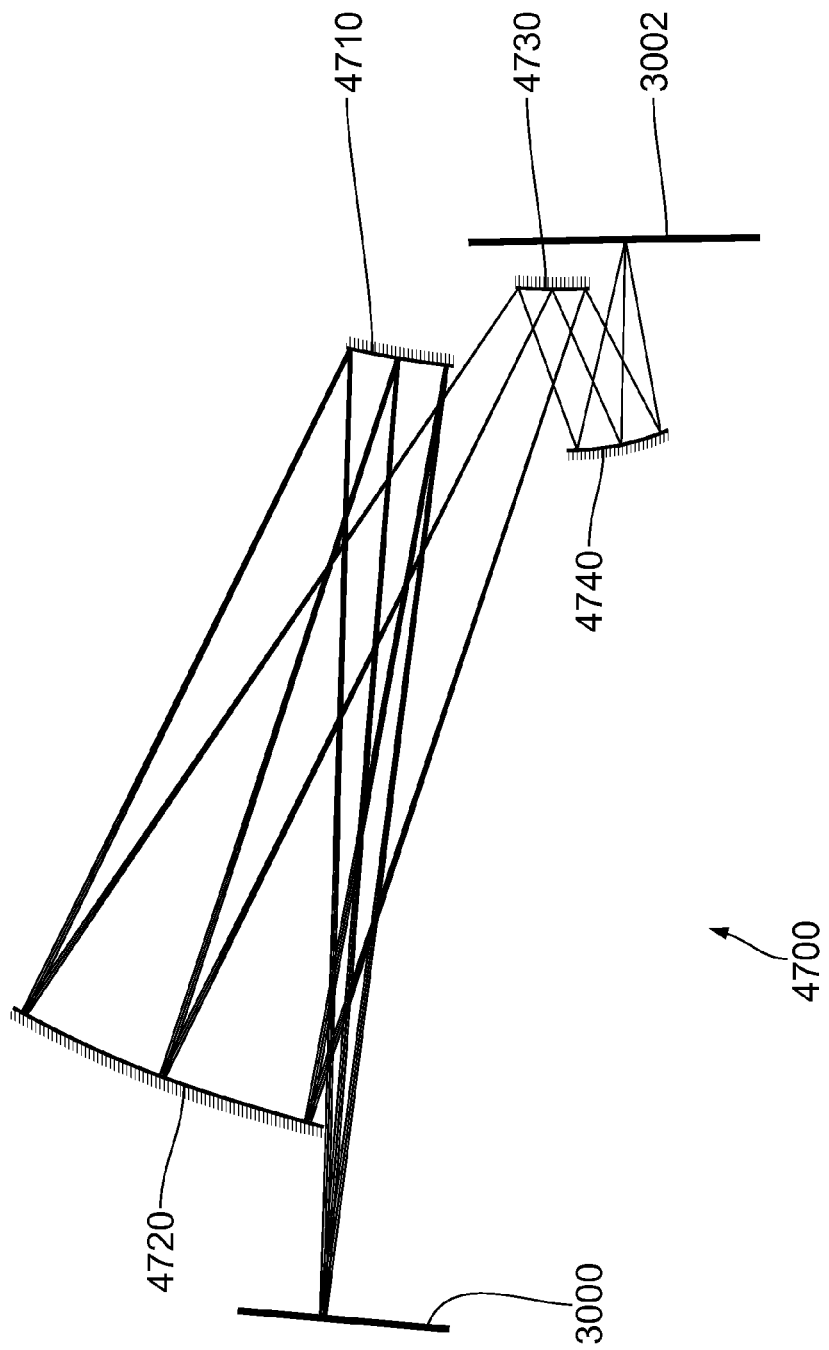
FIG. 47 is a cross-sectional view of a projection objective shown in meridional section.

Referring to FIG. 47, another embodiment of a projection objective 4700 includes four rotationally-asymmetric mirrors 4710, 4720, 4730, and 4740, which direct radiation from object plane 3000 to image plane 3002. Projection objective 4700 images radiation from an object plane 3000 to an image plane 3002 with a demagnification ratio of 4×.

Projection objective 4700 has an image-side NA of 0.2. Projection objective 4700 has a rectangular field. The height and width of the field at object plane 3000 is 6 mm and 48 mm, respectively. The tracklength of projection objective 4700 is 805 mm. Image plane 3002 is tilted with respect to object plane 3000 by −3, 254°.

Data for projection objective 4700 is presented in Tables 17A, 17B, 17C, and 17D below. Table 17A presents optical data, Tables 17B and 17C present rotationally-asymmetric constants for each of the mirror surfaces. For the purposes of Tables 17A-17D, the mirror designations correlate as follows: mirror 1 (M1) corresponds to mirror 4710; mirror 2 (M2) corresponds to mirror 4720; mirror 3 (M3) corresponds to mirror 4730; and mirror 4 (M4) corresponds to mirror 4740.

TABLE 17A

| Surface | Radius | Spacing | Mode |
|---|---|---|---|
| Object | INFINITY | 700.681 | |
| Mirror 1 | 1028.806 | −586.789 | REFL |
| Mirror 2 | 849.319 | 653.594 | REFL |
| Mirror 3 | 242.363 | 0.000 | REFL |
| STOP | INFINITY | −121.170 | |
| Mirror 4 | 250.164 | 158.873 | REFL |
| Image | INFINITY | 0.000 | |

TABLE 17B

| Coefficient | M1 | M2 | M3 | M4 | Image |
|---|---|---|---|---|---|
| Y-decenter | −19.604 | 20.562 | 14.246 | 14.754 | 10.066 |
| X-rotation | −2.555 | −2.217 | −2.176 | −1.945 | −3.254 |

TABLE 17C

| Coefficient | M1 | M2 | M3 | M4 |
|---|---|---|---|---|
| K | 1.85E−01 | 1.74E−02 | −1.85E+00 | 4.82E−01 |
| Y | 1.40E−02 | 6.82E−03 | 1.78E−02 | 3.82E−03 |
| $X^2$ | 1.12E−04 | 1.78E−06 | −2.41E−04 | −2.19E−05 |
| $Y^2$ | 5.11E−05 | 2.94E−06 | 2.25E−05 | 6.32E−05 |
| $X^2Y$ | −1.50E−07 | −2.03E−09 | 2.40E−07 | 6.62E−09 |
| $Y^3$ | 1.37E−07 | 8.46E−09 | 9.10E−08 | −1.22E−07 |
| $X^4$ | 6.14E−10 | 1.05E−11 | 2.48E−08 | −1.21E−09 |
| $X^2Y^2$ | 1.18E−10 | 3.69E−11 | 5.87E−08 | −8.27E−10 |
| $Y^4$ | 1.49E−10 | 1.75E−11 | 2.85E−08 | −6.21E−10 |
| $X^4Y$ | −4.96E−13 | −4.03E−14 | 2.70E−11 | −1.87E−12 |
| $X^2Y^3$ | 3.75E−12 | −9.18E−14 | 2.66E−11 | −3.21E−12 |
| $Y^5$ | −8.45E−13 | −1.45E−14 | 5.11E−11 | −3.08E−12 |
| $X^6$ | −4.48E−13 | −1.55E−16 | 4.07E−13 | −1.32E−14 |
| $X^4Y^2$ | −9.93E−14 | 1.76E−16 | 1.48E−12 | −1.34E−13 |
| $X^2Y^4$ | −1.45E−14 | 4.25E−16 | 1.72E−12 | −4.41E−14 |
| $Y^6$ | −3.27E−15 | 3.37E−17 | 5.96E−13 | 1.31E−13 |
| $X^6Y$ | 9.85E−15 | 1.26E−18 | −4.00E−15 | 9.75E−18 |
| $X^4Y^3$ | 2.03E−16 | −8.24E−19 | −7.92E−15 | −2.79E−15 |
| $X^2Y^5$ | 2.17E−17 | −7.96E−19 | 4.39E−15 | −2.79E−17 |
| $Y^7$ | 3.42E−18 | −4.69E−20 | −7.86E−15 | 2.14E−15 |
| $X^8$ | −9.51E−18 | −1.05E−21 | 2.00E−17 | −1.48E−18 |
| $X^6Y^2$ | −7.13E−17 | 7.34E−23 | 1.55E−16 | −3.11E−17 |
| $X^4Y^4$ | 8.72E−18 | 5.00E−21 | 2.91E−16 | −5.52E−17 |
| $X^2Y^6$ | −6.01E−20 | 1.22E−21 | 8.06E−17 | 1.21E−17 |
| $Y^8$ | 1.39E−20 | 1.11E−22 | 2.93E−17 | 1.34E−17 |
| $X^8Y$ | 8.76E−20 | 3.22E−24 | 1.62E−18 | −1.88E−19 |
| $X^6Y^3$ | 1.77E−19 | −1.60E−23 | 6.77E−18 | −9.63E−19 |
| $X^4Y^5$ | −6.03E−20 | −1.18E−23 | −5.88E−20 | −5.35E−19 |
| $X^2Y^7$ | 3.31E−22 | −1.26E−24 | −1.35E−18 | 1.61E−19 |
| $Y^9$ | 9.94E−23 | −4.83E−26 | 9.84E−20 | 4.93E−20 |
| $X^{10}$ | 2.39E−23 | 5.19E−28 | −1.04E−21 | −2.67E−22 |
| $X^8Y^2$ | −1.62E−22 | 8.70E−28 | −3.92E−20 | −3.09E−21 |
| $X^6Y^4$ | −5.01E−23 | 2.68E−26 | −9.03E−20 | −7.21E−21 |
| $X^4Y^6$ | 1.13E−22 | 1.01E−26 | −3.00E−20 | −1.55E−21 |
| $X^2Y^8$ | −8.02E−25 | 1.14E−27 | 9.53E−21 | 7.07E−22 |
| $Y^{10}$ | −3.08E−25 | 6.63E−29 | 3.03E−21 | 1.68E−22 |
| Nradius | 1.00E+00 | 1.00E+00 | 1.00E+00 | 1.00E+00 |

TABLE 17D

| $x_{Object}/mm$ | $y_{Object}/mm$ | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 200 | 0 | 0.448311 | 0.448311 | 0.0429146 | 0.030026 |
| 0 | 201.5 | 0 | −2.47405 | 2.47405 | 0.0235631 | 0.014465 |
| 0 | 203 | 0 | −0.967497 | 0.967497 | 0.00387066 | 0.028481 |
| 0 | 204.5 | 0 | 0.932079 | 0.932079 | 0.0161673 | 0.017921 |
| 0 | 206 | 0 | −0.816331 | 0.816331 | 0.0365555 | 0.020854 |
| 6 | 200 | −0.229332 | 0.72028 | 0.755908 | 0.0429896 | 0.031915 |
| 6 | 201.5 | −0.764827 | −2.11395 | 2.24805 | 0.0241369 | 0.015911 |
| 6 | 203 | −0.727117 | −0.578603 | 0.929236 | 0.00803243 | 0.028531 |
| 6 | 204.5 | −0.144224 | 1.28903 | 1.29708 | 0.018286 | 0.019129 |
| 6 | 206 | 0.955191 | −0.553491 | 1.10397 | 0.0378693 | 0.025583 |
| 12 | 200 | 0.0887838 | 1.34107 | 1.34401 | 0.0432387 | 0.034302 |
| 12 | 201.5 | −1.10902 | −1.23729 | 1.66157 | 0.0258287 | 0.016652 |
| 12 | 203 | −1.16563 | 0.372291 | 1.22364 | 0.0146925 | 0.027176 |
| 12 | 204.5 | −0.139014 | 2.12835 | 2.13289 | 0.0235883 | 0.019707 |
| 12 | 206 | 1.91157 | −0.015856 | 1.91164 | 0.0416026 | 0.033254 |
| 18 | 200 | 1.27353 | 1.60761 | 2.05092 | 0.0437339 | 0.03238 |
| 18 | 201.5 | −0.903733 | −0.573284 | 1.07023 | 0.0285705 | 0.014127 |
| 18 | 203 | −1.38256 | 1.11952 | 1.77898 | 0.0218489 | 0.02358 |
| 18 | 204.5 | −0.254443 | 2.63758 | 2.64983 | 0.0306063 | 0.015334 |
| 18 | 206 | 2.38718 | −0.072959 | 2.38829 | 0.0472927 | 0.036701 |
| 24 | 200 | 3.13573 | −0.027319 | 3.13585 | 0.0445949 | 0.032197 |
| 24 | 201.5 | −0.646294 | −1.71453 | 1.8323 | 0.0322942 | 0.028012 |
| 24 | 203 | −2.18957 | 0.0094815 | 2.18959 | 0.0293844 | 0.032097 |
| 24 | 204.5 | −1.62383 | 1.08662 | 1.95386 | 0.0386179 | 0.018853 |
| 24 | 206 | 0.918622 | −2.54687 | 2.70747 | 0.0544894 | 0.035386 |

With respect to Table 17D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength $\lambda$=13.5 nm. As the optical system is mirror symmetric with respect to the yz-plane it is sufficient to give data for fieldpoints having positive x-coordinates in the object plane.

Figure 48:
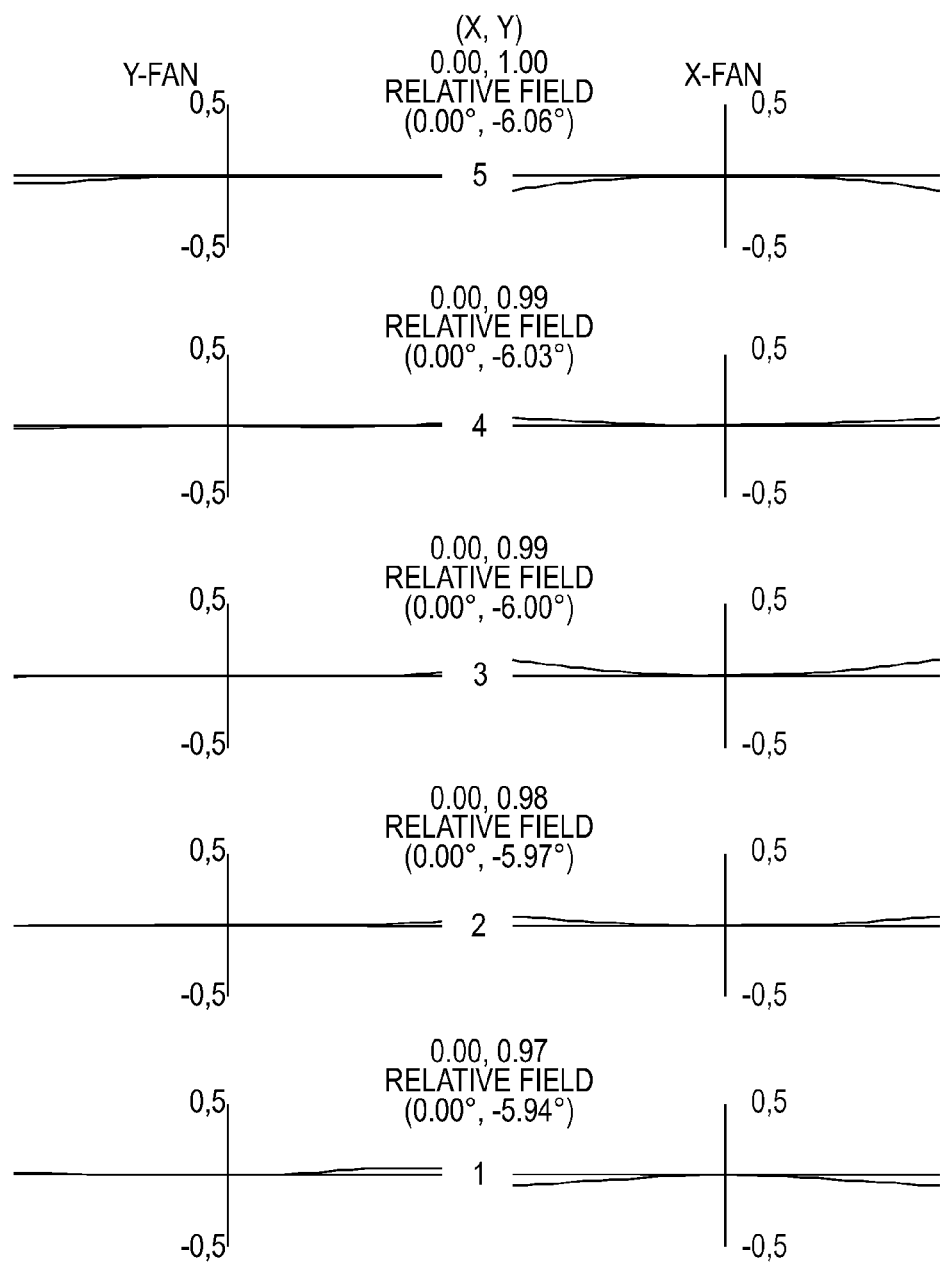
FIGS. 48, 49, and 50 are plots showing aberrations as a function of position in the image field for the projection objective shown in FIG. 47.
Figure 49:
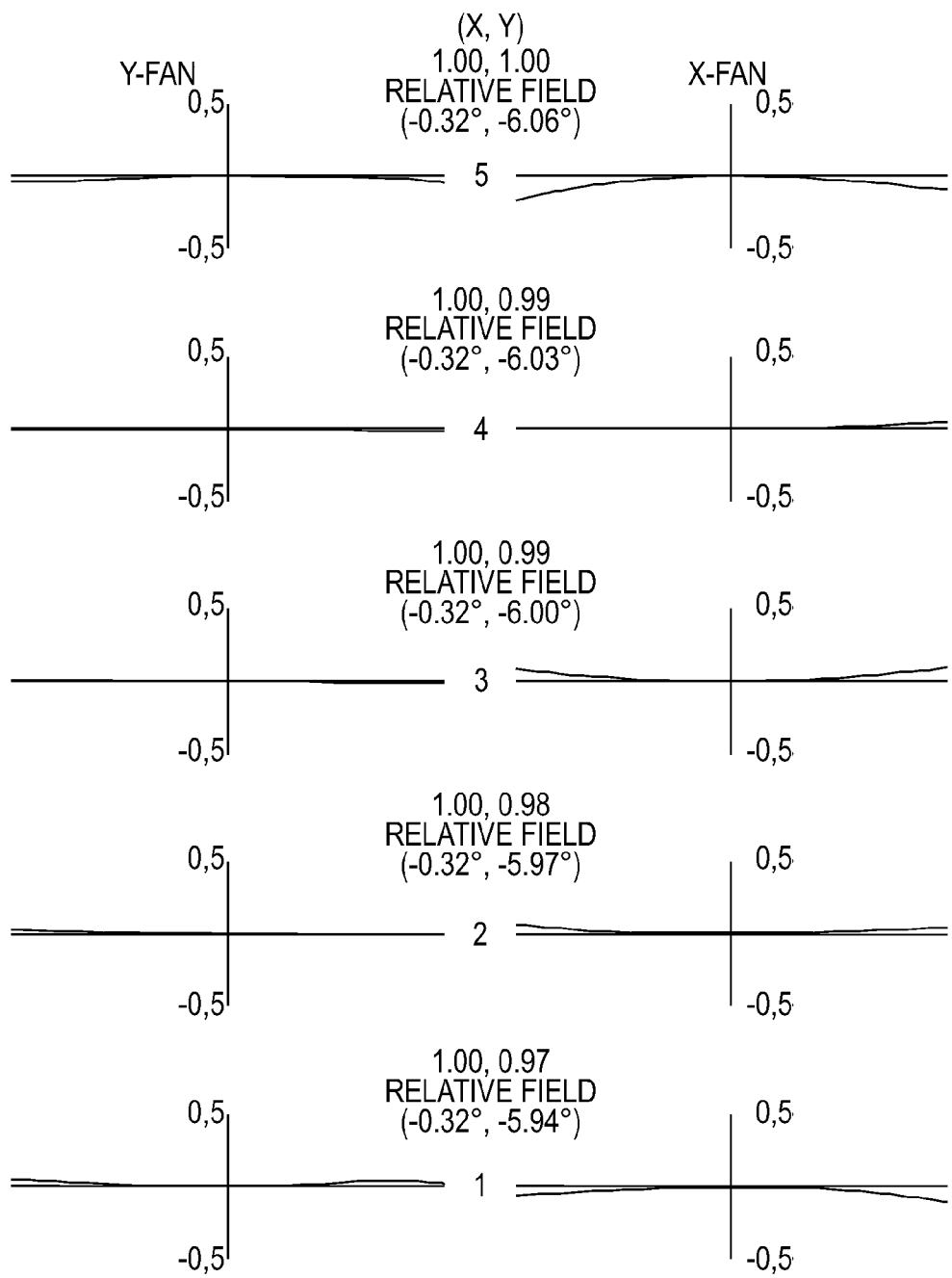
Figure 50:
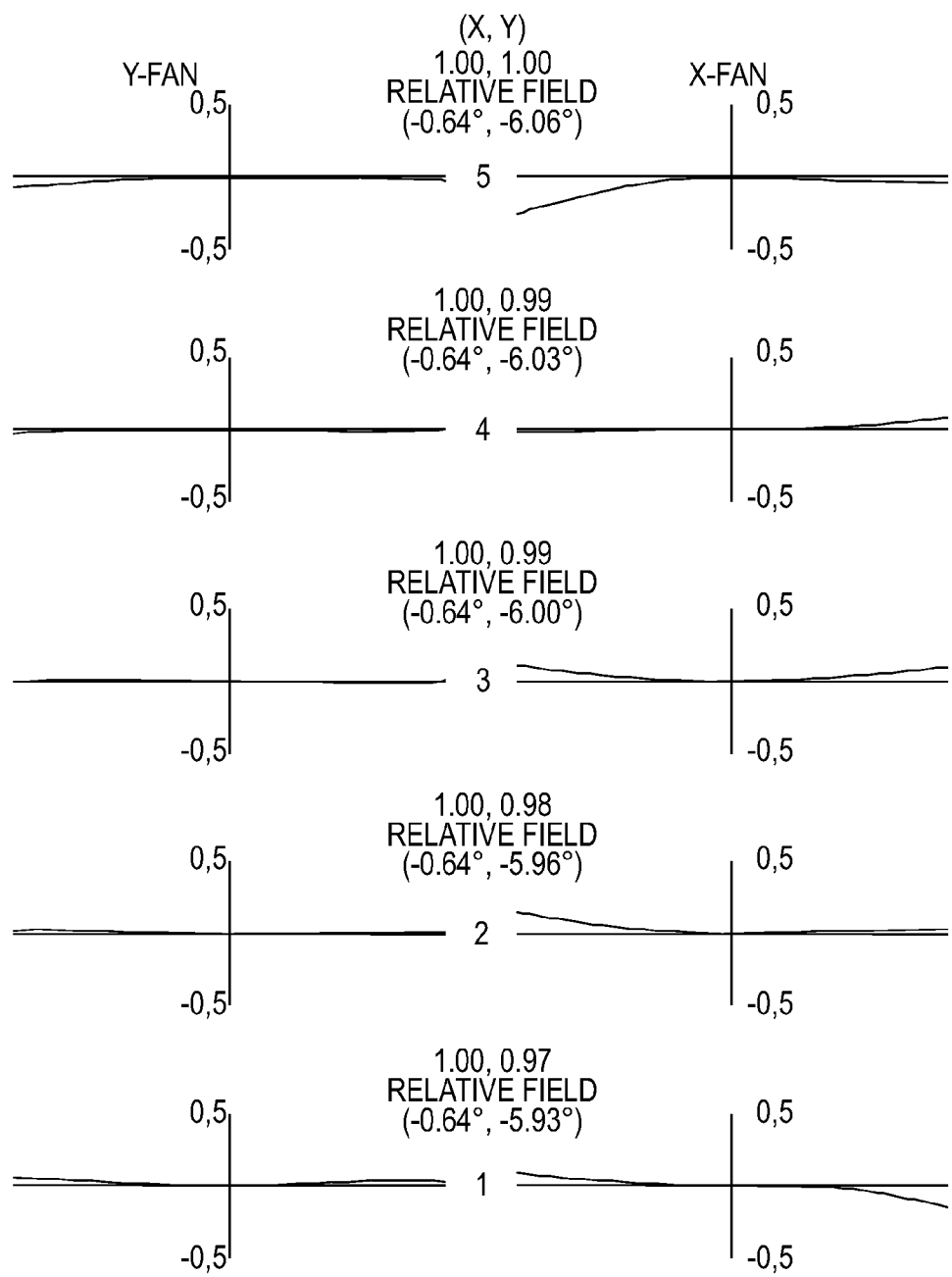

FIGS. 48, 49, and 50 show lateral aberrations in the coordinate system of the exit pupil of projection objective 4700. These aberration plots show the wavefront error for 15 fieldpoints. The fieldpoints correspond to five equidistant y-coordinates between $y_{min}$ and $y_{max}$ at the center of the object field at x=0, at x=$x_{max}$/2 and at x=$x_{max}$.

Figure 51:
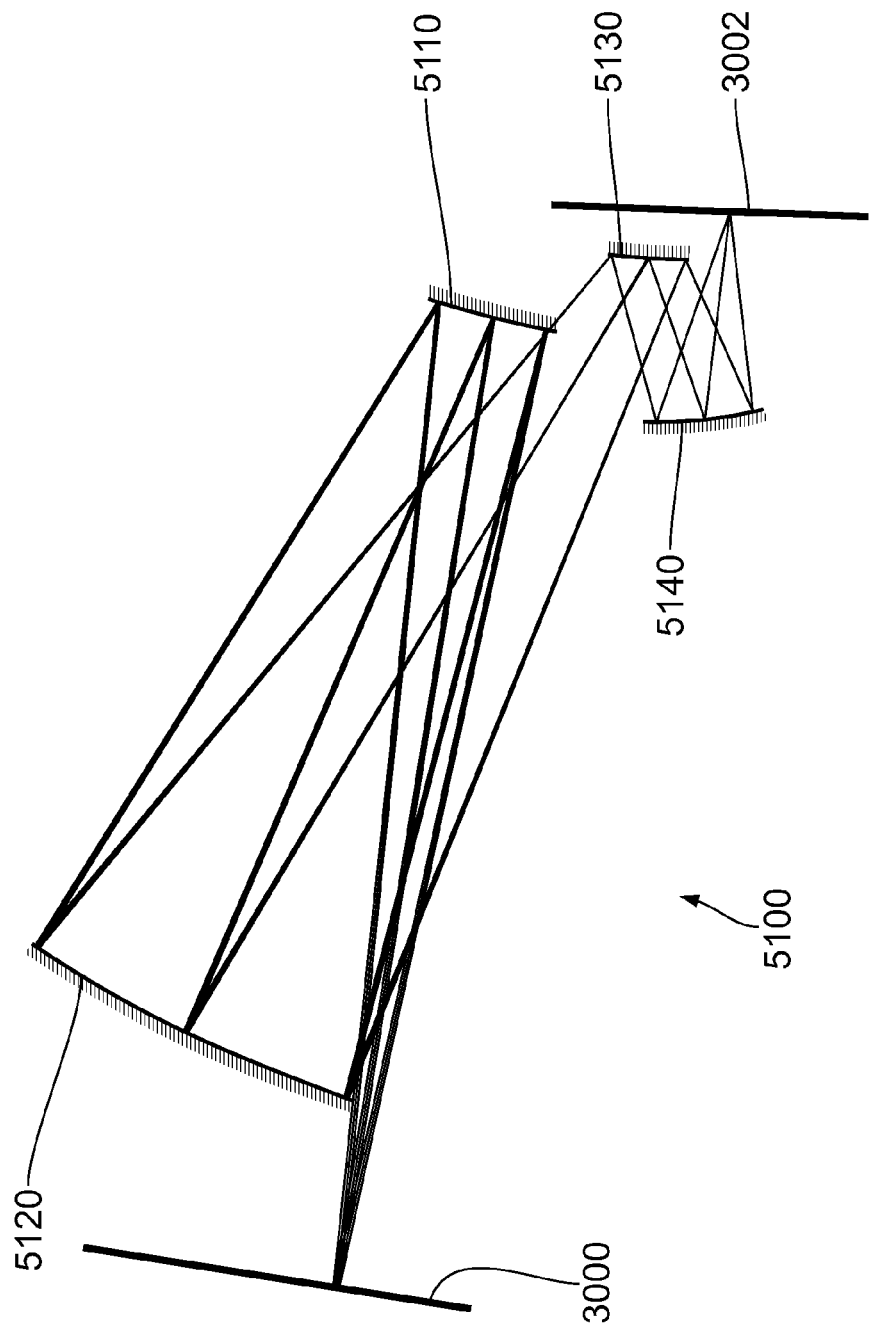
FIG. 51 is a cross-sectional view of a projection objective shown in meridional section.

Referring to FIG. 51, another embodiment of a projection objective 5100 includes four rotationally-asymmetric mirrors 5110, 5120, 5130, and 5140, which direct radiation from object plane 3000 to image plane 3002. Projection objective 5100 images radiation from an object plane 3000 to an image plane 3002 with a demagnification ratio of 4×.

Projection objective 5100 has an image-side NA of 0.22. Projection objective 5100 has a rectangular field. The field at the object plane is a ring-segment field, having a radius of 600 mm and an azimuth angle of −4.8°<$\phi$<+4.8°. The tracklength of projection objective 2300 is 2,354 mm. Image plane 3002 is tilted with respect to object plane 3000 by −3,284°.

Data for projection objective 5100 is presented in Tables 18A, 18B, 18C, and 18D below. Table 18A presents optical data, Tables 18B and 18C present rotationally-asymmetric constants for each of the mirror surfaces. For the purposes of Tables 18A-18D, the mirror designations correlate as follows: mirror 1 (M1) corresponds to mirror 5110; mirror 2 (M2) corresponds to mirror 5120; mirror 3 (M3) corresponds to mirror 5130; and mirror 4 (M4) corresponds to mirror 5140.

TABLE 18A

| Surface | Radius | Spacing | Mode |
|---|---|---|---|
| Object | INFINITY | 2102.043 | |
| Mirror 1 | 3086.275 | −1760.111 | REFL |
| Mirror 2 | 2547.993 | 1960.753 | REFL |
| Mirror 3 | 727.984 | 0.000 | REFL |
| STOP | INFINITY | −360.225 | |
| Mirror 4 | 749.971 | 475.405 | REFL |
| Image | INFINITY | 0.000 | |

TABLE 18B

| Coefficient | M1 | M2 | M3 | M4 | Image |
|---|---|---|---|---|---|
| Y-decenter | −59.076 | 61.644 | 42.310 | 44.405 | 30.452 |
| X-rotation | −2.561 | −2.218 | −2.136 | −1.933 | −3.284 |

TABLE 18C

| Coefficient | M1 | M2 | M3 | M4 |
|---|---|---|---|---|
| K | 2.00E−01 | 1.89E−02 | −1.89E+00 | 4.80E−01 |
| Y | 4.23E−02 | 2.05E−02 | 5.14E−02 | 1.08E−02 |
| $X^2$ | 3.46E−04 | 6.56E−06 | −7.12E−04 | −6.02E−05 |
| $Y^2$ | 1.53E−04 | 8.72E−06 | 8.61E−05 | 1.95E−04 |
| $X^2Y$ | −4.18E−07 | 4.24E−10 | 1.15E−06 | 1.02E−07 |
| $Y^3$ | 4.10E−07 | 2.56E−08 | 1.76E−07 | −4.73E−07 |
| $X^4$ | 2.12E−09 | 2.92E−11 | 7.50E−08 | −3.49E−09 |
| $X^2Y^2$ | 5.90E−10 | 1.00E−10 | 1.77E−07 | −2.72E−09 |
| $Y^4$ | 4.49E−10 | 5.40E−11 | 8.13E−08 | −1.87E−09 |
| $X^4Y$ | −3.35E−11 | −1.41E−13 | 9.25E−11 | −4.80E−12 |
| $X^2Y^3$ | 1.08E−11 | −2.57E−13 | 6.96E−11 | −2.94E−11 |
| $Y^5$ | −2.41E−12 | −4.00E−14 | 1.39E−10 | −5.57E−12 |
| $X^6$ | −3.85E−13 | −3.65E−17 | 1.18E−12 | −4.06E−14 |
| $X^4Y^2$ | 2.15E−13 | 8.00E−16 | 4.59E−12 | −3.08E−13 |
| $X^2Y^4$ | −4.13E−14 | 1.38E−15 | 5.36E−12 | −5.08E−13 |
| $Y^6$ | −8.84E−15 | 1.00E−16 | 1.93E−12 | 4.48E−13 |
| $X^6Y$ | 7.18E−15 | −4.72E−19 | −7.85E−15 | 1.73E−15 |
| $X^4Y^3$ | −6.02E−16 | −1.61E−18 | −1.51E−14 | 2.44E−16 |
| $X^2Y^5$ | 7.75E−17 | −2.49E−18 | 1.58E−14 | −2.98E−15 |
| $Y^7$ | 1.31E−17 | −1.67E−19 | −2.79E−14 | 6.45E−15 |
| $X^8$ | −1.06E−17 | −5.96E−22 | 5.82E−17 | 5.31E−18 |
| $X^6Y^2$ | −3.13E−17 | 1.16E−20 | 2.73E−16 | 2.65E−17 |
| $X^4Y^4$ | 1.56E−18 | 3.02E−21 | 3.20E−16 | 6.02E−17 |
| $X^2Y^6$ | −2.21E−19 | 2.55E−21 | −6.39E−18 | 3.59E−17 |
| $Y^8$ | 1.87E−20 | 3.05E−22 | 6.46E−17 | 2.87E−17 |
| $X^8Y$ | 7.61E−20 | −2.02E−24 | 3.28E−18 | −4.79E−20 |
| $X^6Y^3$ | −7.15E−20 | −4.82E−23 | 1.05E−17 | −4.21E−19 |
| $X^4Y^5$ | −2.92E−21 | −1.16E−24 | −3.75E−18 | 7.33E−19 |
| $X^2Y^7$ | 1.11E−22 | −5.59E−25 | −4.58E−18 | 5.27E−19 |
| $Y^9$ | 3.34E−24 | −4.27E−27 | 8.58E−19 | 1.71E−20 |
| $X^{10}$ | 1.71E−23 | 2.57E−28 | −2.76E−21 | −5.14E−22 |
| $X^8Y^2$ | −2.62E−23 | 1.39E−26 | −1.87E−20 | −3.15E−21 |
| $X^6Y^4$ | 4.86E−22 | 5.94E−26 | −2.67E−20 | −6.00E−21 |
| $X^4Y^6$ | −9.99E−24 | −5.21E−28 | 6.16E−20 | 3.68E−21 |
| $X^2Y^8$ | 6.99E−25 | 7.71E−28 | 3.25E−20 | 2.02E−21 |
| $Y^{10}$ | 1.70E−26 | 1.19E−29 | 1.19E−20 | 9.56E−23 |
| Nradius | 3.00E+00 | 3.00E+00 | 3.00E+00 | 3.00E+00 |

TABLE 18D

| $x_{Object/mm}$ | $y_{Object/mm}$ | Distortion (x)/nm | Distortion (y)/nm | Absolute Value of Distortion/nm | Telecentricity/ Degrees | Wavefront Error at 13.5 nm |
|---|---|---|---|---|---|---|
| 0 | 600 | 0 | −0.892917 | 0.892917 | 0.0133679 | 0.012256 |
| 0 | 602 | 0 | −0.841667 | 0.841667 | 0.00534092 | 0.016933 |
| 0 | 604 | 0 | 0.0201694 | 0.0201694 | 0.00275272 | 0.021805 |
| 0 | 606 | 0 | 0.379474 | 0.379474 | 0.0109134 | 0.010404 |
| 0 | 608 | 0 | −1.08242 | 1.08242 | 0.0191416 | 0.02706 |
| 12.5655 | 599.868 | −0.463563 | −0.551102 | 0.720142 | 0.0164908 | 0.01867 |
| 12.6073 | 601.868 | −0.477332 | −0.590644 | 0.759412 | 0.0108284 | 0.018161 |
| 12.6492 | 603.868 | −0.257454 | 0.245037 | 0.355423 | 0.0095748 | 0.022897 |
| 12.6911 | 605.867 | 0.191813 | 0.643426 | 0.671409 | 0.0140875 | 0.014667 |
| 12.733 | 607.867 | 0.866074 | −0.713531 | 1.12215 | 0.0209974 | 0.029184 |
| 25.1254 | 599.474 | −0.531595 | 0.291324 | 0.606187 | 0.0234981 | 0.028751 |

TABLE 18D-continued

| $x_{Object/mm}$ | $y_{Object/mm}$ | Distortion (x)/nm | Distortion (y)/nm | Absolute Value of Distortion/nm | Telecentricity/ Degrees | Wavefront Error at 13.5 nm |
|---|---|---|---|---|---|---|
| 25.2091 | 601.472 | −0.737092 | −0.0428674 | 0.738337 | 0.0195942 | 0.018248 |
| 25.2929 | 603.47 | −0.47659 | 0.691569 | 0.839884 | 0.0185603 | 0.0228 |
| 25.3766 | 605.468 | 0.241321 | 1.18393 | 1.20828 | 0.0209057 | 0.018522 |
| 25.4604 | 607.467 | 1.40777 | 0.117965 | 1.4127 | 0.0257861 | 0.030662 |
| 37.6743 | 598.816 | 0.166072 | 1.07231 | 1.08509 | 0.0319492 | 0.037305 |
| 37.7999 | 600.812 | −0.597255 | 0.172817 | 0.621755 | 0.0288103 | 0.012352 |
| 37.9255 | 602.808 | −0.665059 | 0.662666 | 0.938845 | 0.0277044 | 0.017593 |
| 38.0511 | 604.804 | −0.0504098 | 1.23414 | 1.23517 | 0.0289218 | 0.01636 |
| 38.1766 | 606.8 | 1.23319 | 0.573939 | 1.36021 | 0.0322511 | 0.025322 |
| 50.2067 | 597.896 | 1.97056 | 0.813316 | 2.13181 | 0.0409886 | 0.048287 |
| 50.3741 | 599.889 | 0.0758373 | −1.03335 | 1.03613 | 0.0381837 | 0.020354 |
| 50.5414 | 601.882 | −0.898661 | −1.045 | 1.37827 | 0.0369235 | 0.027327 |
| 50.7088 | 603.875 | −0.970685 | −0.525246 | 1.10368 | 0.0374078 | 0.03097 |
| 50.8761 | 605.868 | −0.159467 | −1.30833 | 1.31801 | 0.0398057 | 0.030446 |

With respect to Table 18D, $x_{Object/mm}$ and $y_{Object/mm}$ denote the x- and y-coordinates in the object plane. The values Distortion(x)/nm and Distortion(y)/nm denote the distortion at the respective coordinate. Absolute Value of Distortion/nm denotes the absolute distortion value at the respective coordinate. Telecentricity/Degrees denotes the chief ray angle at the respective coordinate. Wavefront Error at 13.5 nm denotes the RMS wavefront error in units of the illumination wavelength $\lambda=13.5$ nm. As the optical system is mirror symmetric with respect to the yz-plane it is sufficient to give data for fieldpoints having positive x-coordinates in the object plane.

Figure 52:
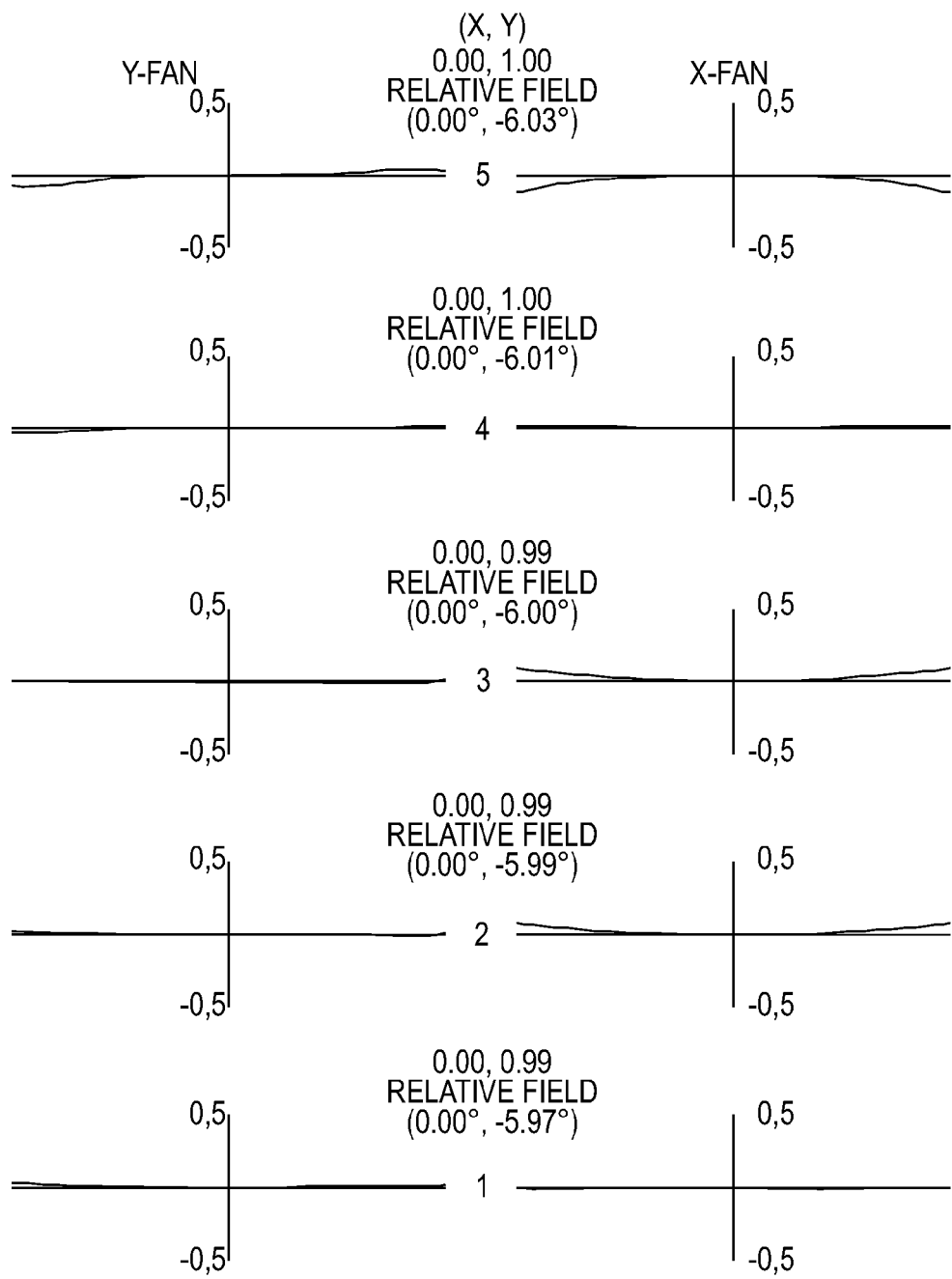
FIG. 52 is a plot showing aberrations as a function of position in the image field for the projection objective shown in FIG. 51.

FIG. 52 shows lateral aberrations in the coordinate system of the exit pupil of projection objective 5100. These aberration plots show the wavefront error for 5 fieldpoints.

Figure 53:
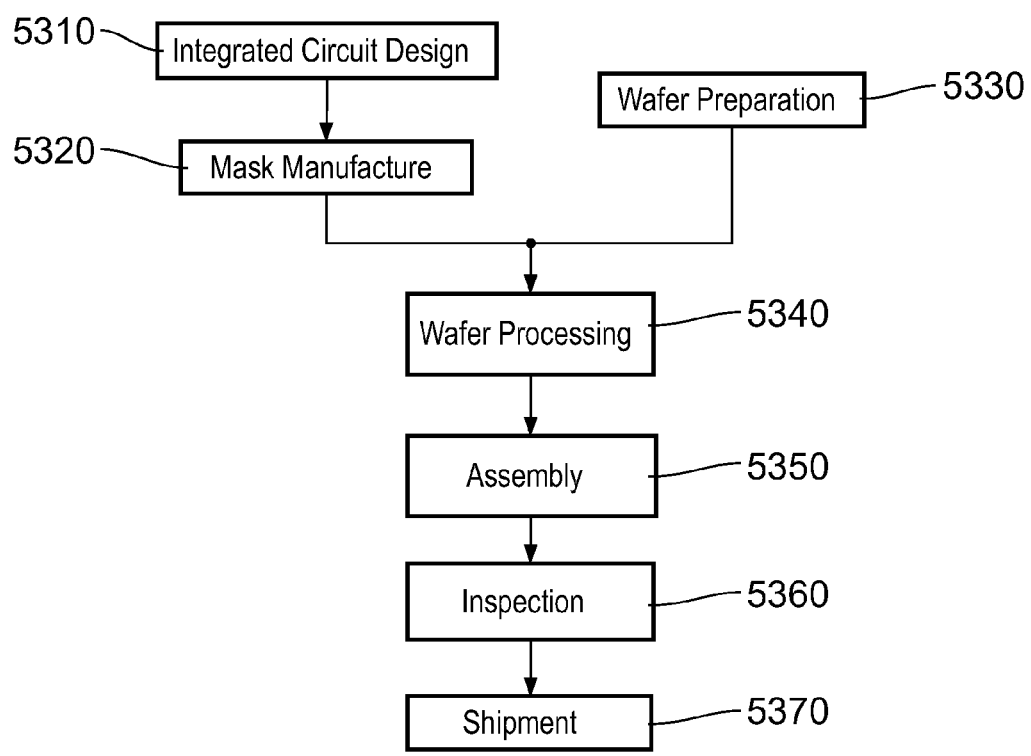
FIG. 53 is a flow chart showing steps in the manufacture of a semiconductor device.

Microlithography tools, such as microlithography tool 100 described above and shown in FIG. 1, can be used in the fabrication of semiconductor devices, such as semiconductor chips, liquid crystal display (LCD) panels, or arrays of charge coupled device (CCD) detectors, for example. Generally, the sequence of process steps used in the fabrication of semiconductor devices varies depending on the specific device being fabricated. FIG. 53 is a flow chart that shows an example of a sequence of steps in the manufacture of a semiconductor device. Initially, in step 5310 the producer designs the integrated circuit to be manufactured for the semiconductor device. Subsequently, in step 5320 masks (i.e., reticles) are produced based on the design of the integrated circuit. Prior to actually building the integrated circuit, wafers (e.g., silicon wafers) are prepared as indicated in step 5330. Next, the integrated circuit is formed on the wafer using the masks in a wafer processing step (step 5340). Details of wafer processing are discussed in greater detail below. After forming the integrated circuit in the wafer, the wafer is diced, bonded, and packaged to produce individual microchips (step 5350). These assembly steps are often referred to as post-processing. After assembly, the chips are inspected (step 5360). For example, the chips' operability and/or durability may be tested. Those devices that pass inspection step 5360 are subsequently shipped to the customer (step 5370).

Figure 54:
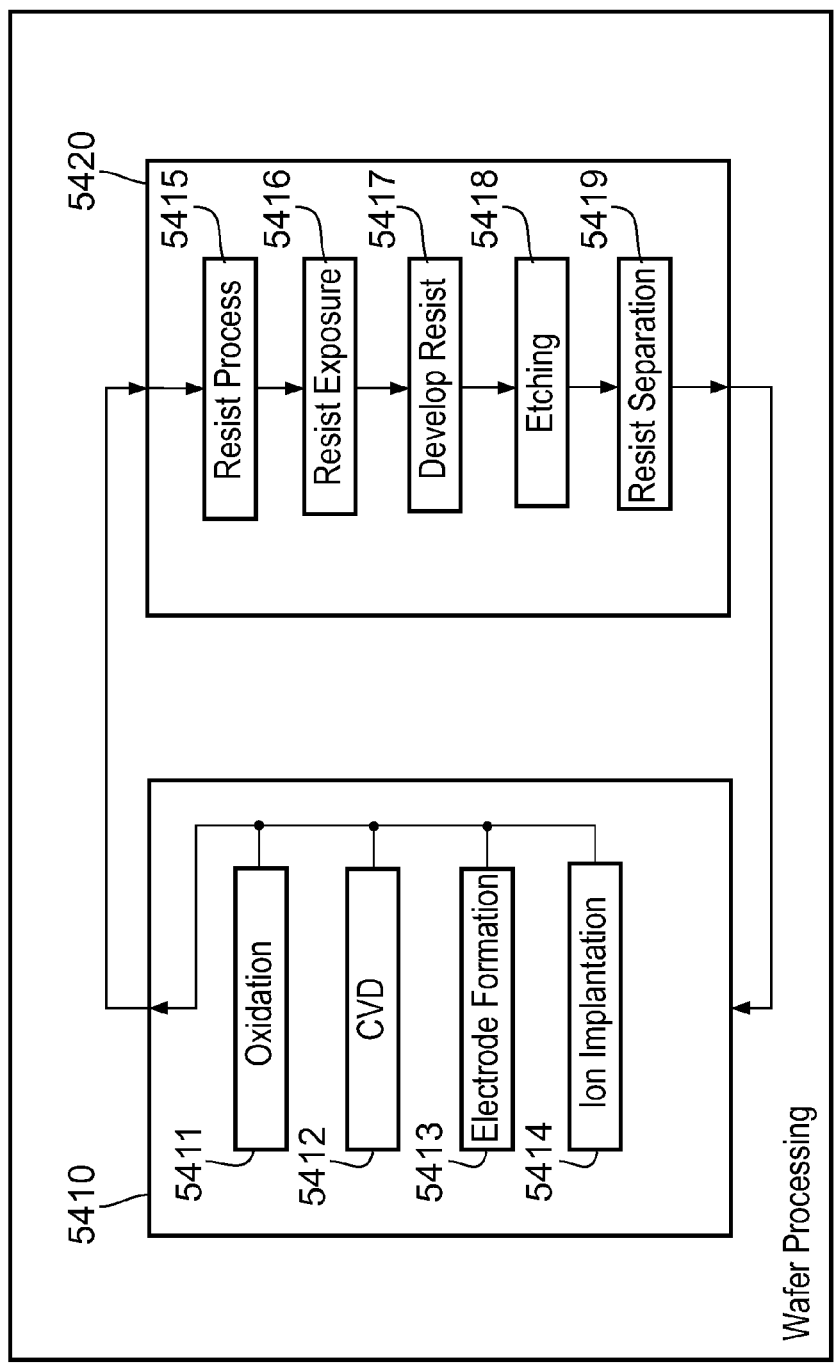
FIG. 54 is a flow chart showing steps in a wafer process.

FIG. 54 is a flow chart showing details of the wafer processing step. Generally, wafer processing involves forming a number of layers of various materials (e.g., conducting materials, semiconducting materials, and/or dielectric materials) on a wafer (Step 5410). One or more of these layers is patterned using a lithographic process (Step 5420). The layers can be formed in a variety of ways. For example, forming the layer can involve oxidizing a surface of the wafer in an oxidation process step (Step 5411). In some embodiments, forming the layer involves depositing a material on a surface of the wafer, such as by chemical vapor deposition (CVD), for example (Step 5412). In certain embodiments, forming the layer involves an electrode forming process for forming electrodes on the wafer by vapor deposition, for example (Step 5412). Forming layers can involve an ion implanting process for implanting ions to the wafer (Step 5414).

After forming a layer of a material, the layer can be patterned using a lithographic process. This typically involves a resist process for applying a resist to the wafer (Step 5415). Step 5416 is an exposure process for printing, by exposure, the circuit pattern of the mask on the wafer using a lithography tool, such as lithography tool 100 described above. Step 5417 is a developing process in which the exposed resist is develop. After developing, portions of the wafer exposed by the developed resist are etched in an etching process (Step 5418). Finally, the remaining resist material is removed from the wafer in a resist separation process (Step 5419).

Steps 5410 and 5420 are repeated forming integrated circuits on the wafer. Embodiments can include additional process steps, such as wafer polishing, for example, before or after patterning a layer of material.

Other embodiments are in the claims.

What is claimed is:

1. A system, comprising:
a plurality of reflective elements arranged to image radiation from an object field in an object plane to an image field in an image plane,
wherein:
the image plane is non-parallel to the object plane;
the image field has a first dimension and a second dimension perpendicular to the first dimension;
the first dimension of the image field is about one millimeter or more;
the second dimension of the image field is about one millimeter or more;
a path of the radiation through the system is characterized by chief rays that are parallel to each other to within 0.05° at the object plane; and
each reflective element in the system which is configured to direct the radiation from the object field to the image field has a curved reflective surface.

2. The system of claim 1, wherein the optical system has a rectangular field at the image plane.

3. The system of claim 1, wherein the system has an image-side numerical aperture of about 0.2 or more.

4. The system of claim 1, wherein the system is a catoptric system.

5. The system of claim 4, wherein the system has an image-side numerical aperture of about 0.2 or more.

6. The system of claim 1, wherein:
the system has an exit pupil and
none of the plurality of reflective elements is configured to cause an obscuration of the exit pupil.

7. The system of claim 1, wherein the plurality of reflective elements includes no more than two reflective elements that have a positive chief ray angle magnification.

8. The system of claim 1, wherein the plurality of reflective elements define a meridional plane and the reflective elements are symmetric with respect to the meridional plane.

9. The system of claim 1, wherein the chief rays intersect the object plane at an angle non-parallel to the object plane normal.

10. The system of claim 1, wherein the chief rays diverge from each other at the object plane.

11. The system of claim 1, wherein, for a meridional section of the system, the chief rays have a maximum angle of incidence on a surface of each of the reflective elements of less than 20°.

12. The system of claim 1, wherein the object plane is positioned between the plurality of reflective elements and an entrance pupil of the system.

13. The system of claim 1, wherein the plurality of reflective elements is telecentric at the image plane.

14. The system of claim 1, wherein the system is configured to reflect the imaged radiation from an object positioned at the object plane.

15. The system of claim 1, wherein for a meridional section of the system, a chief ray of a central field point has a maximum angle of incidence on a surface of each of the reflective elements of θ degrees, the system has an image side numeral aperture, NA, of more than 0.3, and the ratio θ/NA is less than 68.

16. The system of claim 1, wherein the system has a demagnification of 4×.

17. The system of claim 1, wherein the plurality of reflective elements comprises a first mirror and a second mirror, the first and second mirrors having a minimum distance from the object plane of $d_1$ and $d_2$, respectively, where $d_1/d_2$ is about two or more.

18. The system of claim 1, wherein the plurality of reflective elements includes a first reflective element in the path of the radiation from the object plane to the image plane, where the first reflective element has positive optical power.

19. The system of claim 1, wherein the system is a microlithography system.

20. The system of claim 1, wherein the system is a microlithography projection optical system.

21. A system, comprising:
a first subsystem configured to illuminate an object field in an object plane; and
a second subsystem, the second subsystem comprising a plurality of reflective elements arranged to image radiation from the object field to an image field in an image plane,
wherein:
the image plane is non-parallel to the object plane;
the image field has a first dimension and a second dimension perpendicular to the first dimension;
the first dimension of the image field is about one millimeter or more;
the second dimension of the image field is about one millimeter or more;
a path of the radiation through the system is characterized by chief rays that are parallel to each other to within 0.05° at the object plane; and
each reflective element in the second subsystem which is configured to direct the radiation from the object field to the image field has a curved reflective surface.

22. The system of claim 21, further comprising a radiation source configured to provide the radiation at λ to the object plane.

23. The system of claim 22, wherein λ is about 20 nm or less.

24. The system of claim 21, wherein the system is a microlithography system.

25. The system of claim 21, wherein the system is a microlithography projection optical system.

26. A method of operating a system which comprises a first subsystem and a second subsystem, the method comprising:
using the first subsystem to illuminate an object field in an object plane; and
using the second subsystem to image radiation from the object plane into an image plane in an image field,
wherein:
the image plane is non-parallel to the object plane;
the image field has a first dimension and a second dimension perpendicular to the first dimension;
the first dimension of the image field is about one millimeter or more;
the second dimension of the image field is about one millimeter or more;
a path of the radiation through the system is characterized by chief rays that are parallel to each other to within 0.05° at the object plane; and
each reflective element in the second subsystem directs the radiation from the object field to the image field has a curved reflective surface.

27. The system of claim 26, wherein the system is a microlithography system.

28. The system of claim 26, wherein the system is a microlithography projection optical system.

29. A system, comprising:
a plurality of reflective elements arranged to image radiation from an object plane to an image plane,
wherein:
the image plane is non-parallel to the object plane;
the plurality of reflective elements comprises four or more reflective elements;
a path of the radiation through the system is characterized by chief rays that are parallel to each other to within 0.05° at the object plane; and
each reflective element in the system which is configured to direct the radiation from the object field to the image field has a curved reflective surface.

30. The system of claim 29, wherein the system is a microlithography system.

31. The system of claim 29, wherein the system is a microlithography projection optical system.

32. A system, comprising:
a plurality of reflective elements arranged to image radiation from an object plane to an image plane,
wherein:
the image plane is non-parallel to the object plane;
the system has an exit pupil;

none of the plurality of reflective elements is configured to cause an obscuration of the exit pupil at the image plane;

a path of the radiation through the system is characterized by chief rays that are parallel to each other to within 0.05° at the object plane; and each reflective element in the system which is configured to direct the radiation from the object field to the image field has a curved reflective surface.

33. The system of claim 32, wherein the system is a microlithography system.

34. The system of claim 32, wherein the system is a microlithography projection optical system.

* * * * *

UNITED STATES PATENT AND TRADEMARK OFFICE
CERTIFICATE OF CORRECTION

PATENT NO. : 9,465,300 B2
APPLICATION NO. : 13/438428
DATED : October 11, 2016
INVENTOR(S) : Hans-Juergen Mann, Wilhelm Ulrich and Marco Pretorius It is certified that error appears in the above-identified patent and that said Letters Patent is hereby corrected as shown below:

Page 2, Column 1, Line 2 under "U.S. PATENT DOCUMENTS", after "Jewell" insert -- et al. --.

Page 2, Column 1, Line 38 under "U.S. PATENT DOCUMENTS", after "Nakano", insert -- et al. --.

Column 7, Line 10, delete "a" and insert -- $\alpha$ --.

Column 15, Line 35, after "is", delete "i".

Column 18, Line 59, delete "$y_c$." and insert -- $y_c$, --.

Column 21, Table 1B, Line 28, delete "X⁴Y5" and insert -- $X^4Y^5$ --.

Column 29, Line 5, delete "dogs" and insert -- $d_{ois}$ --.

Column 33, Table 2B, Line 28, delete "X⁴Y5" and insert -- $X^4Y^5$ --.

Column 35, Table 3B, Line 28, delete "X⁴Y5" and insert -- $X^4Y^5$ --.

Column 37, Table 4B, Line 28, delete "X⁴Y5" and insert -- $X^4Y^5$ --.

Column 41, Table 5B-continued, Line 21, delete "X⁴Y5" and insert -- $X^4Y^5$ --.

Column 42, make Lines 58-59 part of the same paragraph on Line 60.

Column 43, Table 6B, Line 28, delete "X4Y5" and insert -- $X^4Y^5$ --.

Column 45, Table 7B, delete "X4Y5" and insert -- $X^4Y^5$ --.

Column 50, Line 45, delete "183," and insert -- 1830, --.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,465,300 B2

Column 68, Table 16C-continued, Line 20, delete "2.0e+00 2.0e+00 2.0e+00 2.06+00" and insert -- 2.0e+00 2.0e+00 2.0e+00 2.0e+00 --.

Column 69, Line 12, delete "- 3, 254°." and insert -- - 3,254°. --.

Column 74, Line 35, delete "develop." and insert -- developed. --.

Column 75, Line 33, Claim 15, delete "wherein" and insert -- wherein, --.